United States Patent
Hidaka

(10) Patent No.: US 6,911,703 B2
(45) Date of Patent: Jun. 28, 2005

(54) SEMICONDUCTOR INTEGRATED CIRCUIT DEVICE OPERATING WITH LOW POWER CONSUMPTION

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/680,397

(22) Filed: Oct. 8, 2003

(65) Prior Publication Data

US 2004/0071026 A1 Apr. 15, 2004

Related U.S. Application Data

(62) Division of application No. 09/776,681, filed on Feb. 6, 2001, now Pat. No. 6,635,934.

(30) Foreign Application Priority Data

Jun. 5, 2000 (JP) .................................... 2000-167189
Aug. 30, 2000 (JP) .................................... 2000-261703

(51) Int. Cl.$^7$ ............................................. H01L 29/76
(52) U.S. Cl. ................ 257/369; 257/500; 365/185.23; 365/189.09; 365/230.06
(58) Field of Search ............................ 257/368, 500; 365/185.23, 189.09, 189.11, 230.06; 326/33, 83, 103

(56) References Cited

U.S. PATENT DOCUMENTS

| | | | |
|---|---|---|---|
| 3,806,741 A | 4/1974 | Smith | |
| 4,672,243 A | 6/1987 | Kirsch | |
| 5,512,771 A | 4/1996 | Hiroki et al. | |
| 5,610,533 A | 3/1997 | Arimoto et al. | |
| 5,880,604 A | 3/1999 | Kawahara et al. | |
| 5,909,140 A | 6/1999 | Choi | |
| 5,942,784 A | 8/1999 | Harima et al. | |
| 5,985,706 A | 11/1999 | Gilmer et al. | |
| 6,133,762 A | 10/2000 | Hill et al. | |
| 6,201,745 B1 * | 3/2001 | Ryu et al. | .................... 365/200 |
| 6,255,698 B1 | 7/2001 | Gardner et al. | |
| 6,307,234 B1 | 10/2001 | Ito et al. | |
| 6,307,236 B1 * | 10/2001 | Matsuzaki et al. | .......... 257/392 |
| 6,317,370 B2 * | 11/2001 | Shirley | ....................... 365/200 |
| 6,333,541 B1 | 12/2001 | Matsuoka et al. | |
| 6,529,042 B1 | 3/2003 | Hiramoto et al. | |
| 6,545,931 B2 * | 4/2003 | Hidaka | ........................ 365/227 |
| 2002/0000872 A1 | 1/2002 | Ye et al. | |
| 2002/0079542 A1 | 6/2002 | Trivedi et al. | |

FOREIGN PATENT DOCUMENTS

| | | | | |
|---|---|---|---|---|
| EP | 0986177 | | 3/2000 | |
| JP | 06203558 A | * | 7/1994 | ......... G11C/11/407 |
| JP | 6-237164 | | 8/1994 | |
| JP | 11-150193 | | 6/1999 | |

OTHER PUBLICATIONS

"Ultra LSI Memory," by K. Ito, Baifukan, Nov. 5, 1994 (First Edition), pp. 351–371.

* cited by examiner

Primary Examiner—George Eckert
(74) Attorney, Agent, or Firm—McDermott Will & Emery LLP

(57) ABSTRACT

Transistors having large gate tunnel barriers are used as transistors to be on in a standby state, MIS transistors having thin gate insulating films are used as transistors to be off in the standby state, and main and sub-power supply lines and main and sub-ground lines forming a hierarchical power supply structure are isolated from each other in the standby state so that a gate tunnel current is reduced in the standby state in which a low power consumption is required. In general, a gate tunnel current reducing mechanism is provided for any circuitry operating in a standby state and an active state, and is activated in the standby state to reduce the gate tunnel current in the circuitry in the standby state, to reduce power consumption in the standby state.

4 Claims, 54 Drawing Sheets

Tox2 > Tox1

HEAVY CHANNEL DOPE

Vth LARGE

Tox3≧Tox2

Vbias
; DEEP BIAS

SEMICONDUCTOR INTEGRATED CIRCUIT DEVICE OPERATING WITH LOW POWER CONSUMPTION

This application is a divisional of application Ser. No. 09/776,681 filed Feb. 6, 2001, now U.S. Pat. No. 6,635,934.

BACKGROUND OF THE PRESENT INVENTION

1. Field of the Present Invention

The present invention relates to a semiconductor device including insulated gate field effect transistors, referred to as "MIS transistors" hereinafter, as it components, and particularly to a configuration for reducing power consumption in a semiconductor device having miniaturized CMOS transistors (P- and N-channel MIS transistors). More particularly, the present invention relates to a structure for suppressing a gate tunnel current of a miniaturized MIS transistor.

2. Description of the Background Art

In a CMOS semiconductor device, as the size of MIS transistors is reduced, an operation power supply voltage is lowered for ensuring reliability of the transistors and reducing power consumption. For reducing the sizes of MIS transistors in accordance with lowering of the operation power supply voltage, values of various transistor parameters are reduced according to a certain scaling rule. According to the scaling rule, it is necessary to reduce a thickness Tox of a gate insulating film of the MIS transistor, and it is also necessary to reduce an absolute value Vth of a threshold voltage. However, it is difficult to reduce the absolute value of the threshold voltage according to the scaling rule. The threshold voltage is defined as a gate-source voltage, which causes a predetermined drain current under application of a predetermined drain voltage. If absolute value Vth of the threshold voltage is small, a weak inversion layer is formed in a channel region even with a gate-source voltage Vgs being 0 V, and a sub-threshold leak current, referred to as an "off-leak current" hereinafter, flows through this inversion layer.

Therefore, such a problem occurs that the off-leak current increases to increase the standby current in a standby cycle during which MIS transistors are off. Particularly, in a semiconductor device for use in a battery-powered equipment such as a portable equipment, it is greatly required to reduce the off-leak current in view of a lifetime of the battery.

For reducing the off-leak current, absolute value Vth of the threshold voltage can simply be increased. In this case, however, reduction of the operation power supply voltage cannot achieve an intended effect, and fast operation cannot be ensured. Thus, an MTCMOS (Multi-Threshold CMOS) structure has been proposed for reducing the off-leak current in the standby cycle and for ensuring fast operation.

FIG. 104 shows, by way of example, a structure of an MT-CMOS circuit in the prior art. In the structure shown in FIG. 104, five inverter circuits IV0–IV4 are cascaded. For these inverter circuits IV0–IV4, there are arranged a main power supply line MVL coupled to a power supply node, a sub-power supply line SVL coupled to main power supply line MVL via a switching transistor SWP, a main groundline MGL coupled to a ground node, and a sub-ground line SGL coupled to main ground line MGL via a switching transistor SWN.

Inverter circuits IV0–IV4 each have a structure of a CMOS inverter, and include P-channel MIS transistors P0–P4 and N-channel MIS transistors N0–N4, respectively. This MT-CMOS circuit has a standby cycle in a standby state and an active cycle in which an input signal changes actually. In the standby cycle, input signal IN is fixed to L-level, and switching transistors SWP and SWN are kept in the off state in response to control signals /φ and φ, respectively. Each of switching transistors SWP and SWN has a threshold voltage relatively large (medium) in absolute value, M-Th. Each of MIS transistors P0–P4 and N0–N4 of inverter circuits IV0–IV4 has a threshold voltage of a small absolute value, L-Th.

Depending on a logical level of an input signal IN in the standby cycle, a source of each MIS transistor, which is on in the standby cycle, is connected to main power supply line MVL or main ground line MGL. More specifically, sources of MIS transistors P0, P2 and P4 are connected to main power supply line MVL, and sources of MIS transistors N1 and N3 are connected to main ground line MGL. A source of each MIS transistor, which is off in the standby cycle, is connected to sub-power supply line SVL or sub-ground line SGL. More specifically, sources of MIS transistors P1 and P3 are connected to sub-power supply line SVL, and sources of MIS transistors N0, N2 and N4 are connected to sub-ground line SGL. Now, an operation of the MT-CMOS circuit shown in FIG. 104 will now be described with reference to a signal waveform diagram of FIG. 105.

During the standby cycle, input signal IN is at L-level, and control signals φ and /φ are at L- and H-levels, respectively. In this state, switching transistors SWP and SWN are off. Switching transistor SWP is an M-Vth transistor, and the off-leak current thereof in the standby state cycle is small.

In inverter circuits IV0–IV4, MIS transistors P0, P2 and P4 are on, and therefore do not cause a sub-threshold leak (off-leak) current. Meanwhile, MIS transistors P1 and P3 are off, and cause an off-leak current from sub-power supply line SVL. The off-leak currents flowing through MIS transistors P1 and P3 flow to main ground line MGL through MIS transistors N1 and N3 in the on state, respectively. However, the off-leak current flowing through MIS transistors P1 and P3 depends in magnitude on the off-Leak current flowing through switching transistor SWP. Therefore, the voltage level of sub-power supply line SVL reaches an equilibrium state where the off-leak current flowing through switching transistor SWP is balanced with the sum of off-leak currents flowing through MIS transistors P1 and P3. Due to the current flow, the voltage level of sub-poWer supply line SVL is lower than power supply voltage VCC, and MIS transistors P1 and P3 enters such a state that the gate to source thereof is reverse-biased, and therefore enters a deeper off state. Accordingly, MIS transistors P1 and P3 can have the off-leak currents suffluiently reduced.

Likewise, off-leak currents flow through MIS transistors N0, N2 and N4. These off-leak currents flowing through MIS transistors N0, N2 and N4 depend in magnitude on the off-leak current flowing through switching transistor SWN. Switching transistor SWN is an M-Vth transistor, and has a sufficiently small off-leak current so that the off-leak currents of MIS transistors N0, N2 and N4 can be sufficiently suppressed.

In the above case, the voltage level of sub-ground line SGL reaches an equilibrium state where the sum of off-leak currents flowing through MIS transistors N0, N2 and N4 are balanced with the off-leak current flowing through switching transistor SWN, and therefore is higher than ground voltage GND. In this case, each of MIS transistors N0, N2 and N4 enters such a state that the gate to source thereof is reverse-biased, and therefore enters a deeper off state. Accordingly, MIS transistors N0, N2 and N4 can have the off-leak current sufficiently suppressed.

In the active cycle for actually performing an operation, control signals φ and /φ are set to H- and L-levels, respectively, and switching transistors SWP and SWN are turned off. Responsively, sub-power supply line SVL is connected to main power supply line MVL, and sub-ground line SGL is connected to main ground line MGL. Inverter circuits IV0–IV4 include L-Vth transistors as components, and therefore, rapidly change their output signals in accordance with input signal IN.

As shown in FIG. 104, the power supply line differs in impedance value depending on the standby cycle and the active cycle. Thereby, even with the L-Vth transistors employed as its components, the off-leak current can be sufficiently suppressed in the standby cycle, while ensuring fast operation performance in the active cycle. Accordingly, a CMOS circuit capable of fast operation with low power consumption can be implemented.

Various parameters such as sizes of the MIS transistors are reduced according to a certain scaling rule. The scaling rule stands on the premise that the gate length of the MIS transistor and the thickness of the gate insulating film thereof are reduced at the same scaling ratio. For example, an MIS transistor having a gate length of 0.25 μm (micrometers) generally has a gate insulating film of 5 nm (nanometers) in thickness, and therefore an MIS transistor having a gate length of about 0.1 μm has a gate insulating film from about 2.0 to about 2.5 nm in thickness. In the case where the thickness of gate insulating film is reduced in accordance with lowering of the operation power supply voltage and is reduced to about 3 nm in accordance with the condition that the power supply voltage is 1.5 V or lower, for example, a tunnel current flows through the gate insulating film of MIS transistor in the on state, resulting in a problem of increase in power supply current of the transistor in the on state.

FIGS. 106A–106C schematically show energy bands of the MIS transistor, with the gate being a metal gate. Normally, in the MIS structure, a gate is formed of polycrystalline silicon doped with impurities and has properties as a semiconductor. For simplicity reason, however, it is here assumed that the gate is made of a metal. The semiconductor substrate region is of the P-type substrate (layer).

As shown in FIG. 106A, it is now assumed that a negative voltage is applied on the gate. In this state, holes present in the P-type substrate are pulled toward the interface between the substrate and the insulating film. Thereby, the energy band of the P-type substrate is bent upward at the interface between the insulating film and the P-type substrate, and a valence band Ev approaches a Fermi level EF. A conduction band Ec is bent upward at the vicinity of this interface. In this case of application of the negative voltage, Fermi level EF of the gate (corresponding to conduction band Ec in the case of a polycrystalline silicon gate) also rises. In this state, the density of majority carriers (holes) on the interface is higher than that in the inner portion. This state is called an accumulated state. In this state, the conduction band Ec is bent upward, and a barrier against electrons is high so that the tunneling current through the gate insulating film does not flow.

Where a low positive voltage is applied to the gate as shown in FIG. 106B, the Fermi level (conduction band) of the gate lowers so that conduction band Ec and valence band Ev are bent downward in the P-type substrate region at the interface with the insulating film. In this state, holes have been located away from the interface to the gate insulating film so that depletion of majority carriers occurs, and Fermi level EF on the interface is located substantially in the center of the band. This state, where a majority carrier is not present, is called a depletion state. In this depletion state, a carrier is not present on the interface, and a tunnel current does not occur.

When a further high positive voltage is applied as shown in FIG. 106C, Fermi level EF of the gate further lowers, and the band bending at the vicinity of the interface occurs to a larger extent. Consequently, Fermi level EF of the gate exceeds the intermediate value of energy gap Eg at the vicinity of the interface, and electrons which are minority carries are accumulated. This state is called an inverted state because the conduction type of the interface is inverted with respect to that of the interior. This state corresponds to the state where a channel is formed in the MIS transistor. If the gate insulating film has a thickness δ of, e.g., 3 nm in this state, electrons which are minority carriers flow into the gate through a tunneling phenomenon. Thus, the tunnel current directly flows into the gate from the channel region in the MIS transistor having the channel formed and thus conductive. This tunnel current is called a (direct) gate tunnel current. Similar behaviors occur in a structure having an N-type substrate region, except for that a voltage applied to the gate has the opposite polarity and that the energy band bends in the opposite direction.

In MIS transistor, if the thickness of the gate insulating film is reduced, e.g., to 3 nm, a direct gate current flows from the channel region to the gate. Consequently, the MT-CMOS circuit such as that shown in FIG. 104 accompanies the following problem. In the standby cycle, a tunnel current flows from the channel region to the gate in an on state MIS transistor, and through-current finally flows from the power supply node to the ground node so that the current consumption in the standby cycle increases.

FIG. 107 shows a path of a tunnel current in the MT-CMOS circuit shown in FIG. 104 in the standby cycle.

FIG. 107 shows a structure of a portion including inverter circuits IV1 and IV2. In inverter circuit IV1, MIS transistor N1 has a source and a back gate connected together to main ground line MGL, and MIS transistor P1 has a source connected to a sub-power supply line (not shown). In inverter circuit IV2, MIS transistor P2 has a back gate and a source connected together to main power supply line MVL, and MIS transistor N2 has a source connected to a sub-ground line (not shown).

In the standby cycle, inverter circuit IV1 is supplied with a signal at H-level. Therefore, the output signal of inverter circuit IV1 is at L-level or the level of ground voltage GND in the standby cycle, and MIS transistor P2 in inverter circuit IV2 is on. In MIS transistor P2, a tunneling current It flows from the substrate region to the gate, and further flows to main ground line MGL through MIS transistor N1. As indicated by broken line in FIG. 107, the gate tunnel current of MIS transistor P2 causes a through current flowing from main power supply line MVL to main ground line MGL.

FIG. 108 shows a structure of a portion including inverter circuits IV2 and IV3 of the MT-CMOS circuit shown in FIG. 104. In the standby cycle, inverter circuit IV2 is supplied with a signal at L-level. The sources of MIS transistors P2 and N3 are connected to main power supply line MVL and main ground line MGL, respectively, while the sources of MIS transistors N2 and P3 are connected to the sub-ground line and sub-power supply line (both not shown in FIG.

108), respectively. In this state in the standby cycle, MIS transistor P2 is on, and supplies a current to the gate of MIS transistor N3 from main power supply line MVL.

MIS transistor N3 is on, and therefore gate tunnel current It flows through MIS transistor N3 (through the source region and the back gate region) to main ground line MGL. When the back gate of MIS transistor N3 is biased to a voltage level different from ground voltage GND, gate tunnel current. It of MIS transistor N3 flows from this channel region through the source region. In this case, therefore, gate tunnel current It likewise causes a though current flowing from main power supply line MVL to main ground line MGL.

This gate tunnel current is nearly equal to the off-leak current when the gate oxide film has a thickness of about 3 nm or less. If the gate oxide film has a thickness smaller than about 3 nm, the gate tunnel current exceeds the off-leak current. Therefore, in the case where the operating power supply voltage is lowered and the thickness of gate insulating film is reduced according to the scaling rule, this gate tunnel current cannot be neglected and causes a problem of increase in current consumption in the standby cycle.

A gate tunnel current J approximately satisfies the relationship expressed by the following formula:

$$J \sim E \cdot \exp[-T_{ox} \cdot A \cdot \sqrt{\phi}],$$

where $\phi$ represents a height of a barrier at the interface with the gate insulating film, and is approximately expressed by a difference between the Fermi level and the surface potential $\phi s$ at the interface, A is a constant depending on an impurity concentration (an effective mass of an electron) of the semiconductor substrate in the channel region, and E represents an electric field applied to the gate insulating film. The barrier Height $\phi$ is a function of a dielectric constant $\epsilon i$ and thickness Tox of the gate insulating film. Therefore, if a tunnel current starts to flow at the gate oxide film thickness of 3 nm with the gate insulating film formed of silicon oxide, a gate tunnel current likewise flows through the gate insulating film, which provides a barrier equal to that by the silicon oxide film of 3 nm in thickness. As the gate insulating film, there is a silicon nitride oxide film, other than the silicon oxide film (silicon dioxide film).

As described above, with the miniaturized transistors as components, there arises a problem that the gate tunnel current of the MIS transistor becomes substantially equal to or larger than the off-leak current in the standby, and the current consumption in the standby cycle cannot be reduced.

SUMMARY OF THE PRESENT INVENTION

An object of the present invention is to provide a semiconductor device, which can sufficiently suppress current consumption in the standby state, and is suitable to a high integration.

Another object of the present invention is to provide a semiconductor device, in which a gate tunnel current of an MIS transistor can be sufficiently suppressed in the standby state.

A semiconductor device according to the present invention includes: a first power supply node, a logic gate receiving a voltage on a first power supply line as one operation power supply voltage, for performing a predetermined operation, and a first switching transistor connected between the first power supply node and the first power supply line, and being selectively turned on in response to an operation mode instructing signal instructing an operation mode of the logic gate. The logic gate includes, as its components, an MIS transistor having a first gate tunnel barrier, and the first switching transistor has a gate tunnel barrier greater than the gate tunnel barrier of the MIS transistor of the logic gate.

According to a second aspect of the present invention, a semiconductor device includes a first MIS transistor connected between a first power supply node and a first output node and receiving an input signal on a gate thereof, and a second MIS transistor connected between the output node and a second power supply node and receiving the input signal on a gate thereof. The first MIS transistor is turned on in accordance with the input signal in a standby cycle, and has a first gate tunnel barrier. The second MIS transistor is turned off in accordance with the input signal in the standby cycle, and has a gate tunnel barrier smaller than the first gate tunnel barrier.

According to a third aspect of the present invention, a semiconductor device includes a first MIS transistor connected between a first power supply node and a first output node and receiving an input signal on a gate thereof, a second MIS transistor connected between the first output node and a second power supply node and receiving the input signal on a gate thereof, and a control circuit for reducing leakage amounts of gate tunnel currents of the first and second MIS transistors in the standby cycle below those in an active cycle.

According to a fourth aspect of the present invention, a semiconductor device includes a first MIS transistor connected between a first power supply node and a first output node, having a first gate tunnel barrier and receiving an input signal on a gate thereof, a second MIS transistor connected between the first output node and a sub-power supply node, receiving the input signal on a gate thereof to be turned on complementarily to the first MIS transistor, and a first switching transistor connected between the sub-power supply node and a second power supply node and being selectively turned on in response to an operation cycle instructing signal. The second MIS transistor has a second gate tunnel barrier smaller than the first gate tunnel barrier.

According to a fifth aspect of the present invention, a semiconductor device includes a first switching transistor connected between a power supply node and a power supply line and being selectively turned on in response to an operation cycle instructing signal, a gate circuit receiving a voltage on the power supply line as one operation power supply voltage, for performing a predetermined processing, a replica circuit including elements formed by proportionally scaling down the gate circuit and the first switching transistor, and a transmitting circuit for transmitting an output voltage of the replica circuit to the power supply line in accordance with the operation cycle instructing signal. The scaled down gate circuit of the replica circuit receives the voltage on the output node as one operation power supply voltage, and the scaled down transistor of the first switching transistor supplies a voltage from the power supply node to the output node.

According to a sixth aspect of the present invention, a semiconductor device includes a first switching transistor connected between a first power supply node and a first power supply line and being selectively turned on in response to an operation cycle instructing signal, a first gate circuit receiving a voltage on the first power supply line as one operation power supply voltage, a second switching transistor connected between a second power supply node and a second power supply line, and being selectively turned on in response to the operation cycle instructing signal, and a second gate circuit receiving a voltage on the second power supply line as one operation power supply voltage. The first and second gate circuits include MIS transistors as their components, and have the same structure.

According to a seventh aspect of the present invention, a semiconductor device includes a gate circuit including first and second transistors each having an SOI (Silicon On Insulator) structure, and effecting predetermined processing on an input signal for outputting, and a bias voltage applying circuit for applying a bias voltage to body regions of the first and second transistors of the gate circuit. The input signal applied to the gate circuit is at a predetermined logical level in a standby cycle, and each of first and second transistors has a gate insulating film having a thickness not exceeding 3 nanometers. The bias voltage applying circuit sets a bias of the body region of at least the transistor in the off state out of the first and second transistors in the standby cycle to be deeper than that in an active cycle.

According to an eighth aspect of the present invention, a semiconductor device includes a gate circuit including first and second MIS transistors each having an SOI (Silicon On Insulator) structure, and effecting a predetermined logical processing on an input signal for outputting, and a bias voltage applying circuit for applying a bias voltage to body regions of the first and second MIS transistors. The bias voltage applying circuit sets biases of the body regions of the first and second transistors to be deeper in the standby cycle than those in an active cycle.

According to a ninth aspect of the present invention, a semiconductor device includes a first MIS transistor connected between a first power supply node and an output node and receiving an input signal on a gate thereof, and a second MIS transistor connected between the output node and a second power supply node and receiving the input signal on a gate thereof A logical level of the input signal in a standby cycle is predetermined, and the first MIS transistor is turned on in accordance with the input signal in the standby cycle, and is formed of an MIS transistor of a buried channel type.

According to a tenth aspect of the present invention, a semiconductor device includes a first MIS transistor connected between a first power supply node and an output node and receiving an input signal on a gate thereof, and a second MIS transistor connected between an output node and a second power supply node and receiving the input signal on a gate thereof. The logical level of the input signal in a standby cycle is predetermined, and the first MIS transistor is turned on in response to the input signal in the standby cycle, and is an MIS transistor of a depleted gate type.

According to an eleventh aspect of the present invention, a semiconductor device includes a latch circuit for latching an applied signal, and a gate circuit for effecting a predetermined processing on a latch output signal of the latch circuit. The latch circuit is formed of an MIS transistor having a first gate tunnel barrier. The gate circuit is formed of an MIS transistor having a gate tunnel barrier smaller than the first gate tunnel barrier.

According to a twelfth aspect of the present invention, a semiconductor device includes a first latch circuit for latching an applied signal in an active cycle, a second latch circuit for latching an applied signal in a standby cycle, and a transfer circuit transferring a latching signal of the first latch circuit to the second latch circuit in response to transition of an operation cycle instructing signal from an active cycle instruction to a standby cycle instruction, and transferring a latching signal of the second latch circuit to the first latch circuit in response to transition of the operation cycle instructing signal from the standby instruction to the active cycle instruction. The first latch circuit has a first gate tunnel barrier, and the second latch circuit has a gate tunnel barrier larger than the first gate tunnel barrier.

According to a thirteenth aspect of the present invention, a semiconductor device includes a precharge transistor for precharging a precharge node to a predetermined voltage level in response to activation of a precharge instructing signal, and a gate circuit coupled to the precharge node, being in a standby state in an active state of the precharge instructing signal, and driving the precharge node in accordance with an applied signal in an inactive state of the precharge instructing signal. The precharge transistor has a first gate tunnel barrier, and an MIS transistor of the gate circuit has a second gate tunnel barrier greater than the first gate tunnel barrier.

According to a fourteenth aspect of the present invention, a semiconductor device has a precharge transistor being activated to precharge a precharge node to a predetermined voltage for a predetermined time upon transition from a standby cycle to an active cycle, and a gate circuit for driving the precharge node in accordance with an applied signal in the active cycle. The gate circuit has the same, first gate tunnel barrier as the precharge transistor. The first gate tunnel barrier has a height equal to or greater than that of a gate tunnel barrier provided by a silicon oxide film of 3 nm in thickness.

According to a fifteenth aspect of the present invention, a semiconductor device includes a plurality of memory cells requiring refresh of storage data, a timer circuit being activated in a refresh mode to generate a refresh request instructing refreshing of the stored data of the plurality of memory cells at predetermined intervals, a refresh address counter for generating a refresh address specifying a memory cell row of the plurality of memory cells to be refreshed, and refresh-related circuitry for refreshing the stored data of the memory cells specified by the refresh address among the plurality of memory cells. The timer circuit and the refresh address counter include MIS transistors having a first gate tunnel barrier as components, and the refresh-related circuitry includes, as a component, an MIS transistor having a second gate tunnel barrier of a height not exceeding that of the first gate tunnel barrier.

According to a sixteenth aspect of the present invention, a semiconductor device includes a logic circuit including an insulated gate field effect transistor as its component, a latch circuit provided corresponding to an internal node of the logic circuit for latching a signal on the corresponding internal node, and a transfer path coupled to the latch circuit for transferring the signal of the latch circuit. At least the logic circuit is set to a state of having a gate tunnel current reduced in a standby state.

According to a seventeenth aspect of the present invention, a semiconductor device includes a plurality of internal circuits formed of MIS transistors, and performing predetermined operations when made active, an activation control circuit responsive to an internal circuit designating signal designating an internal circuit to be activated among the plurality of internal circuits for generating an internal circuit activating signal for activating the designated internal circuit, and a current control circuit responsive to an operation mode instructing signal and the internal circuit activating signal for holding a gate tunnel current of the MIS transistor of the internal circuit in the inactive state among the plurality of internal circuits to be smaller than that of the MIS transistor of the internal circuit in the active state. The operation mode instructing signal designates an active cycle of enabling the plurality of internal circuits and a standby cycle of disabling the plurality of internal circuits.

According to an eighteenth aspect of the present invention, a semiconductor device includes a normal array having a plurality of normal memory cells, a redundant array having spare memory cells for repairing a defective normal memory cell having a defect in the normal array, a normal access circuit for accessing a selected memory cell in the normal array, a spare access circuit for accessing a spare memory cell in the redundant array, and a power supply control circuit for determining a gate tunnel current of an MIS transistor of the inactive circuit out of the spare access circuit and the normal access circuit to be smaller than the gate tunnel circuit of the MIS transistor of the active circuit.

If a gate tunnel current may occur in an MIS transistor, measures are taken for the MIS transistor, e.g., of increasing the height of the gate tunnel barrier or cutting off the current flowing path. For the MIS transistors through which the gate tunnel current may not occur, MIS transistors having sizes reduced according to a scaling rule is used. Owing to these measures, the semiconductor device which can operate fast with low current consumption can be implemented.

When the circuit is to be disabled, the gate tunnel current of the MIS transistor forming the circuit is reduced, or the power supply voltage is powered down. Thereby, the current consumption of the disabled circuit can be reduced, and the semiconductor device operating with low current consumption can be implemented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1A:
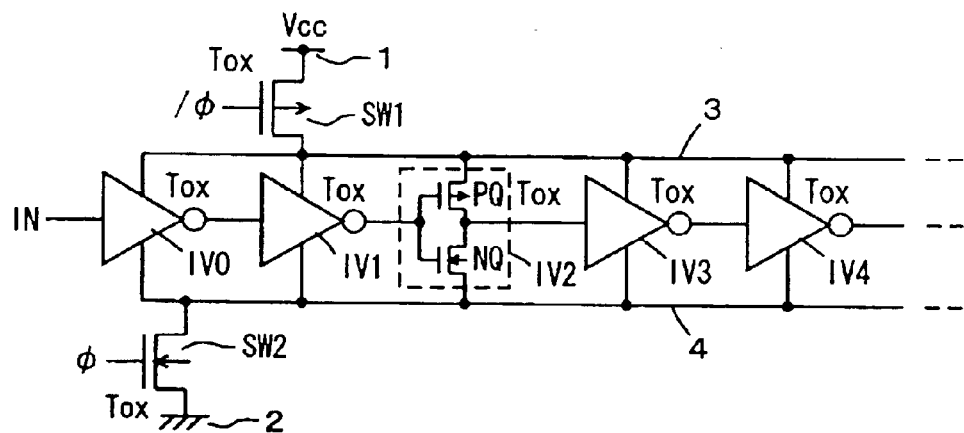
FIG. 1A shows a structure of a semiconductor device according to a first embodiment of the present invention.

FIG. 1A schematically shows a structure of a semiconductor device according to a first embodiment of the present invention. Referring to FIG. 1A, the semiconductor device includes cascaded CMOS inverter circuits IV0–IV4. Each of CMOS inverter circuits IV0–IV4 includes a P-channel MIS transistor PQ and an N-channel MIS transistor NQ as its components. Each of MIS transistors PQ and NQ has a gate insulating film having a sufficiently reduced thickness Tox that provides a gate tunnel barrier similar to or lower than a gate tunnel barrier provided, e.g., by a silicon oxide film of 3 nm in thickness. The previous formula of the gate tunnel current J includes the gate insulating film thickness Tox and the barrier height $\phi$ as parameters, and therefore, the "gate tunnel barrier" is defined here and hereinafter as being given by a product of thickness Tox of the gate insulating film and a square root of barrier height $\phi$. The barrier height $\phi$ is expressed by a difference between a Fermi level and a surface potential in a so-called band bending. Usually, this barrier height $\phi$ is approximately expressed by the following expression:

$$\phi = c2 \cdot \phi G + c3,$$

where $\phi G$ represents a work function of a gate electrode, and c2 and c3 are expressed by functions of a dielectric constant of the gate insulating film, thickness Tox of the gate insulating film and others.

Each of CMOS inverter circuits IV0–IV4 commonly receives the voltages on sub-power supply line 3 and sub-ground line 4 as its operation power supply voltages. Sub-power supply line 3 is connected to a main power supply node 1 via a switching transistor SW1. Sub-ground line 4 is connected to a main ground node 2 via a switching transistor SW2. Switching transistors SW1 and SW2 each are similar in gate insulation film thickness to MIS transistors PQ and NQ, and have sufficiently great gate tunnel barrier. Switching transistors SW1 and SW2 are sufficiently larger in current drive capability than MIS transistors PQ and NQ, for sufficiently supplying the operation currents to CMOS inverter circuits IV0–IV4 in the active cycle. Thus, these switching transistors SW1 and SW2 have sufficiently increased channel widths, respectively.

Switching transistors SW1 and SW2 are selectively turned on and off in response to control clock signals /$\phi$ and $\phi$, respectively. Control clock signals $\phi$ and /$\phi$ turn on switching transistors SW1 and SW2, respectively, in the active cycle in which CMOS inverter circuits IV0–IV4 actually operate. In the standby cycle in which CMOS inverter circuits IV0–IV4 are in a standby state, control clock signals $\phi$ and /$\phi$ turn off switching transistors SW1 and SW2, respectively.

Figure 1B:
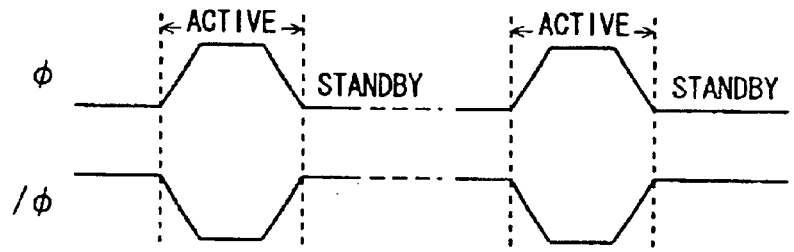
FIG. 1B is a signal waveform diagram representing an operation of the semiconductor device shown in FIG. 1A.

Referring to FIG. 1A, control clock signals $\phi$ and /$\phi$ are at H- and L-levels in the active cycle, as shown in a signal waveform diagram of FIG. 1B, and switching transistors SW1 and SW2 are turned on to couple the power supply node (main power supply line) 1 to sub-power supply line 3 and sub-ground line 4 to the main ground node 2, respectively. Switching transistors SW1 and SW2 have sufficiently large current supply capabilities. Each of CMOS inverter circuits IV0–IV4 includes, as its components, MIS transistors PQ and NQ each having a gate insulating film of a sufficiently reduced thickness. MIS transistors PQ and NQ are miniaturized along the scaling rule in accordance with operation power supply voltage VCC, and can operate fast.

In the standby state, as shown in FIG. 1B, control signals φ and /φ are at L- and H-levels, respectively, and switching transistors SW1 and SW2 are rendered off. Switching transistor SW1 receives control clock signal /φ at power supply voltage VCC level on its gate. Switching transistor SW2 receives control clock signal φ at the ground voltage level on its gate. Therefore, switching transistors SW1 and SW2 are in a depletion state, in which a depletion layer expands in a channel region of each of switching transistors SW1 and SW2, so that a reduced voltage is applied to a gate capacitance of each of switching transistors SW1 and SW2. This is because a depletion layer capacitance is connected in series to the gate capacitance, and a voltage between the gate electrode and the substrate region is capacitance-divided by the gate capacitance and the depletion layer capacitance.

Accordingly, a tunnel current hardly flows between the substrate region and the gate electrode, and a gate tunnel current merely flows in an overlap region where the drain region and the gate electrode overlap with each other. This current is smaller in magnitude by about two orders than the gate tunnel current flowing between the channel region and the gate electrode, and the gate tunnel currents of switching transistors SW1 and SW2 can be made sufficiently small in the standby cycle.

In CMOS circuits IV0–IV4, MIS transistors PQ and NQ are connected to sub-power supply line 3 and sub-ground line 4, respectively. Currents which flow under this state are only leak currents (gate tunnel currents and sub-threshold currents) flowing through switching transistors SW1 and SW2 as well as leak currents in CMOS inverter circuits IV0–IV4. Balance is kept between the voltage levels of sub-power supply line 3 and the sub-ground line 4 when balance is kept between the leak currents flowing through switching transistors SW1 and SW2 and the leak currents flowing through CMOS inverter circuits IV0–IV4.

In this state, switching transistor SW2 is off, and the gate tunnel current of MIS transistor NQ is sufficiently suppressed even when a gate tunnel current flows through MIS transistor NQ to sub-ground line 4. Likewise, in the case where a gate tunnel current flows through MIS transistor PQ, sub-power supply line 3 is coupled to main power supply node 1 via switching transistor SW1, and the gate tunnel current flowing through MIS transistor PQ is sufficiently suppressed by switching transistor SW1. Thereby, switching transistors SW1 and SW2 can effectively cut off the gate tunnel current flow between power supply node 1 and ground node 2, and the current consumption in the standby state can be reduced.

As compared to a structure in which CMOS inverter circuits IV0–IV4 are connected directly to power supply node 1 and ground node 2, switching transistors SW1 and SW2 which are made off in the standby cycle can sufficiently suppress the gate tunnel currents.

[Modification]

Figure 2A:
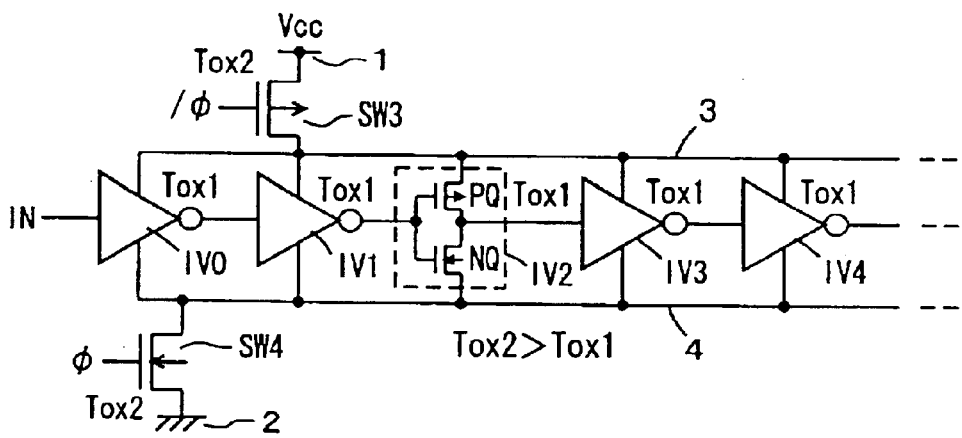
FIG. 2A shows a structure of a modification of the first embodiment of the present invention.

FIG. 2A shows a structure of a modification of the first embodiment of the present invention. In the structure shown in FIG. 2A, each of the gate insulating films of MIS transistors PQ and NQ included in inverter circuits IV0–IV4 has a thickness Tox1 corresponding to the silicon oxide film thickness of 3 nm. A switching transistor SW3 connected between power supply node 1 and sub-power supply line 3 has a gate insulating film thickness Tox2 that is greater than thickness Tox1 of the gate insulating films of MIS transistors PQ and NQ. A switching transistor SW4 connected between sub-ground line 4 and ground node 2 likewise has a gate insulating film of a thickness, Tox2. Structures other than the above are substantially the same as those shown in FIG. 1A, and the corresponding portions are allotted with the same reference numbers.

Figure 2B:
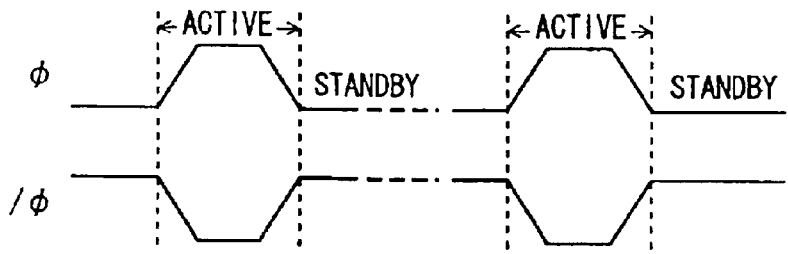
FIG. 2B is a signal waveform diagram representing an operation of the device shown in FIG. 2A.

As shown in a signal waveform diagram of FIG. 2B, control clock signals φ and /φ attains inactive and active states depending on the active and the standby cycles of inverter circuits IV0–IV4. Switching transistors SW3 and SW4 are formed of MIS transistors. In switching transistors SW3 and SW4, the thickness Tox of the gate insulating film is increased to the thickness Tox2, and the gate tunnel barrier increases so that a gate tunnel current is suppressed. As the thickness of the gate insulating film increases, the absolute values of threshold voltages of switching transistors SW3 and SW4 increase so that sub-threshold currents (off-leak currents) are also suppressed. When inverter circuits IV0–IV4 are in a standby state, the off-leak currents of the switching transistors SW3 and SW4 are suppressed, and thereby the gate tunnel currents in inverter circuits IV0–IV4 are suppressed because the gate tunnel currents of the inverters IV0–IV4 depend on the off-leak currents of switching transistors SW3 and SW4.

In the structure shown in FIGS. 1A and 2A, a control circuit which generates control clock signals φ and /φ is required to include a component having a adequately thick gate insulating film. This is for the following reasons. In switching transistors SW1–SW4, the gate tunnel current may flow, and the path through which the through current due to the gate tunnel current flows may be formed between the power supply node and the ground node. For preventing the through current due to the gate tunnel current in the clock control circuit, the MIS transistor having a thick gate insulating film has to be used in the clock control circuit, to suppress the through current due to the gate tunnel current.

In the structure where switching transistors SW3 and SW4 are used, the gate tunnel current is sufficiently suppressed owing to the thick gate insulating films thereof. Therefore, it is possible to reduce the thickness of the gate insulating film of the MIS transistor in the circuit for generating control clock signals φ and /φ.

According to the first embodiment of the present invention, as described above, a CMOS circuit having sufficiently thin gate insulating films are coupled to the power supply node and the ground node via the switching transistors which are off in the standby cycle. In the standby cycle, only the off-leak currents of switching transistors is a current source for the gate tunnel current in the CMOS circuit, and the gate tunnel current can be suppressed more significantly than the case where the CMOS circuit is directly connected to the power supply node and the ground node.

[Second Embodiment]

Figure 3A:
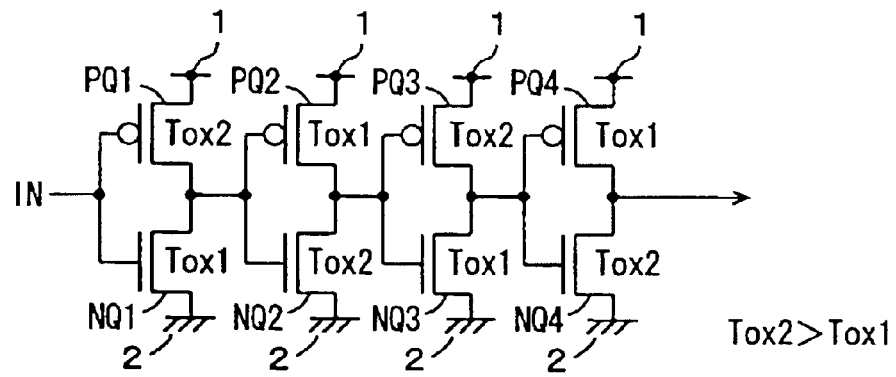
FIG. 3A shows a structure of a semiconductor device according to a second embodiment of the present invention.

FIG. 3A schematically shows a structure of a semiconductor device according to a second embodiment of the present invention. In FIG. 3, four CMOS inverter circuits are cascaded. These CMOS inverter circuits are directly coupled to power supply node 1 and ground node 2. More specifically, each of P-channel MIS transistors PQ1–PQ4 has a source coupled to power supply node 1, and each of N-channel MIS transistors NQ1–NQ4 has a source coupled to ground node 2.

Figure 3B:
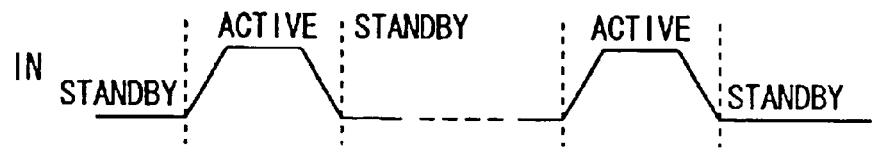
FIG. 3B is a signal waveform diagram representing an operation of the device shown in FIG. 3A.

Input signal IN is held at L-level in the standby state and is driven to H-level in the active cycle, as shown in FIG. 3B. In accordance with the logical level of input signal IN in the standby cycle, the thickness of the gate insulating film is set to the large value, the thickness Tox2 in each of MIS transistors PQ1, PQ3, NQ2 and NQ4, which are on in the standby state. In MIS transistors NQ1, PQ2, NQ3 and PQ4 which are off in the standby cycle, the thickness of each gate insulating film is set to the thickness, Tox1. In the case of a silicon oxide film, thickness Tox1 is equal to 3 nm (nanometers).

Figure 4:
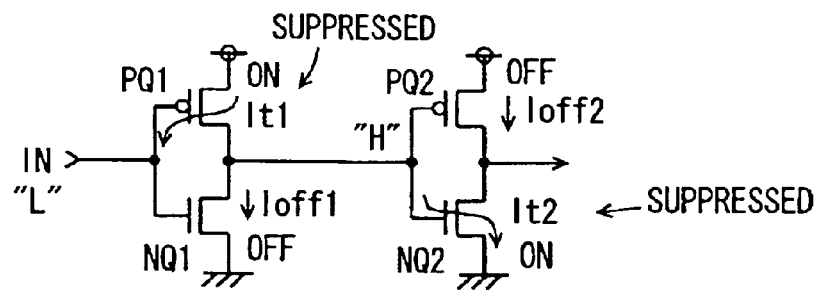
FIG. 4 shows a leak current path in the device shown in FIG. 3A.

In the structure shown in FIG. 3A, MIS transistors PQ1, NQ2, PQ3 and NQ4 which are on in the standby cycle are large in gate insulating film thickness, and are high in the gate tunnel barrier so that the gate tunnel current in the standby cycle can be sufficiently suppressed. In the structure shown in FIG. 3A, P-channel MIS transistor (transistor PQ1, for example) is on in accordance with input signal IN in the standby state, as shown in FIG. 4. However, the gate insulating film of the on-state P-channel MIS transistor is Tox2 in thickness so that gate tunnel current It1 can be sufficiently suppressed. In N-channel MIS transistor NQ1, off-leak current Ioff1 flows. MIS transistor NQ1 is off, and the gate tunnel current thereof is sufficiently small. In the standby cycle, MIS transistor NQ2 receives a signal at H-level on its gate, and is turned on. However, its gate insulating film has large thickness Tox2, and gate tunnel current It2 in MIS transistor NQ2 can be sufficiently suppressed. In this case, an off-leak current Ioff2 merely flows through MIS transistor PQ2.

By increasing the thickness of the gate insulating film of the MIS transistor, which is on in the standby cycle, it is possible to suppress sufficiently the gate tunnel current in the standby state. By taking appropriate measures against the off-leak current, the current consumption in the standby state can be sufficiently suppressed.

Upon transition to the active cycle, only MIS transistors NQ1, PQ2, NQ3 and PQ4 having thin gate insulating films turn from the off state to the on state, and this transition from the on state to the off state is performed fast owing to small thickness Tox1 of their gate insulating films and small absolute values of their threshold voltages. In accordance with the change of input signal IN, the state of the output signal can be rapidly driven to a definite state, and any problem such as increase in access time does not occur. In the standby state, the output signal of each CMOS inverter circuit is in the definite state, and such a situation can be prevented that the power supply node and the ground node of each CMOS circuit are electrically floated so that the output signal of each CMOS circuit is at an uncertain level, and the output signal enters the indefinite logical state upon transition to the active cycle.

[Third Embodiment]

Figure 5:
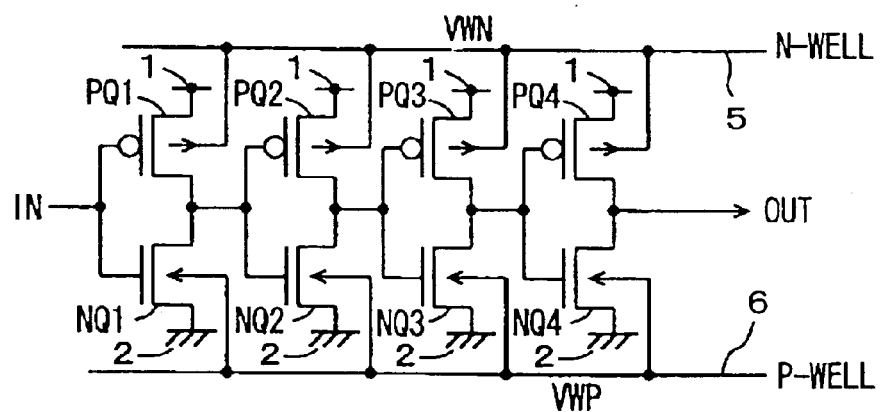
FIG. 5 shows a structure of a semiconductor device according to a third embodiment of the present invention.

FIG. 5 shows a structure of a semiconductor device according to a third embodiment of the present invention. In FIG. 5, four CMOS inverter circuits are arranged. Back gates of P-channel MIS transistors PQ1–PQ4 of these CMOS inverter circuits are commonly connected to an N-well 5, and sources thereof are commonly connected to power supply node 1. Each of N-channel MIS transistors NQ1–NQ4 has a source connected to ground node 2 and a back gate coupled to a P-well 6. A well voltage VWN on N-well 5 and a well voltage VWP on P-well 6 change with the operation cycle.

Figure 6:
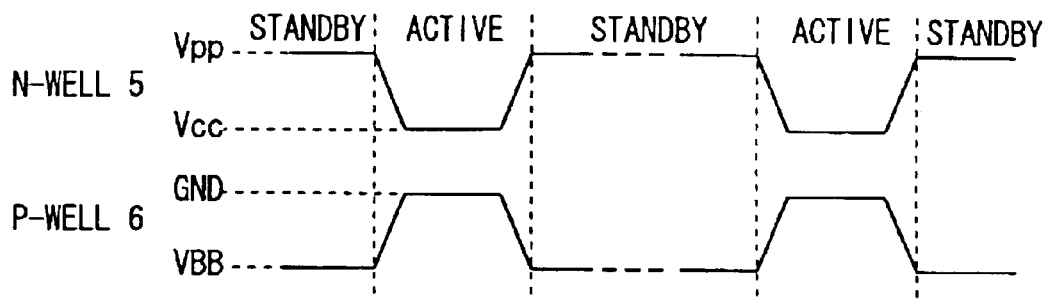
FIG. 6 is a signal waveform diagram representing an operation of the semiconductor device shown in FIG. 5.

FIG. 6 is a signal waveform diagram representing an operation of the semiconductor device shown in FIG. 5. In the standby state, as shown in FIG. 6, the voltage VWN applied to N-well 5 is set to a high voltage Vpp level, and the voltage VWP applied to P-well 6 is set to a negative voltage VBB level. In the active cycle, the voltage VWN applied to N-well 5 is at power supply voltage VCC level, and the voltage VWP applied to P-well 6 is at ground potential GND level.

Generally, when the back gate bias becomes deeper in an MIS transistor, the depletion layer in this substrate region expands, and the absolute value of the threshold voltage increases. When the depletion layer expands, the electric field applied to the gate insulating film becomes low because the capacitance value of the gate insulating film equivalently increases, and thereby the electric field applied to the gate insulating film becomes weak so that the gate tunnel current can be suppressed. The bias voltages of increased absolute values are applied to N- and P-wells 5 and 6 in the standby state, to increase the absolute values of the threshold voltages of MIS transistors PQ1–PQ4 and NQ1–NQ4, so that the sub-threshold leak currents (off-leak currents) of these transistors can be suppressed. Accordingly, both the suppression of the gate tunnel current and the suppression of the off-leak current can be achieved so that the current consumption in the standby state can be significantly reduced.

In the structure shown in FIG. 5, the CMOS inverter circuits are directly coupled to power supply node 1 and ground node 2, the logical levels of the respective output signal are in the fixed state, and output signal OUT can be changed fast in accordance with change in voltage level of input signal IN upon transition to the active cycle. In the standby state, the back gate biases (substrate biases) of MIS transistors PQ1–PQ4 and NQ1–NQ4 are deepened commonly, and the gate tunnel currents and the off-leak currents can be both reduced regardless of the logical level of the input signal IN in the standby state.

Figure 7:
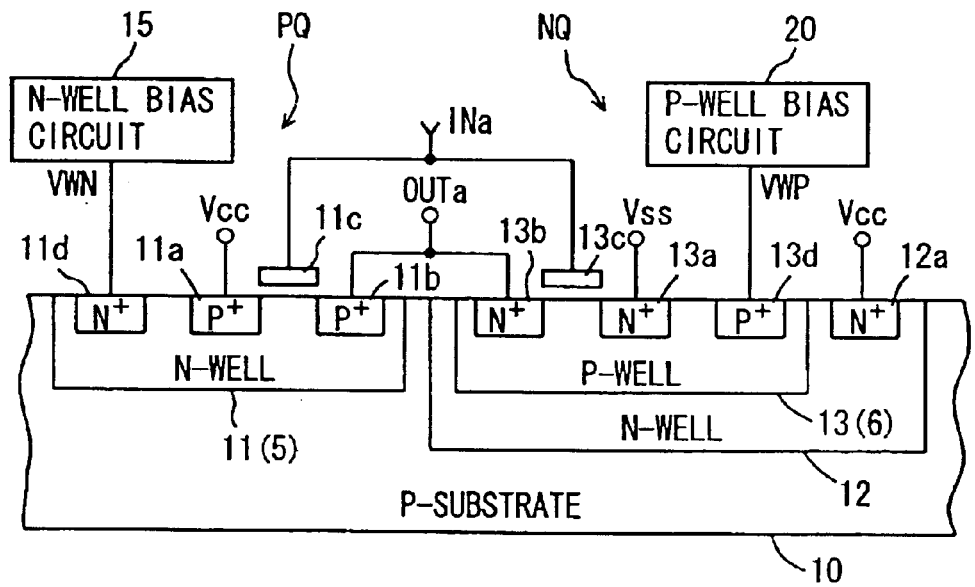
FIG. 7 schematically shows a cross sectional structure of the semiconductor device shown in FIG. 5.

FIG. 7 schematically shows a structure of the CMOS inverter circuit shown in FIG. 5. In FIG. 7, MIS transistors PQ and NQ of the CMOS inverter circuit are formed respectively in N-well 11 and N-well 12, which are spaced from each other and are formed at a surface of a P-type semiconductor substrate 10. N-well 12 receives power supply voltage Vcc via an N-type impurity region 12a. A P-well 13 is formed at the surface of N-well 12. P-well 13 serves as a substrate region of N-channel MIS transistor NQ.

P-type impurity regions 11a and 11b are formed at the surface of N-well 11 with a space laid therebetween, and a gate electrode 11c is formed between impurity regions 11a and 11b with a gate insulating film (not shown) underlaid. The gate insulating film under a gate electrode 11c has a thickness, which provides a tunnel barrier similar to or smaller than the gate tunnel barrier provided by a silicon oxide film of 3 nm in thickness. Unless otherwise specified in the following description, the thin gate insulating film of the MIS transistor has thickness Tox1, which provides a gate tunnel barrier similar to smaller than the gate tunnel barrier provided by the silicon oxide film of 3 nm in thickness.

Impurity regions 11a and 11b formed in N-well 11 as well as gate electrode 11c form P-channel MIS transistor PQ.

An N-type impurity region 11d is formed at the surface of N-well 11. Through N-type impurity region 11d, an N-well bias circuit 15 applies well bias voltage VWN to N-well 11.

N-type impurity regions 13a and 13b are formed at the surface of P-well 13 with a space laid therebetween. A gate electrode 13c is formed on the channel region between N-type impurity regions 13a and 13b with a thin gate insulating film underlaid. P-well 13, N-type impurity regions 13a and 13b, and gate electrode 13c form N-channel MIS transistor NQ. A P-type impurity region 13d is formed at the surface of P-well 13. P-type impurity region 13d receives well bias voltage VWP from P-well bias circuit 20, and applies the received well bias voltage VWP to P-well 13.

Impurity regions 11b and 13b are coupled to an output node generating an output signal OUTa, and impurity regions 11a and 13a are supplied with power supply voltage Vcc and ground voltage Vss (=GND). Gate electrodes 11c and 13c commonly receive an input signal INa.

The bias voltages of N- and P-wells 11 and 13 are switched depending on the standby cycle and the active cycle. In the standby cycle, N-well 11 is set to high voltage Vpp level, a PN junction between N-well 11 and impurity regions 11a and 11b attains a deep reverse bias state, and the depletion layer expands in N-well 11. Likewise, by applying negative voltage VBB to P-well 13 in the standby state, a PN junction between P-well 13 and N-type impurity regions 13a and 13b attains a deep reverse bias state, and the depletion layer expands in P-well 13.

Figure 8A:
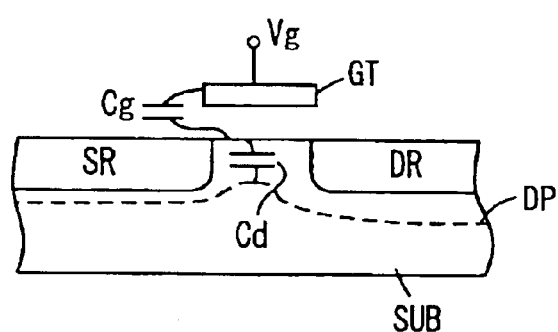
FIG. 8A schematically shows a cross sectional structure of an MIS transistor in the third embodiment of the present invention.
Figure 8B:
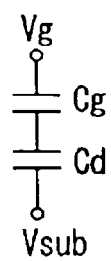
FIG. 8B shows a gate-substrate capacitance of the MIS transistor shown in FIG. 8A.

FIG. 8A schematically shows a distribution of a depletion layer DP in the MIS transistor. In FIG. 8A, depletion layer DP is formed at the vicinities of source region SR and drain region DR even if an inversion layer is formed in the channel region at the surface of substrate region (well) SUB. This depletion layer, which is a layer containing no carrier, functions in a similar manner as an insulating layer, and a depletion layer capacitance Cd is formed at the surface of substrate region SUB. Therefore, depletion layer capacitance Cd is connected in series to a gate insulating film capacitance Cg provided by a gate insulating film located between a gate electrode GT and substrate region SUB. Accordingly, gate insulating film capacitance Cg and depletion layer capacitance Cd are connected in series as shown in FIG. 8B, gate voltage Vg and substrate voltage Vsub are capacitance-divided by these capacitances Cg and Cd, the electric field applied to the gate insulating film is weakened, and consequently the gate tunnel barrier equivalently becomes high. Therefore, by providing a deep well bias in the standby state, the thickness of gate insulating film is equivalently increased, and the height of gate tunnel barrier is increased.

Although a gate tunnel current flows between gate electrode GT and drain region DR, their facing area is small, and this gate tunnel current is sufficiently smaller than the gate tunnel current flowing from/to the channel region. Thereby, the gate tunnel current can be reliably suppressed.

Figure 9:
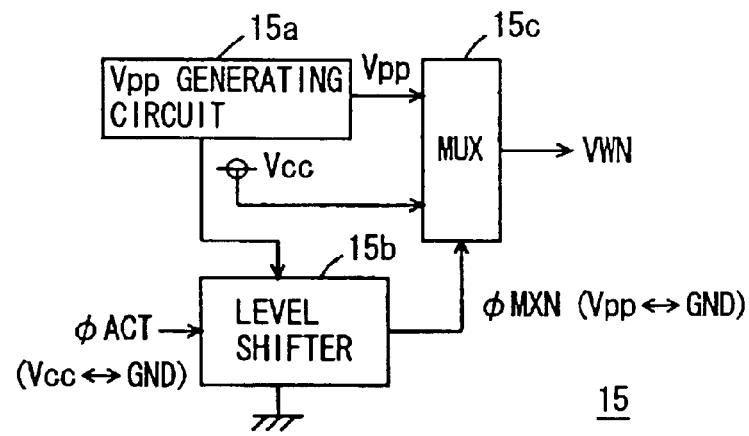
FIG. 9 schematically shows a structure of an N-well bias circuit shown in FIG. 7.

FIG. 9 schematically shows a structure of N-well bias circuit 15 shown in FIG. 7. In FIG. 9, N-well bias circuit 15 includes a Vpp generating circuit 15a for generating high voltage Vpp, a level shifter 15b for shifting a voltage level of an internal operation instructing signal φACT instructing the internal operation cycle, and a multiplexer (MUX) 15c for selecting one of high voltage Vpp generated by VPP generating circuit 15a and power supply voltage Vcc in accordance with a switching control signal φMXN received from level shifter 15b, to generate N-well bias voltage VWN. Internal operation instructing signal φACT changes between power supply voltage Vcc and ground voltage GND (=Vss). Level shifter 15b converts internal operation instructing signal φACT of an amplitude of power supply voltage Vcc into switching control signal φMXN of an amplitude of high voltage Vpp. Multiplexer 15c can reliably selects one of power supply voltage Vcc and high voltage Vpp to generate N-well bias voltage VWN in response to switching control signal φMXN.

Vpp generating circuit 15a for generating high voltage Vpp is formed of a general circuit that utilizes a charge pump operation of a capacitor. Level shifter 15b is formed of a circuit utilizing, e.g., an ordinary level converter circuit of a latch type. Multiplexer 15c is formed utilizing an ordinary transmission gate, for example.

A relationship in logical level between internal operation instructing signal φACT and switching control signal φMXN is appropriately determined in accordance with the logical levels, at which internal operation instructing signal φACT attains in the standby state and the active state, respectively.

Figure 10:
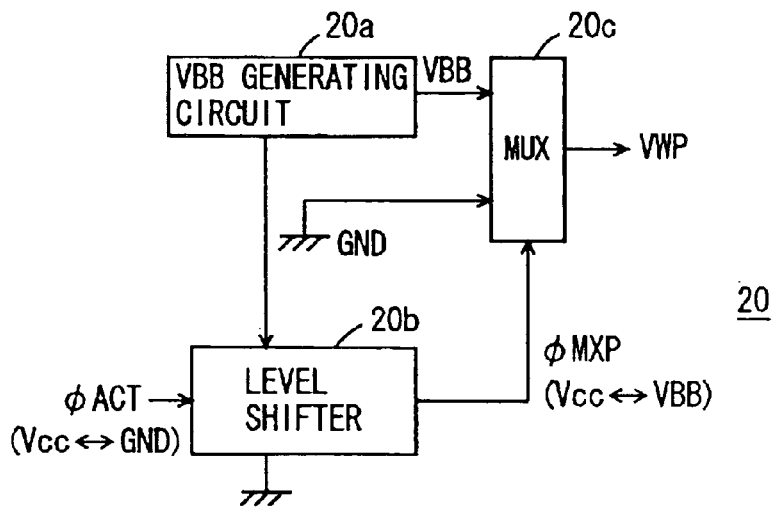
FIG. 10 schematically shows a structure of a P-well bias circuit shown in FIG. 7.

FIG. 10 schematically shows a structure of P-well bias circuit 20 shown in FIG. 7. In FIG. 10, P-well bias circuit 20 includes a VBB generating circuit 20a for generating negative voltage VBB, a level shifter 20b for shifting the level of internal operation instructing signal φACT, and a multiplexer (MUX) 20c for selecting one of ground voltage GND and negative voltage VBB in accordance with switching control signal φMXP received from level shifter 20b, to produce P-well bias voltage VWP.

Level shifter 20b converts internal operation instructing signal φACT changing between power supply voltage Vcc and ground voltage GND into switching control signal φMXP changing between power supply voltage Vcc and negative voltage VBB. The relationship in logical level between internal operation instructing signal φACT and switching control signal φMXN is appropriately determined in accordance with the logical level of internal operation instructing signal φACT in the standby state as well as the structure of multiplexer 20c. In the standby state, multiplexer 20c selects negative voltage VBB generated from VBB generating circuit 20a in accordance with switching control signal φMXP. In the active cycle, multiplexer 20c selects ground voltage GND in accordance with switching control signal φMXP.

VBB generating circuit 20a is formed of a charge pump circuit utilizing a charge pump operation of a capacitor. Level shifter 20b is formed of, e.g., a level converter circuit of a latch type.

In the structure shown in FIG. 5, both the voltages of P- and N-wells 6 and 5 vary in accordance with the operation cycle. However, the bias voltage of only one of P- and N-wells 6 and 5 may be switched in accordance with the operation cycle.

Only the MIS transistor, which is on in the standby state, may be adapted to be deepened in substrate bias.

[First Modification]

Figure 11:
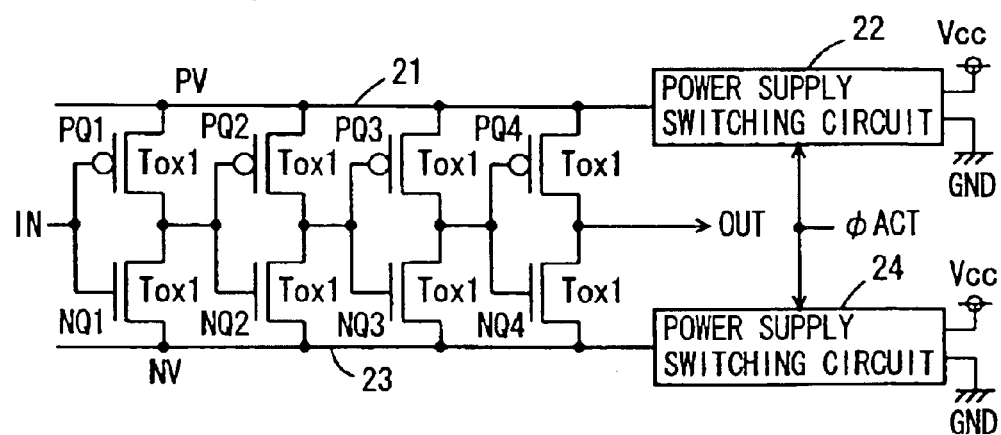
FIG. 11 schematically shows a structure of a modification of the third embodiment of the present invention.

FIG. 11 schematically shows a structure of a first modification of the third embodiment of the present invention. In FIG. 11, four CMOS inverter circuits are arranged. These CMOS inverter circuits includes respective P-channel MIS transistors PQ1–PQ4 and respective N-channel MIS transistors NQ1–NQ4. MIS transistors PQ1–PQ4 have sources connected to a power supply line 21. MIS transistors NQ1–NQ4 have sources connected to a ground line 23. Power supply line 21 and ground line 23 are coupled to power supply switching circuits 22 and 24, respectively. Power supply switching circuits 22 and 24 change the voltage levels of voltages PV and NV on power supply line 21 and ground line 23, respectively, in accordance with internal operation instructing signal φACT.

Figure 12:
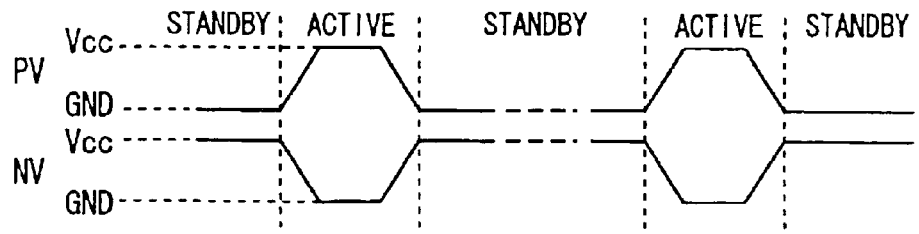
FIG. 12 is a signal waveform diagram representing an operation of the device shown in FIG. 11.

FIG. 12 is a signal waveform diagram representing an operation of the semiconductor device shown in FIG. 11. The operation of the semiconductor device shown in FIG. 11 will now be described, referring to FIG. 12.

In the standby state, power supply switching circuit 22 transmits ground voltage GND as the voltage PV onto power supply line 21, and power supply switching circuit 24 transmits power supply voltage Vcc as the voltage NV onto ground line 23. MIS transistors PQ1–PQ4 receive ground voltage GND on their respective sources, and are made off independently of the respective gate voltages. MIS transistors NQ1–NQ4 receive power supply voltage Vcc on the respective sources, and are made off independently of the voltage levels on the respective gates. Accordingly, a gate tunnel current hardly occurs in MIS transistors PQ1–PQ4 and NQ1–NQ4 regardless of the logical level of input signal IN.

When the active cycle starts, power supply switching circuit 22 transmits power supply voltage Vcc as the voltage PV onto power supply line 21, and power supply switching circuit 24 transmits ground voltage GND as the voltage NV onto ground line 23. In this state, MIS transistors PQ1–PQ4 and NQ1–NQ4 operate as the CMOS inverter circuits each receiving power supply voltage Vcc and ground voltage GND as the operation power supply voltages, and produces output signal OUT in accordance with input signal IN. All MS transistors PQ1–PQ4 and NQ1–NQ4 each have a gate insulating film of a small thickness Tox1, and can operate fast.

In the structure shown in FIG. 11, MIS transistors PQ1–PQ4 receive, as the source voltage, the ground voltage in the standby state. Thereby, the depletion layers in the substrate regions of MIS transistors PQ1–PQ4 expand to reduce the electric fields applied to their gate insulating films so that the gate tunnel currents can be suppressed. Accordingly, the gate tunnel current can be reliably suppressed in each of MIS transistors PQ1–PQ4 independently of the logical level of input signal IN in the standby state. As for MIS transistors NQ1–NQ4, when the source is at power supply voltage Vcc level, the source to substrate is in the deep reverse bias state, and the depletion layer expands. Therefore, the electric fields applied to the gate insulating films of MIS transistors NQ1–NQ4 can be mitigated, and the gate tunnel current can be suppressed.

In MIS transistors NQ1–NQ4 and PQ1–PQ4, a tunnel current may flow between the gate and drain. This tunnel current between the gate and drain can be suppressed by setting the voltages PV and NV on power supply line 21 and ground line 23 to be equal to ground voltage GND and power supply voltage Vcc, respectively, in the standby cycle. The absolute values of threshold voltages are also increased in MIS transistors PQ1–PQ4 and NQ1–NQ4, and the off-leak current is also reduced so that the current consumption in the standby state can be reduced.

Generally, the bias between the gate and source is merely required to be set to a reverse bias state deeper than the bias state in the normal operation. Thereby, it is possible to achieve a state equivalent to the state that the substrate bias is deepened in the normal operation, and the depletion layer can be expanded, and the absolute value of the threshold voltage can be also increased. Thereby, the gate tunnel current and the off-leak current both can be reduced.

Power supply switching circuits 22 and 24 are merely required to be able to transmit either power supply voltage Vcc or ground voltage GND to power supply line 21 and ground line 23, respectively, in accordance with internal operation instructing signal φACT.

[Second Modification]

Figure 13:
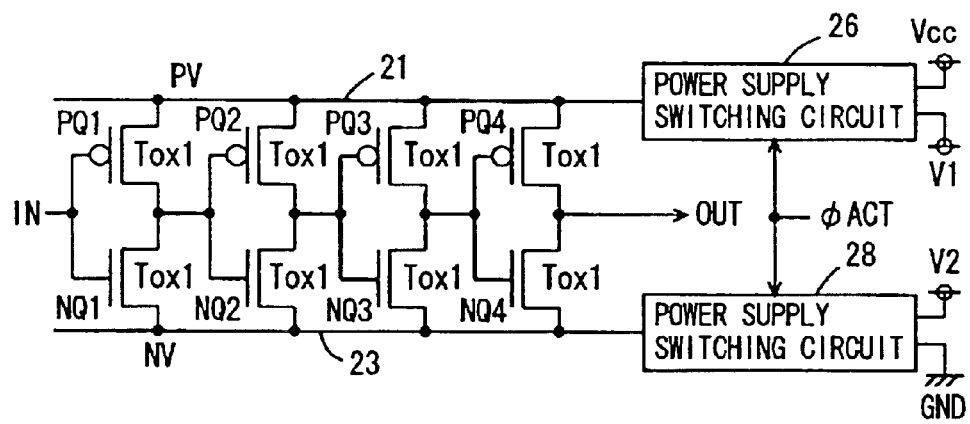
FIG. 13 shows a structure of a second modification of the third embodiment of the present invention.

FIG. 13 schematically shows a structure of a second modification of the third embodiment of the present invention. In the structure shown in FIG. 13, a power supply switching circuit 26 for switching the voltage level on power supply line 21 in response to internal operation instructing signal φACT is provided for power supply line 21. A power supply switching circuit 28 for switching the voltage level on ground line 23 in accordance with internal operation instructing signal φACT is provided for ground line 23.

Power supply switching circuit 26 transmits a voltage V1 lower than power supply voltage Vcc onto power supply line 21 in the standby cycle, and transmits power supply voltage Vcc onto power supply line 21 in the active cycle (active state). Power switching circuit 28 transmits a voltage V2 onto ground line 23 in the standby cycle (standby state), and transmits ground voltage GND onto ground line 23 in the active cycle. Structures other than the above are substantially the same as those shown in FIG. 11, and the corresponding portions are denoted by the same reference numerals.

In the structure shown in FIG. 13, the voltage V1 is lower than power supply voltage Vcc, and the voltage V2 is higher than ground voltage GND. These voltages V1 and V2 may be equal in level.

Figure 14:
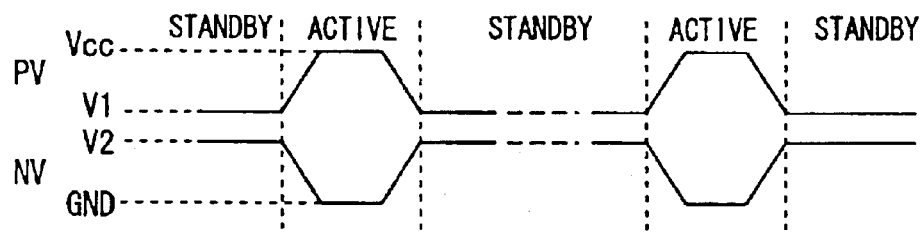
FIG. 14 is a signal waveform diagram representing an operation of the device shown in FIG. 13.
Figure 15:
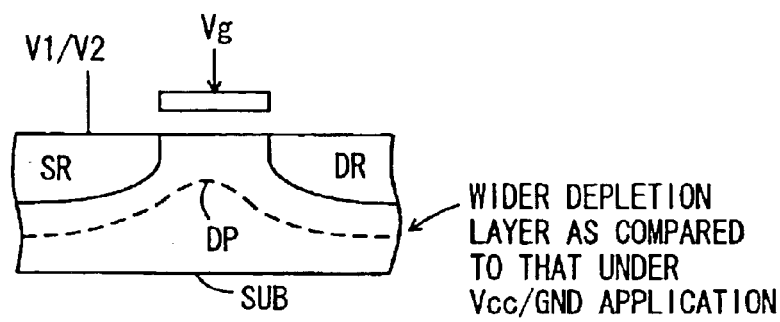
FIG. 15 schematically shows a cross sectional structure of an MIS transistor in the semiconductor device shown in FIG. 13.

In the structure of the semiconductor device shown in FIG. 13, the voltage PV on power supply line 21 is the voltage V1 lower than power supply voltage Vcc, and the voltage VN on ground line 23 is set to a voltage V2 higher than ground voltage GND in the standby state, as shown in a signal waveform diagram of FIG. 14. In the MIS transistor, an effect similar to the "substrate effect" appears when the source voltage changes to lower the gate-source voltage. Therefore, the depletion layer expands in the substrate region (well region) as shown in FIG. 15, and an effect similar to the foregoing effect achieved by changing the well potential can be achieved.

Accordingly, even when the voltages V1 and V2 are different in voltage level from ground voltage GND and power supply voltage Vcc, respectively, the gate tunnel current can be suppressed by employing the voltages V1 and V2, which can set the gate-source voltages of MIS transistors PQ1–PQ4 and NQ1–NQ4 to a deeper reverse bias state in the standby cycle than the bias state thereof achieved in the active cycle.

Accordingly, even if voltages V1 and V2 are equal to, e.g., negative and high voltages VBB and VPP, respectively, a similar effect can be achieved. Power switching circuits 26 and 28 may be formed of structures similar to those shown in FIGS. 9 and 10 already described, in which case appropriate level shifters depending on the polarities and voltage levels of the voltages V1 and V2 are employed, if necessary.

According to the third embodiment of the present invention, as described heretofore, the substrate PN junction is set to a deeper reverse bias state in the standby state than that in the active cycle. In the standby state, therefore, the depletion layer can be expanded in the well region (substrate region) so that the electric field applied to the gate insulating film can be mitigated, and the gate tunnel current can be suppressed. Further, the depletion layer capacitance can mitigate the electric field generated near the drain so that the gate-drain electric field can be relaxed, and the tunnel current between the gate and drain can be also suppressed.

Further, the depletion layer is expanded in the standby state of the MIS transistor, and the absolute value of the threshold voltage is equivalently increased so that the off-leak current can also be reduced.

By utilizing a so-called LDD (Lightly Doped Drain) structure, the drain electric field can be relaxed, and the tunnel current between the gate and drain can be suppressed.

In FIG. 15, the source voltage is switched between a voltage of V1/V2 and a voltage of Vcc/GND. When the voltages V1 and V2 are applied, depletion layer DP expands in substrate region SUB, because the reverse bias of the PN junction between source region SR and substrate region SUB becomes deep, and depletion layer DP expands in either of the voltages V1 and V2.

[Fourth Embodiment]

Figure 16:
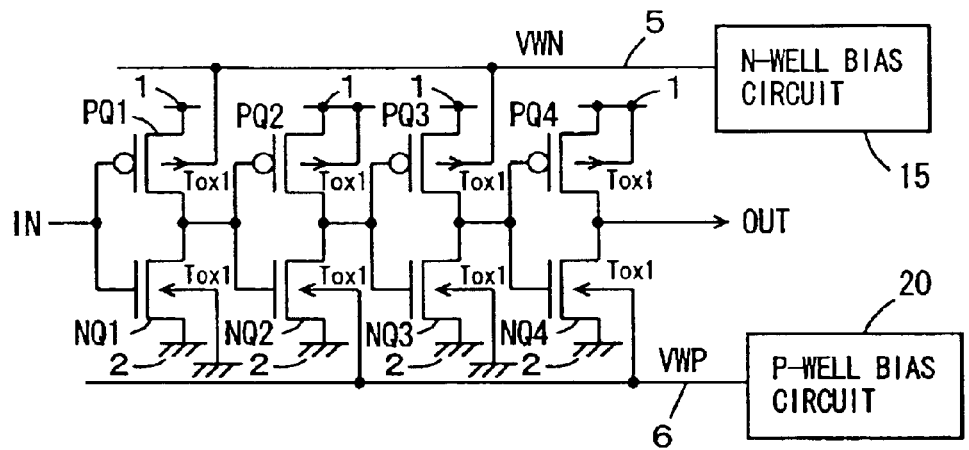
FIG. 16 schematically shows a structure of a semiconductor device according to a fourth embodiment of the present invention.

FIG. 16 schematically shows a structure of a semiconductor device according to a fourth embodiment of the present invention. For the structure shown in FIG. 16, an input signal IN is at a predetermined, L-level level in the standby cycle. In FIG. 16, four CMOS inverter circuits are arranged, similarly to the third embodiment. P-channel MIS transistors PQ1 and PQ3 which are on in the standby cycle have back gates (substrate regions) formed in N-well 5 receiving bias voltage VWN from N-well bias circuit 15. N-channel MIS transistors NQ2 and NQ4 which are on in the standby cycle have back gates formed in P-well 6 receiving bias voltage VWP from P-well bias circuit 20.

MIS transistors PQ2, PQ4, NQ1 and NQ3 which are off in the standby cycle have back gates connected to respective sources. More specifically, the back gates of MIS transistors PQ2 and PQ4 are connected to power supply node 1, and the sources of MIS transistors NQ1 and NQ3 are connected to ground node 2. N- and P-well bias circuits 15 and 20 have structures similar to those shown in FIGS. 9 and 10. MIS transistors PQ1–PQ4 and NQ1–NQ4 have gate insulating films which are sufficiently small in thickness (Tox1).

Figure 17:
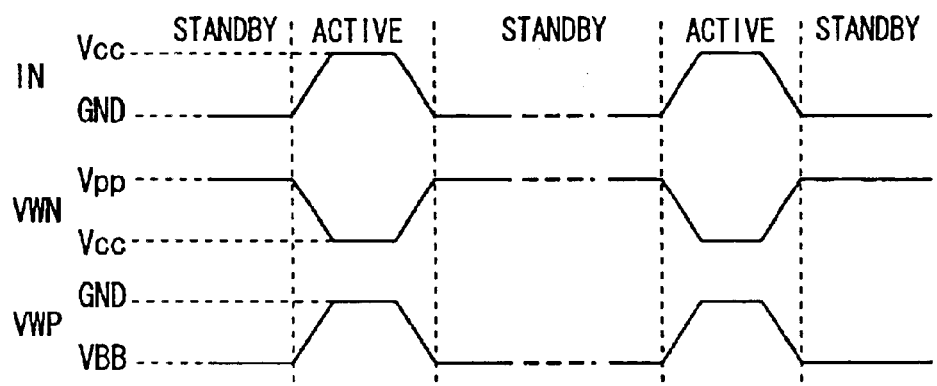
FIG. 17 is a signal waveform diagram representing an operation of the device shown in FIG. 16.

An operation of the semiconductor device shown in FIG. 16 will now be described with reference to a signal waveform diagram of FIG. 17.

In the standby cycle or standby state, input signal IN is at the ground voltage level, or at L-level, and well bias voltage VWN to N-well 5 is set to high voltage Vpp level. Well bias voltage VWP to P-well 6 is set to negative voltage VBB. Even when P-channel MIS transistors PQ1 and PQ3 receive the signals at L-level on their gates, well bias voltage VWN is at high voltage Vpp level, and the depletion layers in the channel regions of MIS transistors PQ1 and PQ3 expand into the substrate region (N-well region) so that the gate tunnel current is sufficiently suppressed. In N-channel MIS transistors NQ2 and NQ4, well bias voltage VWP of P-well 6 is at negative voltage VBB level, and the depletion layers expand in the channel regions of MIS transistors NQ2 and NQ4, respectively, so that the gate tunnel current does not occur.

In the active state, well bias voltage VWN on N-well 5 is set to power supply voltage Vcc level, and well bias voltage VWP of P-well 6 is set to ground voltage GND level. Therefore, MIS transistors PQ1–PQ4 receive the same back gate bias, and operate under the same operation condition. Also, MIS transistors NQ1–NQ4 receive the same back gate bias, and operate fast under the same operation condition in the active period. In the active state, therefore, output signal OUT can be produced fast in accordance with input signal IN.

In the structure shown in FIG. 16, each of N-well bias circuit 15 and P-well bias circuit 20 drives the well regions of MIS transistors, which are half in number as compared to the structure shown in FIG. 5. Accordingly, the area of the well regions to be driven is reduced to half so that the loads driven by N- and P-well bias circuits 15 and 20 are reduced, and thereby the current consumption is reduced.

[First Modification]

Figure 18:
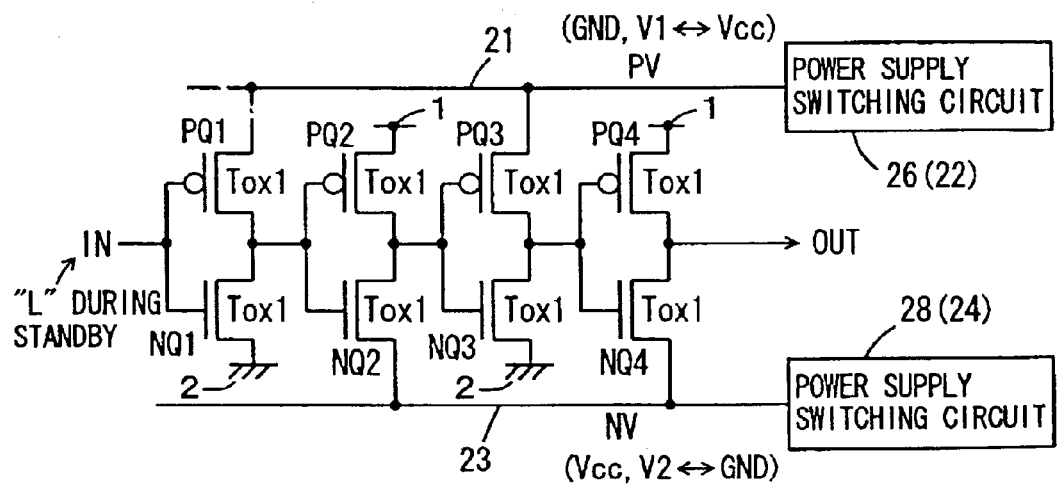
FIG. 18 schematically shows a modification of the fourth embodiment of the present invention.

FIG. 18 schematically shows a structure of a first modification of a fourth embodiment of the present invention. In FIG. 18, input signal IN is at L-level in the standby state. The sources of MIS transistors PQ1 and PQ3 kept on in the standby state are coupled to power supply line 21, and the sources of MIS transistors PQ2 and PQ4 made off in the standby cycle are coupled to power supply node 1.

Likewise, the sources of MIS transistors NQ2 and NQ4 kept on in the standby state are connected to ground line 23. The sources of MIS transistors NQ1 and NQ3 made off in the standby are connected to ground node 2. Power supply line 21 is supplied with a voltage PV from power supply switching circuit 26 (or 22), and ground line 23 is supplied with a voltage VN from power supply switching circuit 28 (or 24). Power supply switching circuit 26 applies the voltage V1 (or ground voltage GND) onto power supply line 21 in the standby cycle. Power supply switching circuit 28 applies the voltage V2 (or power supply voltage Vcc) onto ground line 23 in the standby cycle. In the active cycle, power supply switching circuit 26 (or 22) applies power supply voltage Vcc as the voltage PV, and power supply switching circuit 28 (or 24) applies ground voltage GND onto ground line 23 as the voltage NV. The structures of power supply switching circuits 26 (or 22) and 28 (or 24) are the same as those shown in FIGS. 13 and 11. MIS transistors PQ1–PQ4 and NQ1–NQ4 each have a gate insulating film of the thickness Tox1.

In the structure shown in FIG. 18, in the standby cycle, MIS transistors PQ1 and PQ3, which are on in this standby cycle, receive, on their gates, the voltage (ground voltage or voltage V1) lower than power supply voltage Vcc which is applied in the active cycle. Therefore, MIS transistors PQ1 and PQ3 are off (and the depletion layers expands) so that the gate tunnel current is suppressed. MIS transistors NQ2 and NQ4 are likewise supplied, on their gates, with the power supply voltage or the voltage V2, and are off (and the depletion layer expands). Therefore, the gate tunnel currents can be sufficiently suppressed in MIS transistors NQ2 and NQ4.

In the active cycle, power supply switching circuit 26 (or 22) supplies power supply voltage Vcc as the voltage PV onto power supply line 21, and power supply switching circuit 28 (or 24) transmits ground voltage GND as the voltage NV onto ground line 23. In this state, therefore, MIS transistors PQ1–PQ4 and NQ1–NQ4 operate under the same condition, and change output signal OUT at high speed in accordance with input signal IN.

In FIG. 18, input signal IN in the standby cycle is at a predetermined, logical level. In this case, the MIS transistor to be on has the source bias deepened, and is set into the off state, whereby the gate tunnel current can be sufficiently suppressed in the standby state.

[Fifth Embodiment]

Figure 19:
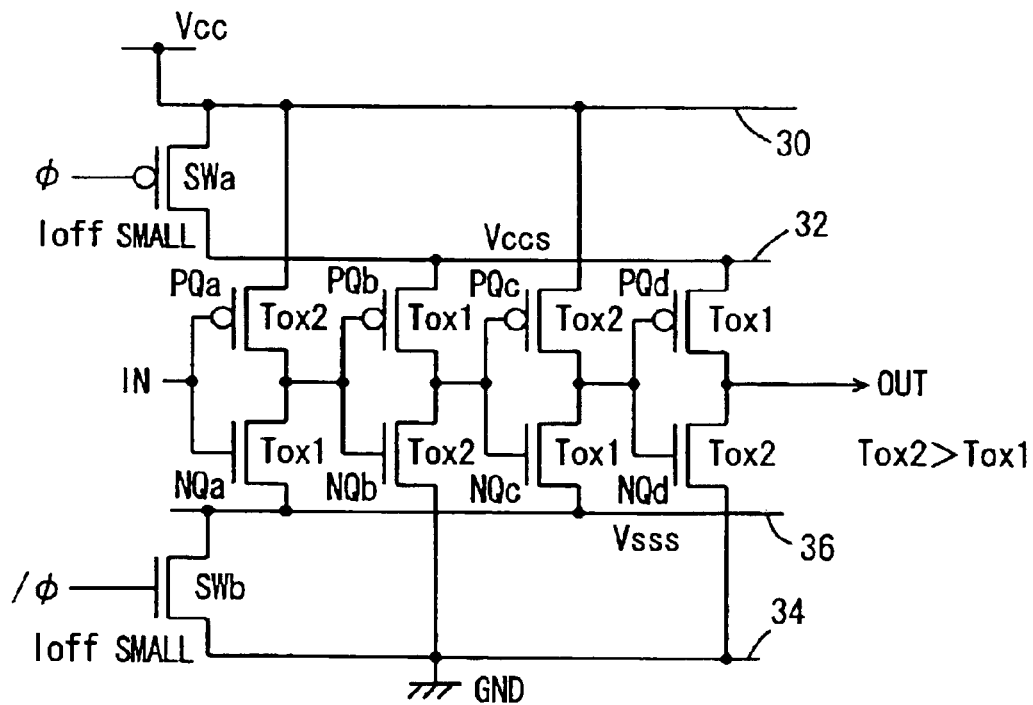
FIG. 19 shows a structure of a semiconductor device according to a fifth embodiment of the present invention.

FIG. 19 schematically shows a structure of a semiconductor device according to a fifth embodiment of the present invention. In FIG. 19, a main power supply line 30 receiving power supply voltage Vcc is connected to a sub-power supply line 32 via a switching transistor SWa. In response to control clock signal φ, switching transistor SWa is off in the standby cycle, and is on in the active cycle. A main ground line 34 receiving ground voltage GND (Vss) is arranged and connected to sub-ground line 36 via a switching transistor SWb. In response to control clock signal /φ, switching transistor SWb is off in the standby cycle, and is on in the active cycle, similarly to switching transistor SWa.

For the hierarchical power supply structure of the main/sub-power supply lines and main/sub-ground lines, CMOS inverter circuits forming a logical circuit are arranged. Input signal IN is fixed at logical L-level in the standby state. Input signal IN is received by CMOS inverter circuits of four stages, for example. These CMOS inverter circuits include P-channel MIS transistors Pqa–PQd and N-channel MIS transistors NQa–NQd. MIS transistors PQa and PQc, which are on in the standby state, each have a gate insulating film of a large thickness of Tox2, and have sources connected to main power supply line 30. MIS transistors PQb and PQd, which are off in the standby state, each have a gate insulating film of a small thickness of Tox1, and have sources commonly connected to sub-power supply line 32.

Likewise, MIS transistors NQb and NQd, which are on in the standby state, each have a gate insulating film of a thickness of Tox2, and have sources commonly connected to main ground line 34. MIS transistors NQa and NQc, which are off in the standby state, each have a gate insulating film of a thickness of Tox1, and have sources commonly connected to sub-ground line 36.

Figure 20:
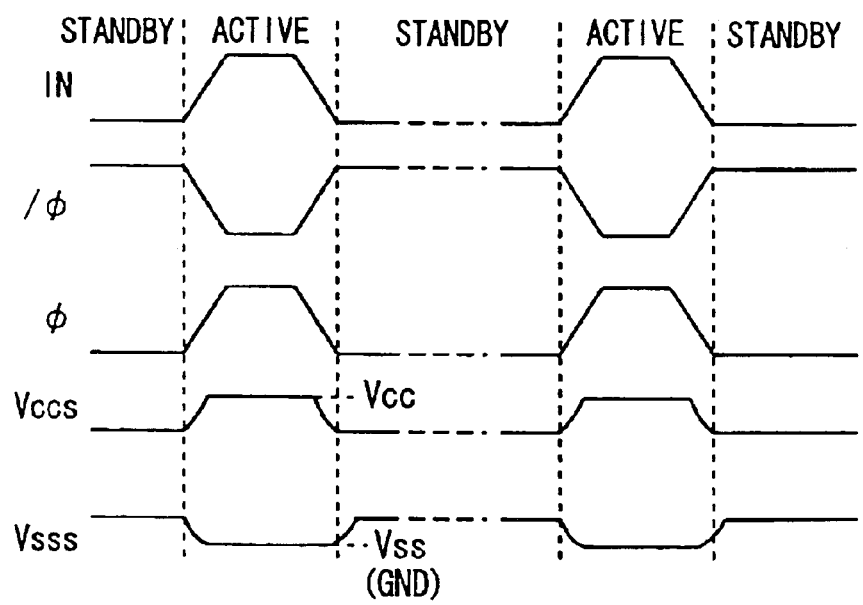
FIG. 20 is a signal waveform diagram representing an operation of the device shown in FIG. 19.

Thickness Tox2 is greater than thickness Tox1. Therefore, MIS transistors PQa and PQc have higher gate tunnel barriers than MIS transistors PQb and PQd, and MIS transistors NQb and NQd have higher gate tunnel barriers than MIS transistors NQa and NQc. An operation of the semiconductor device shown in FIG. 19 will now be described with reference to a signal waveform diagram of FIG. 20.

In the standby state (cycle), input signal IN is at L-level, control clock signal φ is at H-level (power supply voltage Vcc level), and control clock signal /φ is at ground voltage GND level or L-level. Accordingly, switching transistors SWa and SWb are off, main power supply line 30 is isolated from sub-power supply line 32, and sub-ground line 36 is isolated from main ground line 34. In this state, off-leak current Ioff flows from main power supply line 30 to sub-power supply line 32 via switching transistor SWa, and off-leak current Ioff flows from sub-ground line 36 to main ground line 34 via switching transistor SWb. In the CMOS inverter circuits, MIS transistors PQa, PQc, NQb and NQd are on. However, these MIS transistors PQa, PQc, NQb and NQd in the on state have the gate insulating films of Tox2 in thickness, so that the gate tunnel current is sufficiently suppressed. Although MIS transistors PQb, PQd, NQa and NQc in the off state have the gate insulating films of Tox1 in thickness, these transistors are in the off (accumulated) state, and the gate tunnel currents hardly flow.

In these MIS transistors PQb, PQd, NQa and NQc, the off-leak currents flow between the drains and the sources, respectively. However, these off-leak currents are suppressed by the switching transistors SWa and SWb, and a power supply voltage Vccs on sub-power supply line 32 is slightly lower than power supply voltage Vcc because of the off-leak current and the slight gate tunnel current. Meanwhile, the voltage Vsss on sub-ground line 36 is higher than voltage GND owing to the off-leak current and the gate tunnel current. These voltages Vccs and Vsss are stabilized at the voltage levels, at which a balance is established between the off-leak current flow and the gate tunnel current flow that are caused through switching transistors SWa and SWb as well as MIS transistors PQa–PQd and NQa–NQd.

Accordingly, the voltage Vccs on sub-power supply line 32 is lower than power supply voltage Vcc, and the voltage Vsss on sub-power supply line 36 is higher than ground voltage GND. Thereby, MIS transistors PQb, PQd, NQa and NQc which are off in the standby state have their gate-source voltages in the reverse bias state, and the off-leak currents between the sources and drains can be sufficiently suppressed. Accordingly, both the gate tunnel current and the off-leak current between the source and the drain can be reliably suppressed, and the current consumption in the standby state can be sufficiently reduced.

In the structure of semiconductor device shown in FIG. 19, MIS transistors PQa, PQc, NQb and NQd, which are on in the standby state (cycle) and have thick gate insulating films, have sources connected to main power supply line 30 and main ground line 34. The output voltage levels of the respective CMOS inverter circuits are fixed to power supply voltage Vcc level or ground voltage GND level, and the uncertain state of the output signals does not occur. In transition from the standby state to the active state, the MIS transistors having the thin gate insulating films can rapidly drive the output signal OUT to the definite state in accordance with the change in input signal IN without causing a logically unstable state.

In this transition to the active cycle, switching transistors SWa and SWb are on, and their large current driving capabilities are utilized to supply the current from main power supply line 30 to sub-power supply line 32 so that the voltage Vccs can be returned fast to power supply voltage Vcc level, while coupling main ground line 34 to sub-ground line 36 to return the voltage Vsss rapidly to, ground voltage GND level. Thereby, fast operation can be performed in the active cycle to drive output signal OUT to the definite state in accordance with the change in input signal IN.

Switching transistors SWa and SWb are increased in absolute value of threshold voltages as well as in the gate tunnel barrier height, in order that the off-leak currents and the gate tunnel currents can be reduced as much as possible in the off state. However, the current driving capability in the on state is sufficiently increased for fast driving of the CMOS inverter circuits.

Figure 21A:
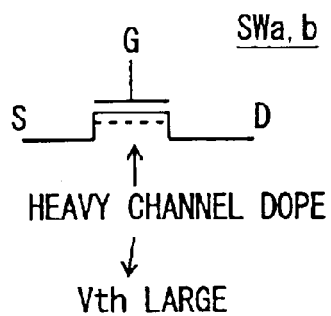
FIGS. 21A–21C show structures of MIS transistors having great gate tunnel barriers, respectively.
Figure 21B:
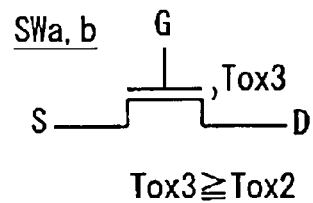
Figure 21C:
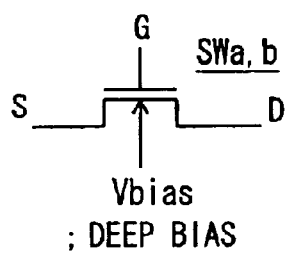

FIGS. 21A–21C show, by way of example, the structures of switching transistors SWa and SWb. In FIG. 21A, the channel impurity doping is performed to a high impurity concentration, and the impurity concentration of the channel region between a source region S and a drain region D. is increased so as to increase absolute value Vth of the threshold voltage In the structure of switching transistor SW (SWa, SWb) shown in FIG. 21B, the insulating film under a gate G has a large thickness Tox3. Gate insulating film thickness Tox3 is greater than thickness Tox2. Thereby, switching transistors SWa and SWb each can have the threshold voltage of a large absolute value and an increased gate tunnel barrier height.

As shown in FIG. 21C, a bias voltage Vbias applied to a substrate region (well region) is deeper than those of other MIS transistors. Also, the threshold voltage is increased in absolute value, and gate tunnel barrier is increased in height. Any one of these structures shown in FIGS. 21A–21C may be used. It is merely required that switching transistors SWa and SWb have the threshold voltages of an increased absolute value Vth, to suppress the off-leak current and the gate tunnel current therethrough.

Upon transition from the standby cycle to the active cycle, the MIS transistor having the thin gate insulating film rapidly transits from the off state to the on state, and thereby changes the output signal of an associated CMOS inverter circuit. Therefore, problems such as increase in access time in a dynamic type semiconductor memory device (e.g., DRAM) do not occur.

According to a fifth embodiment of the present invention, as described above, a hierarchical power supply structure is utilized, and the MIS transistor which is on in the standby state has a gate insulating films of a large thickness, and has a source thereof connected to the main power supply line or the main ground line. The MIS transistor which is off in the standby state (standby cycle) has a gate insulating film of a small thickness, and has a source thereof connected to the sub-power supply line or the sub-ground line. Thus, the off-leak current and the gate tunnel current in the standby state can be sufficiently suppressed, and the current consumption in the standby state can be reduced.

Upon transition to the active cycle, the MIS transistor having the gate insulating films of a small thickness transits from the off state to the on state, and the output signal voltage level of an associated circuit is in the fixed state in the standby state. Therefore, the output signal can be rapidly driven to the definite state without passing through the logically uncertain state, and the output signal can be rapidly changed in accordance with the input signal, so that the fast operation feature in the active cycle can be sufficiently ensured.

[Sixth Embodiment]

Figure 22:
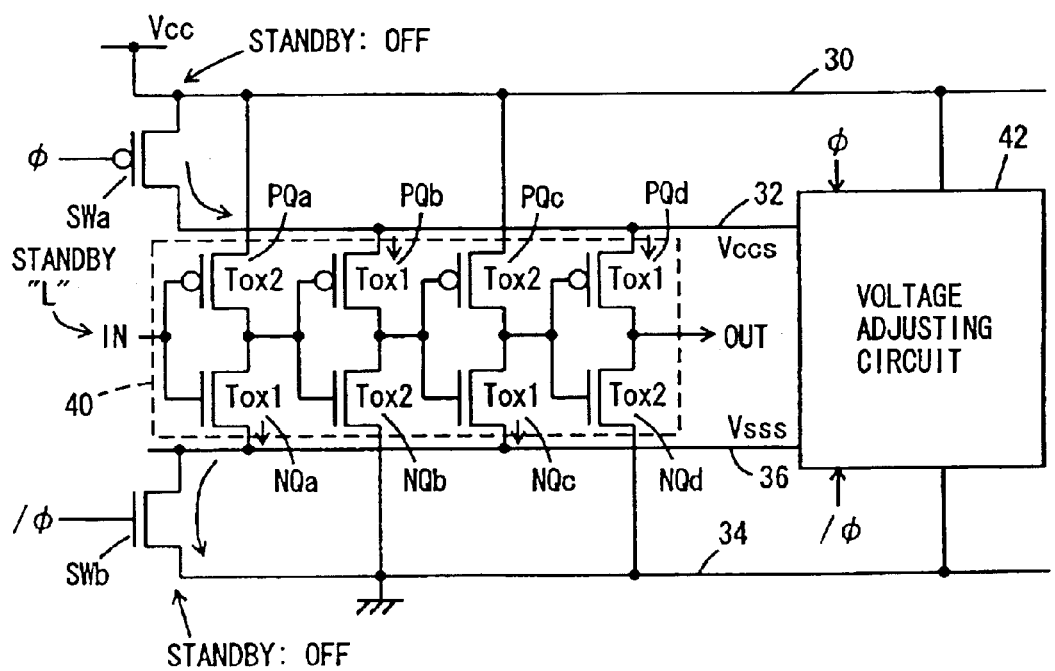
FIG. 22 shows a structure of a semiconductor device according to a sixth embodiment of the present invention.

FIG. 22 schematically shows a structure of a semiconductor device according to a sixth embodiment of the present invention. The semiconductor device shown in FIG. 22 likewise utilizes a hierarchical power supply structure, and is provided with main power supply line 30, sub-power supply line 32, sub-ground line 36 and main ground line 34. Using the voltages on these hierarchical power supplies as the operation power supply voltages, a logic circuit 40 effects predetermined processing on input signal IN to produce output signal OUT.

Input signal IN is at L-level in the standby state. In logic circuit 40, therefore, MIS transistors PQa and PQc which are on in the standby state have the gate insulating films of a large thickness (Tox2), and have the sources connected to main power supply line 30, similarly to the structure shown in FIG. 19.

MIS transistors NQb and NQd are thick in gate insulating film, and have the sources connected to main ground line 34. MIS transistors PQb and PQd as well as NQa and NQc, which enter the off state and may cause off-leak currents during the standby period, have gate insulating films of small thickness Tox1 corresponding to the thickness of 3 nm of the silicon oxide film, in order to ensure the fast operation feature of these transistors. MIS transistors PQb and PQd have the sources connected to sub-power supply line 32, and MIS transistors NQa and NQc have the sources connected to sub-ground line 36.

Sub-power supply line 32 is connected to main power supply line 30 via switching transistor SWa, and sub-ground line 36 is connected to main ground line 34 via switching transistor SWb. These structures are the same as those shown in FIG. 19. The semiconductor device shown in FIG. 22 is further provided with a voltage adjusting circuit 42. Voltage adjusting circuit 42 includes replica circuits of logic circuit 40 and switching transistors SWa and SWb, and drives the voltage levels of sub-power supply line 32 and sub-ground line 36 to predetermined levels in accordance with control dock signals $\phi$ and $/\phi$ in a standby state.

Voltage adjusting circuit 42, of which structure will be described later, produces the voltages corresponding to the voltages in the equilibrium state of sub-power supply line 32 and sub-ground line 36 in the standby state, and rapidly drives the voltage levels of sub-power supply line 32 and sub-ground line 36 to the stable state upon transition to the standby state. Upon transition to the active cycle, therefore, the voltage levels of sub-power supply line 32 and sub-ground line 36 is prevented from entering an unstable state, which may be caused due to an insufficient period of an active cycle. Thus, the internal operation can be quickly started after start of the active cycle.

Figure 23:
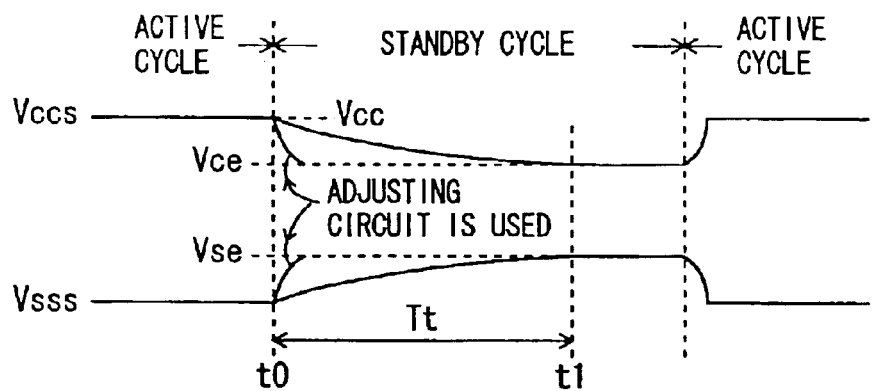
FIG. 23 is a signal waveform diagram representing an operation of the device shown in FIG. 22.

As shown in FIG. 23, in the active cycle, both switching transistors SWa and SWb are on so that the voltage Vccs on sub-power supply line 32 is at the level of power supply voltage Vcc, and the voltage Vsss on sub-ground line 36 is at the level of ground voltage Vss.

In FIG. 23, upon entry into the standby cycle at time t0, both switching transistors SWa and SWb are turned off, and off-leak currents flow through switching transistors SWa and SWb. In logic circuit 40, the current on sub-power supply line 32 is consumed due to the off-leak currents (and tunnel leak currents) of MIS transistors PQb and PQd. Therefore, voltage Vccs on sub-power supply line 32 slowly changes to the voltage level, which keeps balance between the leak current (off-leak current and gate tunnel current) supplied by switching transistor SWa and the leak currents flowing through these MIS transistors PQb and PQd. On sub-ground line 36, voltage Vsss likewise attains the voltage level, at which the leak currents flowing through MIS transistors NQa and NQc is balanced with the leak current flowing through switching transistor SWb. Transition of voltages Vccs and Vsss to equilibrium voltages Vce and Vse require a long time because the transition is caused by the leak currents, and voltages Vccs and Vsss attain equilibrium voltages Vce and Vse at time t1, respectively.

In transition from the standby cycle to the active cycle, switching transistors SWa and SWb having relatively large current drive capabilities recover the voltages on sub-power supply line 32 and sub-ground line 36 to power supply voltage Vcc and ground voltage Vss, respectively. However, when the active cycle starts again before time t1 after entering the standby cycle, the voltage Vccs and Vsss on sub-power supply line 32 and sub-ground line 36 in transition to the active cycle are at the voltage levels in the transient state, and the starting voltage levels thereof upon transition to the active cycle are different. Therefore, the times required for recovery of the voltage levels of the sub-power supply line and the sub-ground line differ depending on the voltage levels of voltages Vccs and Vsss. Accordingly, the time periods required for stabilization of the voltages Vccs and Vsss on sub-power supply line 32 and sub-ground line 36 after transition to the active cycle varies to vary the operation speeds of transistors of the logic circuit so that a malfunction may occur due to shift of internal operation timing.

In view of the above, voltage adjusting circuit 42 always produces equilibrium voltages Vce and Vse as shown in FIG. 22, and forcibly drives the voltages on sub-power supply line 32 and sub-ground line 36 to equilibrium voltages Vce and Vse within a short time after transition to the standby cycle. This reduces a time Tt, which is required for setting voltages Vccs and Vsss to the equilibrium state after transition to the standby cycle, and the voltages Vccs and Vsss is set to the equal starting voltage levels at the time of transition to the active cycle. Thereby, a variation in recovery time of the power supply voltage upon transition to the active cycle can be eliminated so that accurate and stable internal circuit operations can be ensured.

Figure 24:
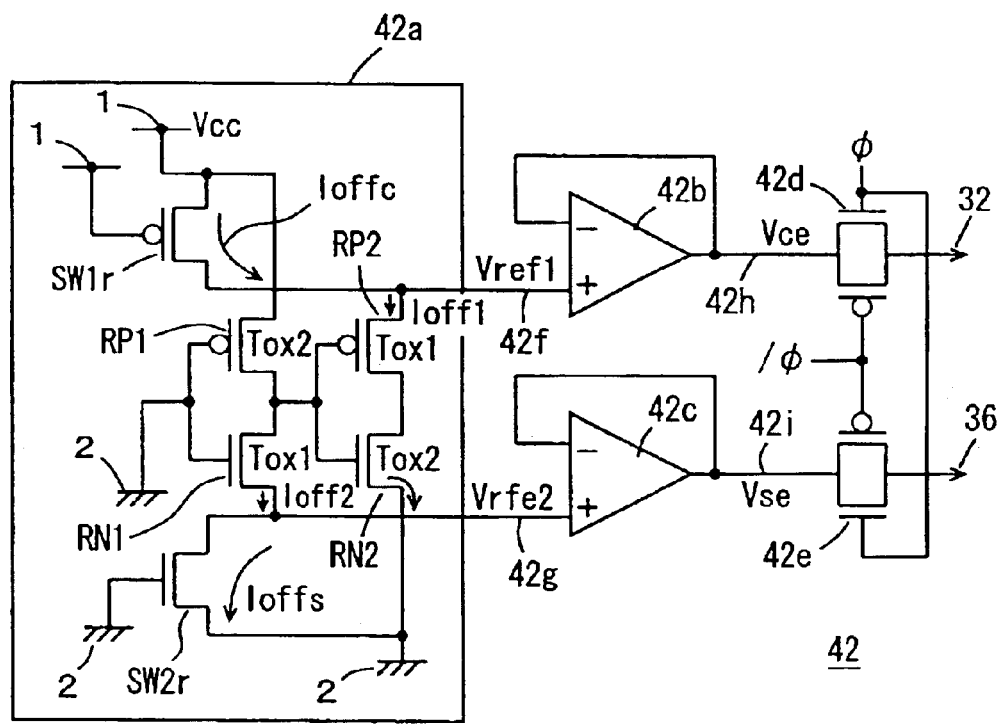
FIG. 24 shows a structure of a voltage adjusting circuit shown in FIG. 22.

FIG. 24 shows a structure of voltage adjusting circuit 42 shown in FIG. 22. In FIG. 24, voltage adjusting circuit 42 includes a replica circuit 42a producing equilibrium voltages Vce and Vse, a differential amplifier 42b for differentially amplifying a reference voltage Vref1 corresponding to equilibrium voltage Vce and supplied from replica circuit 42a and a voltage or a node 42h, a differential amplifier 42c for differentially amplifying a reference voltage Vref2 corresponding to equilibrium voltage Vse and supplied from replica circuit 42a and a voltage on a node 42i, a transmission gate 42d made conductive in the standby cycle in response to control clock signals $\phi$ and $/\phi$, to transmit the voltage on node 42h onto sub-power supply line 32, and a transmission gate 42e made conductive in a same phase as transmission gate 42d in response to control clock signals $\phi$ and $/\phi$, to transmit the voltage on node 42i onto sub-ground line 36.

Differential amplifier 42b differentially amplifies reference voltage Vref1 on output node 42f of replica circuit 42a and the voltage on node 42h, and transmits the result of differential amplification to node 42h. Accordingly, equilibrium voltage Vce at the same voltage level as reference voltage Vref1 is produced on node 42h.

Likewise, differential amplifier 42c differentially amplifies reference voltage Vref2 on output node 42g of replica circuit 42a and the voltage on node 42i, and transmits the result of differential amplification to node 42$i$. Accordingly, the voltage on node 42$i$ attains the same voltage level as reference voltage Vref2, and equilibrium voltage Vse is produced on node 42$i$.

Replica circuit 42$a$ includes: a P-channel MIS transistor SW1$r$ which is connected between power supply node 1 and node 42$f$, and has a gate connected to power supply node 1; an N-channel MIS transistor SW2$r$ which is connected between a node 42$g$ and ground node 2, and has a gate connected to ground node 2; P- and N-channel MIS transistors RP1 and RN1 which are connected in series between power supply node 1 and node 42$g$ and each have a gate connected to ground node 2; and P- and N-channel MIS transistors RP2 and RN2 which are connected in series between node 42$f$ and ground node 2, and have gates connected to drains of MIS transistors RP1 and RN1, respectively. MIS transistors RP1 and RN2 each have a gate insulating film of the large thickness of Tox2. MIS transistors RN1 and RP2 each have a gate insulating film of the thickness of Tox1.

Replica circuit 42$a$ is a replica of logic circuit 40 and switching transistors SWa and SWb shown in FIG. 22. More specifically, MIS transistor RP1 represents MIS transistors PQa and PQc shown in FIG. 22, and MIS transistor RP2 represents MIS transistors PQb and PQd connected to sub-power supply line 32 shown in FIG. 22. MIS transistor RN1 represents MIS transistors NQa and NQc shown in FIG. 22, and MIS transistor RN2 represents MIS transistors NQb and NQd shown in FIG. 22. MIS transistors SW1$r$ and SW2$r$ represent switching transistors SWa and SWb shown in FIG. 22, respectively.

In replica circuit 42$a$ and logic circuit 40 shown in FIG. 22, MIS transistors SW1$r$ and RP2 have a size (ratio of gate width to gate length) ratio determined to be equal to a ratio between the size of switching transistor SWa and the total size of MIS transistors PQb and PQd. The total size of MIS transistors PQb and PQd corresponds to a total value of their current drive capabilities, and represents a sum of the channel width to the channel length ratios. Likewise, the size ratio (the channel width to channel length ratio) of MIS transistor SW2$r$ to MIS transistor RN1 is set to be equal to the ratio of the size of switching transistor SWb to the total size (i.e., total current drive power and, in other words, the sum of the channel width to channel length ratios) of MIS transistors NQa and NQc. MIS transistors RP1 and RP2 correspond to the structures formed by reducing the total size of MIS transistors PQa and PQc with the ratio of replica circuit 42$a$, respectively. MIS transistor RN2 corresponds to the structure formed by scaling down the total size of MIS transistors NQb and NQd shown in FIG. 22.

In replica circuit 42$a$, sizes of respective components are determined so as to simulate the flow of current on sub-power supply line 32 and sub-ground line 36 in the standby state. Based on the sizes thus determined, the components are reduced at a certain proportional reduction ratio, or a scaling rate. In the standby cycle, input signal IN (see FIG. 22) is at L-level, and therefore, replica circuit 24$a$ in FIG. 24 simulates the standby current flowing through logic circuit 40 as well as the voltages on sub-power supply line 32 and sub-ground line 36 in the standby cycle.

In replica circuit 42$a$, voltage Vref1 on node 42$f$ is determined by a sum of an off-leak current Ioffc supplied from MIS transistor SW1$r$ and a gate tunnel current flowing between the gate and drain of MIS transistor SW1$r$ as well as off-leak current Ioff1 flowing through MIS transistor RP2 and a gate tunnel current. The gate tunnel current between the gate and drain of MIS transistor SW1$r$ is much smaller than off-leak current Ioffc because MIS transistor SW1$r$ is off. Therefore, voltage Vref1 on node 42$f$ is approximately at the voltage level, at which off-leak current Ioffc of MIS transistor SW1$r$ is balanced with off-leak current Ioff1 of MIS transistor RP2. More specifically, the voltage level of reference voltage Vref1 is equal to such a voltage level of voltage Vccs that a sum of the off-leak currents flowing through MIS transistors PQb and PQd of logic circuit 40 in FIG. 22 is balanced with the off-leak current flowing through switching transistor SWa.

Likewise, reference voltage Vref2 is kept at such a voltage level that off-leak currents Ioff2 and Ioffs of MIS transistors RN1 and SW2$r$ are balanced with each other with the gate tunnel current of MIS transistor SW2$r$ ignored. Off-leak currents Ioff2 and Ioffs are equivalent to the off-leak currents flowing through MIS transistors NQa and NQc shown in FIG. 22 and the off-leak current flowing through switching transistor SWb, respectively. Therefore, reference voltage Vref2 is at the voltage level where the voltage Vsss on sub-ground line 36 is kept in an equilibrium state in the standby cycle.

Differential amplifiers 42$b$ and 42$c$ receive reference voltages Vref1 and Vref2, and produce equilibrium voltages Vce and Vse, which are equal to reference voltages Vref1 and Vref2, respectively, on internal nodes 42$h$ and 42$i$. In the standby cycle, transmission gates 42$d$ and 42$e$ are on, and therefore sub-power supply line 32 and sub-ground line 36 are driven by differential amplifiers 42$b$ and 42$c$, respectively, so that the voltages on sub-power supply line 32 and sub-ground line 36 are rapidly driven to the voltage levels of equilibrium voltages Vce and Vse, respectively.

At the time of transition from the active cycle to the standby cycle, therefore, voltage adjusting circuit 42 can rapidly drive sub-power supply line 32 and sub-ground line 36 to the voltage levels of equilibrium voltages Vce and Vse as shown in FIG. 23, respectively. At the time of transition from the standby cycle to the active cycle, therefore, it is possible to prevent the voltage levels of sub-power supply line 32 and sub-ground line 36 from changing from the transient state, and the internal circuits can operate accurately at a fast timing after transition to the active cycle.

Voltage adjusting circuit 42 is formed through the same manufacturing processes as switching transistors SWa and SWb as well as logic circuit 40. Therefore, the voltage adjusting circuit 42 can also monitor the variation and the temperature-dependent deviation in power supply voltage Vcc with respect to the actual circuitry. Regardless of the variations in operation environment, equilibrium voltages Vce and Vse can be stably and accurately produced to be transmitted onto sub-power supply line 32 and sub-ground line 36, respectively.

By utilizing replica circuit 42$a$, it is also possible to replicate reliably the influences by the gate tunnel current (current between the gate and drain) flowing through the MIS transistor in the off state as well as the gate tunnel current flowing through the MIS transistor in the on state. Therefore, reference voltages Vref1 and Vref2 can be produced while accurately monitoring the influences by the leak currents due to the gate tunnel currents and the off-leak currents.

[First Modification]

Figure 25A:
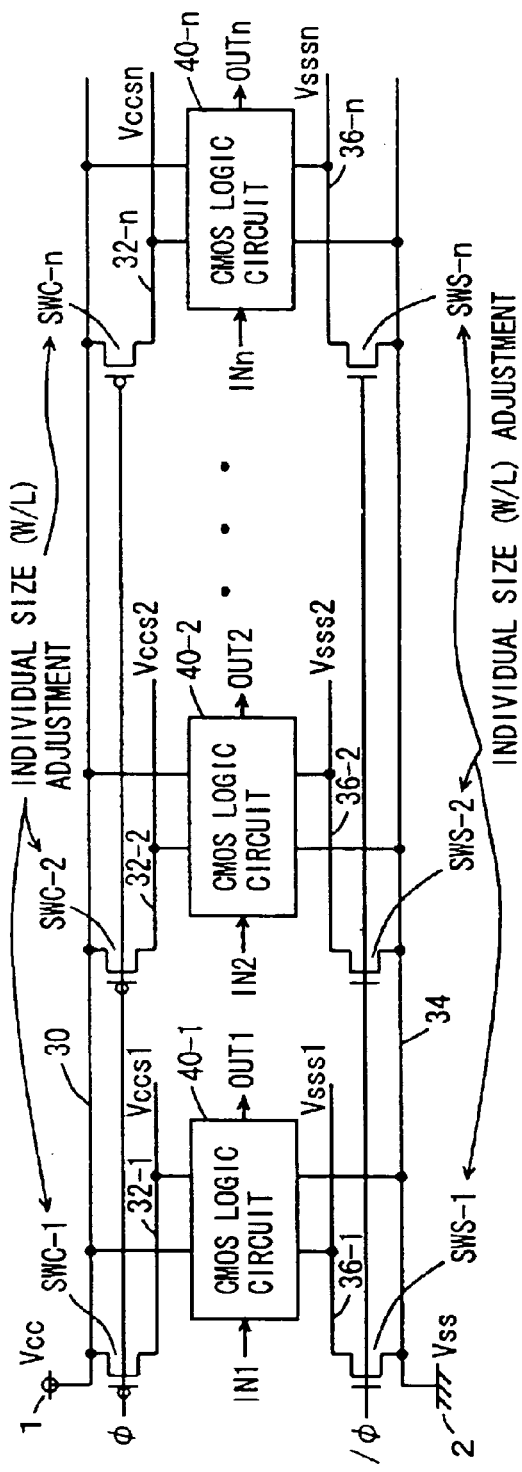
FIG. 25A shows a structure of a first modification of the sixth embodiment of the present invention.

FIG. 25A schematically shows a structure of a first modification of the sixth embodiment of the present invention. In FIG. 25A, a plurality of sub-power supply lines 32-1 to 32-$n$ are provided for main power supply line 30. These sub-power supply lines 32-1 to 32-$n$ are coupled to main power supply line 30 via switching transistors SWC-1 to SWC-$n$ formed of P-channel MIS transistors, respectively.

For main ground line 34, sub-ground lines 36-1 to 36-n are provided. Sub-ground lines 36-1 to 36-n are coupled to main ground line 34 via switching transistors SWS-1 to SWS-n formed of N-channel MIS transistors, respectively. A CMOS logic circuit 40-i is provided for sub-power supply line 32-i and sub-ground line 36-i, with i being any of 1, 2, ... n.

Switching transistors SWC-1 to SWC-n and SWS-1 to SWS-n have sizes (ratios between channel widths and channel lengths), which depend on the sizes of the MIS transistors connected to sub-power supply lines 32-1 to 32-n of corresponding CMOS logic circuits 40-1 to 40-n and the sizes of MIS transistors connected to sub-ground lines 36-1 to 36-n. In each of CMOS logic circuits 40-1 to 40-n, the MIS transistors are selectively connected to the sub-power supply lines, main power supply lines, sub-ground lines and main ground lines, depending on the logical levels of the corresponding input signals IN1 to INn in the standby cycle.

The sizes of switching transistors SWC-1 to SWC-n and SWS-1 to SWS-n are adjusted in accordance with the structures of corresponding CMOS logic circuits 40-1 to 40-n such that voltages Vccs1 to Vccsn on sub-power supply lines 32-1 to 32-n in the standby cycle becomes equal to equilibrium voltage Vce, and voltages Vss1 to Vssn on sub-ground lines 36-1 to 36-n becomes equal to the level of the common equilibrium voltage Vse in the standby cycle.

Figure 25B:
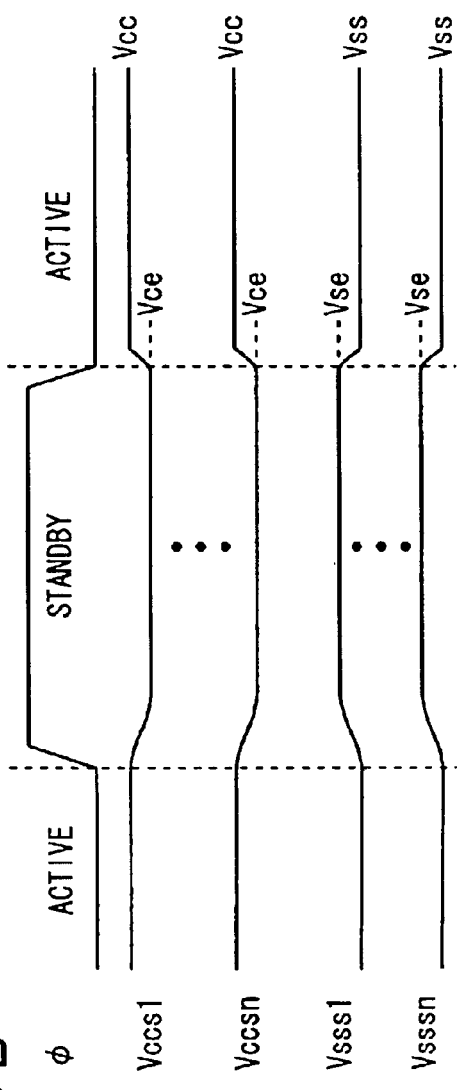
FIG. 25B is a signal waveform diagram representing an operation of the device shown in FIG. 25A.

In FIG. 25B, the voltages on sub-power supply lines 32-1 to 32-n are at the equilibrium voltage Vce level and at the level of voltage Vcc in the active cycle. The voltages Vss1 to Vssn on sub-ground lines 36-1 to 36-n are equal to ground voltage Vss in the active cycle. Upon entry into the standby cycle, control clock signal φ and complementary control clock signal /φ attain H- and L-levels, respectively, and switching transistors SWC-1 to SWC-n and SWS-1 to SWS-n are turned off. In this state, all the voltages on sub-power supply lines 32-1 to 32-n and all the voltages on sub-ground lines 36-1 to 36-n reach the common equilibrium voltages Vce and Vse, respectively owing to the gate tunnel currents and the off-leak currents.

At the time of transition from the standby cycle to the active cycle, the voltages on sub-power supply lines 32-1 to 32-n and sub-ground lines 36-1 to 36-n are all at the same levels, respectively. Even if these CMOS logic circuits 40-1 to 40n operate at the same timing in the active cycle, the recovery time periods of the power supply voltage and ground voltage are uniform in CMOS logic circuits 40-1 to 40-n so that it is possible to prevent a malfunction due to timing mismatch caused by unstable signals.

Figure 26:
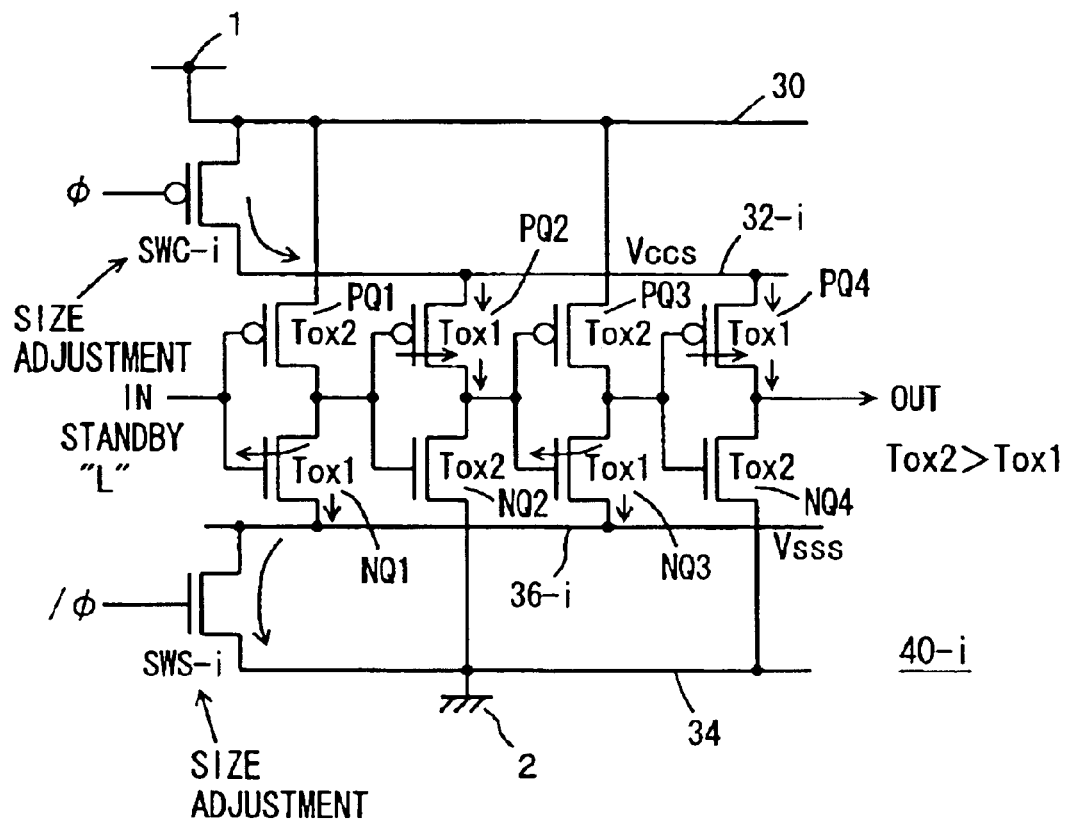
FIGS. 26–29 shows structures of first to fourth modifications of the sixth embodiment of the present invention, respectively.

FIG. 26 shows, by way of example, a structure of CMOS logic circuit 40-i (i=1, 2, ..., n) shown in FIG. 25A. In FIG. 26, CMOS logic circuit 40-i includes P-channel MIS transistors PQ1–PQ4 and N-channel MIS transistors NQ1–NQ4 connected in series to respective MIS transistors PQ1–PQ4.

In the standby cycle, input signal IN is at L-level, and MIS transistors PQ1 and PQ3 have sources connected to main power supply line 30. Also, MIS transistors PQ2 and PQ4 have sources connected to sub-power supply line 32-i. Likewise, MIS transistors NQ1 and NQ3 have sources connected to sub-ground line 36-i, and MIS transistors NQ2 and NQ4 have sources connected to main ground line 34. MIS transistors NQ1, NQ3, PQ2 and PQ4 each have a gate insulating film of the small thickness Tox1, because these transistors are off in the standby cycle. MIS transistors PQ1, PQ3, NQ2 and NQ4 which are on in the standby cycle each have a gate insulating film of the large thickness Tox2.

Switching transistor SWC-i between sub-power supply line 32-i and main power supply line 30 has a size (ratio of channel width to channel length) determined such that the off-leak current and gate tunnel current thereof is balanced with the leak current (i.e., a sum of the off-leak current and gate tunnel current) flowing through MIS transistors PQ2 and PQ4 in the standby cycle. Also, switching transistor SWS-i have a size (ratio of channel width to channel length, W/L) determined such that the leak current flowing through MIS transistors NQ1 and NQ3 is balanced with the off-leak current and the gate tunnel current thereof.

In the standby cycle, MIS transistors PQ1 and PQ3 are on. However, they have the gate insulating films of thickness Tox2, and therefore the gate tunnel currents therein are substantially suppressed. MIS transistors PQ2 and Q4 having thin gate insulating films are off in the standby cycle, and the off-leak currents flow between the drains and the sources as indicated by arrows in FIG. 26, and at the same time, the gate tunnel current flows between the gate and the drain in these MIS transistors. However, MIS transistors PQ2 and PQ4 are off in the standby cycle, and the gate tunnel currents thereof are extremely small. In MIS transistors NQ1 and NQ3, the gate tunnel current flows from the drain to the gate, and the off-leak current flows between the drain and source. The gate tunnel currents of MIS transistors NQ1 and NQ3 are small in value, and these gate tunnel currents hardly affect the current on sub-ground line 36-i. Therefore, by adjusting the sizes of switching transistors SWC-i and SWS-i in consideration of only the factors of the off-leak currents, the voltages on sub-power supply line 32-i and sub-ground line 36-1 in the standby cycle can be set to predetermined voltage levels, respectively. In this size adjustment, a formula for obtaining the sub-threshold current is used to obtain such a size of switching transistor SWC-i that a sum of the off-leak currents of MIS transistors PQ2 and PQ4 is equal to the off-leak current flowing through switching transistor SWC-i (and the voltage level of voltage Vccs in the standby cycle reaches the predetermined equilibrium level). The size of switching transistor SWS-i is determined similarly to the above.

[Second Modification]

Figure 27:
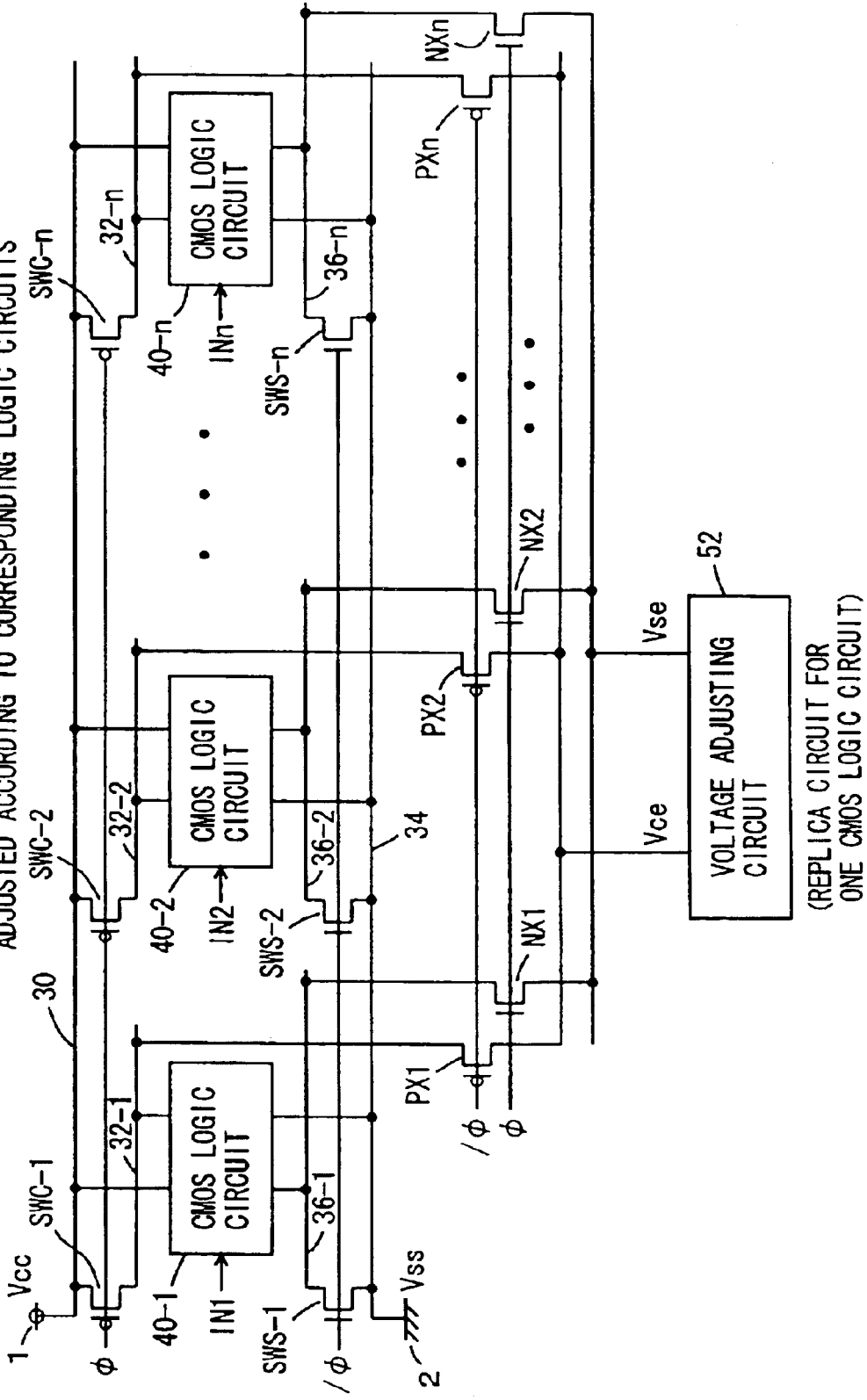

FIG. 27 schematically shows a structure of a second modification of the sixth embodiment of the present invention. In FIG. 27, a voltage adjusting circuit 52 is provided commonly to the power supply system (sub-power supply lines and sub-ground lines) of CMOS logic circuits 40-1 to 40-n. CMOS logic circuits 40-1 to 40-n and switching transistors SWC-1 to SWC-n and SWS-1 to SWS-n have the same structures as those shown in FIG. 25A. Therefore, the sizes (ratios of channel widths to channel lengths) of switching transistors SWC-1 to SWC-n are adjusted such that the voltages on sub-power supply lines 32-1 to 32-n are equal to equilibrium voltage Vce in the standby cycle. Also, the sizes of switching transistors SWS-1 to SWS-n are adjusted such that the voltages on sub-ground lines 36-1 to 36-n are equal to equilibrium voltage Vse. These structures are the same as those shown in FIG. 25A.

Voltage adjusting circuit 52 is provided commonly to sub-power supply lines 32-1 to 32-n and sub-ground lines 36-1 to 36-n. Voltage adjusting circuit 52 includes a replica circuit for one CMOS logic circuit and corresponding switching transistors SWC and SWS, and produces equilibrium voltages Vce and Vse in the standby cycle. Voltage adjusting circuit 52 has the same structure as that shown in FIG. 24, and produces equilibrium voltages Vce and Vse based on the leak current of the replica circuit.

Output voltage Vce of voltage adjusting circuit 52 is transmitted to sub-power supply lines 32-1 to 32-n via transfer gates (or transmission gates) PX-1 to PXn, which are turned on in response to control clock signal /ϕ in the standby cycle. Equilibrium voltage Vse produced from voltage adjusting circuit 52 is transmitted to sub-ground lines 36-1 to 36n via transfer gates (or transmission gates) NX1 to NXn, which are turned on in response to control clock signal ϕ in the standby cycle. In FIG. 27, transfer gates PX1 to PXn are represented as P-channel MIS transistors, respectively, and transfer gates NX1 to NXn are represented as N-channel MIS transistors, respectively. These transfer gates PX1 to PXn and NX1 to NXn may be formed of CMOS transmission gates.

Switching transistors SWC-1 to SWC-n have sizes so adjusted as to provide the equal equilibrium voltages on sub-power supply lines 32-1 to 32-n in the standby cycle. Also, switching transistors SWS-1 to SWS-n have sizes so adjusted as to provide the equal equilibrium voltages on sub-ground lines 36-1 to 36-n in the standby cycle. Therefore, all the voltages ultimately appearing on sub-power supply lines 32-1 to 32-n and sub-ground lines 36-1 to 36-n in the standby cycle are equal to each other. In the standby cycle, therefore, equilibrium voltages Vce and Vse, which are supplied from the single voltage adjusting circuit 52, are transmitted via transfer gates PX1 to PXn to respective sub-power supply lines 32-1 to 32-n and to sub-ground lines 36-1 to 36-n via respective transfer gates NX1–NXn, respectively. Thereby, the voltages on sub-power supply lines 32-1 to 32-n can be rapidly driven to equilibrium voltage Vce level, and the voltages on sub-ground lines 36-1 to 36-n are rapidly driven to equilibrium voltage Vse level in the standby cycle.

Accordingly, upon transition from the standby cycle to the active cycle, all the voltages on these sub-power supply lines 32-1 to 32-n can be at the equal level, and all the voltages on sub-ground lines 36-1 to 36-n can be at the equal level. Therefore, it is possible to prevent variation in voltage level on sub-power supply lines 32-1 to 32-n as well as variation in voltage level on sub-ground lines 36-1 to 36-n, which may be caused depending on the time length of the standby cycle, and the operation power supply voltages of CMOS logic circuits 40-1 to 40-n can be stabilized at a faster timing after transition to the active cycle, and the stability of the operations of internal circuits can be ensured.

[Third Modification]

Figure 28:
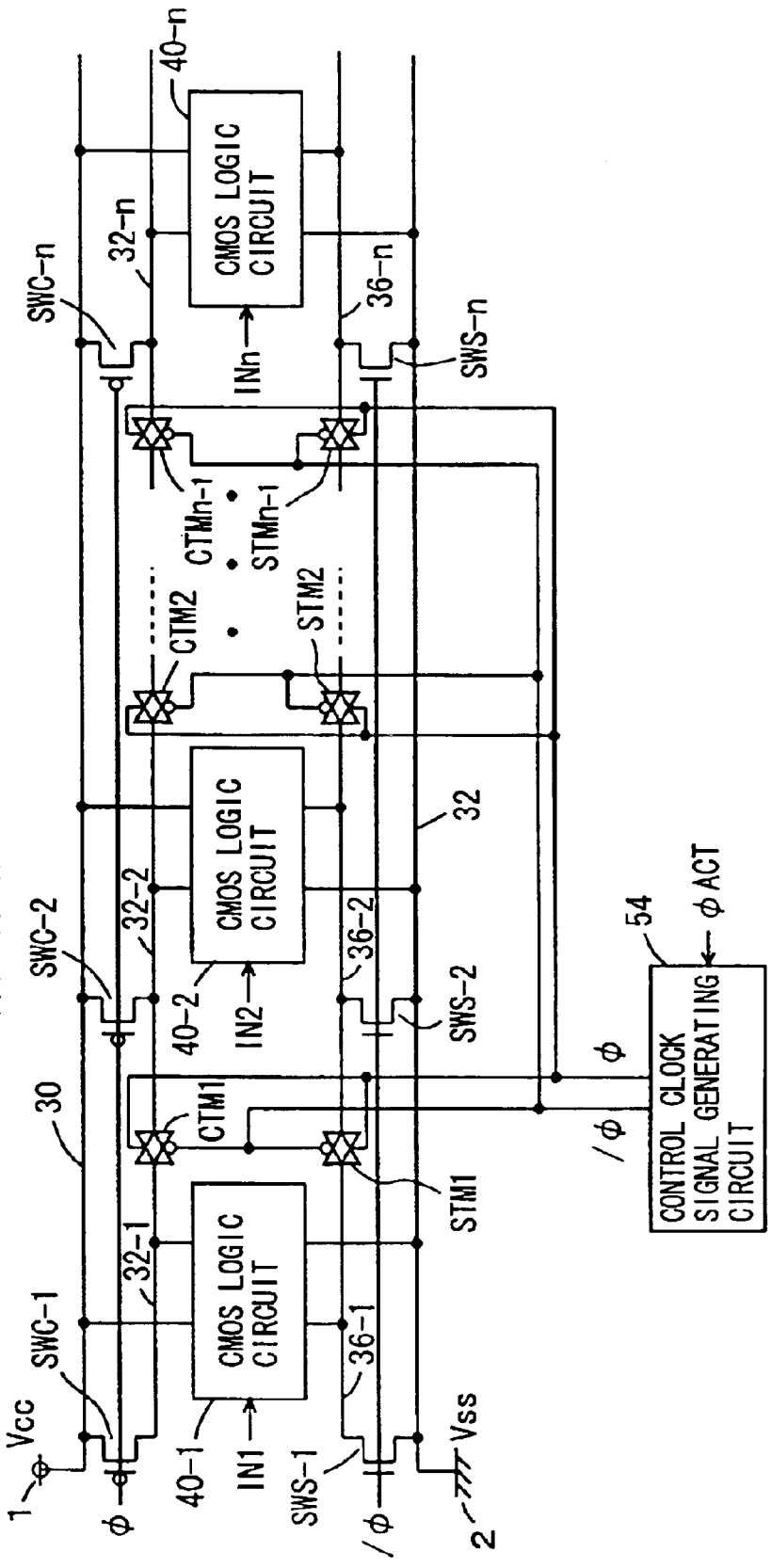

FIG. 28 schematically shows a structure of a third modification of the sixth embodiment of the present invention. The structure shown in FIG. 28 differs from the structure shown in FIG. 25A in the following points. Transmission gates CTM1, CTM2, ..., CTMn–1, which are turned on in the standby cycle in response to control clock signals ϕ and /ϕ applied from a control clock signal generating circuit 54, are arranged between sub-power supply lines 32-1 to 32-n. For sub-ground lines 36-1 to 36-n, transmission gates STM1, STM2, ..., STMn–1, which are turned on in the standby cycle in response to control clock signals ϕ and /ϕ applied from control clock signal generating circuit 54, are arranged.

In the standby cycle, therefore, these transmission gates CTM1-CTMn–1 interconnect sub-power supply lines 32-1 to 32-n together, and transmission gates STM1 to STMn–1 interconnect sub-ground lines 36-1 to 36-n together. Structures other than the above are the substantially same as those shown in FIG. 25A. The corresponding portions are allotted with the same reference numerals, and description thereof is not repeated.

Control clock signal generating circuit 54 produces control clock signals ϕ and /ϕ in accordance with internal operation instructing signal ϕACT. In the standby cycle, the equilibrium voltages on sub-power supply lines 32-1 to 32-n are at the equal level owing to the adjustment of the sizes of switching transistors SWC-1 to SWC-n. Also, the equilibrium voltages on sub-ground lines 36-1 to 36-n are at the equal level in the standby cycle owing to the adjustment of sizes of switching transistors SWS-1–SWS-n. In the standby cycle, therefore, transmission gates CTM1–CTMn–1 interconnect sub-power supply lines 32-1-32-n together, and transmission gates STM1–STMn–1 interconnect sub-ground lines 36-1-36-n together, whereby the voltages on sub-power supply lines 32-1 to 32-n in the standby cycle can be stably kept at the equal equilibrium voltage level. Likewise, the voltages on sub-ground lines 36-1-36-n can be stably kept at equilibrium voltage Vse.

In the standby cycle, the voltages on sub-power supply lines 32-1 to 32-n are reliably set to the equal level, and the voltages on sub-ground lines 36-1 to 36-n are reliably set to the equal level. Upon transition from the standby cycle to the active cycle, the voltage recovery time periods of respective sub-power supply lines 32-1 to 32-n and sub-ground lines 36-1 to 36-n can be equal to each other. Therefore, CMOS logic circuits 40-1 to 40-n can start the operation at the same timing in the active cycle, and the stable and accurate internal operation can be reliably implemented.

The voltages on sub-power supply lines 32-1 to 32-n and sub-ground lines 36-1 to 36-n can be rapidly stabilized at the equilibrium voltage level. When this equilibrium voltage is kept, the standby currents (off-leak currents and gate tunnel currents) of CMOS logic circuits 40-1 to 40-n are minimized, and the current consumption in a standby cycle can be minimized.

[Fourth Modification]

Figure 29:
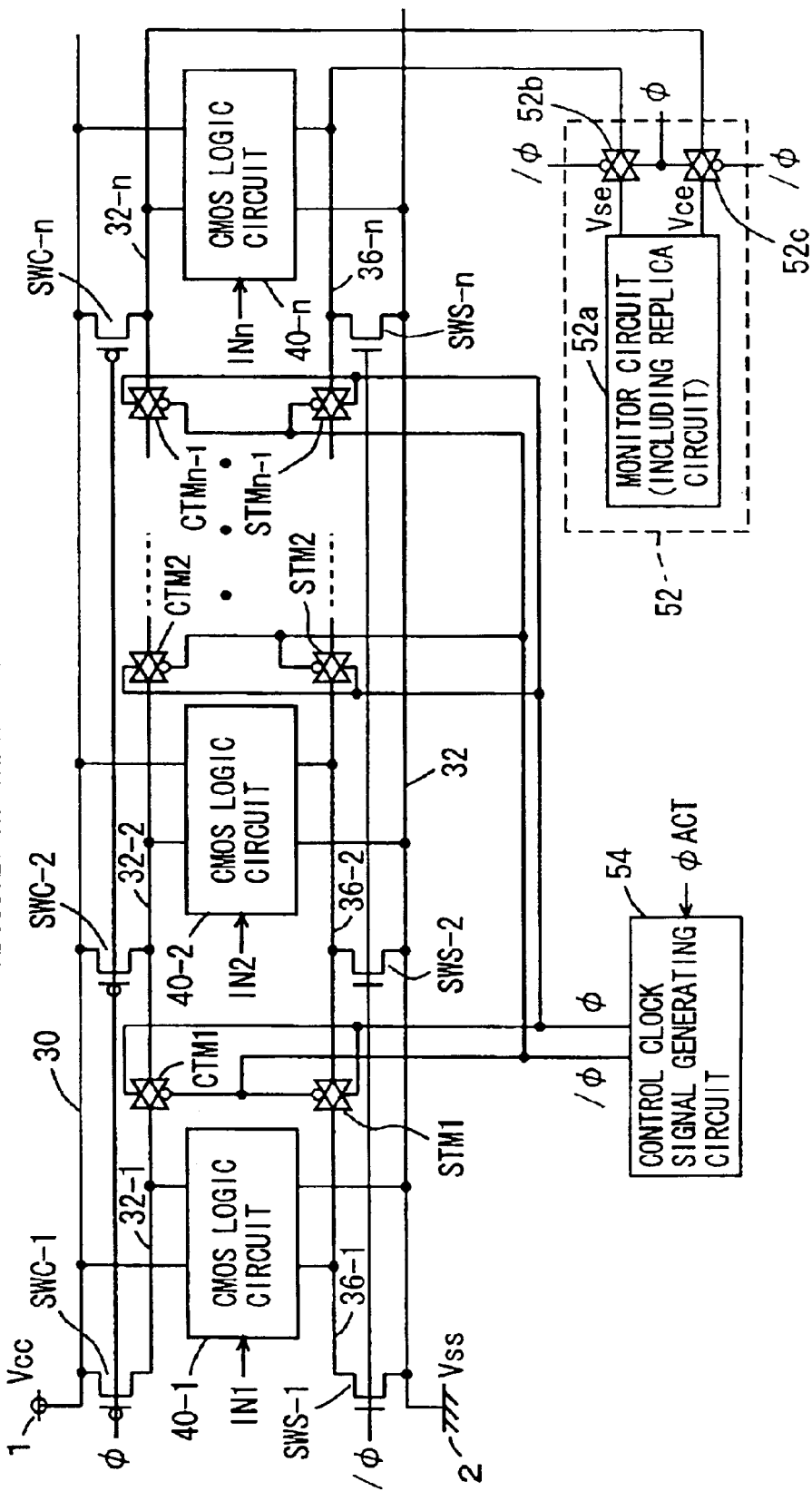

FIG. 29 schematically shows a structure of a fourth modification of the sixth embodiment of the present invention. The structure shown in FIG. 29 differs from the structure shown in FIG. 28 in the following points. Equilibrium voltages Vse and Vce supplied from voltage adjusting circuit 52 are transmitted to sub-ground line 36-n and sub-power supply line 32n in the standby cycle, respectively. The sub-ground lines 36-1 to 36-n are mutually connected by transmission gates STM1-STMn–1 in the standby cycle, and sub-power supply lines 32-1 to 32-n are mutually connected by transmission gates CTM1–CTMn–1 in the standby cycle. In the standby cycle, therefore, equilibrium voltages Vse and Vce supplied from voltage adjusting circuit 52 are transmitted onto sub-ground lines and sub-power supply lines, and accordingly the voltages on sub-power supply lines 32-1 to 32-n can be rapidly set to equilibrium voltage Vce, and sub-ground lines 36-1 to 36-n can be rapidly driven to equilibrium voltage Vse.

Voltage adjusting circuit 52 includes a monitor circuit 52a including a replica circuit, and transmission gates 52b and 52c responsive to control clock signals ϕ and /ϕ for transmitting equilibrium voltages Vse and Vce onto sub-ground line 36-n and sub-power supply line 32-n, respectively. Monitor circuit 52a includes a replica circuit for CMOS logic circuits 40-1 to 40-n as well as a differential amplifier, and the structure thereof is similar to that shown in FIG. 24.

By utilizing the structure shown in FIG. 29, it is possible to prevent such a situation that when the standby period is short, sub-power supply lines 32-1 to 32-n carry the voltages at different levels and sub-ground lines 36-1 to 36-n carry the voltages at different levels. At the time of transition to the active cycle, the internal circuits can stably start the operation at a faster timing.

Sub-power supply lines 32-1 to 32-n and sub-ground lines 36-1 to 36-n can quickly reach their respective equilibrium voltages, and the standby currents of CMOS logic circuits 40-1 to 40-*n* can be rapidly driven to the minimum value so that the current consumption in the standby cycle can be reduced.

According to the sixth embodiment, as described above, the voltage adjusting circuit quickly drives the sub-power supply lines and sub-ground lines to the equilibrium voltages in the standby cycle, or sets the equilibrium voltages on the sub-power supply lines and sub-ground lines to the equal voltage level in the standby state. Thus, it is possible to prevent variations in recovery time of the operation power supply voltage, which may occur depending on the length of the standby cycle period, at the time of transition to the active cycle, and the internal circuit can stably and quickly performs an operation after transition to the active cycle.

[Seventh Embodiment]

Figure 30:
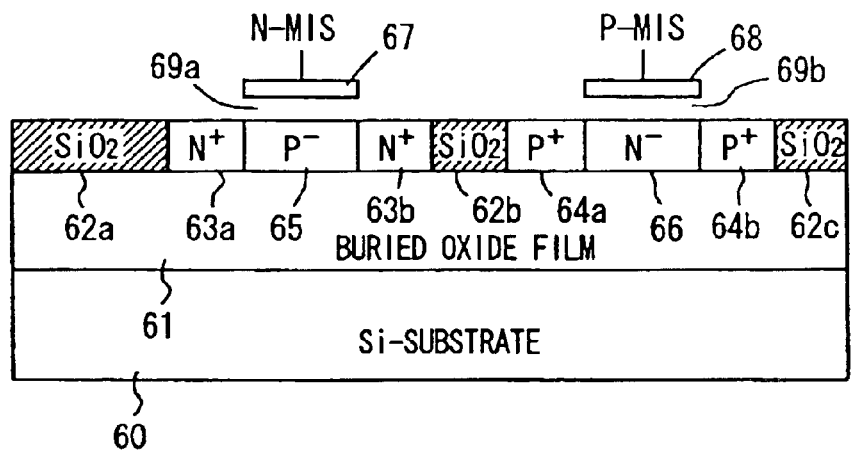
FIG. 30 schematically shows a cross sectional structure of a semiconductor device according to a seventh embodiment of the present invention.

FIG. 30 schematically shows a cross sectional structure of a CMOS inverter circuit of an SOI (Silicon On Insulator) structure, which is used in a seventh embodiment of the present invention. In FIG. 30, the MIS transistor of the SOI structure is formed at a semiconductor layer on a buried oxide film (insulating film) 61 which in turn is formed at the surface of silicon (Si) substrate 60. N-type impurity regions 63*a* and 63*b* are formed on buried oxide film 61 with a space laid between them. A P-type impurity region 65 is formed between N-type impurity regions 63*a* and 63*b*. A gate electrode 67 is formed on P-type impurity region 65 with a gate insulating film 69*a* underlaid. Impurity regions 63*a*, 63*b* and 65, gate insulating film 69*a* and gate electrode 67 form an N-channel MIS transistor. P-type impurity region 65 is called a "body region", and acts as the substrate region of this N-channel MIS transistor. Body region 65 is supplied with a bias voltage, as will be described later.

Further, P-type impurity regions 64*a* and 64*b* spaced from each other are formed on buried oxide film (insulating film) 61, and an N-type impurity region 66 is formed between impurity regions 64*a* and 64*b*. A gate electrode 68 is formed on N-type impurity region 66 with a gate insulating film 69*b* underlaid. An insulating film 62*b* for element isolation, which is formed of, e.g., a silicon oxide film, is arranged between impurity regions 63*b* and 64*a*. Insulating films 62*a* and 62*c* for element isolation, which are formed of, e.g., silicon oxide films, are arranged outside impurity regions 63*a* and 64*b*, respectively.

Impurity regions 64*a*, 64*b* and 66, gate insulating film 69*b* and gate electrode 68 form a P-channel MIS transistor. Impurity region 66 functions as the substrate region of this P-channel MIS transistor, and is called a "body region". The transistor of the SOI structure describe above has a small junction capacitance, and does not cause a junction leak current because the buried oxide film (insulating film) is formed, so that fast operation and reduced leak current can be achieved.

In the transistor of the SOI structure described above, however, a gate tunnel current flows if the thickness of each of gate insulating films 69*a* and 69*b* is reduced to, e.g., 3.0 nm.

Figure 31A:
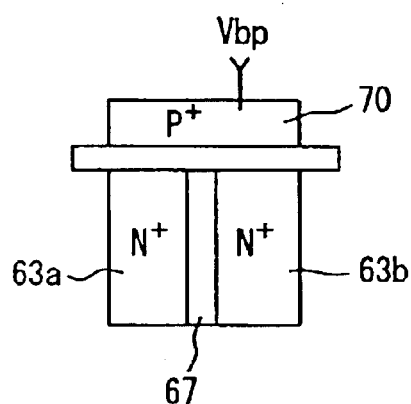
FIG. 31A schematically shows a plan layout of an MIS transistor shown in FIG. 30, and FIG. 31B schematically shows a cross sectional structure of the transistor shown in FIG. 31A.

FIG. 31A schematically shows a planar layout of the N-channel MIS transistor shown in FIG. 30. In FIG. 31, gate electrode 67 has a T-shaped feature, and the impurity regions 63*a* and 63*b* are isolated by a P-type impurity region formed under the gate electrode 67. A heavily doped P-type impurity region 70 is faced to N-type impurity regions 63*a* and 63*b*. Heavily doped p-type impurity region 70 is coupled to P-type impurity region 65 of the body region formed under gate electrode 67, and transmits a bias voltage Vbp.

Figure 31B:
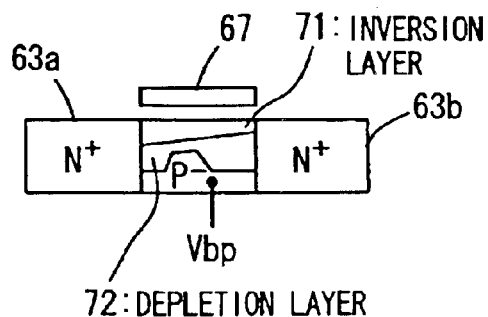

FIG. 31B schematically shows distributions of a depletion layer and an inversion layer in the MIS transistor shown in FIG. 31A. In FIG. 31B, impurity regions 63*a* and 63*b* serve as a source and a drain, respectively. In this case, the thickness of the inversion layer gradually decreases from impurity region 63*a* of the source region towards impurity region 63*b* of the drain region. A depletion layer 72 is formed under an inversion layer 71. Depletion layer 72 gradually decreases in thickness as the distance increases from impurity region 63*a* to a certain position due to the influence by the voltage applied from gate electrode 67, and then increases in thickness due to the drain electric field as approaching impurity region 63*b* of the drain. The body region in which the depletion layer and the inversion layer is supplied with bias voltage Vbp via impurity region 70. By applying bias voltage Vbp to the body region, a so-called "substrate floating effect" can be prevented, and an influence by the residual charges can be prevented. In the body region shown in FIG. 31B, depletion layer 72 is formed only in a portion of the body region. The MIS transistor of the SOI structure shown in FIGS. 31A and 31B is called a "MIS transistor of a partial depletion type".

Figure 32:
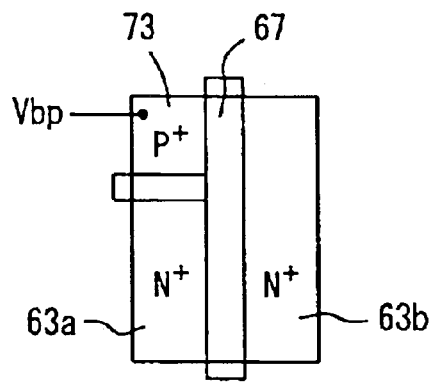
FIG. 32 shows a modification of the plan layout of the MIS transistor shown in FIG. 30.

FIG. 32 schematically shows another planar layout of the MIS transistor of the SOI structure. In the layout shown in FIG. 32, impurity regions 63*a* and 63*b* are isolated from each other by a P-type impurity region formed under gate electrode 67. Gate electrode 67 has a gate electrode portion, which extends horizontally in FIG. 32 and isolates impurity region 63*a* and heavily doped P-type impurity region 73 from each other. A P-type impurity region is formed between impurity regions 73 and 63*a* and 63*b*. Impurity region 73 is electrically connected to a P-type impurity region, which is formed under gate electrode 67 having a lateral T-shaped figure, and transmits a bias voltage Vbp to the body region. Even in the arrangement shown in FIG. 32, bias voltage Vbp can be transmitted to the body region. In this structure shown in FIG. 32, the MIS transistor of the partial depletion type is likewise implemented.

A planar layout of the P-channel MIS transistor can be obtained by replacing the P-type and the N-type with each other in the layouts of FIGS. 31A and 32.

The seventh embodiment utilizes this MIS transistor of the partial depletion type of SOI structure.

Figure 33A:
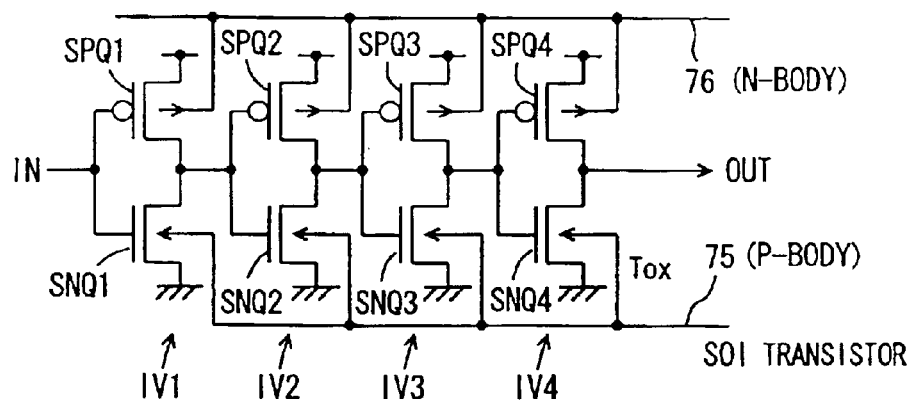
FIG. 33A shows a structure of a semiconductor device of a seventh embodiment of the present invention.

FIG. 33A shows, by way of example, a structure of the semiconductor device according to the seventh embodiment of the present invention. In FIG. 33A, a CMOS circuit is formed utilizing SOI transistors, or an MIS transistor of SOI structure. This CMOS circuit includes four CMOS inverters IV1–IV4. CMOS inverters IV1–IV4 include P-channel MIS transistors SPQ1–SPQ4 and N-channel MIS transistors SNQ1–SNQ4 each having an SOI structure. Each of MIS transistors SPQ1–SPQ4 and SNQ1–SNQ4 has a gate insulating film of thickness Tox, which in turn provides a gate tunnel barrier similar to that provided by a silicon oxide film of 3 nm in thickness.

In this structure, a large tunnel current may flow through the MIS transistor in the on state. For preventing this tunnel current flow, N-type body (N-body) regions of MIS transistors SPQ1–SPQ4 are coupled together, and the voltage on a common N-body region 76 is switched in accordance with the standby cycle and the active cycle. In MIS transistors SNQ1–SNQ4, the voltage level of a P-body (P-type body) region 75 is likewise switched in accordance with the standby cycle and the active cycle. More specifically, N-body region 76 is supplied with a bias voltage, which turns off MIS transistors SPQ1–SPQ4, in the standby cycle. In the active cycle, a shallow bias is applied to N-body region 76 of MIS transistors SPQ1–SPQ4 for operating MIS transistors SPQ1–SPQ4 fast.

In MIS transistors SNQ1–SNQ4, the bias voltage on P-body region 75 is deepened to turn off MIS transistors SNQ1–SNQ4 in the standby cycle so that the off-leak current and gate tunnel current are reduced. In the active cycle, the bias voltage on P-body region 75 is lowered to operate MIS transistors SNQ1–SNQ4 fast.

In the structure shown in FIG. 33A, the logical level of input signal IN may be unfixed in the standby cycle. Due to the bias voltages on N and P-body regions 76 and 75, all MIS transistors SPQ1–SPQ4 and SNQ1–SNQ4 are turned off regardless of the logical level of input signal IN, so that both the gate tunnel current and the off-leak current can be reduced.

Figure 33B:
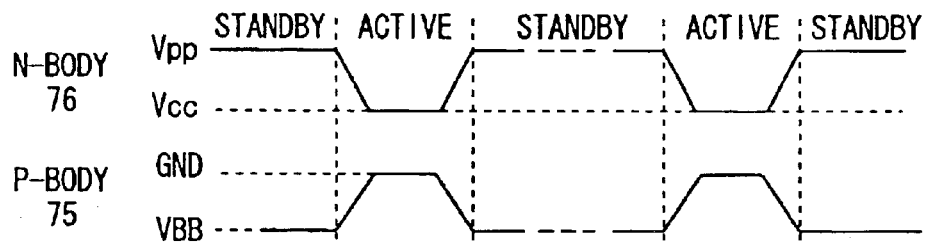
FIG. 33B is a signal waveform diagram representing an operation of the device shown in FIG. 33A.

FIG. 33B is a signal waveform diagram representing an operation of the semiconductor device shown in FIG. 33A. First, as shown in FIG. 33B, N-body region 76 is supplied with a high voltage Vpp in the standby cycle, and the threshold voltages of MIS transistors SPQ1–SPQ4 are increased in absolute value, and these transistors SPQ1–SPQ4 are turned off regardless of the levels of voltage applied to their gates. In N-body region 76, high voltage Vpp prevents formation of an inversion layer at an interface with the insulating film and therefore prevents a gate tunnel current even when MIS transistors SPQ1–SPQ4 receive signals at L-level on their gates. At most, a tunnel current occurs between the gate and drain. This tunnel current is extremely small and can be ignored. In N-channel MIS transistors SNQ1–SNQ4, negative voltage VBB is applied to P-body region 75 in the standby cycle, and MIS transistors SNQ1–SNQ4 are turned off so that the gate tunnel current is sufficiently suppressed.

In the active cycle, N-body region 76 is supplied with power supply voltage Vcc, and P-body region 75 is supplied with ground voltage GND (=Vss). In MIS transistors SPQ1–SPQ4 and SNQ1–SNQ4, the back gates and the sources are at the same potential, and each threshold voltage is reduced to be sufficiently small in absolute value. Further, the substrate leak current does not occur and the junction capacitance is small owing to the characteristics of the transistors of the SOI structures. Accordingly, these transistors operate fast in the active cycle.

[Modification]

Figure 34A:
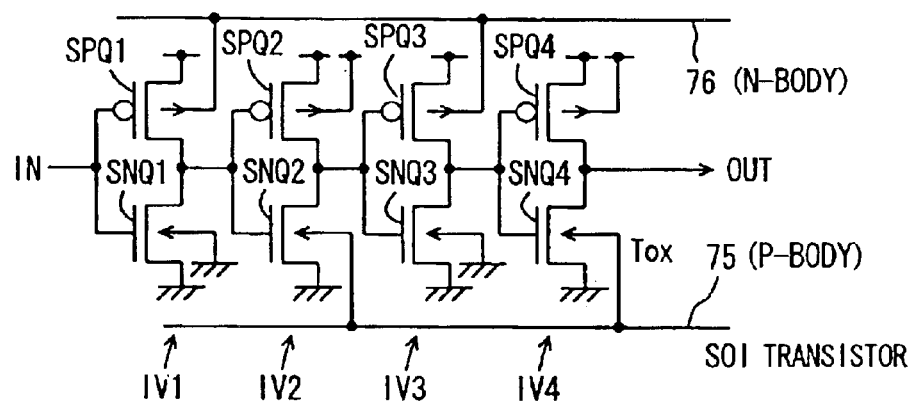
FIG. 34A shows a modification of the seventh embodiment of the present invention.

FIG. 34A shows a structure of a modification of the seventh embodiment of the present invention. In the structure shown in FIG. 34A, input signal IN is fixed to L-level in the standby cycle. MIS transistors SPQ1 and SPQ3, which are turned on in the standby cycle, have the body regions commonly connected to N-body region 76 in accordance with the logical level of input signal IN in the standby state. MIS transistors SPQ2 and SPQ4, which are turned off in the standby cycle, have the body regions connected to the power supply node to be held at the same voltage level as their respective sources. N-channel MIS transistors SNQ1–SNQ4 are connected in a similar fashion. More specifically, MIS transistors SNQ2 and SNQ4, which are turned on in the standby cycle, have the body regions commonly coupled to P-body region 75. MIS transistors SNQ1 and SNQ3, which are turned off in the standby cycle, have the body regions coupled to the ground node so that the sources and the body regions thereof are held at the equal voltage level.

Figure 34B:
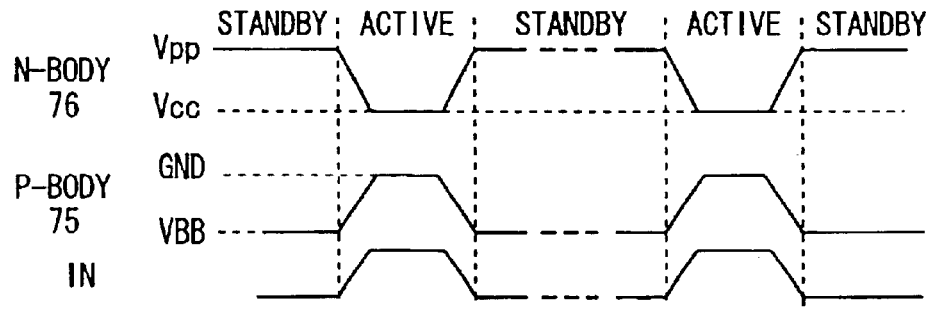
FIG. 34B is a signal waveform diagram representing an operation of the device shown in FIG. 34A.

All MIS transistors SPQ1–SPQ4 and SNQ1–SNQ4 have the SOI structures and each have a gate insulating film of the small thickness (Tox). In the standby cycle, as shown in FIG. 34B, high voltage Vpp is applied to N-body region 76, and negative voltage VBB is applied to Pbody region 75. Although input signal IN is at L-level, high voltage Vpp applied to N-body region 76 turns off MIS transistors SPQ1 and SPQ3, so that the gate tunnel currents are suppressed. In MIS transistors SNQ2 and SNQ4, P-body region 75 is at the negative voltage level, and MIS transistors SNQ2 and SNQ4 are off, so that the gate tunnel currents are suppressed.

Accordingly, if the logical level of input signal IN in the standby cycle is known in advance, the bias of the body regions of the MIS transistors, which are on in the standby cycle, has only to be deepened, whereby the gate tunnel current can be suppressed even in the case where the gate insulating films are thin.

In the active cycle, N-body region 76 receives power supply voltage Vcc, and P-body region 75 receives ground voltage GND (=Vss). Therefore, MIS transistors SPQ1–SPQ4 and SNQ1–SNQ4 quickly produce output signal OUT in accordance with input signal IN.

In the seventh embodiment, the previously described structure of the well bias structure shown in FIG. 7 can be utilized as the structure for switching the voltages on N- and P-body regions 76 and 75. In the semiconductor device utilizing the MIS transistors of the SOI structure, the hierarchical power supply arrangement can also be utilized for reducing the off-leak current. Since the transistors, of which well biases are deep, have the sources connected to the main power supply line or main ground line, the voltage level of an internal node can be held in the fixed state in the standby state because the leak current flows through the transistor deep in well bias. Therefore, such a state can be prevented that the logical level of output signal OUT becomes unstable at the time of transition to the active cycle, and the fast and accurate operation can be ensured.

According to the seventh embodiment of the present invention, as described above, the bias of the body region of the transistor with the SOI structure is changed in accordance with the operation cycle, and therefore the gate tunnel current can be suppressed even if the transistor employs the SOI structure having a thin gate insulating film, and the semiconductor device which operates fast with low current consumption can be implemented.

[Eighth Embodiment]

Figure 35:
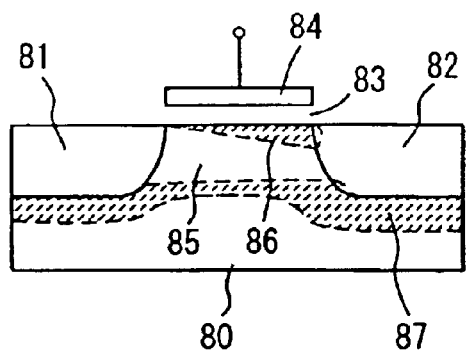
FIG. 35 schematically shows a cross sectional structure of an MIS transistor used in an eighth embodiment of the present invention.

FIG. 35 schematically shows a cross sectional structure of a buried channel MIS transistor used in an eighth embodiment of the present invention. In FIG. 35, buried channel MIS transistor includes impurity regions 81 and 82 formed spaced apart from each other at the surface of substrate region 80, a thin gate insulating film 83 formed on a channel region between impurity regions 81 and 82, and a gate electrode 84 formed on a thin gate insulating film 83.

When the buried channel MIS transistor is on, a channel (inversion layer) 85 thereof is formed in a substrate region that is slightly spaced from the substrate surface. On the channel region surface, a depletion layer 86 expands from the source to the drain region. Under channel (inversion layer) 85, a depletion layer 87 is formed. Capacitances of these depletion layers formed at the surface are equivalently added to the capacitance formed by gate insulating film 83. Therefore, the thickness of the gate insulating film for the gate tunnel current equivalently increases so that the tunnel current between inversion layer 85 and gate electrode 84 can be suppressed. Therefore, this buried channel MIS transistor can be used as the MIS transistor having a large gate tunnel barrier. In other words, the buried MIS transistor can be utilized instead of the MIS transistor having a thick gate insulating film.

Figure 36A:
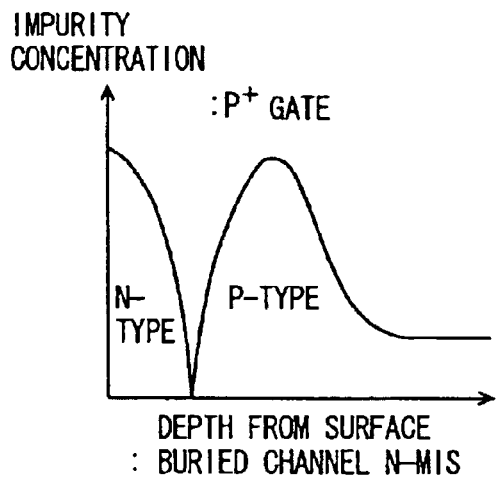
FIG. 36A schematically shows a channel impurity concentration profile of a buried channel N-type MIS transistor with a P+ gate, and FIG. 36B schematically shows an impurity concentration profile of a channel region of a surface channel N-type MIS transistor with an N+ gate.
Figure 36B:
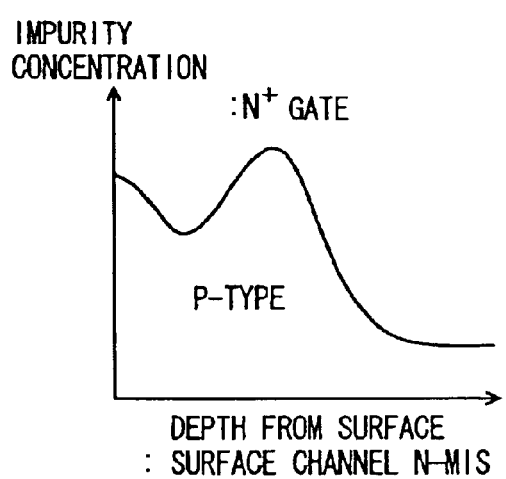

FIGS. 36A and 36B schematically show impurity profiles in the channel region of the N-channel MIS transistor. More specifically, FIG. 36A shows the channel impurity concentration profile of the structure with a P+ type polycrystalline silicon gate used as the gate electrode. In the structure using the P+ type polycrystalline silicon as the gate electrode, a difference in work function between the gate and the P-type substrate is small, and the depletion layer is hardly formed. For adjusting the threshold voltage, the substrate surface is doped with N-type impurities, and then a deeper substrate portion is heavily doped with P-type impurities for forming an inversion layer.

In this structure, therefore, the channel region of the P-type substrate region is of the N-type. In the on state, a depletion layer is formed in this N-type impurity region, and an inversion layer is formed in the P-type impurity region. This inversion layer region is the channel, and this N-channel MIS transistor can be used as the N-channel MIS transistor of the buried type.

FIG. 36B shows an impurity concentration profile in a case where an N+ polycrystalline silicon gate is used in the N-channel MIS transistor. In the structure using the N+ polycrystalline silicon gate, a large difference in work function is present between the gate and the P-type semiconductor substrate region, and the depletion layer is formed easily. In this case, therefore, a heavily doped P-type impurity region is formed in the channel region so that the inverter layer is formed. The concentration of the P-type impurities at the substrate surface is controlled to adjust the threshold voltage. The channel region is formed at the surface of the P-type semiconductor substrate region so that the N-channel MIS transistor of the surface channel type is formed.

Figure 37A:
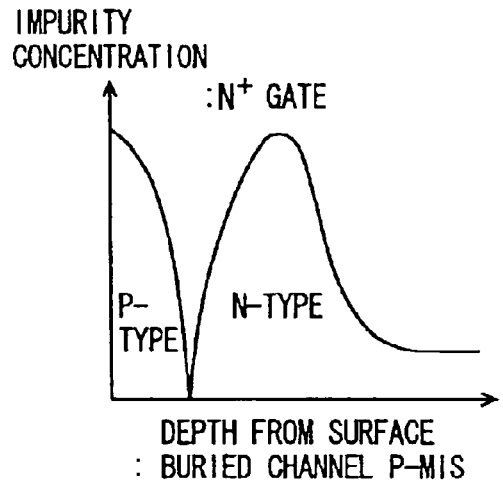
FIG. 37A schematically shows an impurity concentration profile of a channel region of a buried channel P-type MIS transistor with an N+ gate.

FIG. 37A shows an impurity concentration profile of the channel region of the P-channel MIS transistor using an N-type semiconductor substrate region. An N+ polycrystalline silicon gate is used as the gate electrode. In the structure with the N+ polycrystalline silicon used as the gate electrode, a difference in work function between the gate and the N-type semiconductor substrate region is small, and the depletion layer cannot be formed easily. Therefore, P-type impurities are implanted into the channel region surface for the purpose of allowing easy formation of the depletion layer and adjusting the threshold voltage, and a peak concentration region of N-type impurities is formed in a region deeper than the region doped with P-type impurities.

When the MIS transistor with N+ polycrystalline silicon gate is on, therefore, the P-type impurity region functions as the depletion layer, and the N-type impurity doped region functions as the inversion layer. In the structure shown in FIG. 37A, therefore, the P-channel MIS transistor of the buried channel type is formed.

Figure 37B:
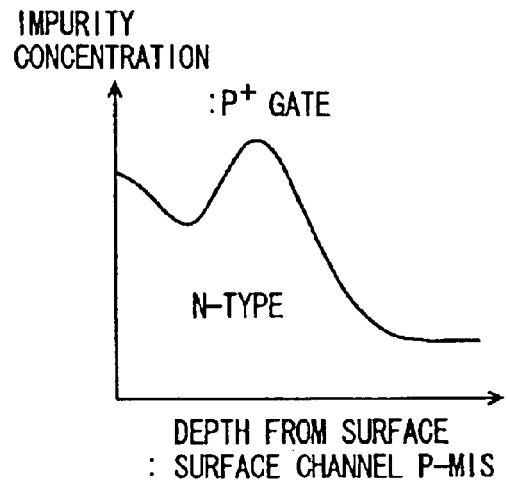
FIG. 37B shows an impurity concentration profile of a channel region of a surface channel P-type MIS transistor with a P+ gate.

In FIG. 37B, a P+ polycrystalline silicon gate is formed at the surface of the N-type semiconductor substrate region, and in this structure, a large difference is present in work function between the gate electrode and the substrate region, and therefore the depletion layer is formed easily. The channel region surface is doped with N-type impurities for adjusting the threshold voltage, and an N-type impurity region having a peak concentration for forming the inversion layer is formed within the channel region. In the structure shown in FIG. 37B, when the transistor is on, the inversion layer is formed entirely over the N-type impurity region at the substrate surface. In the case of using P+ polycrystalline silicon gate, a P-channel MIS transistor of the surface channel type is formed.

The peak concentration region in this MIS transistor of the surface channel type is formed at the depth substantially equal to the junction depth of the source/drain diffusion layers, and suppresses the increase of the short-channel effect and the substrate bias effect.

Accordingly, by using the MIS transistors having the impurity concentration profiles as shown in FIGS. 36A and 37A, the MIS transistors of the buried channel type can be implemented, and the gate tunnel currents can be suppressed.

Figure 38A:
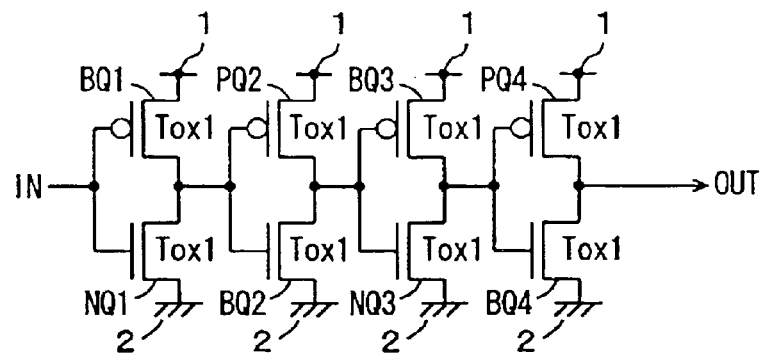
FIG. 38A shows a structure of a semiconductor device according to an eighth embodiment of the present invention.

FIG. 38A shows, by way of example, a semiconductor device according to an eighth embodiment of the present invention. Although the structure shown in FIG. 38A corresponds to the structure shown in FIG. 3, MIS transistors BQ1–BQ4 of the buried channel type are employed, instead of the MIS transistors having the gate insulating films of Tox2 in thickness as employed in the structure shown in FIG. 3.

Figure 38B:
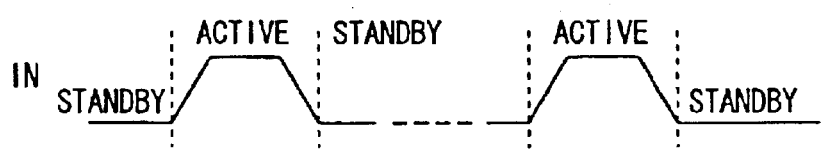
FIG. 38B is a signal waveform diagram representing an operation of the semiconductor device shown in FIG. 38A.

As shown in FIG. 38B, input signal IN is at L-level in the standby cycle, and the MIS transistors which are turned on in the standby cycle are formed of MIS transistors BQ1–BQ4 of the buried channel type having gate insulating film thickness Tox1, respectively. Even if the gate insulating film has small thickness Tox1, the gate tunnel barrier can be made large enough to prevent the gate tunnel current from flowing, because MIS transistors BQ1–BQ4 are of the buried channel type, and the depletion layer is formed at the substrate surface in the on state to equivalently provide a large gate capacitance together with the gate insulating film.

[Modification]

Figure 39A:
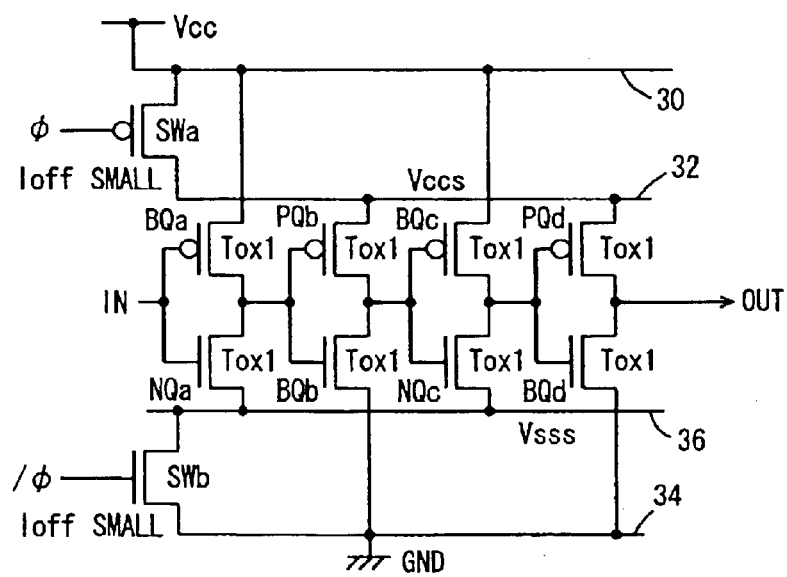
FIG. 39A shows a modification of the eighth embodiment of the present invention.
Figure 39B:
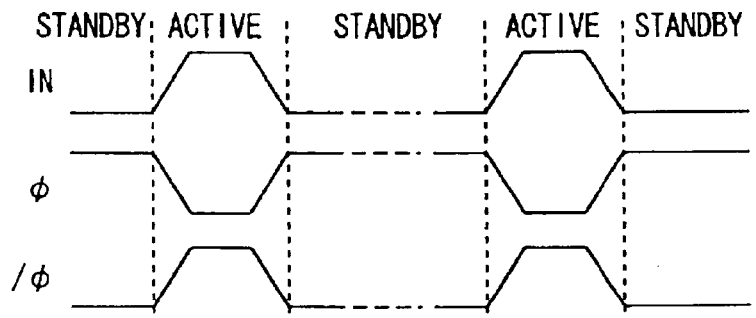
FIG. 39B is a signal waveform diagram representing an operation of the device shown in FIG. 39A.

FIG. 39A shows a structure of a modification of the eighth embodiment of the present invention. The structure shown in FIG. 39A corresponds to the semiconductor device shown in FIG. 19. Input signal IN shown in FIG. 39A is at L-level in the standby cycle, as shown in FIG. 39B. In this structure, buried channel MIS transistors BQa, BQb, BQc and BQd are used for the MIS transistors which are on in the standby cycle. These MIS transistors BQa–BQd correspond to MIS transistors PQa, NQb, PQc and NQd shown in FIG. 19, respectively. Buried channel MIS transistors BQa–BQd have the gate insulating films of Tox1 in thickness.

Control clock signals $\phi$ and /$\phi$ are at H- and L-levels in the standby state, respectively, as shown in FIG. 39B. Therefore, switching transistors SWa and SWb are off in the standby cycle, and MIS transistors PQb, PQd, NQa and NQc having the gate insulating films of Tox1 in thickness hardly cause the gate tunnel current flow, and suppress the off-leak currents.

MIS transistors BQa–BQd of the buried channel type each having gate insulating film thickness Tox1 are on in the standby cycle, but have the gate insulating films equivalently increased owing to the depletion layers formed at the channel region surfaces so that the gate tunnel currents are suppressed. Accordingly, by employing MIS transistors BQa–BQd of the buried channel type for the respective MIS transistors which are turned on in the standby cycle, the gate tunnel currents can be suppressed even if the gate insulating films are thin.

Power supply switching transistors SWa and SWb each may be formed of an MIS transistor of the buried channel type having thin gate insulating film.

The MIS transistors of the buried channel type can be applied to the MIS transistors, in which a gate tunnel current may occur, of the first to seventh embodiments.

According to the eighth embodiment of the present invention, as described above, the MIS transistors of the buried channel type are used for the respective MIS transistors, in which a gate tunnel current may occur, so that the gate tunnel current can be reliably suppressed, and the power consumption of the semiconductor device in the standby state can be reduced.

[Ninth Embodiment]

Figure 40A:
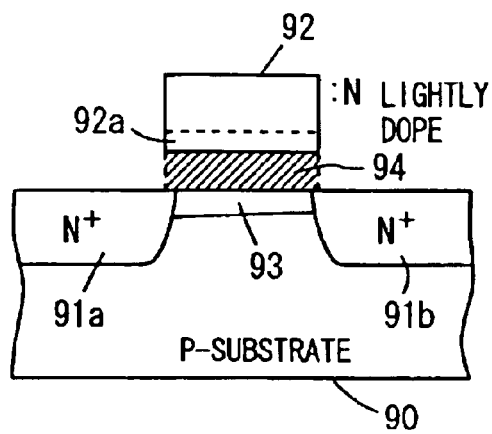
FIGS. 40A and 40B schematically show a sectional structure of an MIS transistor used in a ninth embodiment of the present invention.

FIG. 40 schematically shows a cross sectional structure of an N-channel MIS transistor used in a ninth embodiment of the present invention. In FIG. 40A, the N-channel MIS transistor includes N-type impurity regions 91a and 91b, which are formed, spaced away from each other, at a surface of P-type semiconductor substrate 90, as well as a gate electrode 92 formed on a channel region between impurity regions 91a and 91b with a gate insulating film 94 underlaid. Gate electrode 92 is doped with N-type impurity at a concentration slightly smaller than that of an N+ doped polycrystalline silicon gate in a normal surface channel type MIS transistor. In the structure using N− doped polycrystalline silicon for gate electrode 92, an inversion layer 93 is formed in the channel region of P-type substrate 90 when the MIS transistor is on.

In this state, a depletion layer 92a is formed more widely in gate electrode 92 that is in contact with gate insulating film 94. This is for the following reason. In the case where N doped polycrystalline silicon is used for gate electrode 92, the majority carriers are less and the energy band bending occurs to a larger extent, and the depletion layer is more likely to be formed, compared with the case using N+ doped polycrystalline silicon for the gate electrode. Depletion layer 92a is a region where electric charges are not present, and serves as an insulating film. Therefore, gate insulating film 94 and wide depletion layer 92a are interposed between gate electrode 92 and inversion layer 93 so that the insulating film for the gate tunnel current equivalently increases in thickness, and the gate tunnel barrier increases in height. Accordingly, the gate tunnel current can be suppressed by depletion layer 92a even in the structure using a thin gate insulating film having thickness Tox1.

Figure 40B:
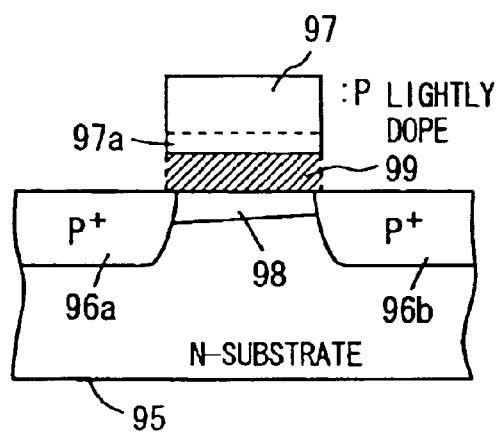

FIG. 40B schematically shows a cross sectional structure of a P-channel MIS transistor used in the ninth embodiment of the present invention. In FIG. 40B, P-channel MIS transistor includes P-type impurity regions 96a and 96b formed, spaced apart from each other, at a surface of an N-type substrate 95, and a gate electrode 97 formed on a channel region between impurity regions 96a and 96b with a gate insulating film 99 underlaid. Gate electrode 97 is formed of P doped polycrystalline silicon. This MIS transistor is of a surface channel type. However, a concentration of P-type impurities in gate electrode 97 is small. Therefore, in the case where an inversion layer 98 is formed in a channel region when this MIS transistor is on, a wider depletion layer 97a is formed in gate electrode 97 as a result of less majority carrier and band bending at the insulating film interface.

In the structure shown in FIG. 40B, therefore, a gate insulating film 99 and the wide depletion layer 97a are disposed between gate electrode 97 and inversion layer 98 so that the thickness of gate insulating film 99 can be equivalently increased, and the gate tunnel current can be suppressed.

In this ninth embodiment, the MIS transistors of the gate depletion type shown in FIGS. 40A and 40B are used as MIS transistors having large gate tunnel barriers.

Figure 41:
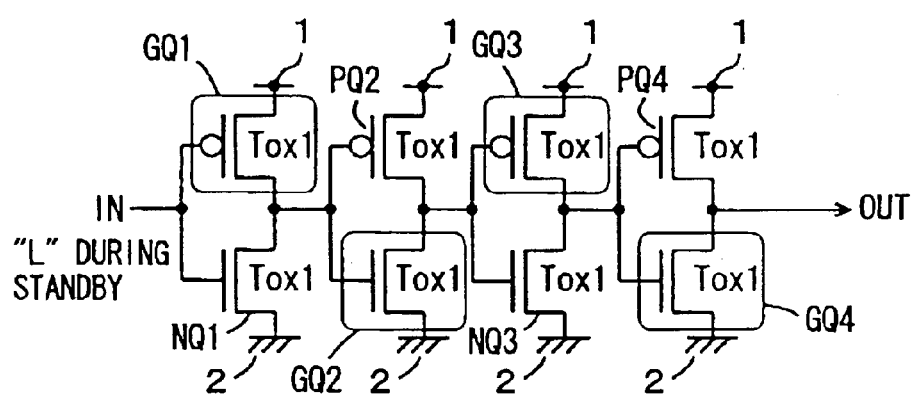
FIG. 41 shows a structure of a semiconductor device according to the ninth embodiment of the present invention.

FIG. 41 shows, by way of example, the structure of the semiconductor device according to the ninth embodiment of the present invention. The structure of the semiconductor device shown in FIG. 41 corresponds to the structure of the semiconductor device shown in FIG. 3. The structure shown in FIG. 41 uses MIS transistors GQ1–GQ4 of the gate depletion type each having a gate insulating film of thickness Tox1, instead of MIS transistors PQ1, PQ3, NQ2 and NQ4 having thick gate insulating films as shown in FIG. 3. Input signal IN is at L-level in the standby state. Therefore, MIS transistors GQ1–GQ4 of the gate depletion type are used for the MIS transistors that are on and may cause gate tunnel currents in the standby state. The MIS transistors of the surface channel type each having a gate insulating film of thickness Tox1are used for the other MIS transistors NQ1, PQ2, NQ3 and PQ4 that are on in the standby state. Each of MIS transistors GQ1–GQ4 of the gate depletion type has a wide depletion layer formed extending from the interface between the gate electrode and the insulating film into the gate electrode when turned on, and thereby the gate tunnel current is suppressed. Therefore, the gate tunnel current can be sufficiently suppressed even when the gate insulating film has sufficiently small thickness Tox1.

[Modification]

Figure 42:
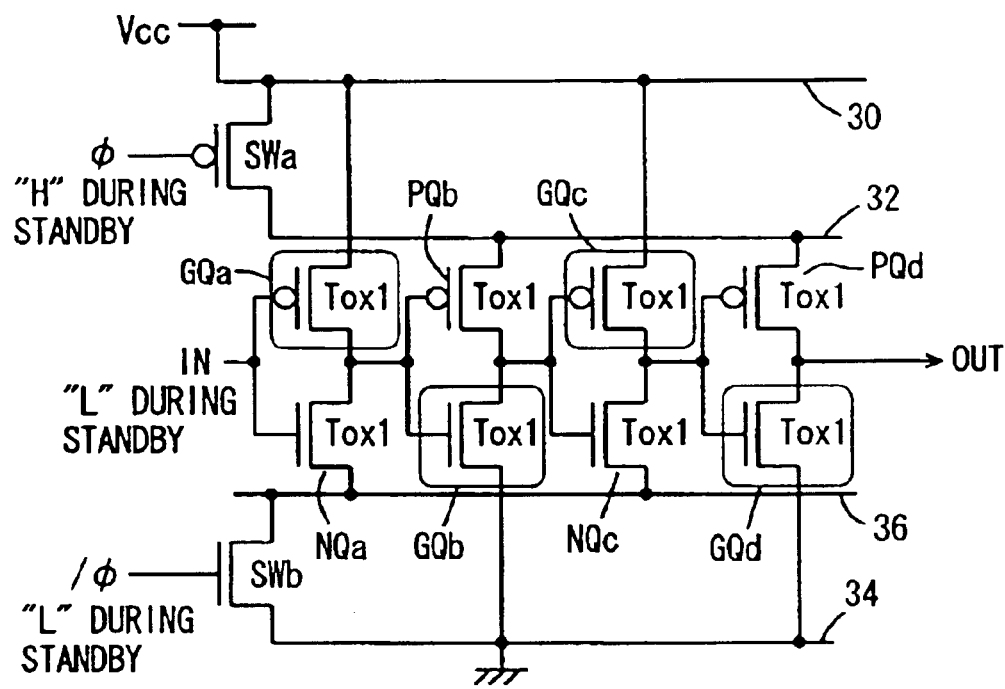
FIG. 42 shows a modification of the ninth embodiment of the present invention.

FIG. 42 shows a structure of a semiconductor device of a modification of an ninth embodiment of the present invention. The semiconductor device shown in FIG. 42 corresponds to the semiconductor device having the hierarchical power supply structure shown in FIG. 19. In the semiconductor device shown in FIG. 42, MIS transistors GQa, GQb, GQc and GQd are used instead of MIS transistors PQa, PQc, NQb and NQd which are on in the standby cycle. Structures other than the above are the substantially same as those shown in FIG. 19.

In the hierarchical power supply structure shown in FIG. 42, MIS transistors GQa–GQd of the gate depletion type are used for the MIS transistors that are on in the standby state and may cause gate tunnel currents therein. Therefore, in the structure shown in FIG. 42, the gate tunnel current in the standby state can be suppressed, and the off-leak current flowing through the MIS transistor in the off state can also be reduced.

MIS transistors of the gate depletion type each having the gate insulating film of thickness Tox1 may be used for switching transistors SWa and SWb. MIS transistors of another type having large gate tunnel barriers may be used for the switching transistors.

The MIS transistor of the gate depletion type described above may be applied to the MIS transistors, which may cause the gate tunnel currents therein, in the first to seventh embodiments.

According to the ninth embodiment of the present invention, as described above, the MIS transistor of the gate depletion type is used for the MIS transistor that is on in the standby state. Therefore, the gate tunnel current in the standby state can be reduced, and thereby the current consumption in the standby state can be reduced.

[Tenth Embodiment]

Figure 43:
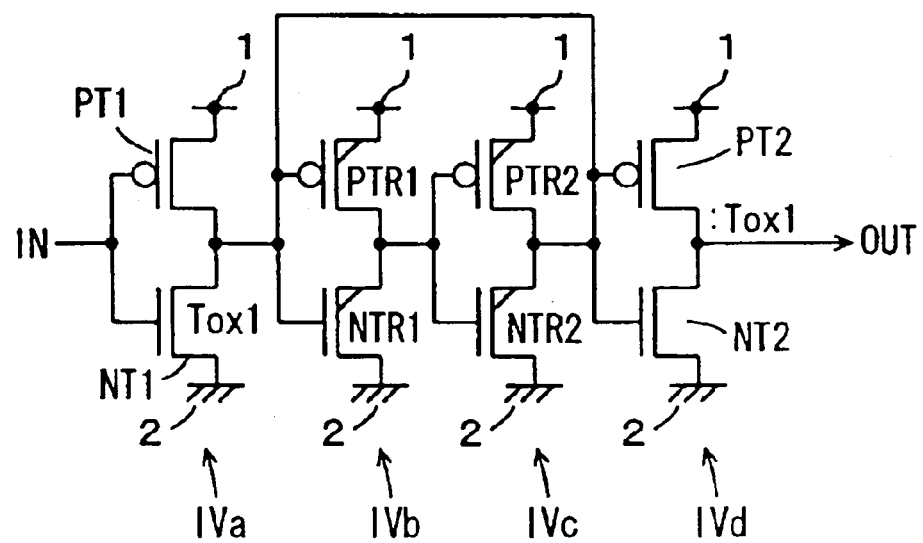
FIG. 43 shows a structure of a semiconductor device according to a tenth embodiment of the present invention.

FIG. 43 shows a structure of a semiconductor device according to a tenth embodiment of the present invention. In FIG. 43, the semiconductor device includes four CMOS inverter circuits Iva-IVd. The output of CMOS inverter circuit IVc is fed back to an input of CMOS inverter circuit IVb. Therefore, CMOS inverter circuits IVb and IVc form an inverter latch.

CMOS inverter circuit IVa includes P- and N-channel MIS transistors PT1 and NT1, and CMOS inverter circuit IVd includes P- and N-channel MIS transistors PT2 and NT2. Each of MIS transistors PT1, PT2, NT1 and NT2 has a gate insulating film of thickness Tox1.

CMOS inverter circuit IVb includes P- and N-channel MIS transistors PTR1 and NTR1. CMOS inverter circuit IVc includes P- and N-channel MIS transistors PTR2 and NTR2. Each of CMOS inverter circuits IVa–IVd uses the voltage on power supply node 1 and the voltage on ground node 2 as its operation power supply voltages.

MIS transistors PTR1, PTR2, NTR1 and NTR2 included in CMOS inverter circuits IVb and IVc have larger gate tunnel barriers than the transistors in CMOS inverter circuits IVa and IVd. These MIS transistors PTR1, PTR2, NTR1 and NTR2 may be MIS transistors having thick gate insulating films, or may be MIS transistors having deep well biases. Further, these MIS transistors PTR1, PTR2, NTR1 and NTR2 may be of the buried channel type or of the gate depletion type. In the following description, the MIS transistor which has a large gate tunnel barrier suppressing the gate tunnel current will be referred to as a "tunnel-current-reduced MIS transistor" or an "ITR transistor" hereinafter. MIS transistors having thin gate insulating films are used in circuits such as a logic circuit other than the above semiconductor device.

As shown in FIG. 43, ITR transistors PTR1, PTR2, NTR1 and NTR2 are utilized in the latch circuit, and the ITR transistors are used between power supply node 1 and ground node 2 so that the gate tunnel current can be suppressed even in such a case that the logic level of the input signal IN changes in accordance with the operating state, and therefore the logical levels in the standby state of the latch signals of inverters IVb and IVc forming the latch circuit cannot be predicted.

[First Modification]

Figure 44:
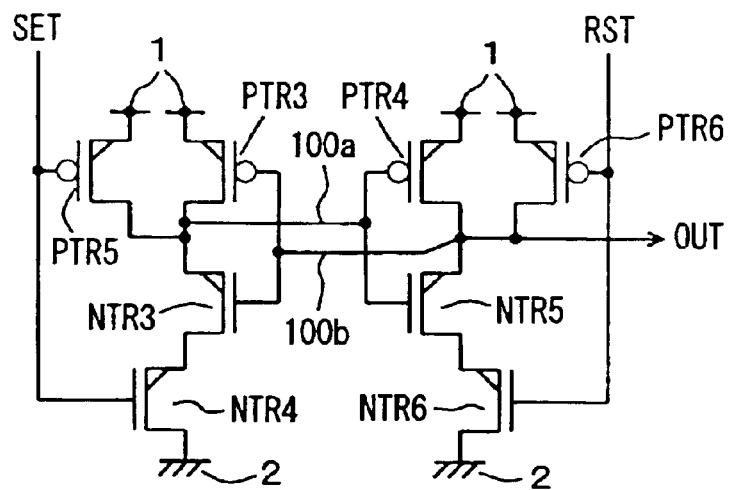
FIG. 44 shows a modification of the tenth embodiment of the present invention.

FIG. 44 shows a structure of a first modification of the tenth embodiment of the present invention. In FIG. 44, the semiconductor device includes a clocked CMOS inverter circuit for latching signals on nodes 100a and 100b. Clocked CMOS inverter circuit includes ITR transistors PTR3, NTR3 and NTR4 connected in series between power supply node 1 and ground node 2. The gates of ITR transistors PTR3 and NTR3 are connected to node 100b. ITR transistor NTR4 is supplied, on its gate, with a set signal SET.

The other CMOS inverter circuit includes ITR transistors PTR4, NTR5 and NTR6 connected in series between power supply node 1 and ground node 2. The gates of ITR transistors PTR4 and NTR5 are connected to node 100a, and ITR transistor NTR6 is supplied with a reset signal RST on its gate. Output signal OUT is generated from node 100b.

Figure 45:
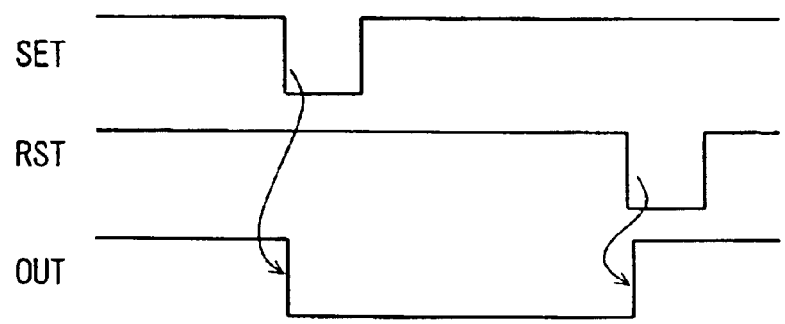
FIG. 45 is a signal waveform diagram representing an operation of the semiconductor device shown in FIG. 44.

The semiconductor device further includes transistors for establishing the signal states of nodes 100a and 100b, and more specifically includes a P-channel ITR transistor PTR5 which is turned on in response to set signal SET to transmit the voltage on power supply node 1 to node 100a, and a P-channel ITR transistor PTR6 which is turned on to transmit the voltage on power supply node 1 to node 100b when reset signal RST is at L-level. ITR transistors PTR3–PTR6 and NTR3–NTR6 have sufficiently large gate tunnel barriers, and can suppress the gate tunnel currents, as already described. An operation of the semiconductor device shown in FIG. 44 will now be described with reference to a signal waveform diagram of FIG. 45.

In the standby state (latch state), set signal SET and reset signal RST are both at H-level, and both ITR transistors PRT5 and PTR6 are off while ITR transistors NTR4 and NTR6 are on. Therefore, nodes 100a and 100b are held in the set or reset state. MIS transistors NTR4 and NTR6 are ITR transistors, and gate tunnel currents thereof are sufficiently small even in the on state. MIS transistors PTR3, PTR4, NTR3 and NTR5 are likewise ITR transistors, and gate tunnel currents thereof are sufficiently small. Therefore, the gate tunnel currents are sufficiently suppressed regardless of the signal voltage levels of nodes 100a and 100b, or regardless of the signal level of latch signal of the CMOS inverter latch.

When set signal SET falls to L-level, ITR transistor PTR5 is turned on, and ITR transistor NTR4 is turned off so that node 100a is driven to the power supply voltage level. ITR transistor PTR6 is off. When the voltage on node 100a attains H-level, the CMOS inverter circuit formed of ITR transistors PTR4, NTR5 and NTR6 sets the voltage level of node 100b to L-level. When set signal SET attains H-level, nodes 100a and 100b are held at H- and L-level, respectively. Therefore, output signal OUT falls from H-level to L-level in response to falling of set signal SET (i.e., the state changes from the reset state to the set state).

When reset signal RST falls to L-level under the set state, ITR transistor PTR6 is turned on, and ITR transistor NTR is turned off. Node 100b is driven to H-level so that ITR transistors PTR3, NTR3 and NTR4 drive node 100a to L-level. When reset signal RST rises to H-level, nodes 100a and 100b are held at L- and H-levels, respectively. Therefore, output signal OUT rises to H-level when reset signal RST falls to L-level.

When the semiconductor device shown in FIG. 44 is to be operated, set signal SET and reset signal RST are driven to L-level, or to the set and reset states in the operation. However, in the standby state where both set signal SET and reset signal RST are held at H-level, nodes 100a and 100b are held at H- and L-levels, or at L- and H-levels, respectively. Even in this state, the gate tunnel current is sufficiently suppressed because the ITR transistor is used in the CMOS inverter latch circuit.

ITR transistor PTR5 for setting and ITR transistor PTR6 for resetting are off in the standby state, and are selectively turned on only upon setting or resetting. Accordingly, ITR transistors PTR5 and PTR6 may be formed of MIS transistors having thin gate insulating films.

[Second Modification]

Figure 46:
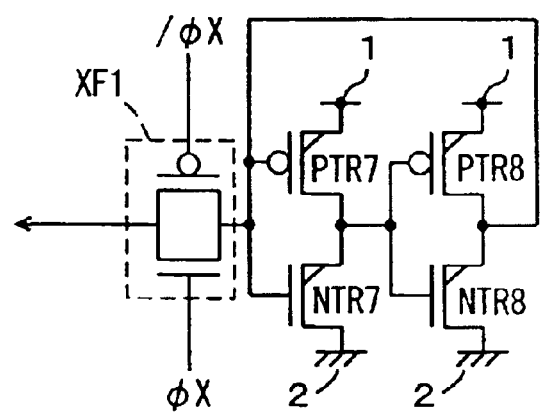
FIG. 46 shows a structure of a second modification of the tenth embodiment of the present invention.

FIG. 46 shows a structure of a second modification of the tenth embodiment of the present invention. In FIG. 46, P- and N-channel MIS transistors PTR7 and NTR7 connected between power supply node 1 and ground node 2 form one CMOS inverter circuit. Likewise, P- and N-channel MIS transistors PTR8 and NTR8 connected between power supply node 1 and ground node 2 form another CMOS inverter circuit. These CMOS inverter circuits form a latch circuit. The drains of MIS transistors PTR8 and NTR8 are connected to the gates of MIS transistors PTR7 and NTR7. The drains of MIS transistors PTR7 and NTR7 are connected to the gates of MIS transistors PTR8 and NTR8. MIS transistors PTR7, PTR8, NTR7 and NTR8 are formed of ITR transistors, respectively. The gates of MIS transistors PTR7 and NTR7 are connected to a transfer gate XF1, which is turned on in response to control clock signals $\phi X$ and $/\phi X$. Flow of signals via transfer gate XF1 depends on the current drive capabilities of MIS transistors PTR7, PTR8, NTR7 and NTR8. If the CMOS inverter circuit formed of MIS transistors PTR8 and NTR8 have large current drive capabilities, signals are output from the latch circuit via transfer gate XF1. In the case where MIS transistors PTR7 and NTR7 have larger current capabilities, An external signal is applied to this latch circuit via transfer gate XF1.

In the standby state, control clock signals $\phi X$ and $/\phi X$ are at L- and H-levels, respectively, transfer gate (transmission gate) XF1 is off, and MIS transistors PTR7, PTR8, NTR7 and NTR8 are in the latch state. In this state, the logical level of the latch signal depends on the logical level of the signal which was applied in the last active cycle. However, MIS transistors PTR7, PTR8, NTR7 and NTR8 are all formed of the ITR transistors, respectively, and the gate tunnel currents are sufficiently suppressed regardless of the logical level of the latch signal.

In the standby state, transfer gate XF1 is off, and the gate tunnel current hardly occurs. Therefore, a problem of increase in gate tunnel current does not occur even if transfer gate XF1 is formed of MIS transistors having thin gate insulating films.

According to the tenth embodiment of the present invention, as described above, the latch circuit is formed of the ITR transistors, and the gate tunnel current during the latching state can be suppressed.

[Eleventh Embodiment]

Figure 47:
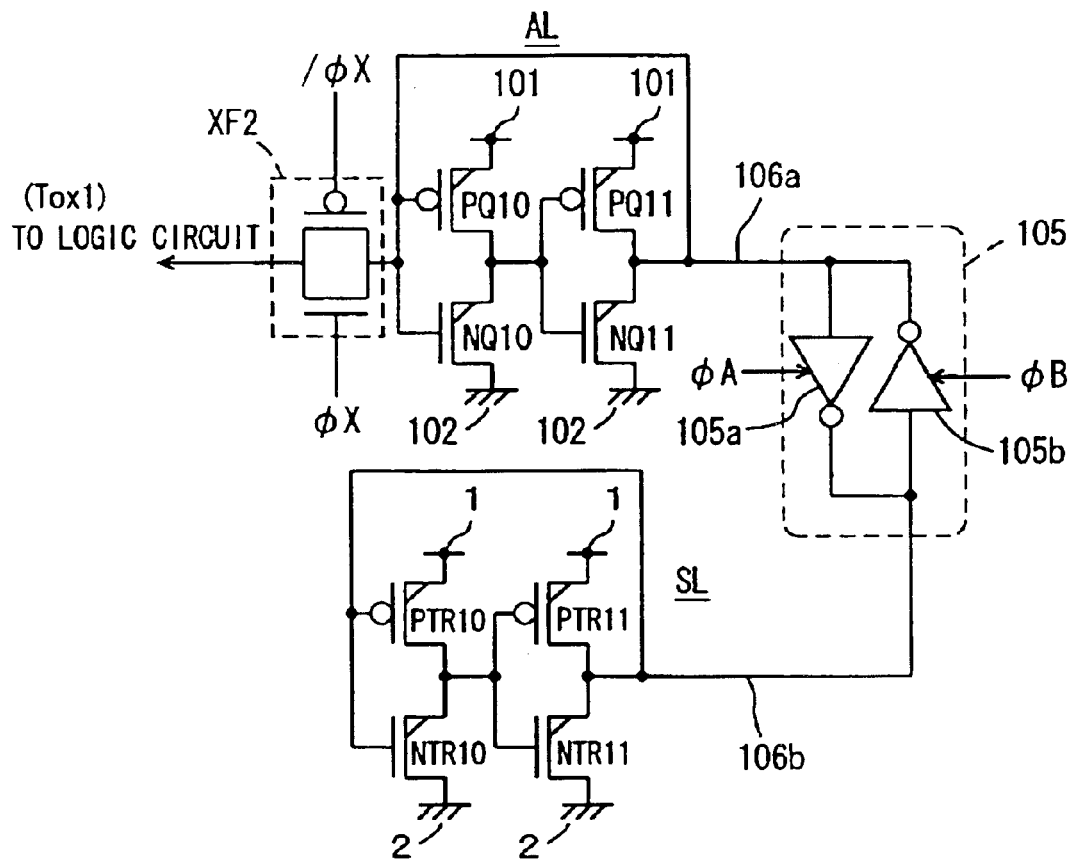
FIG. 47 schematically shows a structure of a semiconductor device according to an eleventh embodiment of the present invention.

FIG. 47 shows a structure of a semiconductor device according to an eleventh embodiment of the present invention. In FIG. 47, the semiconductor device includes an active latch circuit AL which is made active and latches a received signal in the active period, and a standby latch circuit SL which holds the latch signal of active latch circuit AL during the standby period. Active latch circuit AL is coupled to a logic circuit via a transfer gate XF2, which is turned on in response to control clock signals φX and /φX.

Active latch circuit AL includes a CMOS inverter circuit formed of MIS transistors PQ10 and NQ10, and a CMOS inverter circuit formed of MIS transistors PQ11 and NQ11. These CMOS inverter circuits are coupled to a power supply node 101 and a ground node 102. A drain node 106a of MIS transistors PQ11 and NQ11 is coupled to gates of MIS transistors PQ10 and NQ10. Transfer gate XF2 is coupled to the gates of MIS transistors PQ10 and NQ10. MIS transistors PQ10, PQ11, NQ10 and NQ11 each have a gate insulating film of the small thickness Tox1.

Standby latch circuit SL includes a CMOS inverter circuit formed of P- and N-channel MIS transistors PTR10 and NTR10 coupled between power supply node 1 and ground node 2, as well as P- and N-channel MIS transistors PTR11 and NTR11 coupled in series between power supply node 1 and ground node 2. These MIS transistors PTR10, PTR1, NTR10 and NTR11 are ITR transistors, in which gate tunnel currents are reduced. A drain node 106b of MIS transistors PTR11 and NTR11 is connected to the gates of MIS transistors PTR10 and NTR10. Each of latch circuits AL and SL is formed of a so-called inverter latch circuit.

This semiconductor device further includes a bidirectional transfer circuit 105 for bidirectionally transferring signals between the drain nodes 106a and 106b in accordance with transfer control signals φA and φB. Bidirectional transfer circuit 105 includes a clocked inverter circuit 105 responsive to a transfer instructing signal φA for inverting the signal on the drain node 106a for transmission to the drain node 106b, and a clocked inverter circuit 105b for transferring the signal on the node 106b to the node 106a in accordance with a transfer instructing signal φB.

Figure 48:
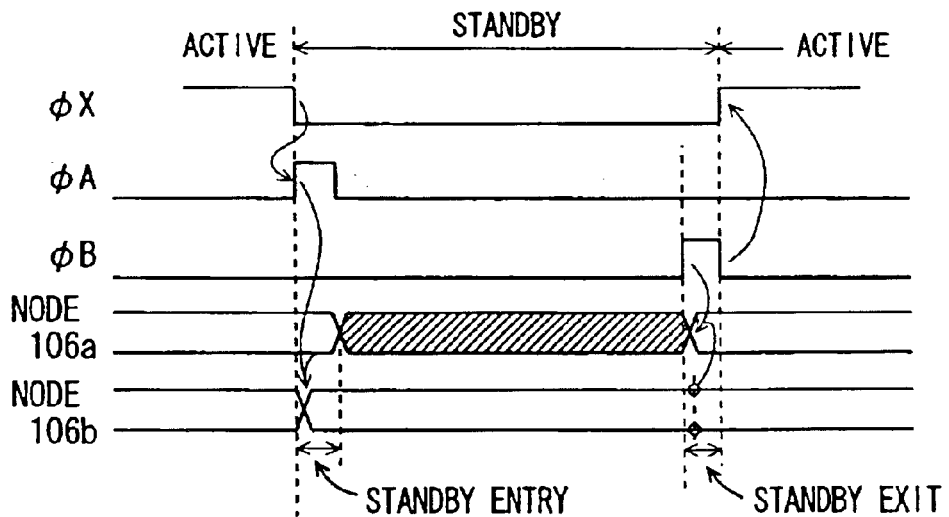
FIG. 48 is a signal waveform diagram representing an operation of the semiconductor device shown in FIG. 47.

In transition from the active period to the standby period, transfer instructing signal φA is activated, and the signal on the node 106a is transmitted to node 106b. In transition from the standby period to the active period, transfer instructing signal φB is activated, and the signal on the node 106b which is latched by standby latch circuit SL is transferred to active latch circuit AL. An operation of semiconductor device shown in FIG. 47 will now be described with reference to a signal waveform diagram of FIG. 48.

In the active period, control clock signal φX is at H-level, and transfer gate XF2 is on so that active latch circuit AL is coupled to the logic circuit. Active latch circuit AL latches the signal applied from the logic circuit, or applies the signal, which is latched by active latch circuit AL, to the logic circuit.

When the standby period starts subsequently to the completion of the active period, transfer instructing signal φA is activated, and the signal on the node 106a is transmitted to the node 106b. Standby latch circuit SL latches the signal on the node 106b. After completion of the signal transfer to standby latch circuit SL, supply of the power supply voltage to power supply node 101 stops, or a gate tunnel current reducing circuit provided for the nodes 101 and 102 is activated, so that the gate tunnel current in active latch circuit AL is reduced or suppressed.

In active latch circuit AL, therefore, the signal held on the node 106a becomes unstable after completion of the signal transfer to standby latch circuit SL. In contrast, standby latch circuit SL is always supplied with the operation power supply voltage from power supply node 1, and reliably latches the signal on node 106b.

In transition to the active period after completion of the standby period, transfer instructing signal φB is first activated, and the signal on node 106b is transmitted to node 106a via clocked inverter circuit 105b. Thereby, active circuit AL returns to the state of holding the signal latched in the last active cycle. Before activation of transfer instructing signal φB, power supply voltage Vcc and ground voltage GND (=Vss) are supplied to power supply node 101 and ground node 102 of active latch circuit AL, respectively.

When the signal transfer to active latch circuit AL is completed, control clock signal φX attains H-level, and active latch circuit AL is coupled to the logic circuit.

During the standby period, therefore, standby latch circuit SL including ITR transistors as its components latches a signal, and the active latch circuit is set to the state where the gate tunnel current is suppressed. Accordingly, the current consumption in the standby state can be reduced. In transition to the active period, the signal saved in standby latch circuit SL is transferred to active latch circuit AL so that the active latch circuit AL can be accurately restored to the original state.

Figure 49A:
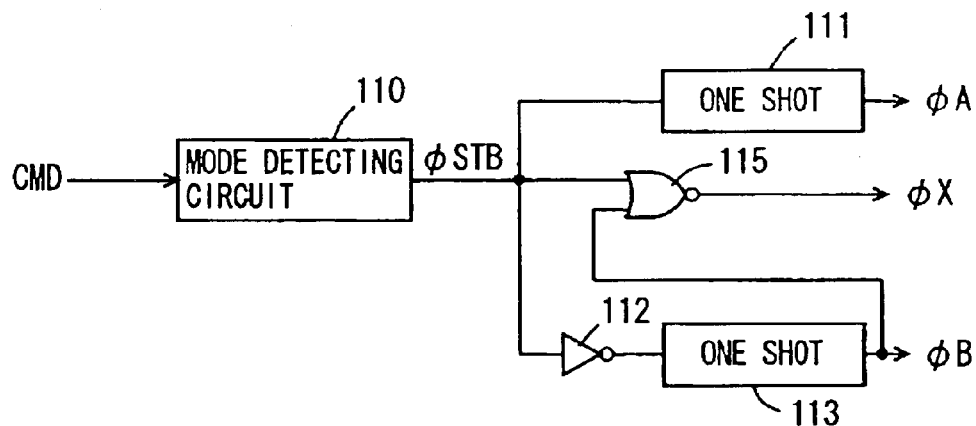
FIG. 49A schematically shows a structure of a portion for generating a control signal in the semiconductor device shown in FIG. 47.

FIG. 49A schematically shows a structure of a portion for generating transfer instructing signals φA and φB shown in FIG. 47. In FIG. 49A, the transfer instructing signal generating portion includes: a mode detecting circuit 110 which generates a standby instructing signal φSTB in accordance with an operation mode instructing signal CMD; a one shot pulse generating circuit 111 which produces a one shot pulse signal in response to activation of standby instructing signal φSTB received from mode detecting circuit 110; an inverter 112 which inverts standby instructing signal φSTB; a one shot pulse generating circuit 113 which generates a one shot pulse signal in response to rising of the output signal of inverter 112; and an NOR circuit 115 which receives the output signal of one shot pulse generating circuit 113 and standby instructing signal φSTB generated from mode detecting circuit 110.

Figure 49B:
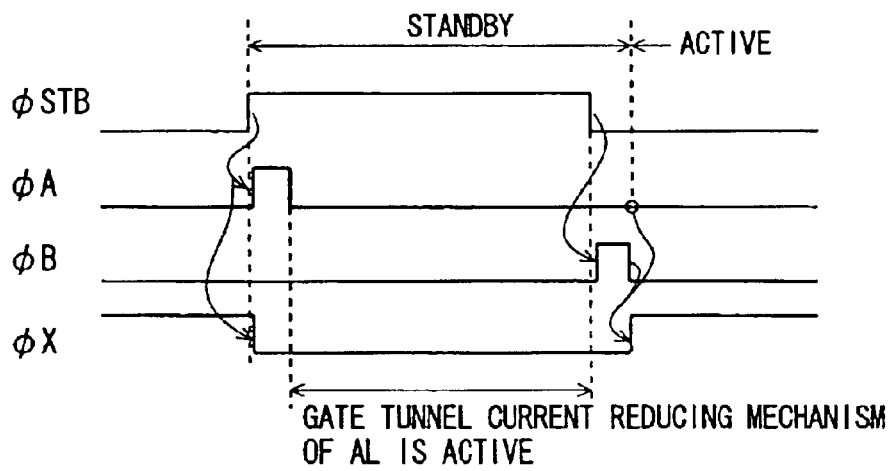
FIG. 49B is a signal waveform diagram representing an operation of the control signal generating portion shown in FIG. 49A.

One shot pulse generating circuit 111 generates transfer instructing signal φA, and one shot pulse generating circuit 113 generates transfer instructing signal φB. NOR circuit 115 generates control clock signal φX. An operation of the transfer instructing signal generating portion shown in FIG. 49A will now be described with reference to a signal waveform diagram of FIG. 49B.

During the active period, mode detecting circuit 110 keeps standby instructing signal φSTB at L-level. Therefore, one shot pulse signals φA and φB are not generated. Accordingly, control clock signal φX from NOR circuit 115 is at H-level in the active period, and transfer gate XF2 shown in FIG. 47 is conductive.

If operation mode instructing signal CM1 applied to mode detecting circuit 110 is an active period stop instructing signal (e.g., a sleep mode instructing signal), mode detecting circuit 110 raises standby instructing signal φSTB to H-level. In response to the rising of standby instructing signal φSTB, one shot pulse generating circuit 111 generates a one shot pulse signal so that transfer instructing signal φA is activated. In this operation, control clock signal φX from NOR circuit 115 falls to L-level in response to rising of standby instructing signal φSTB. Accordingly, when transfer gate XF2 shown in FIG. 47 is non-conductive, bidirectional transfer circuit 105 transfers the signal from active latch circuit AL to standby latch circuit SL. When transfer instructing signal φA is deactivated, a mechanism for reducing the gate tunnel current (gate tunnel current reducing mechanism) of active latch circuit AL is deactivated (activation of the gate tunnel current reducing mechanism, or stop of supply of power supply voltage).

When operation mode instructing signal CMD is the standby period stop instructing signal (e.g., sleep mode stop instructing signal), mode detecting circuit 110 lowers standby instructing signal φSTB to L-level. In response to falling of standby instructing signal φSTB, the output signal of inverter 112 rises, and one shot pulse generating circuit 113 generates a one shot pulse signal so that transfer instructing signal φB is activated. Even when standby instructing signal φSTB attains L-level, transfer instructing signal φB is at H-level so that control clock signal φX maintains the L-level. In accordance with standby instructing signal φSTB, the gate tunnel current reducing mechanism is deactivated so that active latch circuit AL is supplied with the operation power supply voltage. Therefore, by transferring the signal from standby latch circuit SL to active latch circuit AL in response to activation of transfer instructing signal φB, active latch circuit AL reliably latches the transferred signal.

In the structure shown in FIG. 49A, NOR circuit 115 may be replaced with a set/reset flip-flop that is set in response to rising of transfer instructing signal φB and is reset in response to falling of standby instructing signal φSTB. With such flip-flop, after transfer instructing signal φB is deactivated and the transfer of the signal from standby latch circuit SL to active latch circuit AL is completed, control clock signal φX can be reliably set to H-level.

The gate tunnel current reducing mechanism for active latch circuit AL may be adapted to be deactivated in response to deactivation of standby instructing signal φSTB, and to be activated in response to falling of transfer instructing signal φA. For example, a rise-delayed signal of standby instructing signal φSTB can be utilized as the signal for controlling the gate tunnel current reducing mechanism of active latch circuit AL.

Control clock signal φX may be formed of an inverted, fall-delayed signal of standby instructing signal φSTB.

[First Modification]

Figure 50:
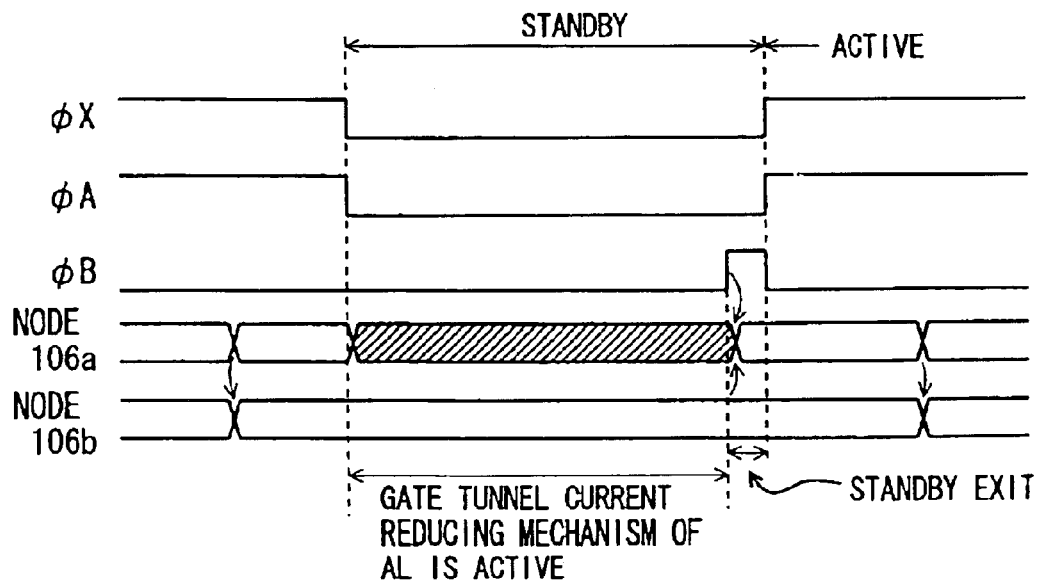
FIG. 50 shows a modification of the operation of the semiconductor device shown in FIG. 49A.

FIG. 50 is a signal waveform diagram representing an operation of a first modification of the eleventh embodiment of the present invention. This first modification utilizes the semiconductor device shown in FIG. 47, and thus utilizes active latch circuit AL and standby latch circuit SL. Bidirectional transfer circuit 105 transfers the signal between active latch circuit AL and standby latch circuit SL.

In the structure of the first modification, transfer instructing signal φA changes in synchronization with control clock signal φX. During the active period, therefore, the latch signal of active latch circuit AL is transmitted to standby latch circuit SL via bidirectional transfer circuit 105. During the active period, therefore, an operation on active latch circuit AL is effected, and a change in signal level of active latch circuit AL is transmitted to standby latch circuit SL via bidirectional transfer circuit 105 without a delay when a change occurs in logical level of the latch signal of active latch circuit AL.

In the standby cycle, control clock signal φX attains L-level, and transfer gate XF2 is off. Also, transfer instructing signal φA is at L-level, and clocked inverter circuit 105a is in the output high-impedance state. In response to deactivation of control clock signal φX, active latch circuit AL and standby latch circuit SL are isolated from each other. In active latch circuit AL, the gate tunnel current reducing mechanism is activated, and the latch signal of active latch circuit AL is in the indefinite state. However, standby latch circuit SL continues latching of the received signal during the standby period because the power supply voltage is still supplied.

In transition to the active period after the standby period, transfer instructing signal φB is first activated, and the signal latched in standby latch circuit SL is transferred to active latch circuit AL via bidirectional transfer circuit 105. In this case, the gate tunnel current reducing mechanism of active latch circuit AL is already made inactive, and active latch circuit AL reliably latches the signal applied from standby latch circuit SL via bidirectional transfer circuit 105.

When transfer instructing signal φB is deactivated, control clock signal φX and transfer instructing signal φA attains H-level of the active state. Therefore, a change in latch signal of active latch circuit AL is immediately transmitted to standby latch circuit SL.

This standby latch circuit SL is formed of the ITR transistors having large gate tunnel barriers, and therefore operate more slowly than an MIS transistor having a thin gate insulating film. Therefore, by transferring the latch signal from active latch circuit AL to standby latch circuit SL during the active period, it is not necessary to consider the latch/transfer timing, and the transfer period upon transition to the active period can be shortened. Further, a signal can be accurately transferred from active latch circuit AL to standby latch circuit SL for latching it by standby latch circuit SL.

Although the operation speed of standby latch circuit SL is slower than that of active latch circuit AL, standby latch circuit SL merely latches the signal in the standby state, and the latched signal is in the fixed state. In transition from the standby period to the active period, active latch circuit AL can accurately and quickly latch the transferred signal in accordance with the latch signal of standby latch circuit SL when the signal is transferred to active latch circuit AL via bidirectional transfer circuit 105.

Figure 51A:
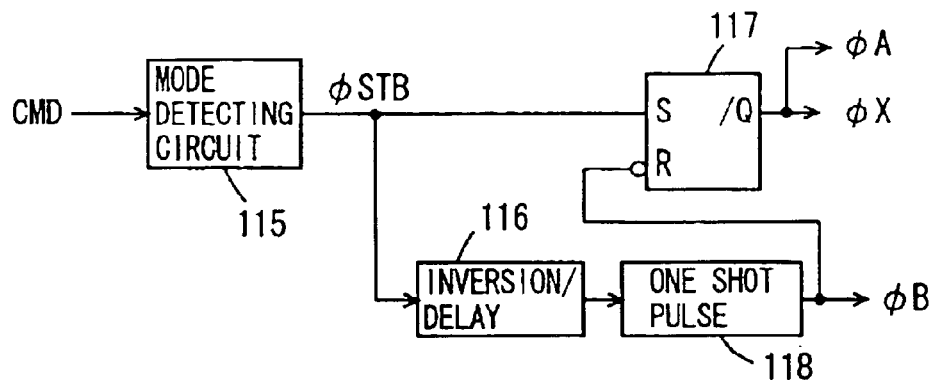
FIG. 51A shows a modification of a control signal generating portion for the semiconductor device shown in FIG. 47.

FIG. 51A schematically shows a structure of a control signal generating portion, which generates a control clock signal φX as well as transfer instructing signals φA and φB shown in FIG. 50. In FIG. 51A, the control signal generating portion includes: a mode detecting circuit 115 which activates standby instructing signal φSTB when the standby mode is instructed in accordance with operation mode instructing signal CMD; a set/reset flip-flop 117 which is set in response to the rising of standby-instructing signal φSTB; an inverting and delaying circuit 116 which generates a signal by inverting and delaying by a predetermined period the standby instructing signal φSTB; and a one shot pulse generating circuit 118 which generates a one shot pulse signal in response to the rising of the output signal of inverting and delaying circuit 116.

Figure 51B:
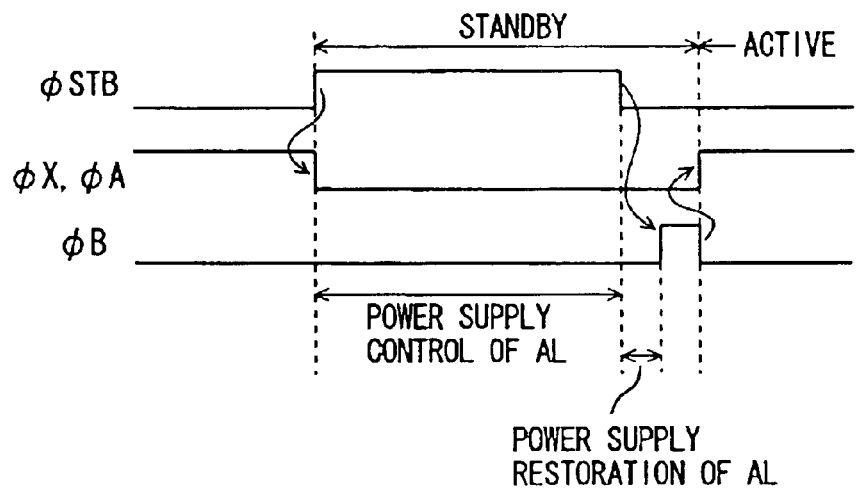
FIG. 51B is a signal waveform diagram representing an operation of the device shown in FIG. 51A.

Set/reset flip-flop 117 is reset in response to falling of the one shot pulse generated from one shot pulse generating circuit 118. Set/reset flip-flop 117 generates transfer instructing signal φA and control clock signal φX from its output Q. An operation of the control signal generating portion shown in FIG. 51A will now be described with reference to a signal waveform diagram of FIG. 51B.

In the active period, standby instructing signal φSTB is at L-level, and set/reset flip-flop 17 is in the reset state. Control clock signal φX and transfer instructing signal φA are both at H-level. When operation mode instructing signal CMD designates the standby mode, standby instructing signal φSTB rises to H-level. In response to the rising of standby instructing signal φSTB, set/reset flip-flop 117 is set to lower control clock signal φX and transfer instructing signal φA from H-level to L-level. At this time, control of the power supply voltage of active latch circuit AL (activation of the gate tunnel current reducing mechanism by stop of supply of the power supply voltage and others) is performed in response to the falling of standby instructing signal φSTB.

When the operation mode instructing signal CMD instructs the stop of the standby period, standby instructing signal φSTB generated from mode detecting circuit 115 is deactivated. Inverting and delaying circuit 116 delays standby instructing signal φSTB by a predetermined time. For the delay time of inverting and delaying circuit 116, recovery of the power supply for active latch circuit AL (deactivation of the gate tunnel current reducing mechanism) is performed in response to deactivation of standby instructing signal φSTB. When a predetermined period of time elapses, the output signal of inverting and delaying circuit 116 rises, and the transfer instructing signal φB generated from one shot pulse generating circuit 118 is activated for a predetermined period. After transfer instructing signal φB reaches L-level, set/reset flip-flop 117 is reset, and transfer instructing signal φA and control clock signal φX rise to H-level. Responsively, active latch circuit AL is coupled to the logic gate via transfer gate XF2 after the signal is transferred from standby latch circuit SL to active latch circuit AL.

After recovery of the power supply voltage for active latch circuit AL, the latch signal is transferred from standby latch circuit SL to active latch circuit AL, and therefore active latch circuit AL can accurately latch the transferred signal.

In clocked inverter circuits 105a and 105b of the bidirectional transfer circuit, both the gate tunnel current and the sub-threshold leak current (off-leak current) can be reduced by employing ITR transistors as the MIS transistors in the clock controlled portion.

[Second Modification]

Figure 52:
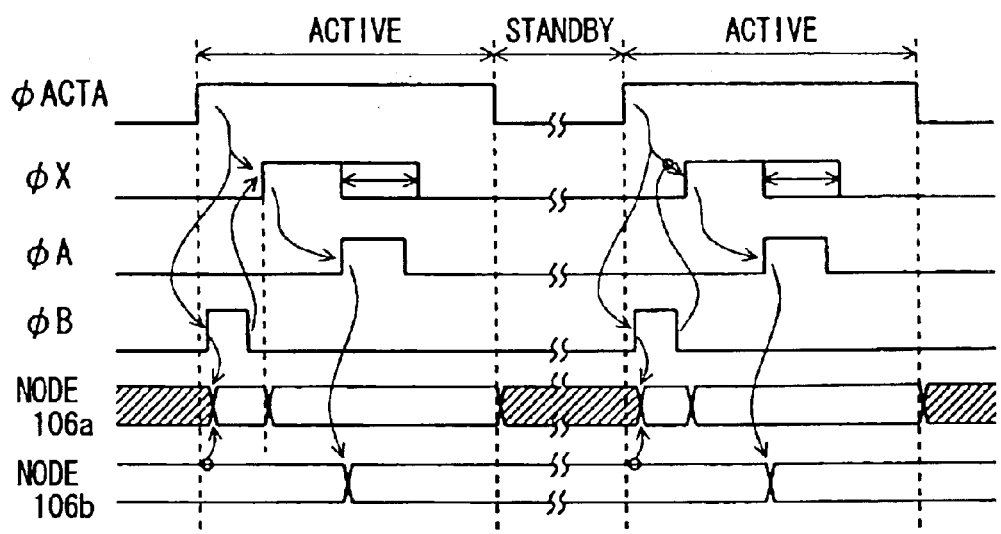
FIG. 52 shows a modification of the operation of the semiconductor device shown in FIG. 47.

FIG. 52 is a signal waveform diagram representing an operation of a second modification of the eleventh embodiment of the present invention. A semiconductor device employed for the operation in FIG. 52 includes active latch circuit AL and standby latch circuit SL as well as bidirectional transfer circuit 105 shown in FIG. 47. In this second modification, data transfer is executed between active latch circuit AL and standby latch circuit SL in accordance with an active cycle instructing signal φACTA, which instructs the cycle for an operation to active latch circuit AL.

When active cycle instructing signal φACTA is activated, transfer instructing signal φB is first activated, and bidirectional transfer circuit 105 executes data transfer from standby latch circuit SL to active latch circuit AL. At this point of time, power supply voltage is already stabilized in active latch circuit AL. Then, transfer instructing signal φB is deactivated, and signal transfer from standby latch circuit SL to active latch circuit AL is completed. Then, control dock signal φX becomes active, and transfer gate XF2 is turned on. Responsively, active latch circuit AL is coupled to the corresponding logic circuit, and processing such as transfer of the latch signal or latching of the signal received from the logic circuit is executed.

When the processing for active latch circuit AL is completed, transfer instructing signal φA is activated with a predetermined delay from rising of control clock signal X. In accordance with this activation of transfer instructing signal φA, clocked inverter circuit 105a is activated, and the signal is transferred from active latch circuit AL to standby latch circuit SL. When a predetermined time elapses after completion of the signal transfer from active latch circuit AL to standby latch circuit SL, active cycle instructing signal φACTA is deactivated, and the operation cycle for active latch circuit AL is completed.

In response to this deactivation of active cycle instructing signal φACTA, the power supply voltage for active latch circuit AL is so controlled as to reduce the gate tunnel current (e.g., by stopping supply of the power supply voltage). Standby latch circuit SL receives and latches the signal held by active latch circuit AL in response to activation of transfer instructing signal φA in a period of the active state of active cycle instructing signal φACTA. Therefore, fast operation performance can be ensured without adversely affecting the logical processing speed in the active period, and further the current consumption during the active period can be reduced. Thereafter, the above operation is repeated every time the operation for the active latch circuit AL is performed.

Figure 53:
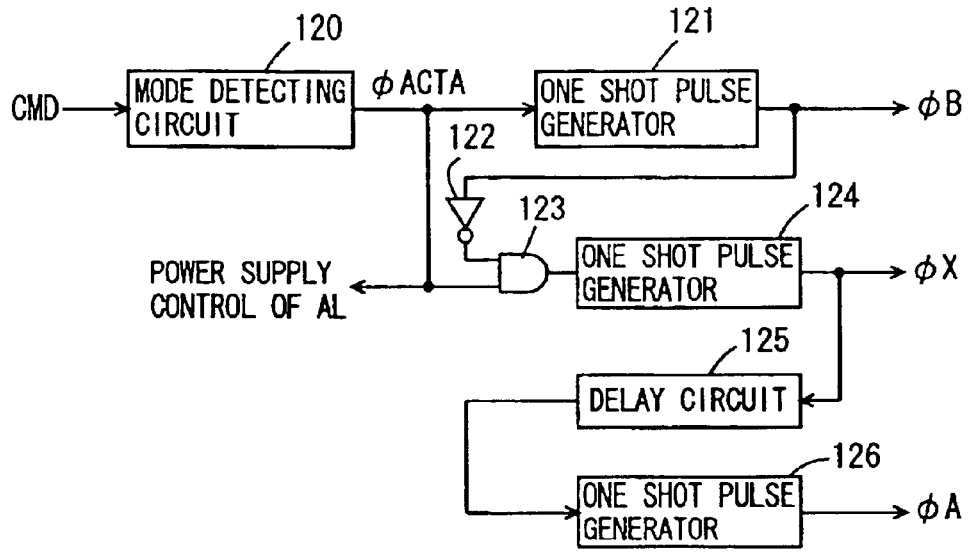
FIG. 53 schematically shows a structure of a portion for generating a control signal shown in FIG. 52.

FIG. 53 schematically shows a structure of a control signal generating portion generating the respective signals shown in FIG. 52. In FIG. 53, the control signal generating portion includes: a mode detecting circuit 120 for generating active cycle instructing signal φACTA indicative of a period, for which the operation for active latch circuit AL is to be performed, in accordance with operation mode instructing signal CMD; a one shot pulse generating circuit 121 which generates a one shot pulse signal in response to activation of active cycle instructing signal φACTA generated from mode detecting circuit 120; an inverter circuit 122 which inverts the pulse signal received from one shot pulse generating circuit 121; an AND circuit 123 which receives the output signal of inverter circuit 122 and active cycle instructing signal φACTA; a one shot pulse generating circuit 124 which generates a one shot pulse signal in response to rising (activation) of the output signal of AND circuit 123; a delay circuit 125 which delays by a predetermined time the pulse signal generated by one shot pulse generating circuit 124; and a one shot pulse generating circuit 126 which generates a one shot pulse signal in response to rising of the output signal of delay circuit 125.

One shot pulse generating circuits 121 and 126 generate transfer instructing signals φB and φA, respectively. One shot pulse generating circuit 124 generates control clock signal φX. Delay circuit 125 has a delay time equal to a period required for such an operation that processing is effected on the signal for active latch circuit AL and the latch signal of active latch circuit AL attains the definite state.

In the control signal generating portion shown in FIG. 53, when operation mode instructing signal (or command) CMD is applied, mode detecting circuit 120 activates active cycle instructing signal φACTA for a period of the operation on active latch circuit AL being active. This corresponds, for example, to such a structure that the whole device including the active latch circuit operates in synchronization with a clock signal CLK, and active cycle instructing signal φACTA is activated for a predetermined period of time at the same timing as activation of the active latch circuit after elapsing of predetermined number of cycles of this clock signal CLK when operation mode instructing signal CMD instructs a certain operation mode.

When active cycle instructing signal φACTA is activated, transfer instructing signal φB generated from one shot pulse generating circuit 121 is activated, and the signal transfer from standby latch circuit SL to active latch circuit AL is performed. When active cycle instructing signal φACTA is made active, and transfer instructing signal φB is made inactive, one shot pulse generating circuit 124 activates control clock signal φX. Thus, control clock signal φX is activated, and active latch circuit AL is coupled to the corresponding logic circuit after the power supply voltage is recovered in active latch circuit AL owing to the power supply control by active cycle instructing signal φACTA, and after the data transfer from standby latch circuit SL is completed.

When control clock signal φX is activated, transfer instructing signal φA is generated by one shot pulse generating circuit 126 after elapsing of the delay time of delay circuit 125. Therefore, transfer instructing signal φA is activated to execute the signal transfer from active latch circuit AL to standby latch circuit SL after the signal processing for active latch circuit AL by the logic circuit is completed, and the latch signal of active latch circuit AL is fixed. Within the cycle of execution of the processing on active latch circuit AL, the signal of standby latch circuit SL is transferred. Therefore, an additional cycle is not required for this transfer. Further, the signal transfer from active latch circuit AL to standby latch circuit SL does not adversely affect the processing operation of the logic circuit, and reduction in operation speed of the whole device can be prevented.

When transfer instructing signal φA is activated, control clock signal φX is deactivated in accordance with appropriate timing, and transfer gate XF2 is turned off.

[Third Modification]

Figure 54:
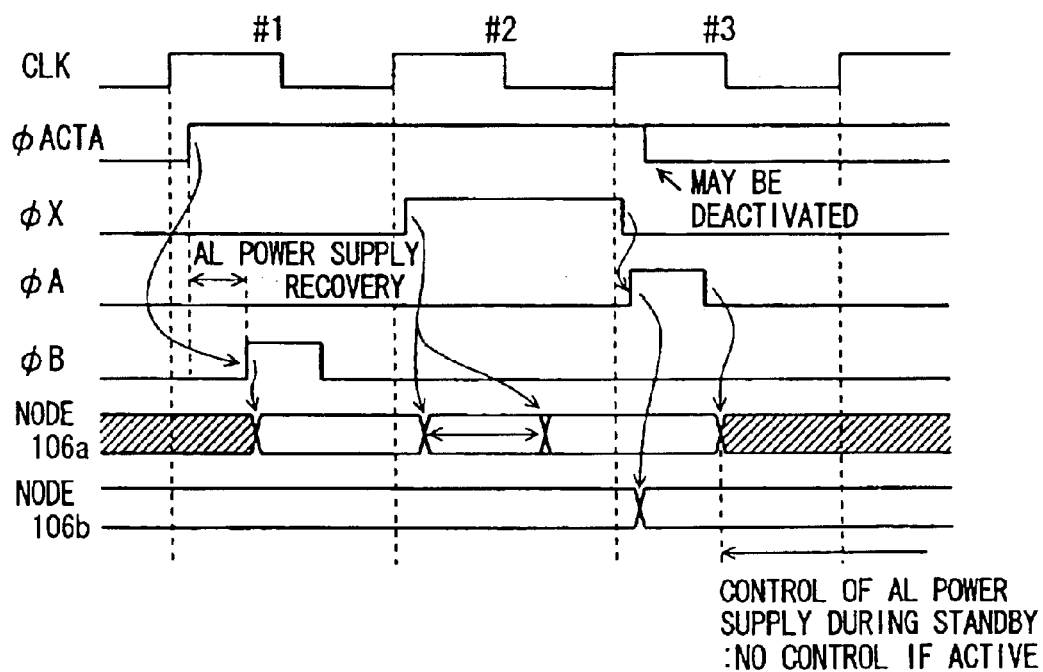
FIG. 54 is a signal waveform diagram representing still another operation of the semiconductor device shown in FIG. 47.

FIG. 54 is a signal waveform diagram representing an operation of a third modification of the eleventh embodiment of the present invention. In the third modification, clock signal CLK defines the operation cycle. The structure of the semiconductor device is the same as that shown in FIG. 47, and includes active latch circuit AL, standby latch circuit SL, bidirectional transfer circuit 105 for signal transfer between latch circuits AL and SL, and transfer gate XF2 which couples active latch circuit AL to the logic circuit. An operation of the third modification will now be described with reference to a signal waveform diagram of FIG. 54.

In a cycle #1 of clock signal CLK, active cycle instructing signal φACTA is activated in accordance with an operation mode instructing signal. In accordance with activation of active cycle instructing signal φACTA, power supply recovery processing for active latch circuit AL is performed. When this processing of recovery of the power supply for active latch circuit AL is completed, transfer instructing signal φB is activated, and the signal latched on node 106b of standby latch circuit SL is transferred to node 106a of active latch circuit AL via bidirectional transfer circuit 105. Responsively, the signal potential on node 106a of active latch circuit AL attains the level determined by the latch signal of standby latch circuit SL.

In a cycle #2 of clock signal CLK, control clock signal φX which is an activating signal for active latch circuit AL is made active, and active latch circuit AL is coupled to the logic circuit via transfer gate XF2. The logic circuit predeterminedly processes the signal latched by active latch circuit AL.

In this cycle #2 of clock signal CLK, necessary processing is performed, and the signal for active latch circuit AL is processed. In accordance with this signal processing, the signal potential on node 106a of active latch circuit AL changes. The timing of this change is determined by the signal processing timing of the logic circuit. Accordingly, FIG. 54 shows the timing of signal potential change of node 106a as it has a certain time width.

After the processing for active latch circuit AL is completed in clock cycle #2, control clock signal φfX is deactivated in a next cycle #3. Subsequently to the deactivation of control clock signal φX, transfer instructing signal φA is activated, and the signal latched by active latch circuit AL is transferred to standby latch circuit SL. When the signal transfer to standby latch circuit SL is completed, the power supply for active latch circuit AL is so controlled as to reduce the gate tunnel current.

Active cycle instructing signal φACTA may be inactive in clock cycle #3, or may be held in the active state while other logic circuits are operating.

As shown in FIG. 54, a signal is transferred from active latch circuit AL to standby latch circuit SL in the cycle following the cycle in which the signal processing for active latch circuit AL is performed. Thereby, it is not necessary to consider the time for transfer from active latch circuit AL to SL when determining the cycle period of the clock signal, and the fast operation feature is not adversely affected. Further, it is possible to reduce the current consumption of active latch circuit AL in the standby state (standby cycle).

Figure 55:
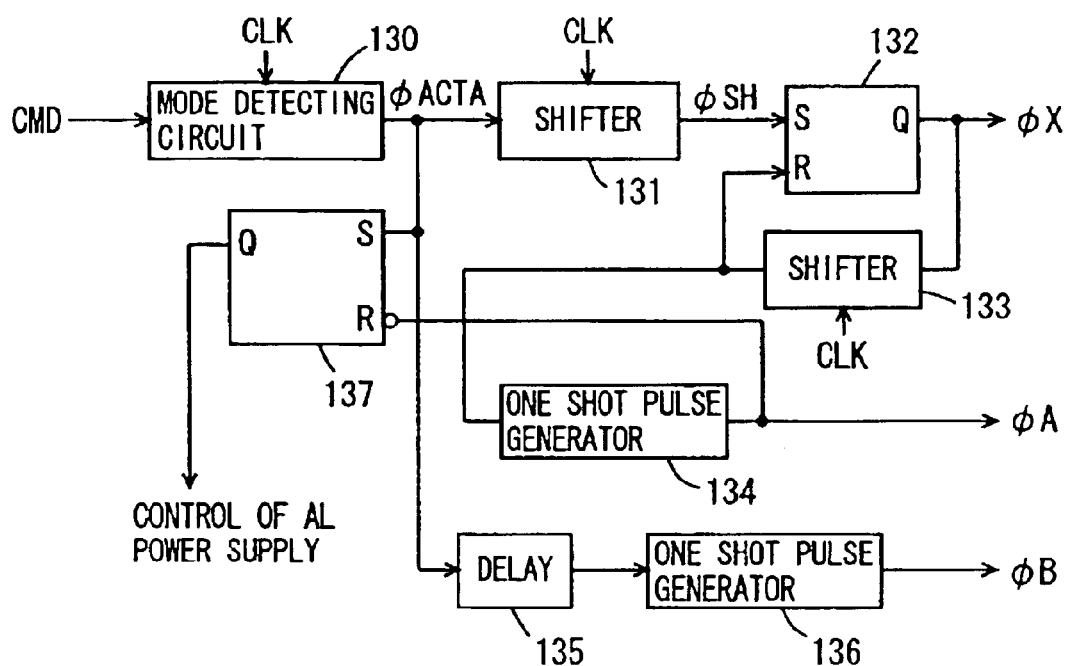
FIG. 55 schematically shows a structure of a portion generating a control signal shown in FIG. 54.

FIG. 55 schematically shows a structure of a control signal generating portion for generating various signals shown in FIG. 54. In FIG. 55, the control signal generating portion includes: a mode detecting circuit 130 which receives operation mode instructing signal CMD and clock signal CLK, and activates active cycle instructing signal φACTA at the rising of dock signal CLK in accordance with the state of operation mode instructing signal CMD; a shifter 131 which transfers active cycle instructing signal φACTA in accordance with clock signal CLK; a set/reset flip-flop 132 which is set in response to rising of an output signal φSH of shifter 131 to set control clock signal φfX to H-level; a shifter 133 which transfers control clock signal φX in accordance with clock signal CLK; a one shot pulse generating circuit 134 which produces a one shot pulse signal in response to rising of the output signal of shifter 133; a delay circuit 135 which delays active cycle instructing signal φACTA by a predetermined time; and a one shot pulse generating circuit 136 which generates a one shot pulse signal in response to rising of the output signal of delay circuit 135.

Set/reset flip-flop 132 generates control clock signal φX, and one shot pulse generating circuits 134 and 136 generate transfer instructing signals φA and φB, respectively. Delay circuit 135 has a delay time equal to the time required for recovery of the operation power supply voltage of active latch circuit AL when active cycle instructing signal φACTA is activated. Owing to provision of delay circuit 135, the signal transfer from standby latch circuit SL to active latch circuit AL can be performed upon transition to the active cycle after the power supply voltage of active latch circuit AL is sufficiently restored. Therefore, accurate signal latching by the active latch circuit can be ensured.

Shifters 131 and 133 transfer the received signals for predetermined cycle periods to delay the received signals, respectively. Accordingly, the delay times of shifters 131 and 133 can be set in a unit of half the cycle of clock signal CLK. By adjusting the number of transfer cycles of shifter 131, the clock cycle period of the active state of control clock signal φX can be set to either cycle #1 or cycle #3 shown in FIG. 54. By using shifter 133, transfer instructing signal φA can be produced after deactivation of control clock signal φX. By shifter 133, the active period of control clock signal φfX can be adjusted in a unit of half the clock cycle.

This control signal generating portion further includes a set/reset flip-flop 137 which is set in response to rising of active cycle instructing signal φACTA, and is reset in response to falling of transfer instructing signal φA. The signal generated from output Q of set/reset flip-flop 137 is used for the power supply control on active latch circuit AL and is used, in the case of the hierarchical power supply structure, as control clock signal φ for the power supply switch transistor.

In the signal waveform diagram shown in FIG. 54, if the number of clock transfer cycles of shifter 131 is set to 0, the signal transfer between active latch circuit AL and standby latch circuit SL is performed with clock cycles #1 and #2 being one clock cycle.

[Fourth Modification]

Figure 56A:
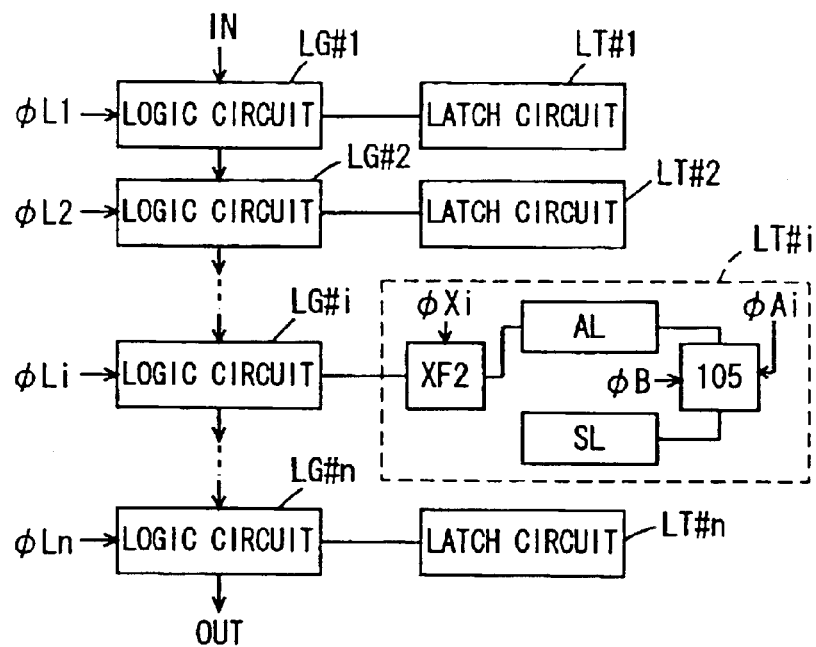
FIG. 56A shows a modification of the semiconductor device of the eleventh embodiment of the present invention.

FIG. 56A schematically shows a structure of a fourth modification of the eleventh embodiment of the present invention. In the structure shown in FIG. 53A, a plurality of stages of logic circuits LG#1–LG#n are designed to synchronously operate, and successively execute a processing in accordance with activating signals φL1–100 Ln. Latch circuits LT#1–LT#n are provided corresponding to logic circuits LG#1–LG#n, respectively. Since latch circuits LT#1–LT#n have the same structures, FIG. 56A shows only the structure of latch circuit LT#i as a representative example. Latch circuit LT#i includes active latch circuit AL, standby latch circuit SL, transfer gate XF2 for coupling active latch circuit AL to logic circuit LG#i in accordance with control clock signal φXi, and bidirectional transfer circuit 105 for transferring signals between active latch circuit AL and standby latch circuit SL in accordance with transfer instructing signals φAi and φB.

Figure 56B:
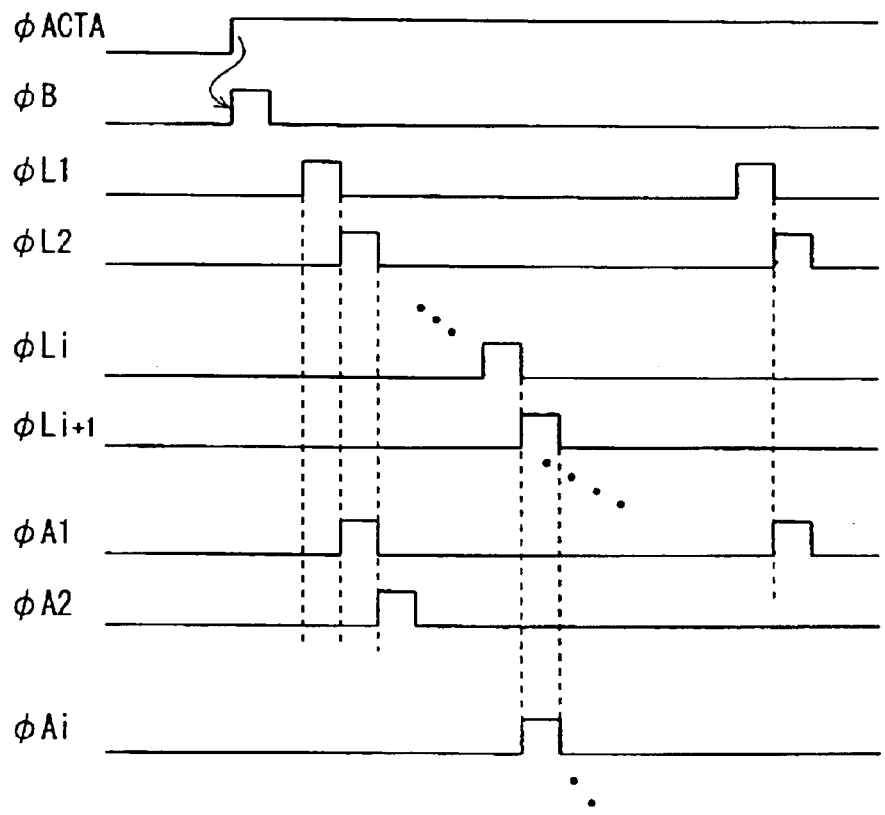
FIG. 56B is a signal waveform diagram representing an operation of the semiconductor device shown in FIG. 56A.

Transfer instructing signal φAi (i=1–n) for controlling the signal transfer from active latch circuit AL to standby latch circuit SL is produced for each of latch circuits LT#1–LT#n. When the standby state is completed, transfer instructing signal φB for instructing the signal transfer from standby latch circuit SL to active latch circuit AL is produced commonly to latch circuits LT#1–LT#n. An operation of the semiconductor device shown in FIG. 56A will now be described with reference to a signal waveform diagram of FIG. 56B.

When the standby period is completed and the active cycle starts, transfer instructing signal φB is first activated, and each of latch circuits LT#1–LT#n operate to transfer the signal from standby latch circuit SL to active latch circuit AL. Prior to this operation, the power supply for active latch circuit AL, which is controlled during the standby state, is already recovered. When active cycle instructing signal φACTA is activated, logic circuits LG#1–LG#n are successively activated in accordance with activation control signals φL1–100 Ln, to execute the processing on the signals received from the logic circuits in the preceding stages, respectively. In each of latch circuits LT#1–LT#n, when activation control signal φLi for the corresponding logic circuit is activated in the above processing, control clock signal φφXi is activated at a predetermined timing so that transfer gate XF2 is turned on to couple active latch circuit AL to logic circuit LG#i.

In logic circuits LG#1–LG#n, operational processings are executed in accordance with activation control signals φL1–100 Ln, and the results of execution are latched by associated active latch circuits AL in latch circuits LT#1–LT#n, respectively. In the next cycle, the signal latched in active circuit AL is transferred to corresponding standby latch circuit SL through bidirectional transfer circuit 105. Thus, transfer instructing signals φA1–100 An are activated in the cycle subsequent to the activation of activation control signals φL1–100 Ln in logic circuits LG#1–LG#n, respectively. Therefore, signal transfer from active latch circuit AL to standby latch circuit SL is performed in the cycle subsequent to the cycle, in which a corresponding logic circuit LG#i operates to perform the signal processing. It is not necessary to consider the signal definition timing in active latch circuit AL and the timing of signal transfer to standby latch circuit SL based on the signal processing timing of the logic circuit in each operation cycle, and thus, the signal can be transferred from active latch circuit AL to standby latch circuit SL with a sufficient margin. A circuit for timing adjustment is not required, and it is possible to reduce the number of circuit components as well as the power consumption.

Figure 57A:
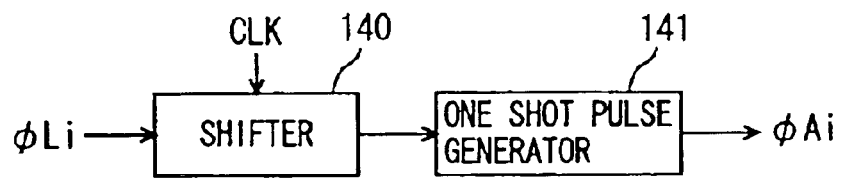
FIG. 57A shows a structure of a transfer instructing signal generating portion of the semiconductor device shown in FIG. 56A.
Figure 57B:
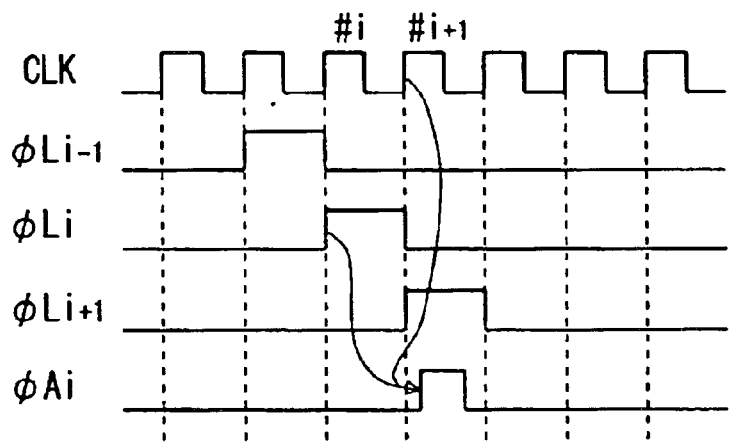
FIG. 57B is a signal waveform diagram representing an operation of the circuit shown in FIG. 57A.

FIG. 57A schematically shows a structure of a portion for generating transfer instructing signal φAi shown in FIG. 56A. In FIG. 57A, the transfer instructing signal generating portion includes: a shifter 140 which transfers activation control signal φLi for one clock cycle period in synchronization with clock signal CLK; and a one shot pulse generating circuit 141 which generates a one shot pulse signal in response to rising of the output signal of shifter 140. One shot pulse generating circuit 141 generates transfer instructing signal φAi. Clock signal CLK determines the operation cycle of logic circuits LG#1–LG#n shown in FIG. 56A. An operation of the transfer instructing signal generating portion shown in FIG. 57A will now be described with reference to a timing chart of FIG. 57B.

When activation control signal φLi is activated in synchronization with the rising of clock signal CLK, shifter 140 takes in this activation control signal φLi, and outputs the signal thus taken at the next rising of the clock signal CLK. Therefore, during activation of activation control signal φLi in dock cycle #i, a predetermined operational processing is performed in the logic circuit LG#i, and a resultant signal is transferred and latched into associated active latch circuit AL. Then, activation control signal #Li+1 for logic circuit LG#(i+1) in the next stage is activated in the next cycle #i+1, and one shot pulse generating circuit 141 generates one shot to activate transfer instructing signal φAi in clock cycle #i+1. Accordingly, the signal which is latched in clock cycle #i by active latch circuit AL is transferred from active latch circuit AL to standby latch circuit SL in the next clock cycle #i+1.

Control clock signal φXi is merely required to be activated at an appropriate timing in response to activation control signal φLi.

Activation control signals φL1–100 Ln can be produced from the shift register performing a shifting operation in synchronization with clock signal CLK when active cycle instructing signal φACTA is activated.

Logic circuits LG#1–LG#n may successively perform the processing in a pipeline manner in synchronization with the clock signal CLK, in which case a register responsive to the clock signal CLK is arranged in input/output portion of the pipeline stage. This register performs the signal transfer between pipeline stages. In synchronization with this signal transfer between the pipeline stages by the register, a signal is transferred from active latch circuit AL to standby latch circuit SL. Even in such pipeline arrangement, the signal transfer in the next cycle can be implemented.

[Fifth Modification]

Figure 58:
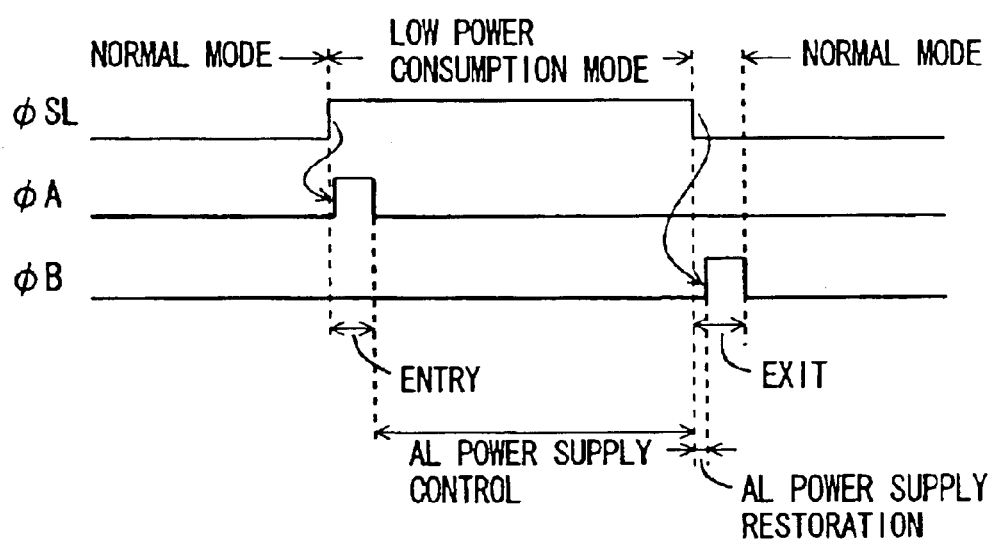
FIG. 58 is a signal waveform diagram representing still another operation of the semiconductor device according to the eleventh embodiment of the present invention.

FIG. 58 is a signal waveform diagram representing an operation of a fifth modification of the eleventh embodiment according to the present invention. In FIG. 58, the semiconductor device has a normal mode of operation and a low power consumption mode of operation. For a logic circuit, the low power consumption mode is a sleep mode in which the logic circuit stops its operation. For a Dynamic Random Access Memory (DRAM), the low power consumption mode is a self-refresh mode in which data refreshing is performed in accordance with internally generated timing and address. In the normal mode, the semiconductor device executes a predetermined processing. As shown in FIG. 58, transfer instructing signal ϕA is activated upon transition from the normal mode to the low power consumption mode, and the latch signal is transferred from active latch circuit AL to standby latch circuit SL. During this period, the device is in a low power consumption entry mode. When this low power consumption entry mode is completed, the active latch circuit is subject to the power supply control to reduce the gate tunnel current.

When the low power consumption mode is completed, the power supply control for the active latch circuit is first performed. After the power supply is recovered, transfer instructing signal ϕB for the active latch circuit is activated, and the latch signal is transferred from standby latch circuit SL to active latch circuit AL. When the active period of transfer instructing signal ϕB expires and the low power consumption exit mode is completed, the semiconductor device can execute the predetermined processing.

In the normal mode, therefore, the MIS transistors having thin gate insulating films are used for fast operation. In the low power consumption mode, the gate tunnel current is reduced, e.g., by controlling the power supply voltage of active latch circuit AL, and the power consumption is reduced. Signal waveforms shown in FIG. 58 can be provided by substituting the period of the low power consumption mode for the standby period in the waveform diagram of FIG. 48. Therefore, the corresponding control signal generating portion can be used for the control signal generating portion which achieves the waveforms shown in FIG. 58.

According to the eleventh embodiment of the present invention, as described above, a signal, of which the logic level in the standby state is not determined in advance, is transferred from the active latch circuit to the standby latch circuit in the standby state, and the active latch circuit is set to the gate tunnel current reduced state. Thereby, the power consumption due to the gate tunnel current in the standby state can be suppressed. Upon transition from the standby period to the active period, the signal latched by the standby latch circuit is transferred to the active latch circuit so that the latched signal can be accurately restored. Further, fast operations can be achieved by the active latch circuit during the active period.

[Twelfth Embodiment]

Figure 59A:
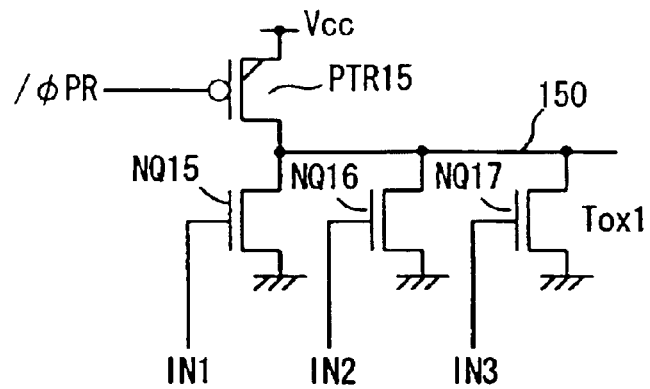
FIG. 59A shows a structure of a semiconductor device according to an twelfth embodiment of the present invention.

FIG. 59A shows, by way of example, a structure of a semiconductor device according to a twelfth embodiment of the present invention. In FIG. 59A, an MIS transistor PTR15, which is turned on when precharge instructing signal /ϕPR is active (at L-level), is arranged between the power supply node and a precharge node 150. N-channel MIS transistors NQ15, NQ16 and NQ17 are arranged in parallel between precharge node 150 and the ground node. MIS transistors NQ15, NQ16 and NQ17 are supplied on their gates with input signals IN1, IN2 and IN3, respectively.

Figure 59B:
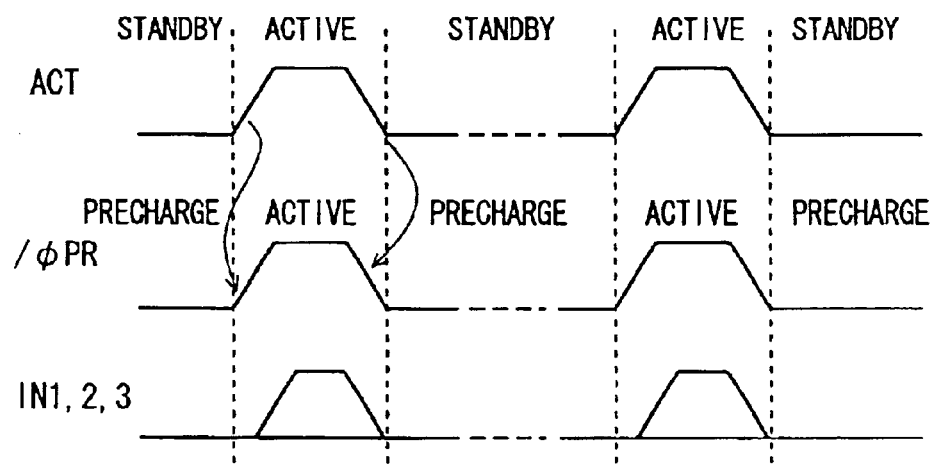
FIG. 59B is a signal waveform diagram representing an operation of the device shown in FIG. 59A.

Precharge instructing signal /ϕPR is set to the active state of L-level in the standby state for precharging the precharge node 150 to power supply voltage Vcc level. MIS transistor PTR15 for precharge is formed of an ITR transistor for suppressing its gate tunnel current leak. MIS transistors NQ15–NQ17 which are responsive to input signals IN1–IN3, respectively, are formed of MIS transistors having thin gate insulating films, respectively. In the standby state, all input signals IN1–IN3 are at L-level, and MIS transistors NQ15–NQ17 stays in the off state. An operation of the semiconductor device shown in FIG. 59A will now be described with reference to an operation waveform diagram shown in FIG. 59B.

In the standby state, precharge instructing signal /ϕPR is at L-level, and precharge node 150 is precharged to the power supply voltage level by precharging MIS transistor PTR15. All input signals IN1–IN3 are at L-level, and all MIS transistors NQ15–NQ17 maintain the off state.

In the precharged state, MIS transistor PRT15 is on, but the gate tunnel current thereof is sufficiently suppressed because precharging MIS transistor PTR15 is an ITR transistor. MIS transistors NQ15–NQ17 are off, and the gate tunnel currents hardly occur. MIS transistor PTR15 for precharging is an ITR transistor, and may have, e.g., a thick gate insulating film, in which case the threshold voltage thereof is large in absolute value, and therefore the off-leak current can be reduced.

When the active cycle starts, precharge instructing signal /ϕPR attains H-level so that MIS transistor PTR15 for precharging is turned off. MIS transistors NQ15–NQ17 are selectively turned on/off in accordance with the logical levels of input signals IN1–IN3, respectively. Depending on the on/off states of MIS transistors NQ15–NQ17, the voltage level on precharge node 150 during the active period is determined. For discharging the precharge node 150 to the ground voltage level, MIS transistors NQ15–NQ17 have the thin gate insulating films, respectively, and can operate fast for discharging precharge node 150 to the ground voltage level.

Accordingly, by utilizing the ITR transistor for the MIS transistor for precharging, the gate tunnel current can be suppressed in such a dynamic operation environment, in which precharge node 150 is precharged to the predetermined voltage level during the standby period, and the voltage level of the precharge node 150 is determined in accordance with the input signal during the active period, as shown in FIG. 59A.

Figure 59C:
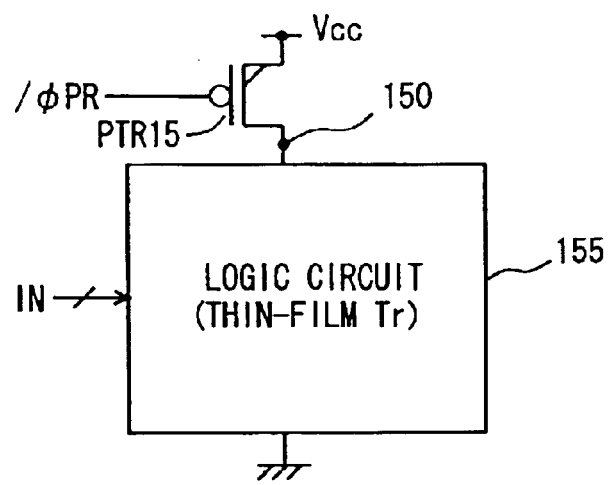
FIG. 59C shows a general form of the semiconductor device shown in FIG. 59A.

The standby period and the active period are designated by activation instructing signal ACT. FIG. 59C shows a general form of the semiconductor device of the twelfth embodiment of the present invention. In FIG. 59C, the semiconductor device includes MIS transistor PTR15 for precharging connected between the power supply node and precharge node 150, and a logic circuit 155 which drives precharge node 150 in accordance with input signals (group). Logic circuit 155 is formed of thin film transistors (Tr) having thin gate insulating films. Logic circuit 155 has an appropriate structure depending on a use thereof, and is merely required to drive precharge node 150 in accordance with input signal IN during the active cycle.

[First Modification]

Figure 60A:
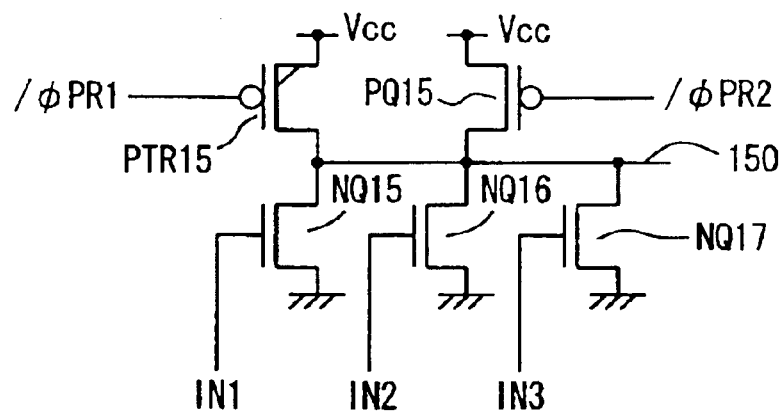
FIG. 60A shows a structure of a first modification of the twelfth embodiment of the present invention.
Figure 60B:
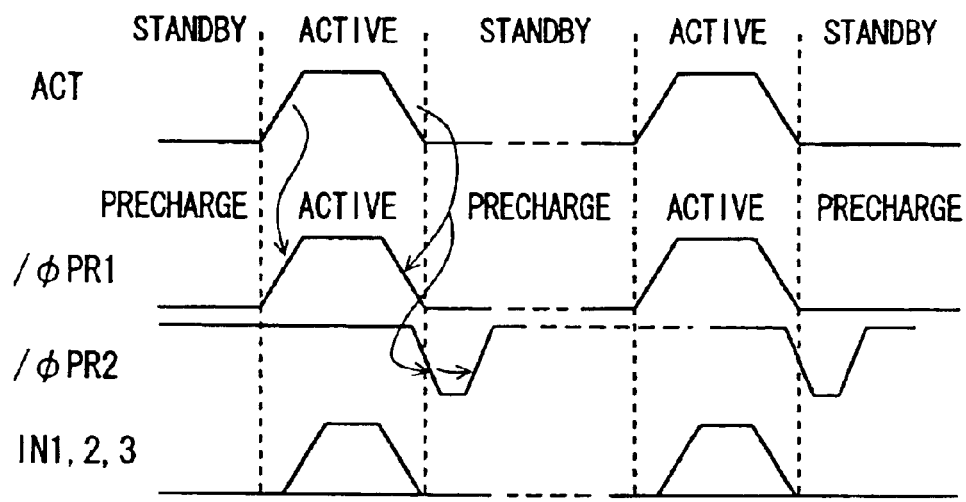
FIG. 60B is a signal waveform diagram representing an operation of the device shown in FIG. 60A.

FIG. 60A shows a structure of a first modification of the twelfth embodiment of the present invention. The structure shown in FIG. 60A includes the same components as those shown in FIG. 59A, and additionally includes an MIS transistor PQ15 for precharging which is turned on when precharge instructing signal /ϕPR2 is active. MIS transistor PQ15 has a gate insulating film of a small thickness, and therefore can operate fast. Precharge instructing signal /ϕPR2 is activated in the form of a one shot pulse upon transition from the active period to the standby period. An operation of the semiconductor device shown in FIG. 60A will now be described with reference to a signal waveform diagram of FIG. 60B.

In the standby state, activation instructing signal ACT is at L-level so that precharge instructing signal /φPR1 is at L-level, or active. Also, MIS transistor PTR15 for precharging is on, and node 150 is precharged to power supply voltage Vcc level. Precharge instructing signal /φPR2 is at H-level and inactive, and MIS transistor PQ15 for precharging maintains the offstate. Since MIS transistor PQ15 for precharge is off, the gate tunnel current does not occur in MIS transistor PQ15 in spite of the fact that the MIS transistor PQ15 for precharging has a thin gate insulating film. Input signals IN1–IN3 are at L-level in the standby state.

When the active period starts, MIS transistor PTR15 for precharging is turned off in accordance with activation instructing signal ACT. Precharge instructing signal /φPR2 maintains H-level. Input signals IN1–IN3 change in the active period, and MIS transistors NQ15–NQ17 are selectively set to on/off states in accordance with input signals IN1–IN3, respectively, so that the voltage level of precharge node 150 is decided.

When the active period ends, precharge instructing signal /φPR1 falls from H-level to L-level in response to deactivation of activation instructing signal ACT, and MIS transistor PTR15 is turned on to precharge the node 150 to power supply voltage Vcc level. In this operation, precharge instructing signal /φPR2 attains L-level for a while, and MIS transistor PQ15 for precharging is turned on.

The ITR transistor has a large gate tunnel barrier for suppressing a gate tunnel current, and has a threshold voltage of a large absolute value. Therefore, in the operation of precharging the precharge node 150 using MIS transistor PTR15 which is the ITR transistor, a certain time is required before the voltage level of precharge node 150 is recovered to power supply voltage Vcc level, and it may be impossible to reduce a time period of the standby period in the case where the standby period and the active period are alternately repeated at high speed. In view of this disadvantage, the MIS transistor, which has a thin gate insulating film and can operate fast, is used for MIS transistor PQ15 for precharging, so that the precharge node 150 can be restored in voltage level fast to power supply voltage Vcc level. Thereby, precharge node 150 can be reliably precharged to power supply voltage Vcc level even in the case where the standby period is short, and reduction in current consumption during the standby period and fast operations during the active period can be both achieved.

Figure 61:
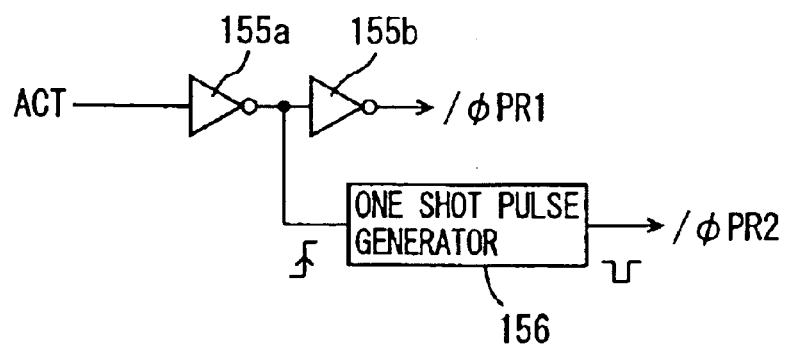
FIG. 61 shows a structure of a portion for generating a precharge instructing signal of the device shown in FIG. 60A.

FIG. 61 schematically shows a structure of a portion for generating the precharge instructing signal shown in FIG. 60A. In FIG. 61, the precharge instructing signal generating portion includes cascaded inverter circuits 155a and 155b of two stages for receiving activation instructing signal ACT, and a one shot pulse generating circuit 156 for generating a one shot pulse signal which becomes L-level for a predetermined period in response to the rising of the output signal of inverter circuit 155a. Inverter circuit 155b generates precharge instructing signal /φPR1, and one shot pulse generating circuit 156 generates precharge instructing signal /φPR2.

Inverter circuits 155a and 155b form a buffer circuit, which produces precharge instructing signal /φPR1 in accordance with activation instructing signal ACT. When an active period is completed, the output signal of inverter circuit 155a rises to H-level, and responsively one shot pulse generating circuit 156 produces a one shot pulse signal so that precharge instructing signal /φPR2 is driven to the active state for a predetermined period upon transition to the standby period. Thus, the precharge instructing signals /φR1 and /φPR2 can be set to the active/inactive states in accordance with the operation cycle/period.

[Second Modification]

Figure 62:
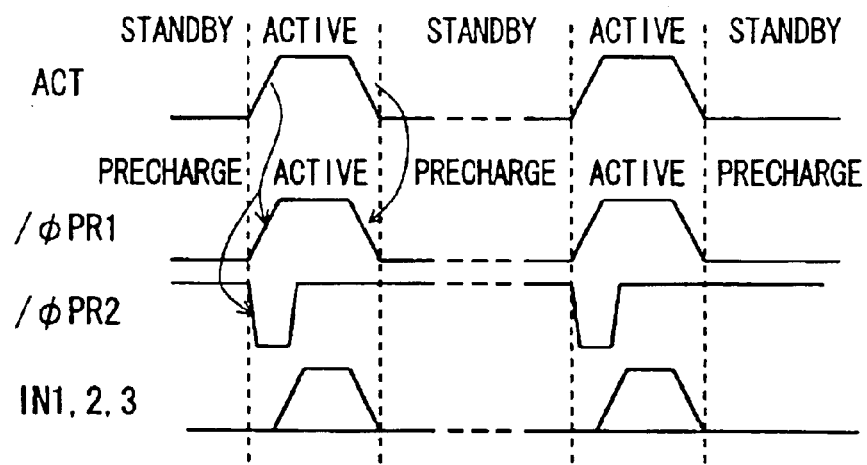
FIG. 62 is a signal waveform diagram showing a modification of the operation of the semiconductor device of the twelfth embodiment of the present invention.

FIG. 62 is a signal waveform diagram representing an operation of a second modification of the twelfth embodiment of the present invention. A structure of a semiconductor device used in this modification is the same as that shown in FIG. 60A. Precharge node 150 is precharged using the precharging transistors PTR15 and PQ15, which are turned on in accordance with precharge instructing signals /φPR1 and /φPR2, respectively. In this signal waveform diagram of FIG. 62, precharge instructing signal /φPR2 for turning on the precharging MIS transistor PQ15 having a thin gate insulating film, is activated in a one shot pulse form at the start of the active period. Thus, upon transition from the standby period to the active period, precharge instructing signal /φPR2 is kept active for a predetermined period, and MIS transistor PQ15 can precharge reliably the precharge node 150 to the predetermined voltage level.

When precharge node 150 is to be precharged by MIS transistor PTR15 during the standby period, there is no problem even when precharge node 150 is not precharged to the predetermined voltage due to inadequate length of the standby period. In this case, the precharge node 150 can be reliably precharged to the predetermined voltage level by the precharge instructing signal /φPR2 at the start of the active period. After completion of the precharging, MIS transistors NQ15–NQ17 are selectively turned on/off in accordance with input signals IN1–IN3.

Figure 63:
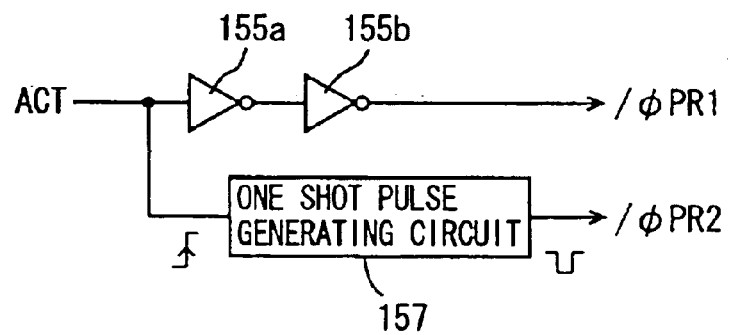
FIG. 63 schematically shows a structure of a precharge instructing signal generating portion having an operation sequence shown in FIG. 62.

FIG. 63 schematically shows a structure of a portion generating the precharge instructing signal shown in FIG. 62. The precharge instructing signal generating portion shown in FIG. 63 differs from the precharge instructing signal generating portion shown in FIG. 61 in the following point. Precharge instructing signal /φPR2 is generated by a one shot pulse generating circuit 157, and is at L-level for a predetermined period in response to rising of activation instructing signal ACT. At the start of an active period, precharge instructing signal /φPR2 is driven to the active state for a predetermined period.

Figure 64:
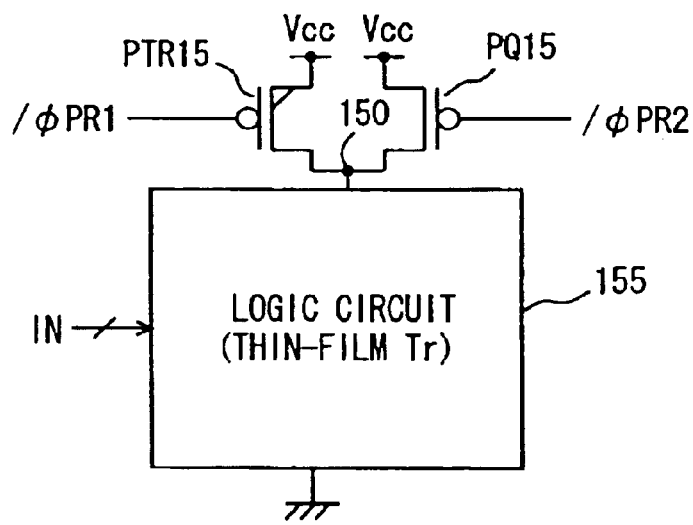
FIG. 64 shows a general structure of a second modification of the twelfth embodiment of the present invention.

FIG. 64 shows a general structure of the semiconductor devices of the first and second modifications of the twelfth embodiment of the present invention. In FIG. 64, the semiconductor device includes logic circuit 155 for driving precharge node 150 in accordance with input signals (group) IN. Logic circuit 155 includes the MIS transistor (thin film Tr) having a thin gate insulating film as its component. Precharge node 150 is precharged to power supply voltage Vcc level by MIS transistors PTR15 and PQ15, which receive precharge instructing signals /φPR1 and /φPR2 on their gates, respectively. Logic circuit 155 executes a predetermined logical processing to drive selectively precharge node 150, similarly to the structure shown in FIG. 59C.

[Third Modification]

Figure 65:
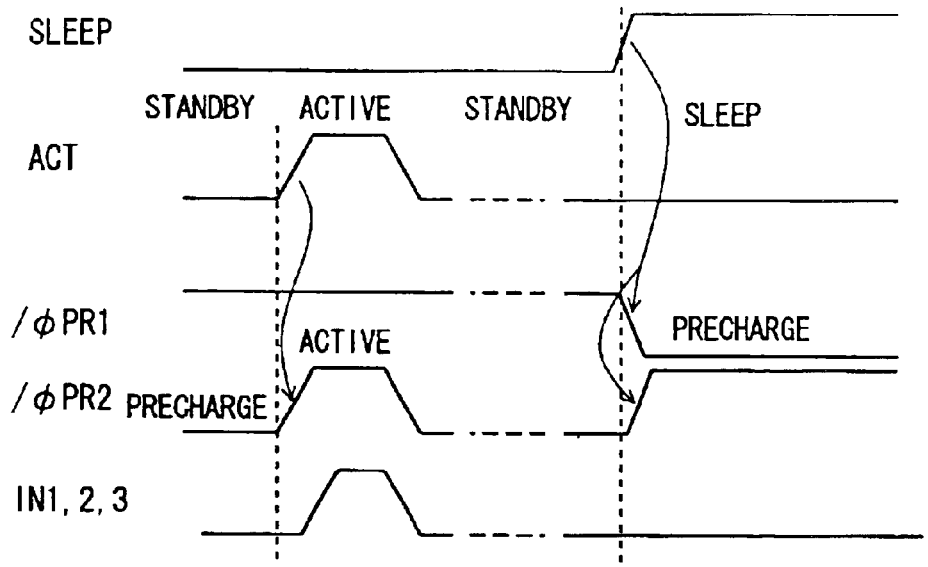
FIG. 65 is a signal waveform showing a third operation sequence of the semiconductor device according to the twelfth embodiment of the present invention.

FIG. 65 is a signal waveform diagram representing an operation of a third modification of the twelfth embodiment of the present invention. In the third modification, the semiconductor device has a sleep mode for halting operations in addition to the standby cycle and the active cycle in the normal operation mode. The structure of the semiconductor device is the same as that shown in FIG. 60A, and includes, as the MIS transistors for precharging, MIS transistor PTR15 formed of an ITR transistor that is turned on in response to precharge instructing signal /φPR1, and MIS transistor PQ15 that is turned on/off in response to precharge instructing signal /φPR2. An operation of the third modification of the twelfth embodiment of the present invention will now be described with reference to a signal waveform diagram of FIG. 65.

When a sleep mode instructing signal SLEEP is at L-level and inactive, the standby cycle and the active cycle are repetitively executed in accordance with activation instructing signal ACT. When sleep mode instructing signal SLEEP is at L-level, precharge instructing signal /φPR1 maintains H-level, and responsively MIS transistor PTR15 maintains the off state. In the normal operation mode (i.e., when the sleep mode instructing signal is inactive), precharge instructing signal /φPR2 is driven to L- or H-level in accordance with activation instructing signal ACT. In the standby cycle, precharge instructing signal /φPR2 is at L-level, and MIS transistor PQ15 for precharging is on so that precharge node 150 is charged fast. In the active cycle, precharge instructing signal /φPR2 is at H-level, and MIS transistor PQ15 for precharging is off. In this active cycle, the logic circuit or MIS transistors NQ15–NQ17 selectively drive precharge node 150 to the ground voltage level in accordance with input signals IN1, IN2 and IN3.

When the standby state continues for a predetermined time or more and the sleep mode instructing signal SLEEP attains H-level to instruct the sleep mode, precharge instructing signal /φPR2 attains H-level, and MIS transistor PQ15 for precharging maintains the off state during the sleep mode period. In response to activation of sleep mode instructing signal SLEEP, precharge instructing signal /φPR1 attains L-level, and MIS transistor PTR15 for precharging is turned on so that precharge node 150 is precharged to power supply voltage Vcc level. In the sleep mode, the current consumption is minimized. By turning off MIS transistor PQ15 in the sleep mode, the gate tunnel current in MIS transistor PQ15 for precharging is suppressed.

MIS transistor PTR15 is an ITR transistor, and the gate tunnel current thereof is sufficiently small in the on state. Therefore, it is possible to suppress the gate tunnel currents in MIS transistors for precharging PTR15 and PQ15 in the sleep mode. In the normal operation mode, precharge node 150 is precharged using MIS transistor PQ15 which operates fast. At the time of transition from the active state to the standby state, the precharge node can be precharged fast, and fast operations are allowed. Upon transition to the sleep mode, fast operation is not required for this transition to the sleep mode. Therefore, there arises no problems even when precharge node 150 is precharged to a predetermined voltage level using the ITR transistor, and the current consumption in the sleep mode is reduced.

Figure 66:
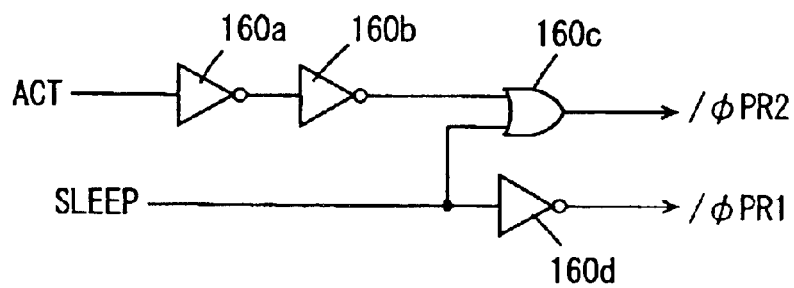
FIG. 66 shows a structure of a portion for generating a precharge instructing signal shown in FIG. 65.

FIG. 66 shows, by way of example, a structure of a portion for generating precharge instructing signals /φPR1 and /φPR2 shown in FIG. 65. In FIG. 66, the precharge instructing signal generating portion includes cascaded inverter circuits 160a and 160b of two stages for receiving activation instructing signal ACT, an OR circuit 160c receiving the output signal of inverter circuit 160b and sleep mode instructing signal SLEEP, and an inverter circuit 160d receiving sleep mode instructing signal SLEEP. OR circuit 160c generates precharge instructing signal /φPR2, and inverter circuit 160d generates precharge instructing signal /φPR1.

Activation instructing signal ACT is produced in accordance with an operation cycle, based on an externally supplied signal. According to the structure shown in FIG. 66, OR circuit 160c operates as a buffer circuit, and inverter circuits 160a and 160b also operate as buffer circuits when sleep mode instructing signal SLEEP is at L-level. Therefore, precharge instructing signal /φPR2 changes in accordance with activation instructing signal ACT. Since sleep mode instructing signal SLEEP is at L-level, precharge instructing signal /φPR1 maintains H-level.

When sleep mode instructing signal SLEEP attains H-level, precharge instructing signal /φPR2 generated from OR circuit 160c attains H-level, and precharge instructing signal /φPR1 from inverter circuit 160d attains L-level.

By utilizing the structure shown in FIG. 66, the MIS transistors for precharging can be selectively used in the normal operation mode and the sleep mode.

[Fourth Modification]

Figure 67A:
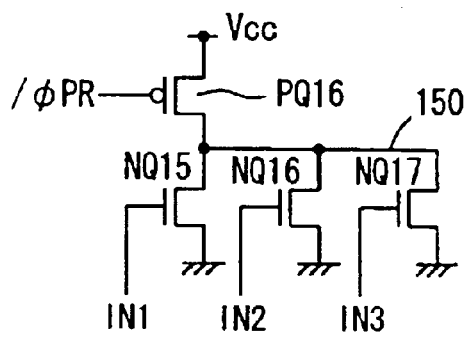
FIG. 67A shows a structure of a semiconductor device according to a fourth modification of the twelfth embodiment of the present invention.

FIG. 67A shows a structure of a fourth modification of the twelfth embodiment of the present invention. In the structure shown in FIG. 67A, an MIS transistor PQ16 which is turned on in accordance with precharge instructing signal /φPR is arranged between the power supply node and precharge node 150. MIS transistor PQ16 has a thin gate insulating film. Precharge node 150 is coupled to MIS transistors NQ15–NQ17, which receive internal signals IN1–IN3 on their gates, respectively.

Figure 67B:
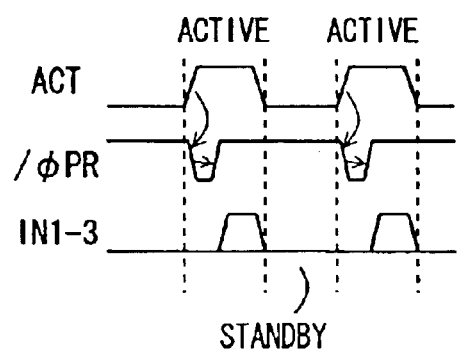
FIG. 67B is a signal waveform diagram representing an operation of the device shown in FIG. 67A.

In the semiconductor device shown in FIG. 67A, precharge instructing signal /φPR is activated in a one shot pulse form at the start of the active cycle. As shown in FIG. 67B, when activation instructing signal ACT rises to H-level, precharge instructing signal /φPR becomes L-level for a predetermined period, and MIS transistor PQ16 for precharging is turned on so that precharge node 150 is precharged to the predetermined voltage level. MIS transistor PQ16 has a thin gate insulating film, and therefore precharge node 150 is rapidly precharged to a predetermined voltage level in accordance with precharge instructing signal /φPR of a one shot pulse form. After completion of this precharging, precharge node 150 is selectively discharged to the ground voltage level in accordance with input signals IN1–IN3.

Even in the case where the gate tunnel current of MIS transistor PQ16 is large, a period for which this gate tunnel current flows can be reduced by activating precharge instructing signal /φPR of a one shot pulse form. Thereby, the gate tunnel current in the MIS transistor for precharging can be suppressed.

Figure 68:
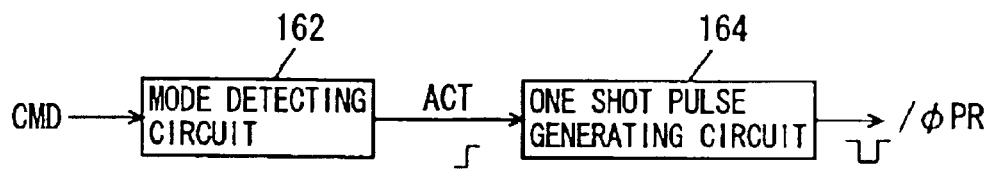
FIG. 68 schematically shows a structure of a portion generating a precharge instructing signal shown in FIG. 67A.

FIG. 68 schematically shows a structure of a portion for generating precharge instructing signal /φPR shown in FIG. 67A. The precharge instructing signal generating portion shown in FIG. 68 includes: a mode detecting circuit 162 which detects the operation mode instructed by operation mode instructing signal CMD, and produces activation instructing signal ACT; and a one shot pulse generating circuit 164 which generates a one shot pulse signal, which in turn becomes L-level for a predetermined period in response to the rising of activation instructing signal ACT generated from mode detecting circuit 162. One shot pulse generating circuit 164 generates precharge instructing signal /φPR.

When the active cycle is designated in accordance with operation mode instructing signal CMD, mode detecting circuit 162 drives activation instructing signal ACT to the active state (H-level). In response to the activation (rising) of activation instructing signal ACT, one shot pulse generating circuit 164 drives precharge instructing signal /φPR to L-level for a predetermined level. Thereby, precharge node 150 can be precharged by one shot upon starting of the active cycle.

In the standby state, all the MIS transistors are off so that the gate tunnel currents can be suppressed.

[Fifth Modification]

Figure 69:
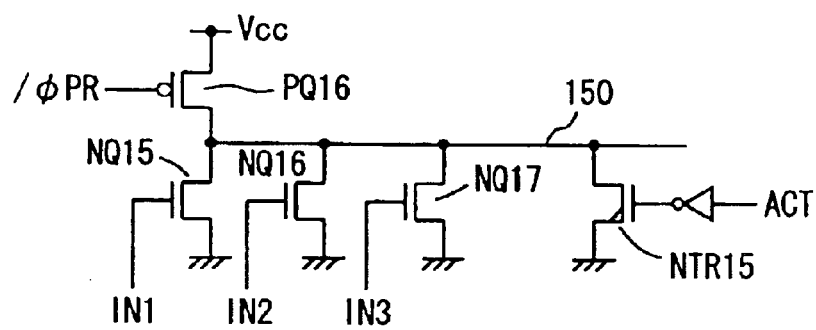
FIG. 69 shows a structure of a fifth modification of the twelfth embodiment of the present invention.

FIG. 69 shows a structure of a fifth modification of the twelfth embodiment of the present invention. The structure shown in FIG. 69 includes the same structure as that shown in FIG. 67A, and further includes an MIS transistor NTR15 which is connected between precharge node 150 and the ground node, and is selectively turned on in response to the inverted signal of activation instructing signal ACT. MIS transistor NTR15 is formed of an ITR transistor having a large gate tunnel barrier, and receives activation instructing signal ACT on its gate via an inverter. Accordingly, MIS transistor NTR15 is turned on when the standby period (cycle) starts after completion of the active period (cycle). When the active period starts, precharge instructing signal /φPR is activated in a one shot pulse form, and precharge node 150 is precharged to a predetermined voltage level.

During the standby period, precharge node 150 is held at the ground voltage level by MIS transistor NTR15, which is an ITR transistor having a large gate tunnel barrier, Thereby, it is possible to prevent precharge node 150 from electrically floating during the standby period, and a malfunction due to an unstable voltage on precharge node 150 can be prevented.

During the standby period, other circuits receiving the signal on precharge node 150 are also in the standby state, and do not operate. Therefore, holding precharge node 150 at the ground voltage level during the standby period does not adversely affect the other circuits. The active cycle operations start after precharge node 150 is precharged to a predetermined voltage level upon transition to the active period. By activating precharge instructing signal /φPR in a one shot pulse form, the other circuits can reliably perform accurate operations in accordance with the voltage level on precharge node 150.

Since the MIS transistor for preventing the electrical floating has a large gate tunnel barrier, the gate tunnel current thereof in the on state is sufficiently suppressed, and the current consumption during the standby period can be sufficiently reduced.

Figure 70:
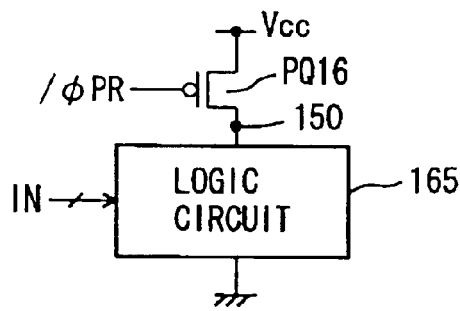
FIG. 70 shows a general structure of the fourth and fifth modifications of the twelfth embodiment of the present invention.

FIG. 70 schematically shows a general structure of fourth and fifth modifications of the twelfth embodiment of the present invention. The structure shown in FIG. 70 uses a general logic circuit 165 instead of the NOR-type logic circuit. Logic circuit 165 includes, as its component, an MIS transistor having a thin gate insulating film. Logic circuit 165 selectively drives precharge node 150 in accordance with input signals (group) IN. Other circuits execute predetermined processing in accordance with the voltage level on precharge node 150.

[Sixth Modification]

Figure 71:
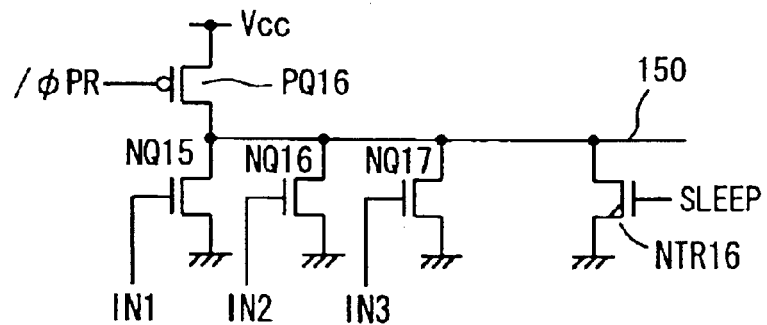
FIG. 71 shows a structure of a sixth modification of the twelfth embodiment of the present invention.

FIG. 71 shows a structure of a sixth modification of the twelfth embodiment of the present invention. In FIG. 71, MIS transistor PQ16, which is turned on in response to precharge instructing signal /φPR, is arranged between precharge node 150 and the power supply node. An MIS transistor NTR16, which is turned on in response to activation of sleep mode instructing signal SLEEP, is arranged between precharge node 150 and the ground node. MIS transistors NQ15, NQ16 and NQ17, which are selectively turned on in accordance with input signals IN1–IN3 and form a logic circuit, are arranged in parallel between precharge node 150 and the ground node.

Figure 72:
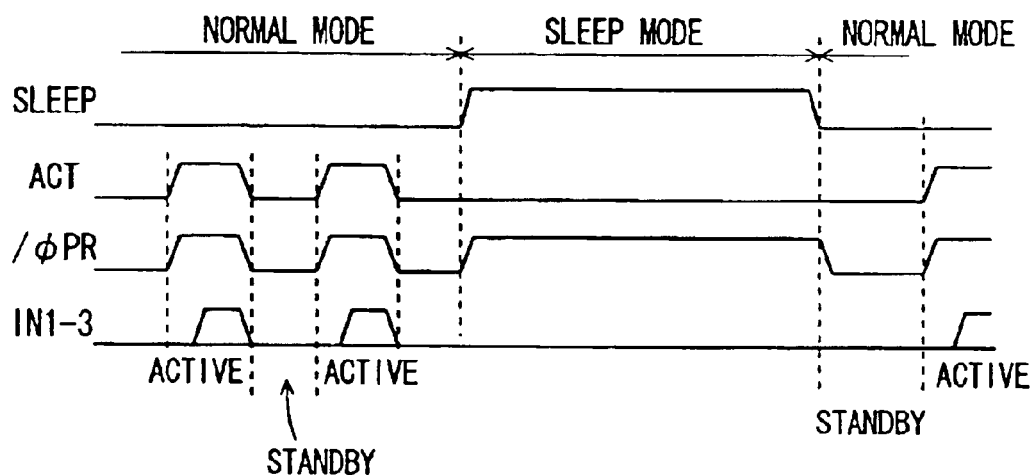
FIG. 72 is a signal waveform diagram representing an operation of the semiconductor device shown in FIG. 71.

MIS transistor NTR16 is an ITR transistor having a large gate tunnel barrier, and can have sufficiently suppressed gate tunnel current. MIS transistors NQ15–NQ17 are MIS transistors having thin gate insulating films, and perform operations at high speed in accordance with input signals IN1–IN3, respectively. An operation of the semiconductor device shown in FIG. 71 will now be described with reference to a signal waveform diagram of FIG. 72.

In the normal mode for processing signals and/or data, sleep mode instructing signal SLEEP is at L-level, and MIS transistor NTR16 maintains the off state. MIS transistor NTR16 is an ITR transistor, and both the gate tunnel current and the off-leak current are small. In the normal mode, the active cycle and the standby cycle are repeated. In the active cycle, precharge instructing signal /φPR repetitively and alternately attains the inactive and active states in accordance with activation instructing signal ACT. In the active period (cycle), precharge instructing signal /φPR is inactive. In this normal mode of operation, precharge node 150 is precharged using MIS transistor PQ16 having a thin gate insulating film. In the normal mode of operation, therefore, precharge node 150 can be charged and discharged fast in accordance with activation instructing signal ACT.

In the sleep mode, sleep mode instructing signal SLEEP attains H-level so that MIS transistor NTR16 is turned on, and precharge node 150 is fixed to ground voltage level. Precharge instructing signal /φPR maintains H-level, and MIS transistor PQ16 is turned off.

In this sleep mode, all input signals IN1–IN3 are set to L-level, and all MIS transistors NQ15–NQ17 are off. In the sleep mode in which the low current consumption is required, therefore, all MIS transistors PQ16 and NQ15–NQ17 having the thin gate insulating films are off so that the gate tunnel currents in MIS transistors PQ16 and NQ15–NQ17 can be suppressed.

When the sleep mode ends, sleep mode instructing signal SLEEP returns to L-level, and MIS transistor NTR16 is turned off. When this sleep mode instructing signal SLEEP attains L-level, precharge instructing signal /φPR attains L-level so that MIS transistor PQ16 is turned on, and precharges rapidly precharge node 150 to power supply voltage Vcc level. For transition from the sleep mode to the standby state in the normal mode, a period before start of the active cycle is prescribed in specifications, and a sufficient time is ensured. In transition from the sleep mode to the standby state, therefore, precharge node 150 can be reliably precharged to a predetermined voltage level using MIS transistor PQ16 for precharging.

Figure 73:
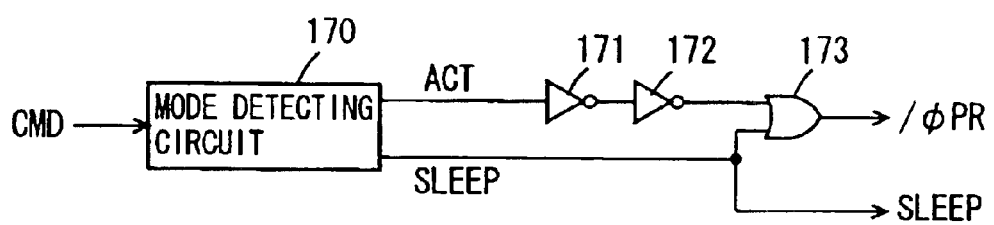
FIG. 73 schematically shows a structure of a portion generating a control signal shown in FIG. 72.

FIG. 73 schematically shows a structure of a portion generating the precharge instructing signal and the sleep mode instructing signal shown in FIG. 71. The control signal generating portion shown in FIG. 73 includes a mode detecting circuit 170 which receives externally supplied operation mode instructing signal CMD, and selectively activates activation instructing signal ACT and sleep mode instructing signal SLEEP in accordance with the designated operation mode, cascaded inverter circuits 171 and 172 of two stages for receiving activation instructing signal ACT from mode detecting circuit 170, and an OR circuit 173 which receives the output signal of inverter circuit 172 and sleep mode instructing signal SLEEP, and produces precharge instructing signal /φPR.

When operation mode instructing signal CMD designates the active cycle, activation instructing signal ACT attains H-level. Thereby, precharge instructing signal /φPR becomes active when sleep mode instructing signal SLEEP is at L-level. When sleep mode instructing signal SLEEP is at L-level, precharge instructing signal /φPR is produced in accordance with activation instructing signal ACT.

When sleep mode instructing signal SLEEP attains the active state of H-level, precharge instructing signal /φPR generated from OR circuit 173 is fixed to H-level. Thereby, the activation manner of precharge instructing signal /φPR can be switched in accordance with the operation mode. In this sixth modification, precharge instructing signal /φPR may be generated in the form of a one shot pulse.

The semiconductor device of the sixth modification of the twelfth embodiment of the present invention shown in FIG. 71 has the general form which is substantially the same as that shown in FIG. 70.

According to the twelfth embodiment of the present invention, as described above, the MIS transistor having a thin gate insulating film is used for assisting the precharge operation in the case where the MIS transistor having a large gate tunnel barrier is used as the MIS transistor for precharging. In the case where the MIS transistor having a thin gate insulating film is utilized as the MIS transistor for precharging, this MIS transistor for precharging is continuously kept off, or is kept on for only a short time in the mode requiring reduction in current consumption. Thereby, the gate tunnel current can be suppressed, without adversely affecting the operation speed, in the standby state in which reduction in current consumption is required.

[Thirteenth Embodiment]

Figure 74A:
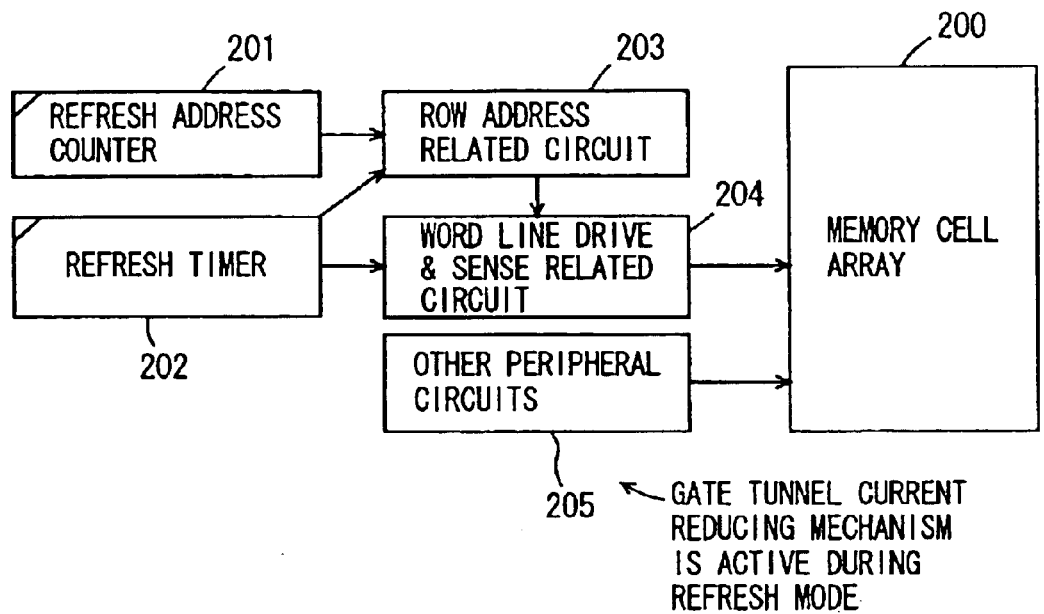
FIG. 74A schematically shows a structure of a semiconductor device according to a thirteenth embodiment of the present invention.

FIG. 74A schematically shows a structure of a main portion of a semiconductor device according to a thirteenth embodiment of the present invention. The semiconductor device shown in FIG. 74A is a dynamic semiconductor memory device (DRAM), and includes a memory cell array 200 having a plurality of memory cells arranged in rows and columns. The memory cells, which are arranged in rows and columns in memory cell array 200, are dynamic memory cells, and are required to refresh storage data in predetermined intervals.

This semiconductor device further includes: a row-address-related circuit 203 for producing a row address designating a row in memory cell array 200; a row-related circuit block 204 including a word line drive circuit for driving a word line arranged corresponding to the addressed row in memory cell array 200 to the selected state in accordance with the row address received from row-address-related circuit 203, and a sense-related circuit for sensing and amplifying data of the memory cells connected to the selected row; and a column-related circuit block 205 including peripheral circuitry for performing column selection and input/output of data.

Row-address-related circuit 203 includes a row address buffer which receives an applied row address and generates an internal row address, a row decode circuit for decoding the row address received from the row address buffer, and a row-address-related control circuit for controlling operations of the row address buffer and the row decode circuit.

Row-related circuit block 204 including the word line drive circuit and the sense-related circuit further includes a row-related control circuit for controlling operations of the word line drive circuit and the sense-related circuit. Row-related circuit block 204 further includes circuits such as a circuit for controlling precharge/equalize circuits, which are arranged corresponding to the columns in memory cell array 200 for precharging the columns to a predetermined intermediate voltage level, and a bit line isolation gate control circuit for controlling conduction/non-conduction of bit line isolation gates in a shared sense amplifier structure, if employed. Column-related circuit block 205 including other peripheral circuits operates when a column selection instruction is applied.

The semiconductor device further includes a refresh address counter 201 which produces a refresh address designating a row to be refreshed in the refresh (self-refresh) mode, and a refresh timer 202 which issues a refresh request in predetermined intervals in the self-refresh mode. The refresh address generated from refresh address counter 201 is applied to row-address-related circuit 203. The refresh request signal issued from refresh timer 202 is applied to row-address-related circuit 203 and row-related circuit block 204 for controlling operations thereof in the refresh mode.

The self-refresh mode includes a refresh active period for actually performing the refresh and a refresh standby period for waiting issuance of the refresh request. The normal operation mode likewise includes the active cycle and the standby cycle. The self-refresh mode usually accompanies the low power consumption mode, and it is preferable to minimize the current consumption in this self-refresh mode. In view of this, refresh address counter 201 and refresh timer 202 operating in the refresh mode are formed of ITR transistors having large gate tunnel barriers, such as thick film transistors each having a thick gate insulating film.

In contrast, row-address-related circuit 203, row-related circuit block 204 and column-related circuit block 205 are required to operate in the normal operation mode, and are required to have fast operation ability. Therefore, row-address-related circuit 203, row-related circuit block 204 and column-related circuit block 205 are formed of MIS transistors each having a thin gate insulating film.

Even if refresh address counter 201 and refresh timer 202 are formed of ITR transistors having large gate tunnel barriers, there substantially causes no problem because these components are not required to operate fast in the self-refresh mode. When row-address related circuit 203, row-related circuit block 204 and column-related circuit block 205 are in the refresh standby state during the self-refresh mode, the gate tunnel currents are suppressed basically by the structures of the first and third embodiments already described. Power supply to these circuit and blocks may be stopped. Accordingly, the current consumption in the self-refresh mode can be reduced without impairing the fast operation ability in the normal operation mode.

In FIG. 74A, the operation for suppressing the gate tunnel current, e.g., by stopping supply of the power supply voltage is executed for column-related circuit block 205 including other peripheral circuits in the self-refresh mode. As for row-address-related circuit 203 and row-related circuit block 204 related to the row selection, the mechanisms for suppressing the gate tunnel current thereof are selectively activated in accordance with the refresh standby state and the refresh active state in the self-refresh mode.

Figure 74B:
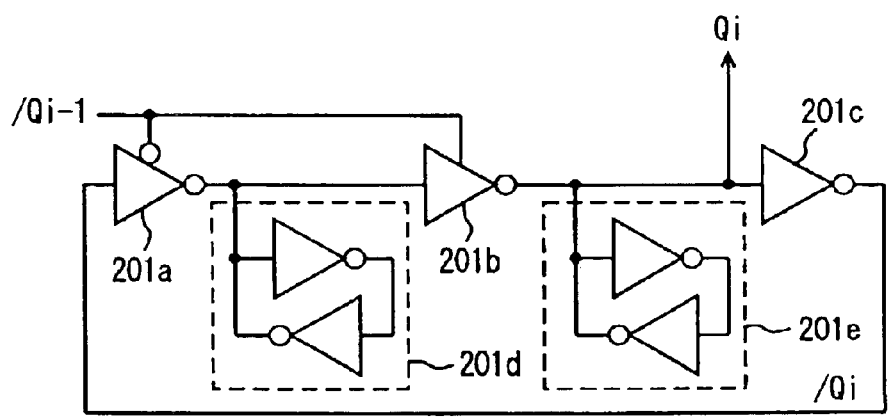
FIG. 74B shows a structure of a refresh address counter shown in FIG. 74A.

FIG. 74B shows a structure of one stage in refresh address counter 201 shown in FIG. 74A. The structure shown in FIG. 74B is employed by a required number of stages, of which number depends on the number of refresh address bits. In FIG. 74B, refresh address counter 201 includes clocked inverters 201a and 201b which are selectively activated in response to a refresh address bit /Qi−1, to invert a signal applied thereto during the active state, an inverter 201c which inverts and applies the output signal of clocked inverter 201b to the input of clocked inverter 201a, an inverter latch 201d which latches the output of clocked inverter 201a, and an inverter latch 201e which latches the output signal of clocked inverter 201b. Clocked inverter 201b generates refresh address bit Qi. All of these inverters are formed of ITR transistors, e.g., having thick gate insulating films. An operation of the refresh address counter shown in FIG. 74B will now be briefly described.

When bit /Qi−1 is at H-level, clocked inverter 201a is in the output high-impedance state, and clocked inverter 201b is activated to invert the signal latched by inverter latch 201d for producing bit Qi. Since bit Qi is latched by inverter latch 201d, bit Qi changes when bit /Qi−1 attains H-level. Thus, the logical level of higher bit Qi changes when lower bit Qi−1 changes from H-level to L-level. While bit /Q-i is at L-level, clocked inverter 201b is in the output high-impedance state, and bit Qi does not change. The count circuit can be formed of any structure, provided that the logical level of the higher bit changes when the lower bit changes from H-level to L-level and a carry from the lower bit generates.

The refresh timer may have a circuit structure similar to a conventional structure utilizing a charge/discharge time of a capacitor.

[First Modification]

Figure 75:
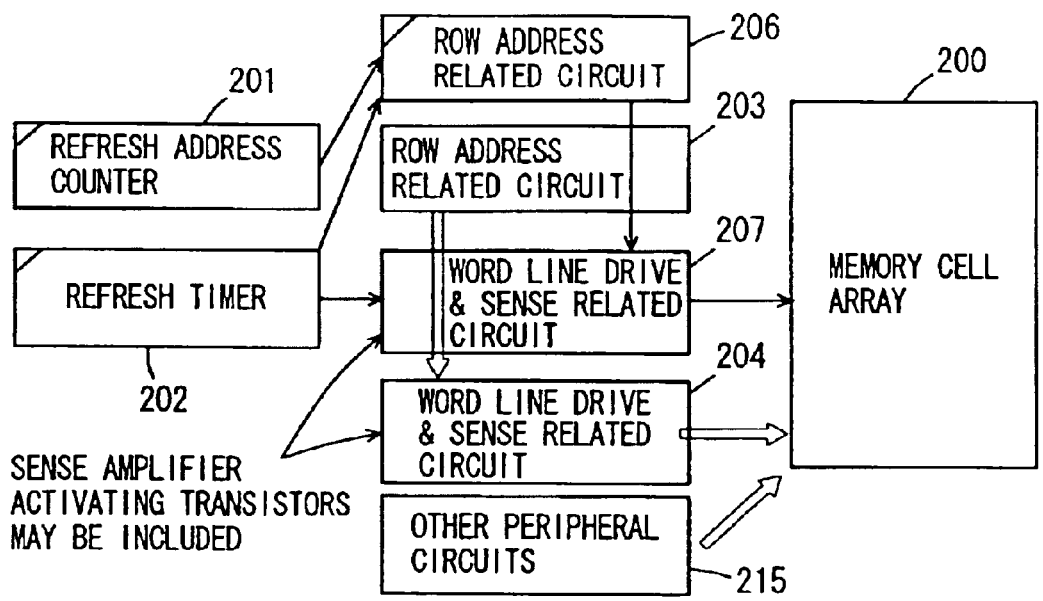
FIG. 75 schematically shows a structure of a first modification of the thirteenth embodiment of the present invention.

FIG. 75 schematically shows a structure of a first modification of the thirteenth embodiment of the present invention. In FIG. 75, a row-address-related circuit 206 and a row-related circuit block 207, which are activated in the refresh mode, are arranged corresponding to row-address-related circuit 203 and row-related circuit block 204, respectively. These row-related circuit block 207 and row-address-related circuit 206 operate only in the refresh mode, and include, as their components, ITR transistors which are, e.g., thick film transistors having thick gate insulating films, respectively.

Row-address-related circuit 203 and row-related circuit block 204 include, as their components, MIS transistors having thin gate insulating films, respectively, and execute a row selecting operation on memory cell array 200 in the normal operation mode. In the refresh mode (self-refresh mode), row-address-related circuit 206 and row-related circuit block 207 execute the row selecting operation on memory cell array 200. Power supply voltages and others of row-address-related circuit 203 and row-related circuit block 204 are controlled to suppress the gate tunnel currents in the refresh mode.

In column-related circuit block 205 including other peripheral circuits, the gate tunnel current reducing mechanism is likewise activated in the refresh mode and the standby state.

In the decode circuit or the like of row-address-related circuit 206 employing a thick film transistor, measures such as increasing of the power supply voltage, as needed, are taken so as to sufficiently suppress the influence by the threshold voltage of the thick film transistor for ensuring accurate operations.

As described above, the row-selection-related circuit which operates in the normal operation mode is arranged independently of the row-selection-related circuit which operates in the self-refresh mode. Thereby, the current consumption due to the gate tunnel current in the self-refresh mode can be reduced without impairing the operation characteristics in the normal operation mode.

The sense-related circuits included in row-related circuit blocks 204 and 207 are formed of a circuit block, which controls the operations of sense amplifiers arranged in memory array 200. For the sense amplifiers, it is not necessary to provide the sense amplifier circuit for the normal operation mode and the sense amplifier circuit for the refresh mode independently of each other. This is because cross-coupled MIS transistors forming the sense amplifier circuit, are all off in the standby state. However, a sense amplifier activating transistor for activating the sense amplifier circuit in the self-refresh mode may be employed independently of that operating in the normal operation mode. This sense amplifier activating transistor for the refresh mode has only to be formed of an MIS transistor having a large gate tunnel barrier and small current drive capability, so as to reduce the average DC current during operation of the sense amplifier circuit. Thus, the DC current consumption in the self-refresh mode can be reduced.

Figure 76:
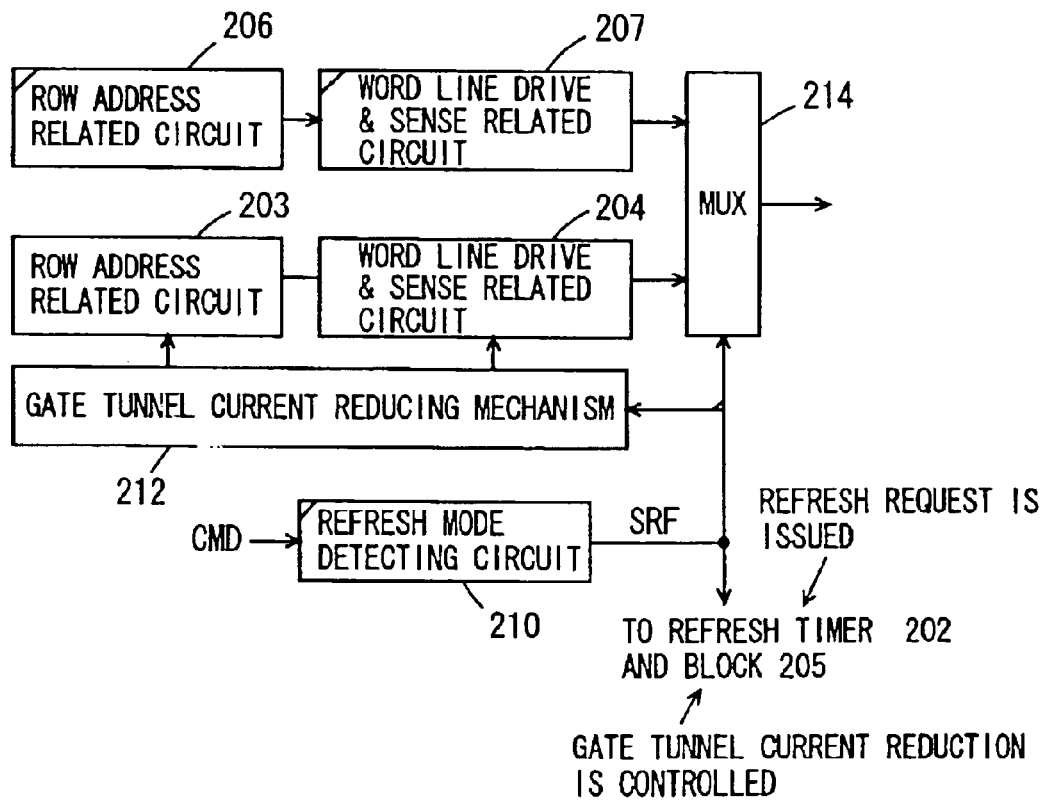
FIG. 76 schematically shows a structure for control of the semiconductor device shown in FIG. 75.

FIG. 76 schematically shows a structure of a control portion for the structure shown in FIG. 75. The control portion in FIG. 76 includes a refresh mode detecting circuit 210 for detecting that the self-refresh mode is designated in accordance with operation mode instructing signal CMD, a multiplexer (MUX) 214 for selecting one of the outputs of row-related circuit blocks 207 and 204 in accordance with a refresh mode instructing signal SRF generated from refresh mode detecting circuit 210, and a gate tunnel current reducing mechanism 212 for performing power control and others of row-address-related circuit 203 and row-related circuit block 204 in accordance with refresh mode instructing signal SRF. Refresh mode detecting circuit 210 includes, as its components, MIS transistors each having a large gate tunnel barrier.

When the refresh mode is designated by activation of refresh mode instructing signal SRF, gate tunnel current reducing mechanism 212 performs the power supply control and others on row-address-related circuit 203 and row-related circuit block 204 so that the gate tunnel current therein is reduced. Gate tunnel current reducing mechanism 212 may be merely configured to interrupt the supply of the power supply voltage to row-address-related circuit 203 and row-related circuit block 204.

In the refresh mode, multiplexer 214 selects and apply the output signals of row-related circuit block 207 including the word line drive circuit and the sense-related circuit to memory cell array 200. Self-refresh mode instructing signal SRF generated from refresh mode detecting circuit 210 is applied to refresh timer 202 and column-related circuit block 205. A gate tunnel current reducing mechanisms is likewise provided for the column-related circuit block so that the power supply or the bias of column-related circuit block 205 is so controlled as to reduce the tunnel current in accordance with refresh mode instructing signal SRF. Refresh timer 202 issues a refresh request at predetermined intervals while refresh mode instructing signal SRF is active.

Row-address-related circuit 206 and row-related circuit block 207 may be configured to be selectively activated in accordance with refresh mode detection signal SRF generated from refresh mode detecting circuit 210, and to have supply of the power supply voltage stopped when the normal operation mode is designated and refresh mode instructing signal SRF is inactive.

[Second Modification]

Figure 77:
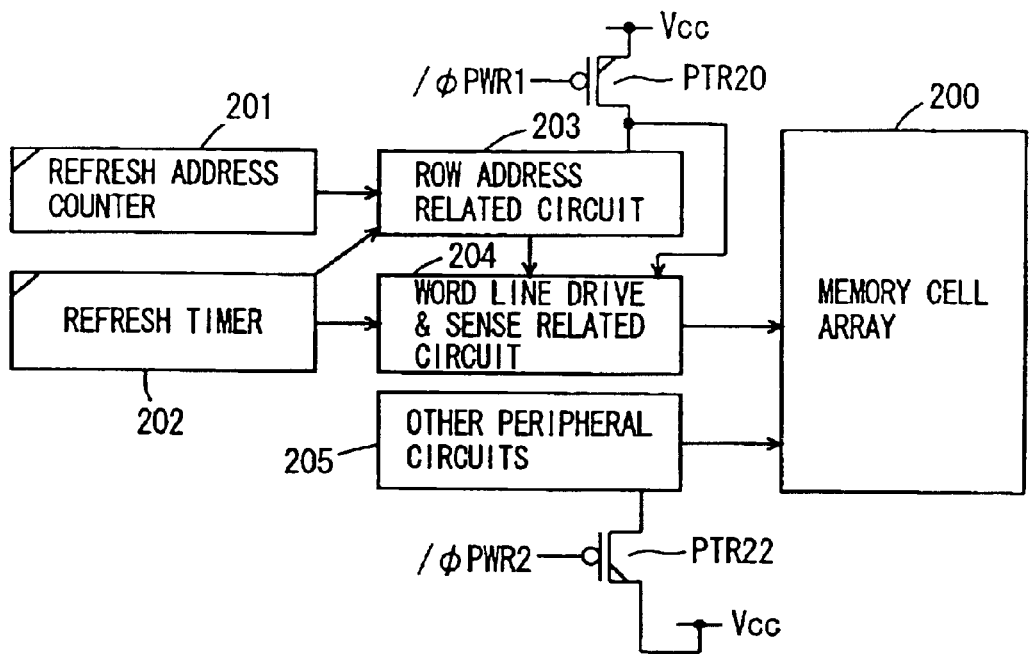
FIG. 77 schematically shows a structure of a second modification of the thirteenth embodiment of the present invention.

FIG. 77 schematically shows a structure of a second modification of the thirteenth embodiment of the present invention. The structure shown in FIG. 77 differs in the following point from the structure shown in FIG. 74. A MIS transistor PTR20 receiving, on its gate, a precharge instructing signal /φPWR1 is provided for row-address-related circuit 203 and row-related circuit block 204. Also, an MIS transistor PTR22, which is selectively turned on in response to a precharge instructing signal /φPWR2, is provided as a power supply control transistor for column-related circuit 205.

MIS transistors PTR20 and PTR22 are ITR transistors having large gate tunnel barriers. Row-address-related circuit 203 and circuit 204 (i.e., word line drive and sense-related circuit 204) include MIS transistors each having a gate insulating film of a minimized thickness as components thereof. Column-related circuit 205 including other peripheral circuits is formed of MIS transistors having thin gate insulating films. Structures other than the above are the substantially same as those shown in FIG. 74. An operation of the semiconductor device shown in FIG. 77 will now be described with reference to a signal waveform diagram of FIG. 78.

In the normal operation mode, refresh mode instructing signal SRF is at L-level. In this state, both power supply control signals /φPWR1 and /φPWR2 are at L-level, and power supply transistors PRT20 and PTR22 are on. Therefore, row-address-related circuit 203, row-related circuit 204 and column-related circuit 205 operate fast in accordance with the applied signals.

When the refresh mode is designated, refresh mode instructing signal SRF rises to H-level. Responsively, power supply control signal /φPWR2 attains H-level, and power supply transistor PRT22 is turned off. Thereby, supply of the power supply voltage to column-related circuit 205 stops so that current consumption of column-related circuit (other peripheral circuits) 205 is reduced. When refresh mode instructing signal SRF is at H-level, a refresh activating signal RFACT, which is produced in accordance with a refresh request issued from refresh timer 202, is activated, and power supply control signal /φPWR1 attains L-level. In this refresh mode, when refresh activating signal RFACT is at L-level, or inactive, the semiconductor device is placed in the standby state. In this standby state, precharge instructing signal /φPWR1 is at H-level. In the refresh mode, therefore, power supply transistor PTR20 is on while this refresh operation (row selecting operation) is being performed. In the standby state, supply of the power supply voltage to row-address-related circuit 203 and row-related circuit (word line drive and sense-related circuit) 204 stops. Thus, the current consumption in the refresh mode can be reduced.

In the structure shown in FIG. 77, power supply transistors PTR20 and PTR22 control the supply of power supply voltage. However, these power supply transistors PTR20 and PTR22 may be replaced with the gate tunnel current suppressing mechanism of any of the first or third embodiment, in which a deep well bias is employed, the polarity of power supply voltage is switched, or a sub-power supply line is isolated in the hierarchical power supply structure. The gate tunnel current reducing mechanism may be configured to be activated when power supply control signals /φPWR1 and /φPWR2 are inactive.

Figure 78:
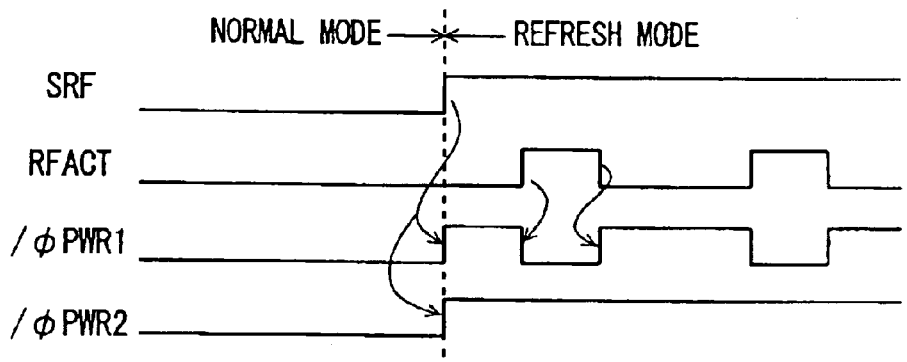
FIG. 78 is a signal waveform diagram representing an operation of the device shown in FIG. 77.
Figure 79:
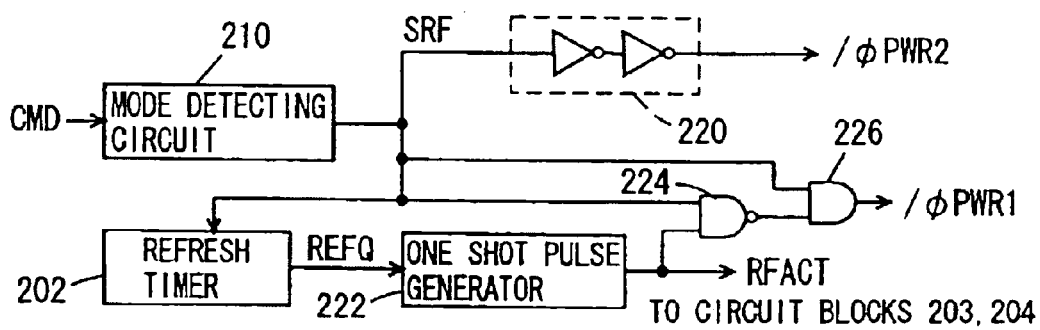
FIG. 79 schematically shows a structure of a portion for generating a signal shown in FIG. 78.

FIG. 79 shows a structure of a portion generating the control signals shown in FIG. 78. Refresh mode instructing signal SRF is produced from mode detecting circuit 210, which detects the designation of the refresh mode in accordance with operation mode instructing signal CMD. Buffer circuit 220 buffers this refresh mode instructing signal SRF to produce power supply control signal /φPWR2. In FIG. 79, buffer circuit 220 includes, e.g., cascaded inverters of two stages.

Refresh timer 202 issues refresh request signal REFQ at predetermined intervals when refresh mode instructing signal SRF is at H-level and active. One shot pulse generating circuit 222 produces a one shot pulse having a predetermined time width in accordance with refresh request signal REFQ. The one shot pulse generated from one shot pulse generating circuit 222 is applied as refresh activating signal RFACT to circuit blocks 203 and 204. While refresh activating signal RFACT is active, row selection as well as sensing, amplification and restoring of data are performed.

This control signal generating portion includes an NAND circuit 224 which receives refresh mode instructing signal SRF and refresh activating signal RFACT, and an AND circuit 226 which receives the output signal of NAND circuit 224 and refresh mode instructing signal SRF. AND circuit 226 generates power supply control signal /φPWR1.

In the normal operation mode, refresh mode instructing signal SRF is at L-level, and power supply control signal /φPWR1 maintains L-level. When refresh mode instructing signal SRF is at H-level, AND circuit 226 operates as a buffer circuit, and NAND circuit 224 operates as an inverter circuit. In the refresh mode, therefore, power supply control signal /φPWR1 is produced as an inverted signal of refresh activating signal RFACT.

Refresh activating signal RFACT may be produced but from a set/reset flip-flop, which is set in accordance with refresh request signal REFQ, and is reset upon elapsing of a predetermined time from generation of the sense amplifier activating signal, rather than one shot pulse generating circuit 222.

This control signal generating circuit includes, as its components, MIS transistors having large gate tunnel barriers. In the self-refresh mode, fast operation performance is not required. In the normal mode, power supply control signals /φPWR1 and /φPWR2 are both fixed to L-level, and therefore fast operation feature is not impeded at all in the normal mode so that no problem occurs.

Control signals /PWR1 and /PWR2 may be both at L-level in the normal mode. Further, in the refresh mode, control signal /PWR1 may be active for the refresh active state, and may be inactive for the refresh standby state, and control signal /φPWR2 may be inactive during the refresh mode. Any structure can be used for producing control signals /PWR1 and PWR2, as far as the above signal conditions are satisfied.

[Third Modification]

Figure 80:
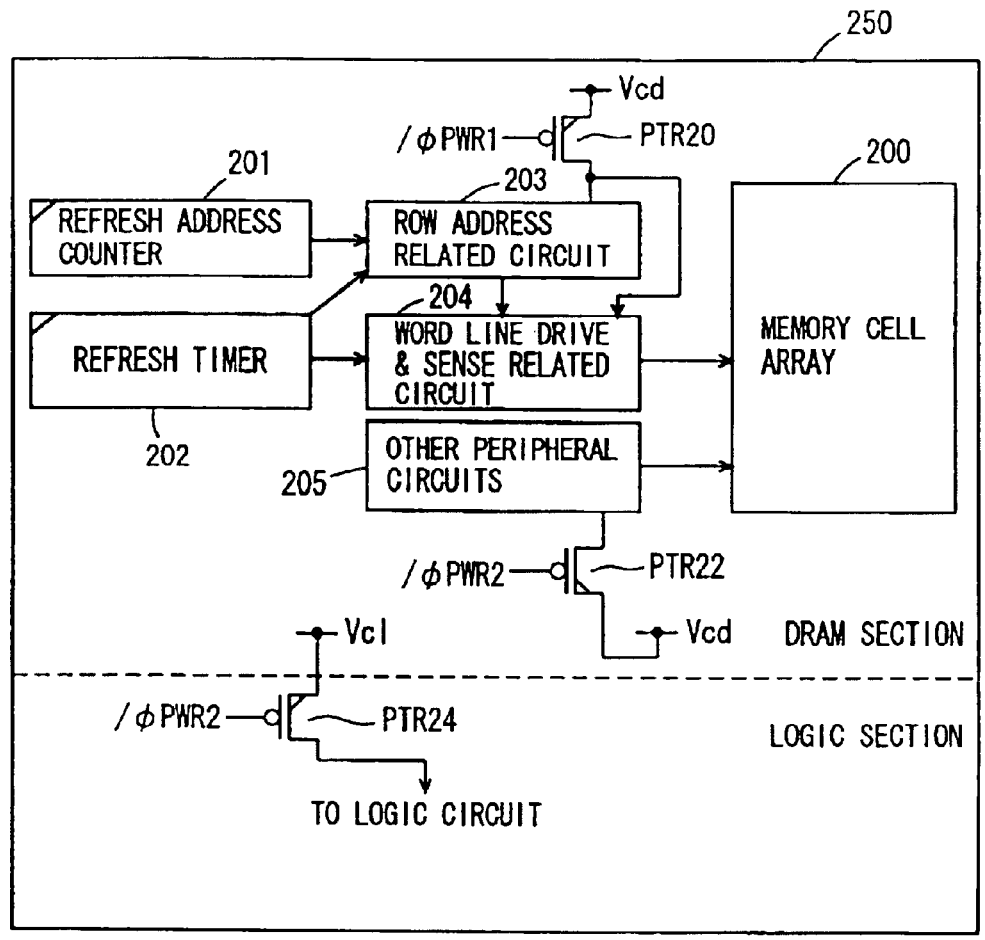
FIG. 80 schematically shows a structure of a third modification of the thirteenth embodiment of the present invention.

FIG. 80 schematically shows a structure of a third modification of the thirteenth embodiment of the present invention. In FIG. 80, a semiconductor device 250 includes a DRAM section and a logic section. This semiconductor device is a system LSI including a logic and a DRAM section mounted on a common semiconductor chip. The DRAM section includes memory cell array 200, row-address-related circuit 203, word line drive and sense-related circuit (row-related circuit) 204, column-related circuit 205 including other peripheral circuits, refresh address counter 201 and refresh timer 202.

Except for refresh address counter 201 and refresh timer 202, this DRAM section uses, as circuit components, logic transistors (MIS transistors) which have thin gate insulating films and are the same as MIS transistors used in the logic section. Refresh address counter 201 and refresh timer 202 are formed of MIS transistors (ITR transistors) having large gate tunnel barriers.

This system LSI can operate in several kinds of operation modes, and can operate in the active/standby cycles during the normal access cycle as well as in a low-current-consumption standby state which is called as a sleep mode. In the sleep mode, the logic section stops its operation. In the normal access cycle, current consumption of tens of milliamperes is allowed in the logic section including the logic circuit even during a standby state internally.

In the sleep mode, the following operations are performed. The logic section is isolated from its external power supply, for achieving the low power consumption of the logic section. In the DRAM section, stored data is held in memory cell array 200 with a minimum current consumption. Accordingly, the self-refresh operation in the sleep mode is performed with a necessary minimum power.

Power supply transistor PTR20 is provided for row-address-related circuit 203 and row-related circuit 204.

Power supply transistor PTR22 is provided for other periphery circuits (column-related circuit 205). Power supply transistors PTR20 and PTR22 are ITR transistors, respectively, and receive a memory power supply voltage Vcd. In the logic section, power supply transistor PTR24 formed of the ITR transistor is arranged as the power supply transistor. Power supply transistor PTR24 is controlled with power supply control signal /φPWR2.

In the normal operation mode, all power supply transistors PTR20, PTR22 and PTR24 are off. The operation waveforms of power supply control signals /φPWR1 and /φPWR2 are the same as those shown in FIG. 78. When the sleep mode is set and the DRAM section enters the self-refresh mode, the power supply voltage is supplied to row-address-related circuit 203 and word line drive and sense-related circuit (row-related circuit 204) or the tunnel leak current reducing mechanism is kept inactive only while the refresh is performed in accordance with power supply control signal /φPWR1. In the standby state during the sleep mode, power supply control signal /φPWR1 is set to activate the tunnel current reducing mechanism. For column-related circuit 205 including other peripheral circuits, power supply control signal /φPWR2 is set to turn off power supply transistor PTR22 so that supply of the power supply voltage to column-related circuit 205 stops.

During the sleep mode, power supply transistor PTR24 is turned off in accordance with power supply control signal /φPWR2. Therefore, the power consumption of the system LSI in the sleep mode can be reduced.

For the logic section, power supply transistor PTR24 receives a logic power supply voltage Vcl. In this logic section, however, as an alternative to power supply transistor PTR24, supply of logic power supply voltage Vcl may be externally stopped, and logic power supply voltage Vcl may be discharged to the ground voltage level internally. In either case, it is merely required that the gate tunnel current reducing mechanisms are active in the logic section and the DRAM section when power supply control signals /φPWR1 and /φPWR2 are inactive.

In the structure of the system LSI shown in FIG. 80, the circuit which is responsive to power supply control signals /φPWR1 and /φPWR2 in the DRAM section may be the gate tunnel current reducing mechanism, which has any of the structures in the foregoing embodiments.

Figure 81:
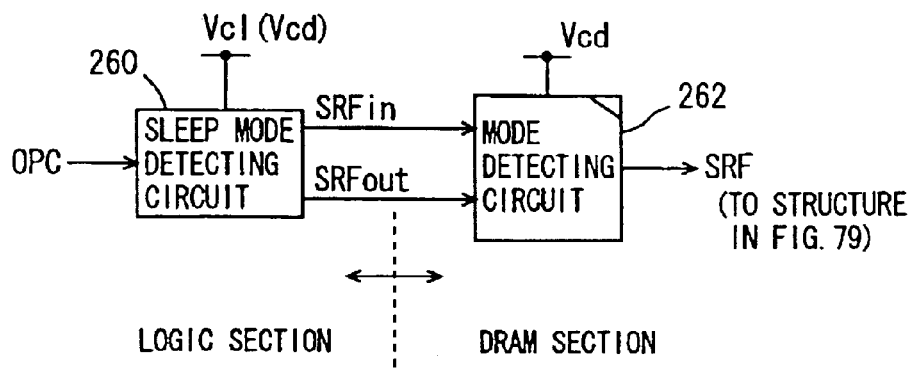
FIG. 81 schematically shows a structure of a portion for generating a control signal shown in FIG. 80.

FIG. 81 schematically shows a structure of a portion for generating the power supply control signals shown in FIG. 80. In FIG. 81, a power supply control signal generating portion includes a sleep mode detecting circuit 260 which decodes an instruction OPC applied, e.g., from a system controller, and detects entry and exit of the sleep mode, and a mode detecting circuit 262 which receives a self-refresh mode entry command SRFin and a self-refresh mode exit signal SRFout from sleep mode detecting circuit 260, and produces self-refresh mode instructing signal SRF. Mode detecting circuit 262 receives a memory power supply voltage Vcd, and preferably includes an ITR transistor as its component. Self-refresh instructing signal SRF is applied to the circuit shown in FIG. 79 for producing power supply control signals /φPWR1 and /φPWR2.

Sleep mode detecting circuit 260 is provided in the logic section, and receives logic power supply voltage Vcl as its operation power supply voltage. In the logic section, when the sleep mode designation is detected, supply of logic power supply voltage Vcl is cut off upon elapsing of a predetermined time after issuance of sleep mode entry command SRFin. In releasing the sleep mode, the system controller applies a sleep mode exit instruction as instruction OPC after logic power supply voltage Vcl is supplied. In the sleep mode, therefore, sleep mode detecting circuit 260 operates accurately to generate self-refresh entry command SRFin and self-refresh exit command SRFout to mode detecting circuit 262 even when supply of power supply voltage Vd stops in the logic section.

Sleep mode detecting circuit 260 may alternatively be configured to receive memory power supply voltage Vcd. In this case, sleep mode detecting circuit 260 always monitors instruction OPC which is applied from the system controller.

Memory power supply voltage Vcd is always supplied to refresh address counter 201 and refresh timer 202.

[Fourth Modification]

Figure 82:
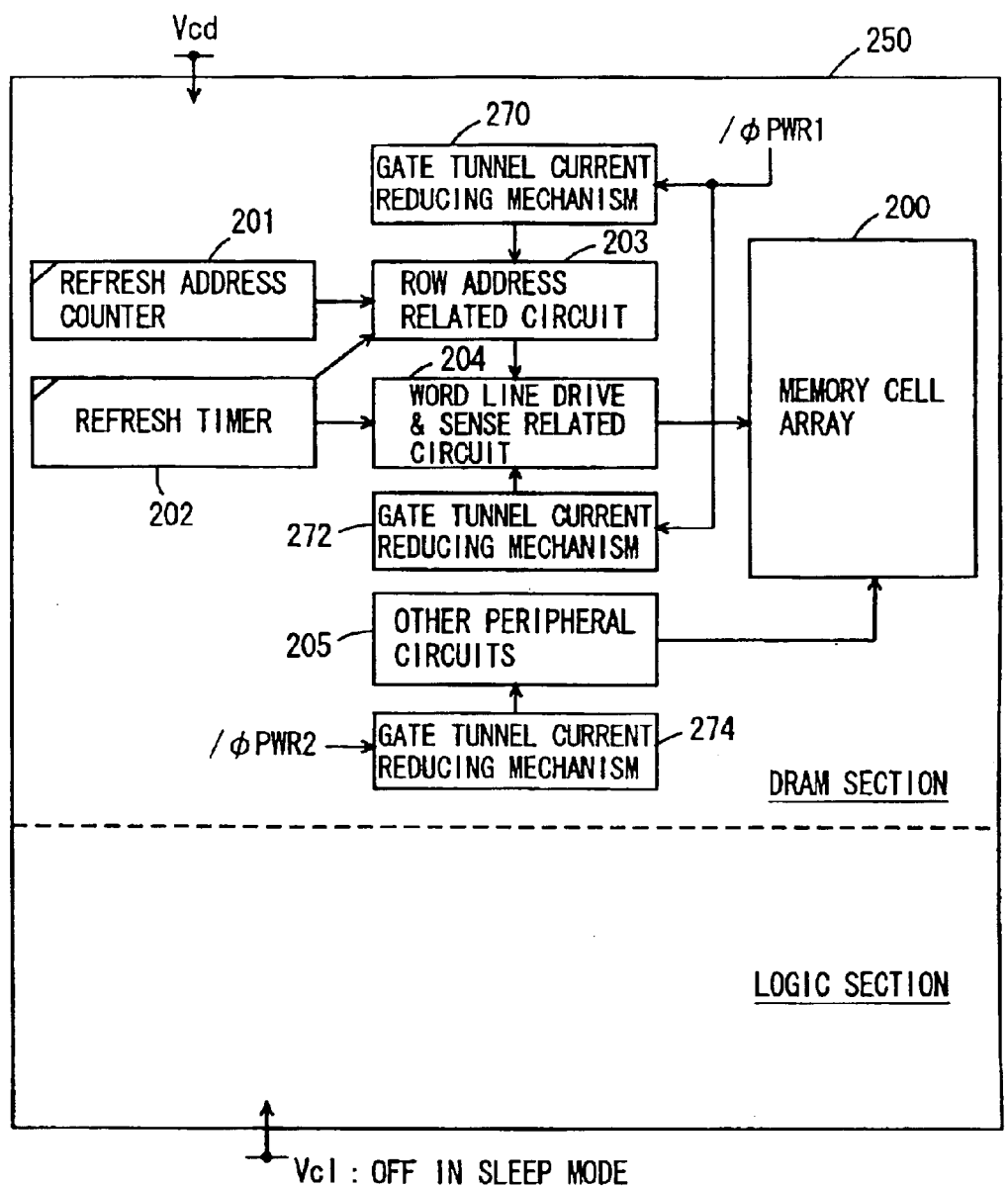
FIG. 82 schematically shows a structure of a fourth modification of the thirteenth embodiment of the present invention.

FIG. 82 schematically shows a structure of a fourth modification of the thirteenth embodiment of the present invention. In FIG. 82, semiconductor device 250 is a system LSI, and includes a DRAM section and a logic section mounted on a common chip. In the DRAM section, gate tunnel current reducing mechanisms 270 and 272, which are selectively activated in response to power supply control signal /φPWR1, are provided for row-address-related circuit 203 as well as word line drive and sense-related circuit (row-related circuit) 204, respectively. For other peripheral circuits (column-related circuit 205), a gate tunnel current reducing mechanism 274 which is selectively activated in response to power supply control signal /φPWR2 is provided. Instead of the configuration of stopping the power supply, gate tunnel current reducing mechanisms 270, 272 and 274 may be configured into any of the structures (well bias changing structure, hierarchical power supply structure, source voltage changing structure and others) in the embodiments already described.

The logic section is supplied with logic power supply voltage Vcl. Logic power supply voltage Vcl for the logic section is not supplied in the sleep mode. For the DRAM section, memory power supply voltage Vcd is always supplied. These power supply control signals /φPWR1 and /PWR2 are produced from the control signal generating portion shown in FIG. 81. By utilizing the structure shown in FIG. 82, it is likewise possible to reduce both the power consumption of the DRAM section and the power consumption of the logic section in the sleep mode associated with the low power consumption even in the case where the DRAM section is always supplied with memory power supply voltage Vcd.

According to the thirteenth embodiment of the present invention, as described above, the circuitry related only to the refresh operation is formed of the ITR transistors. For the other circuitry portion, the gate tunnel current reducing mechanism is activated in the standby state associated with the low current consumption. Therefore, the current consumption can be reduced in the standby state associated with the low power consumption without impairing the fast operation feature.

[Fourteenth Embodiment]

Figure 83:
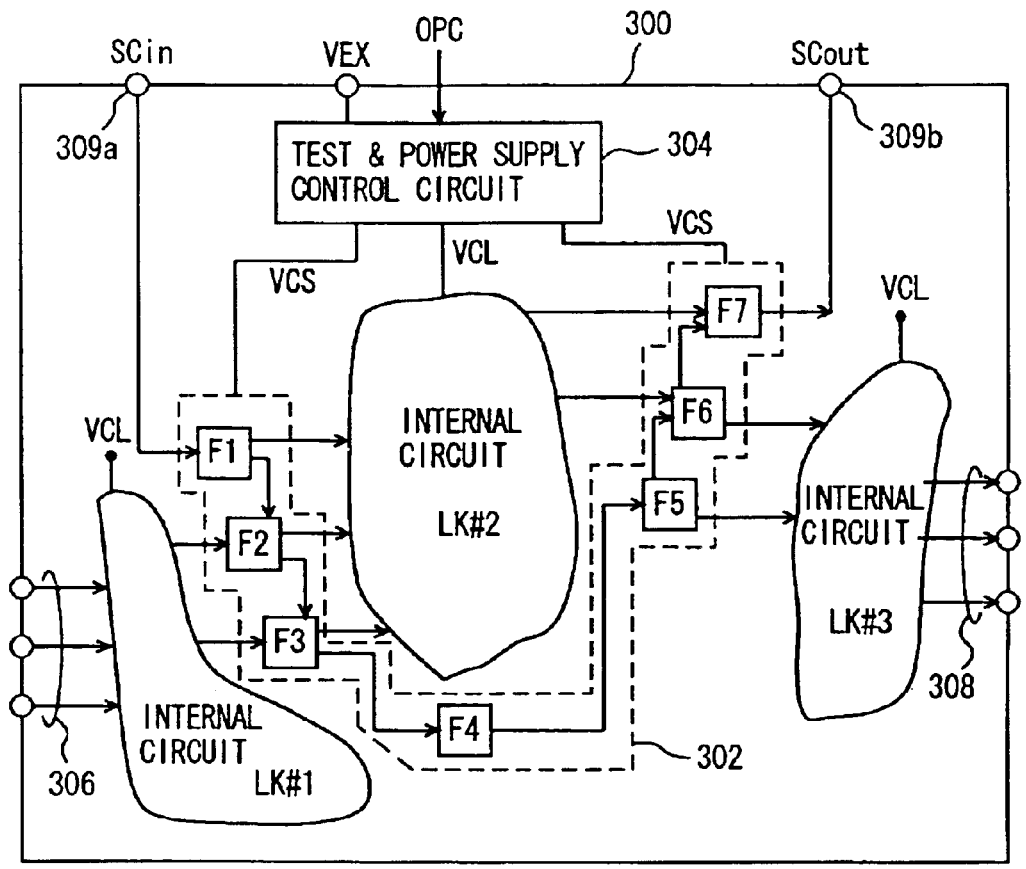
FIG. 83 schematically shows a whole structure of a semiconductor device according to a fourteenth embodiment of the present invention.

FIG. 83 schematically shows a whole structure of a semiconductor device according to a fourteenth embodiment of the present invention. In FIG. 83, a semiconductor device 300 includes a plurality of internal circuits LK#1–LK#3, a scan path 302 including a plurality of scan registers (flip-flops) F1–F7 provided for internal nodes of internal circuits LK#1–LK#3, and a test and power supply control circuit 304 for controlling the power supplies to internal circuits LK#1–LK#3 and scan path 302, and also controlling a test.

Scan registers F1–F7 of scan path 302 are connected in series between a scan data input terminal 309a and a scan data output terminal 309b. In a test operation, scan data SCin is successively transferred and latched via scan path 302 under the control of test and power supply control circuit 304. Subsequently, internal circuits LK#1–LK#3 operate, and the results of operation thereof are latched by scan registers F1–F7 again. Thereafter, the data latched by scan registers F1–F7 is successively output via scan path 302 from a scan data output terminal 309b as scan data SCout.

In the normal operation, scan registers F1–F7 operate as through circuits, and transfer the signals on the corresponding internal nodes to the subsequent internal circuits. In the normal operation, therefore, the signal/data are input via a normal input terminal group 306, and internal circuits LK#1–LK#3 execute predetermined operations. In this normal operation, scan path 302 transfers the signals on the respective internal nodes to the corresponding nodes of the internal circuits at the following stages. The processing result of internal circuit LK#3 is output via a normal signal output terminal group 308.

Provision of scan path 302 in semiconductor device 300 facilitates the test of the semiconductor device. More specifically, by providing scan path 302, internal circuits LK#1–LK#3 surrounded by scan registers F1–F7 can be individually and independently tested. In the test operation, internal circuits LK#1–LK#3 in semiconductor device 300 can be accessed directly through external terminal group 306 or via scan path 302. Thereby, controllability and observability of the internal nodes of semiconductor device 300 can be improved.

For the test of, e.g., internal circuit LK#2, a test pattern is set via scan data input terminal 309a in scan registers F1–F3 provided at the input nodes of internal circuit LK#2. Internal circuit LK#2 operates, and a result of this operation is taken into scan registers F7 and F6 provided at the output nodes of internal circuit LK#2. Then, the result is taken out as scan-out data SCout via scan path 302 and scan data output terminal 309b. By observing scan-out data SCout, the operation state of internal circuit LK#2 can be observed.

The shift and latch operations in scan path 302 are controlled by test and power supply control circuit 304. Test and power supply control circuit 304 controls the power supply to internal circuits LK#1–LK#3 and scan path 302. Internal circuits LK#1–LK#3 are supplied with power supply voltage VCL. Scan registers F1–F7 of scan path 302 are supplied with a power supply voltage VCS. In the standby state, e.g., during the sleep mode, supply of power supply voltage VCL to internal circuits LK#1–LK#3 stops. Scan registers F1–F7 of scan path 302 latch the output nodes of internal circuits LK#1 and LK#2 before this stop of the power supply. San registers F1–F7 of scan path 302 are provided with transfer gates (logic gates) for switching the operation between the test operation and the normal operation. By utilizing the logic gate (transfer gate), transfer and latch of the signal are performed. Thereby, current consumption of semiconductor device 300 is reduced in the standby state, e.g., during the sleep mode.

Figure 84:
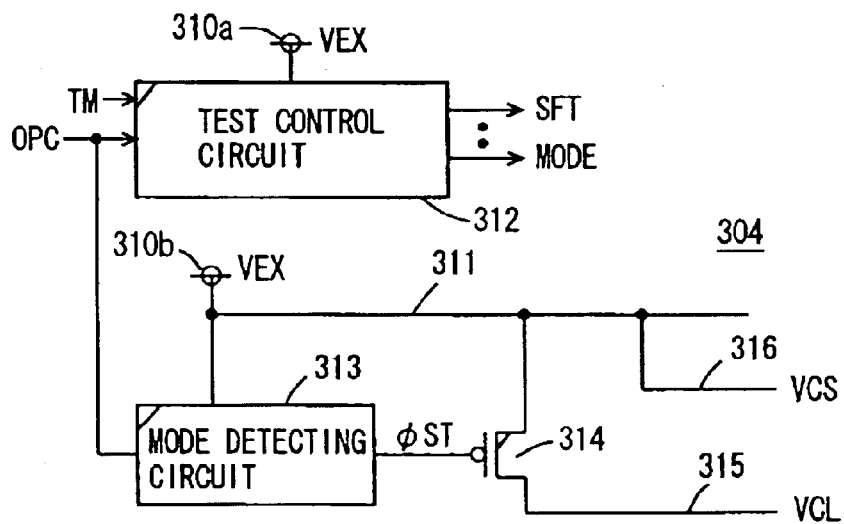
FIG. 84 schematically shows a structure of a test and power supply control circuit shown in FIG. 83.

FIG. 84 schematically shows a structure of test and power supply control circuit 304 shown in FIG. 83. In FIG. 84, test and power supply control circuit 304 includes: a test control circuit 312 which produces an operation mode instructing signal MODE and a shift clock signal SFT for controlling the shift operation of scan path 302 in accordance with operation mode instruction OPC; a mode detecting circuit 313 which detects the designation of the standby mode in response to operation mode instruction OPC; and a power supply transistor 314 which is turned off in response to a standby instructing signal φST received from mode detecting circuit 313, to isolate main power supply line 311 from an internal circuit power supply line 315.

Test control circuit 312 and mode detecting circuit 313 are externally supplied with a power supply voltage VEX through power supply nodes 310a and 310b, respectively. Main power supply line 311 is coupled to a scan path power supply line 316 and scan path power supply voltage VCS corresponding to external power supply voltage VEX is always supplied to scan path 302.

Test control circuit 312, mode detecting circuit 313 and power supply transistor 314 are formed of MIS transistors having large gate tunnel barriers. In the test operation utilizing scan path 302, fast operation performance is not significantly required for transferring signals through scan path 302, and therefore even with test control circuit 312 formed of the MIS transistors having large gate tunnel barriers, substantially no problem is caused.

Figure 85:
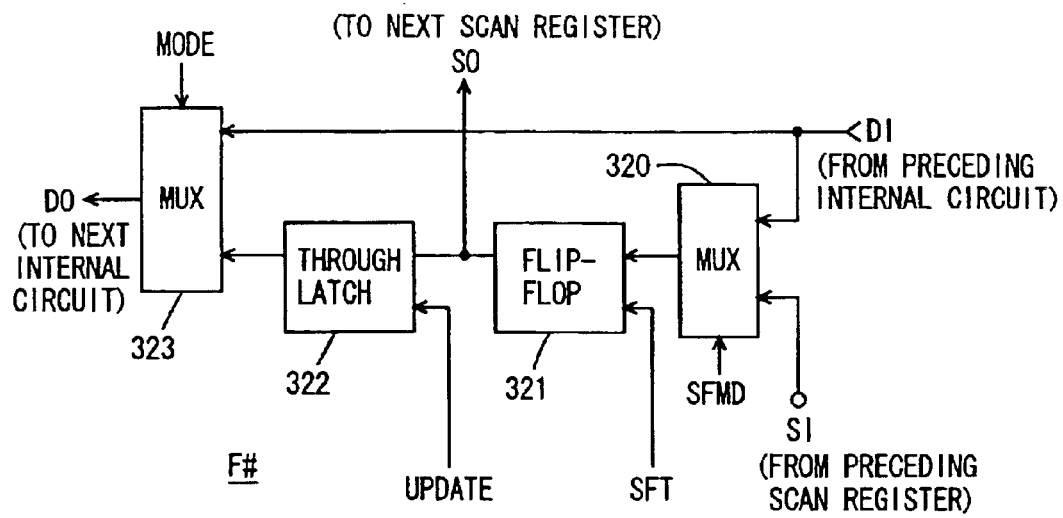
FIG. 85 schematically shows a structure of a register circuit shown in FIG. 83.

FIG. 85 schematically shows a structure of scan registers F1–F7 included in scan path 302 shown in FIG. 83. Scan registers F1–F7 have the same structures, and FIG. 85 shows, by way of example, only one of them as scan register F#.

In FIG. 85, scan register F# includes: a multiplexer (MUX) 320 which selects one of a shift-in signal SI and an internal signal DI in accordance with shift mode instructing signal SFMD; a flip-flop (shift register) 321 which takes in and transfers a signal applied from multiplexer 320 in accordance with shift clock signal SFT; a through latch 322 which takes in the output signal of flip-flop 321 in accordance with an update instructing signal UPDATE; and a multiplexer (MUX) 323 which selects and outputs either internal signal DI or the output signal of through latch 322 in accordance with mode instructing signal MODE.

Shift mode instructing signal SFMD, mode instructing signal MODE, shift clock signal SFT and update instructing signal UPDATE are produced by test control circuit 312 shown in FIG. 84.

Shift mode instructing signal SFMD designates the signal to be selected between internally applied signal DI and the signal (scan-in signal) SI shifted out from the scan register at a preceding stage in the scan path, in the scan test mode. Flip-flop 321 forms a shift register in scan path 302, and shifts the signal received from multiplexer 320 in accordance with shift clock signal SFT. Flip-flop 321 produces a shift-out signal SO for the scan register at the subsequent stage in scan path 302.

Through latch 322 enters a through state for passing the output signal of flip-flop 321 therethrough when update instructing signal UPDATE becomes active. When update instructing signal UPDATE is inactive, through latch 322 enters the latching state, and merely latches output signal SO of flip-flop 321 with passage of the output signal of flip-flop 321 inhibited.

Multiplexer 323 selects internal signal DI when mode instructing signal MODE designates the normal operation mode, and selects the signal applied from through latch 322 when the test operation mode is designated.

In transition to the standby state, scan register F# is utilized, and multiplexer 320 and flip-flop 321 are operated to latch internal signal DI in flip-flop 321. In this standby state, flip-flop 321 holds the signal on an internal node of semiconductor device 300 even when the power supply to internal circuits LK#1–LK#3 is cut off in the standby state.

After completion of the standby state, the signal held in flip-flop 321 is applied to the internal circuit by setting through latch 322 into the through state and multiplexer 323 to select the signal applied from through latch 322. Thereby, internal circuits LK#1–LK#3 can return fast to the original state. In the structure of the scan path shown in FIG. 83, internal circuit LK#1 is not provided at its input node with a flip-flop. However, the input node of internal circuit LK#1 is coupled to normal signal input terminal group 306, and the normal input terminal group 306 can be recovered to the original state (by an external device) immediately after completion of the standby state so that the state of internal circuit LK#1 can be restored to the original state.

Figure 86:
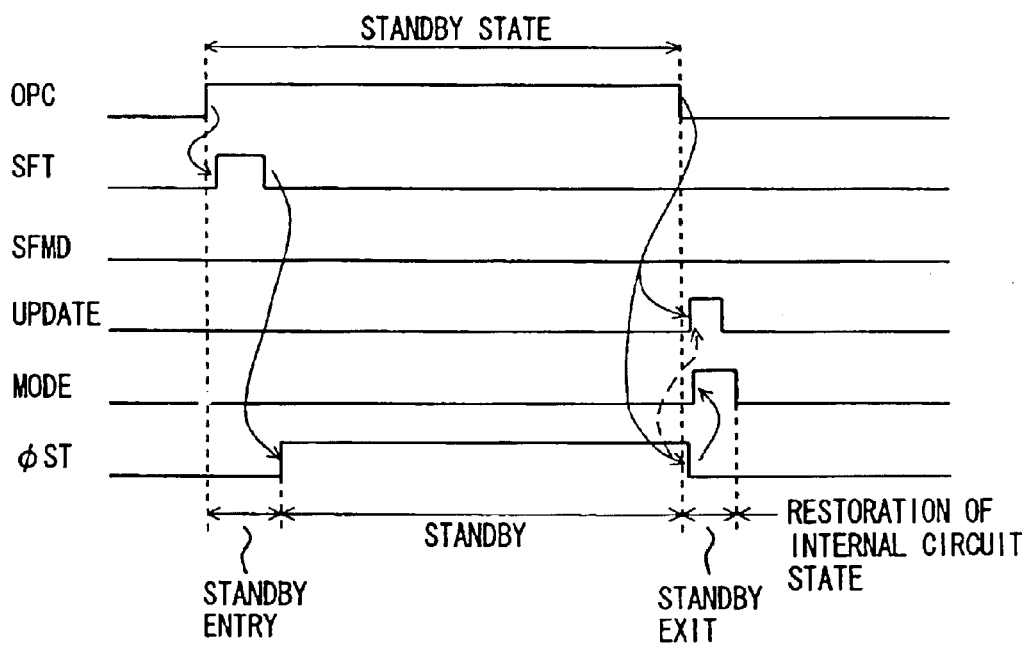
FIG. 86 is a signal waveform diagram representing an operation of the register circuit shown in FIG. 85.

An operation of the circuits shown in FIGS. 83–85 will now be described with reference to a timing chart of FIG. 86.

When operation mode instruct OPC instructs the standby state associated with a low power consumption, test control circuit 312 first activates shift clock signal SFT. In the normal operation mode, shift mode instructing signal SFMD is set to, e.g., L-level, and multiplexer (MUN 320 selects internal signal DI sent from the internal circuit at the preceding stage. Therefore, flip-flop 321 takes in the internal signal applied through multiplexer 320 in accordance with shift clock signal SFT. When shift clock signal SFT becomes inactive, and flip-flop 321 latches internal signal DI, mode detecting circuit 313 drives standby instructing signal $\phi$ST to H-level, to turn off power supply transistor 314. Thus, the standby entry mode is completed, and the power supply to internal circuits LK#1–LK#3 stop to reduce the leak currents due to gate tunnel currents in internal circuits LK#1–LK#3.

When the standby state is completed, operation mode instruction OPC changes, e.g., to L-level for starting the normal operation mode (normal mode). In response to the standby completion instruction (falling) of operation mode instruction OPC, standby instructing signal $\phi$ST from mode detecting circuit 313 attains L-level, and responsively internal circuit power supply line 315 is coupled to main power supply line 311, so that power supply voltage VCL is supplied to internal circuits LK#1–LK#3. Then, test control circuit 312 sets mode instructing signal MODE, e.g., to H-level in response to the standby completion instruction (falling) of operation mode instruction OPC after establishment of supply of the power supply voltage to internal circuits LK#1–LK#3. Multiplexer 323 selects the output signal of through latch 322. At this point in time, update instructing signal UPDATE applied from test control circuit 312 attains H-level, and responsively through latch 322 attains the through state, so that the internal signal latched by flip-flop 321 is applied to multiplexer 323. Therefore, the signal which was applied at the time of transition to the standby state is applied to the internal circuit in the subsequent stage. Thus, the standby exit mode is completed, and the semiconductor device returns to the state of executing the predetermined operation in the next normal operation mode.

FIG. 84 does not shows a response relationship between signals of test control circuit 312 and those of mode detecting circuit 313. Control signals for them have only to be generated with the delay times taken into consideration, or the control signals may be generated in accordance with a predetermined operation sequence based on the response relationship between the correlated control signals. Through latch 322 is configured in view of a boundary scan mode, which is standardized in JTAG (Joint Test Action Group) as described later, and may not be provided.

Figure 87:
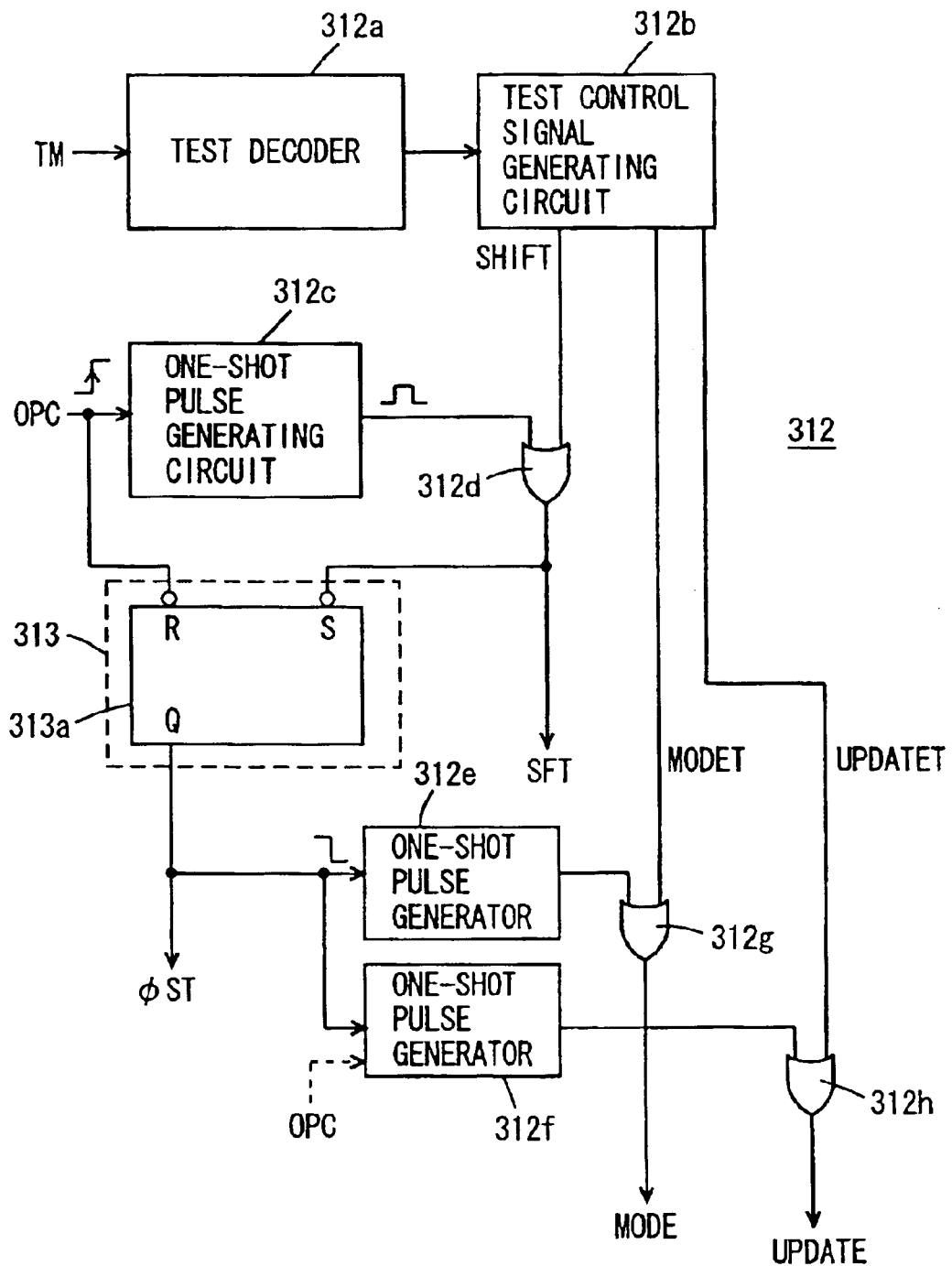
FIG. 87 shows a more specific structure of the test and power supply control circuit shown in FIG. 83.

FIG. 87 shows, by way of example, structures of test control circuit 312 and mode detecting circuit 313 shown in FIG. 84. In the structure shown in FIG. 87, a response relationship is present between operations of test control circuit 312 and mode detecting circuit 313. The delay times of circuits 312 and 313 may be individually adjusted to implement the operation sequence shown in FIG. 86.

In FIG. 87, test control circuit 312 includes: a test decoder 312*a* which decodes test mode command TM, and generates a signal instructing the designated operation mode; and a test control signal generating circuit 312*b* which generates a control signal required for the designated operation in accordance with the test operation mode instructing signal received from test decoder 312*a*. FIG. 87 shows, as a representative, a shift clock signal SHIFT, a mode instructing signal MODET and update instructing signal UPDATE required in the fourteenth embodiment.

Test control circuit 312 further includes: a one shot pulse generating circuit 312*c* which generates a one shot pulse signal in response to the standby state instruction (rising) of operation mode instruction OPC; one shot pulse generating circuits 312*e* and 312*f* which generate one shot pulse signals in response to falling of standby mode instructing signal $\phi$ST received from mode detecting circuit 313, respectively; an OR circuit 312*d* which receives the pulse signal from one shot pulse generating circuit 312*c* and shift signal SHIFT from test control signal generating circuit 312*b*, and produces shift clock signal SFT; an OR circuit 312*g* which receives the pulse signal from one shot pulse generating circuit 312*e* and mode instructing signal MODET from test control signal generating circuit 312*b*, and produces mode instructing signal MODE; and an OR circuit 312*h* which receives the pulse signal from one shot pulse generating circuit 312*f* and update instructing signal UPDATE from test control signal generating circuit 312*b*, and produces update instructing signal UPDATE.

Mode detecting circuit 313 includes a set/reset flip-flop 313*a* that is reset in response to the standby completion instruction (falling) of operation mode instruction command OPC, and is also reset in response to the falling of the pulse signal from OR circuit 312*d*, for generating standby mode instructing signal $\phi$ST. Mode detecting circuit 313 turns on power supply transistor 314 after flip-flop 321 latches a signal in response to shift clock signal SFT.

In the scan test, test decoder 312*a* produces the test operation mode instructing signal in accordance with test mode command TM, and the various control signals SFT, MODE and UPDATE are produced in accordance with this test operation mode instructing signal. During the standby state in the normal operation mode, shift clock signal SFT, mode instructing signal MODE and update instructing signal UPDATE are produced in accordance with the pulse signals generated from one shot pulse generating circuits 312*c*, 312*d* and 312*f*. Accordingly, the scan registers included in the scan path can be easily utilized as the register circuits for data saving without making any change to the structure of the control circuit for test.

In the structure shown in FIG. 87, one shot pulse generating circuit 312*f* may be supplied with an operation mode instruction OPC as indicated by broken line, instead of standby mode instructing signal $\phi$ST. In the scan register circuit, the through operation and the latch operation may be executed in accordance with update instructing signal UPDATE before power supply voltage VCL for the internal circuits recovers to the stable state. Even in this case, no problem arises because the power supply voltage is normally applied to the scan register. Mode instructing signal MODE is set to the state of selecting the output signal of through latch 322 after the power supply to the internal circuits is stabilized.

After the output signal of through latch 322 is selected for a predetermined period mode by the mode instructing signal MODE, the internal circuits perform the respective circuit operations (in the case of the logic circuits), and the internal states return to the same states as the original states set before transition to the standby state. In this state, multiplexer 323 selects the output signal of the associated internal node of the internal circuit at the preceding stage. In this case, if the input circuits operate in synchronization with the clock signal and a transfer gate is arranged at the input/output node, the logical level of the clock signal is merely required to be set, at the time of the standby exit mode, to such a level that the transfer gate for clock synchronization of the internal circuit attains the through state.

[First Modification]

Figure 88:
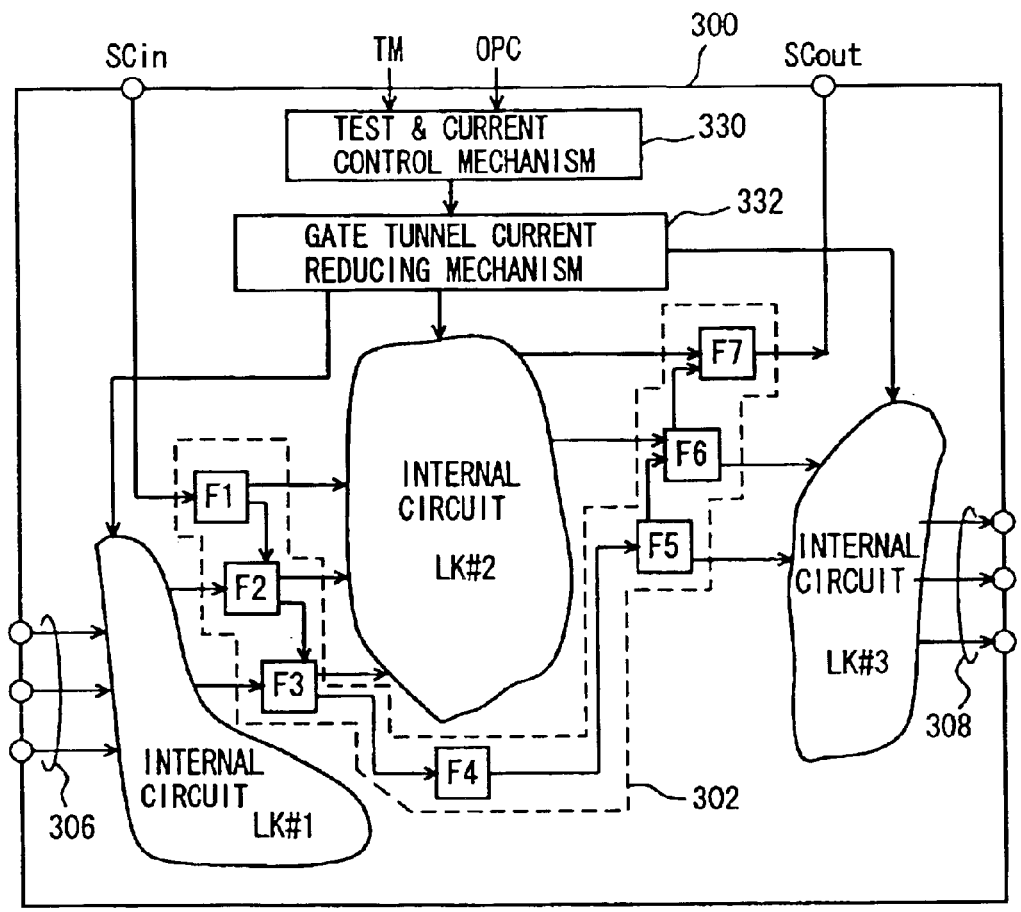
FIGS. 88 to 91 show structures of first to fourth modifications of the fourteenth embodiment of the present invention, respectively.

FIG. 88 schematically shows a structure of a first modification of the fourteenth embodiment of the present invention. In FIG. 88, a gate tunnel current reducing mechanism 332 is arranged for internal circuits LK#1–LK#3 of semiconductor device 300. Gate tunnel current reducing mechanism 332 has any of structures for changing the source voltages and/or deepening the well biases of the MIS transistors included in internal circuits LK#1–LK#3, and for stopping the supply of power supply. A test and current control mechanism 330 is provided for gate tunnel current reducing mechanism 332. Test and current control mechanism 330 operates in accordance with operation mode instruction OPC to activate, in the standby state, gate tunnel current reducing mechanism 332 for reducing the gate tunnel currents in internal circuits LK#1–LK#3. In the test operation and the normal operation mode, gate tunnel current reducing mechanism 332 is deactivated when internal circuits LK#1–LK#3 operate. Structures other than the above are the substantially same as those shown in FIG. 83. In the test operation, a test signal is scanned through scan path 302.

Alternatively, for reducing the gate tunnel currents of internal circuits LK#1–LK#3 in the standby state, individual power supply voltages may be externally supplied to internal circuits LK#1–LK#3 and scan path 302 separately, rather than external supply of power supply voltage VCL to internal circuits LK#1–LK#3.

[Second Modification]

Figure 89:
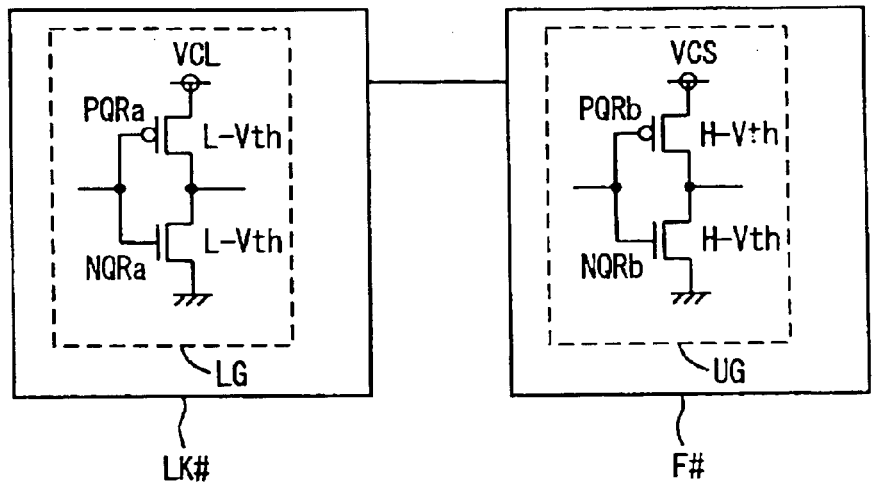

FIG. 89 shows a structure of a second modification of the fourteenth embodiment of the present invention. FIG. 89 shows internal circuit LK# and scan register F# included in scan path 302 as a representative. In internal circuit LK#, logic circuit LG includes a CMOS inverter. The CMOS inverter is formed of MIS transistors PQRa and NQRa each having a low threshold voltage (L-Vth).

A unit circuit UG of scan register F# includes a CMOS inverter. This unit circuit UG is a component of each of flip-flop 312 of the scan register and through latch 322 shown in FIG. 85. In the case where multiplexers 320 and 322 are formed of, e.g., tristate inverter buffers, unit circuits UG may likewise be employed in multiplexers 320 and 323. A CMOS inverter in unit circuit UG includes MIS transistors PQRb and NQRb each having a high threshold voltage (H-Vth). By using the MIS transistor of a high threshold voltage for the MIS transistor forming scan register F#, an off-leak current Ioff in the standby state can be reduced, and the current consumption of the semiconductor device 300 in the standby state can be further reduced.

[Third Modification]

Figure 90:
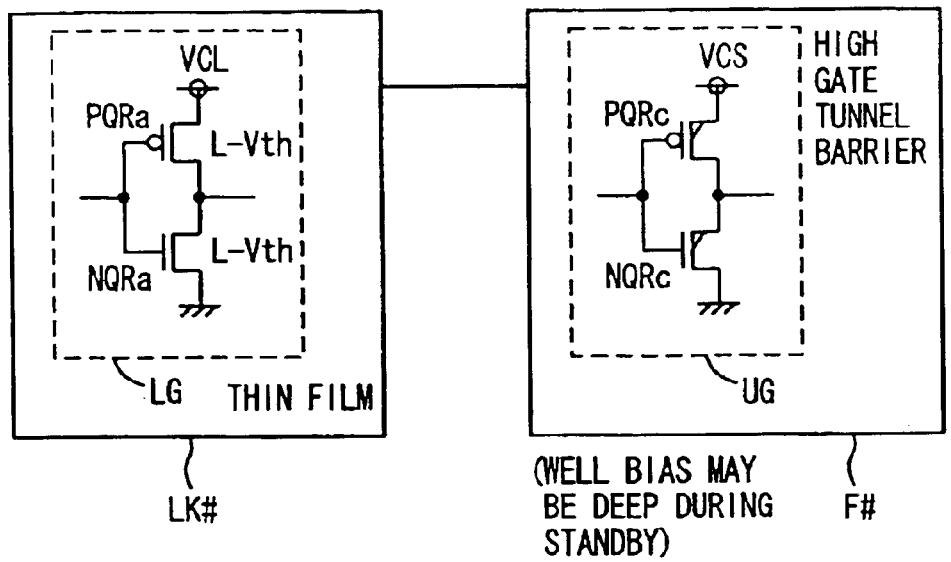

FIG. 90 shows a structure of third modification of the fourteenth embodiment of the present invention. In internal circuit LK# shown in FIG. 90, each of MIS transistors PQRa and NQRa, which are components of logic circuit LG, is a (L-Vth) thin film transistor each having a threshold voltage of a small absolute value and a thin gate insulating film. Each of MIS transistors PQRc and NQRc, which are components of unit circuit UG in scan register F#, is an ITR transistor having a high gate tunnel barrier. In the standby state, therefore, scan register F# in scan path 302 has the gate tunnel current suppressed while holding the internal signal, and the current consumption of semiconductor device 300 in the standby state can be reduced.

In the structure shown in FIG. 90, the well biases of ITR transistors PQRc and NQRc in the standby state may be deepened.

[Fourth Modification]

Figure 91:
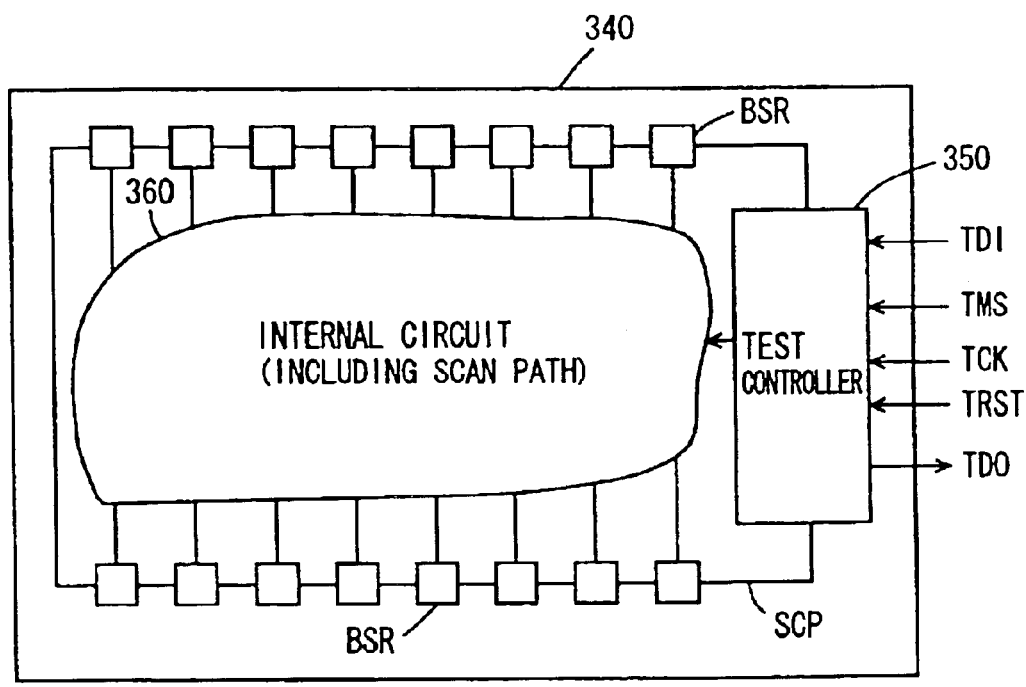

FIG. 91 schematically shows a structure of a fourth modification of the fourteenth embodiment of the present invention. In FIG. 91, a semiconductor device 340 includes boundary scan registers BSR provided for external input/output terminals, respectively, a test controller 350 for controlling transfer of signals/data of boundary scan registers BSR, and an internal circuit 360 coupled to the external input/output terminals via boundary scan registers BSR. Internal circuit 360 may include the scan path, which allows observation of its internal nodes.

Test controller 350 receives externally supplied input test data, test mode select command TMS, test clock signal TCK and test reset signal TRST, and performs shift operations for successively setting test input data TD1in boundary scan registers BSR. Test controller 350 also latch the data in boundary scan registers BSR through a scan path SCP formed of these registers BSR, and thereafter performs the shift operation for outputting output test data therefrom. Further, test controller 350 controls the gate tunnel current reducing mechanism, which is provided in internal circuit 360 for reducing the power supply current of internal circuit 360 in the standby state, and stores the signals/data on an internal node of internal circuit 360 in a corresponding boundary scan register BSR.

Figure 92:
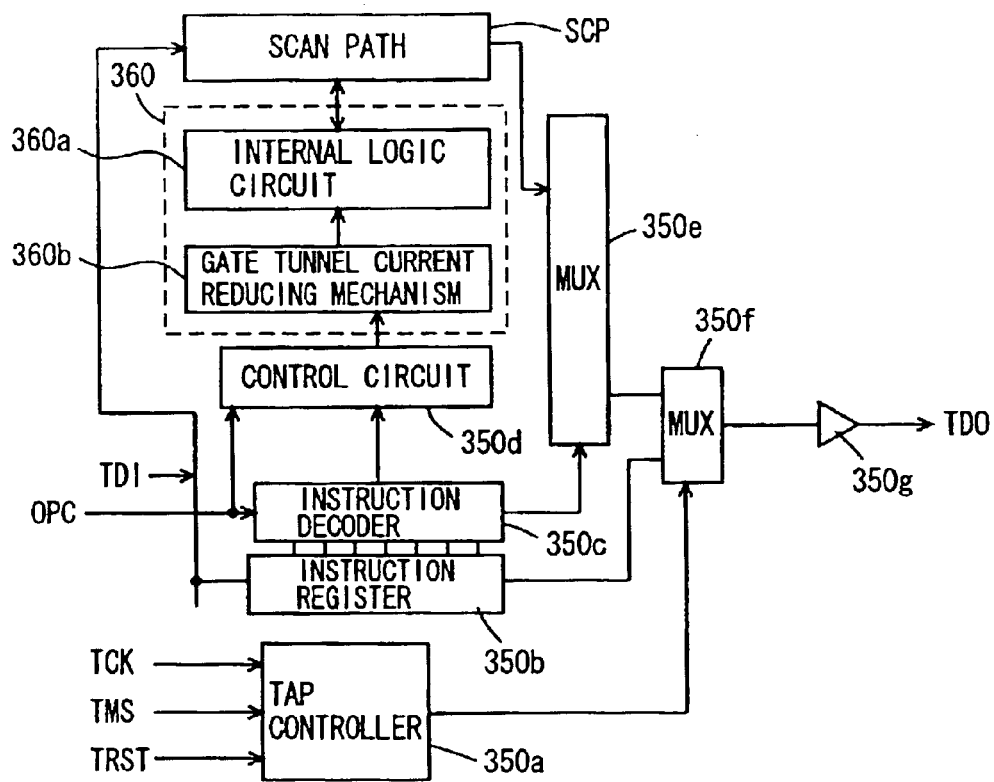
FIG. 92 schematically shows a structure of a test controller shown in FIG. 91.

FIG. 92 schematically shows a structure of a test controller 350 shown in FIG. 91. In FIG. 92, internal circuit 360 includes an internal logic circuit 360a for performing predetermined logical processing, and a gate tunnel current reducing mechanism 360b coupled to internal logic circuit 360a. Internal logic circuit 360a is formed of MIS transistors, and gate tunnel current reducing mechanism 360b reduces a gate tunnel current in the standby state of internal logic circuit 360a. Internal logic circuit 360a transmits in one direction the signal/data with scan path SCP including boundary scan registers BSR. Scan path SCP may include a scan path for allowing observation of the internal nodes of the internal logic circuit 360.

Test controller 350 includes: a TAP (test access port) controller 350a which receives test clock signal TCK applied in the test mode, test mode select signal TMS for selecting and designating the test mode, and test reset signal TRST for resetting the test mode, and produces the internal clock signal for the boundary scan test; an instruction register 350b which receives test data TDI applied bit by bit in serial via a test data input terminal; an instruction decoder 350c which decodes an instruction stored in instruction register 350b, and produces a control signal required for the test; and a control circuit 350d which produces control signals required for the test in accordance with the decode signal applied from instruction decoder 350c. Control circuit 350d controls transfer and latch of the signal/data of the boundary scan registers in scan path SCP, and executes the activation of gate tunnel current reducing mechanism 360b in the standby state.

The test controller shown in FIG. 92 is a controller compatible with the JTAG test, and usually includes a bypass register for bypassing test data TDI, and a user-definable register group of which use can be defined by an user. However, these registers are not shown in FIG. 92.

Test controller 350 includes: a multiplexer (MUX) 350e which selects either the output signal/data of scan path SP or the output signal of the bypass register (not shown) in accordance with the output signal of instruction decoder 350c; a multiplexer (MUX) 350f which selects the output signal/data of either multiplexer 350e or instruction register 350b in accordance with the output signal of TAP controller 350a; and a driver/buffer 350g which buffers and outputs the output signal/data of multiplexer 350f to a test data terminal. In the normal operation mode, test data output terminal TDO is set to a high impedance state.

The test controller shown in FIG. 92 is standardized under the IEEE standard. In the fourteenth embodiment, instruction decoder 350c and/or control circuit 350 have a function of receiving operation mode instruction OPC, to produce signals for controlling the latching of data/signal in scan path SCP and of activating the gate tunnel current reducing mechanism 360b in the standby state of this semiconductor device. Control circuit 350d may have the structure shown in FIG. 87. Instruction decoder 350c performs a control such that scan path SCP latches the signals/data on the corresponding nodes in transition to the standby state, and the signals/data thus latched are transferred to the internal nodes at the next stage when the standby state is completed. Under the IEEE standard, the boundary scan register can take in data/signal according to an instruction "Capture-DR", and the signal/data stored in the boundary scan register can be applied to the internal node at the next stage according to an instruction "Update-DR".

The same states as those achieved when these instructions are applied are produced in instruction decoder 350c according to operation mode instruction OPC. In accordance with the signal indicating a decoding result generated from instruction decoder 350c, control circuit 350d produces control signals required for transfer/latch/update of the data. Operation mode instruction OPC is also applied to instruction decoder 350c and/or control circuit 350d so that the gate tunnel current reducing mechanism 360b is activated for reducing the gate tunnel current in internal logic circuit 360a during the standby state. Scan path SCP operates in the same manner as that already described with reference to FIG. 83. Scan path SCP may include not only the boundary scan registers provided corresponding to the external input/output terminals but also scan path registers which allows external observation of the internal nodes of internal circuitry.

For reducing the gate tunnel current, the MIS transistors included in scan path SCP may be formed of MIS transistors having large gate tunnel barriers, and internal logic circuit 360a is formed of thin film transistors. In the semiconductor device which can be subject to the boundary scan test, the leak current due to the gate tunnel current can be reduced to reduce the current consumption in the standby state.

The structure shown in FIG. 92 can employ all the structures in the fourteenth embodiment already described.

As for the term "the standby state" here, it represents any standby state in a sleep mode in which the logic circuit stops its operation for a long time, a self-refresh mode in which DRAM or the like is self-refreshed, and an auto-refresh mode in which the refresh operation is repeated a predetermined number of times in accordance with an externally applied refresh instruction in DRAM or the like, and a standby cycle in the normal operation in which an active cycle and a standby cycle are repeated.

[Fifteenth Embodiment]

Figure 93:
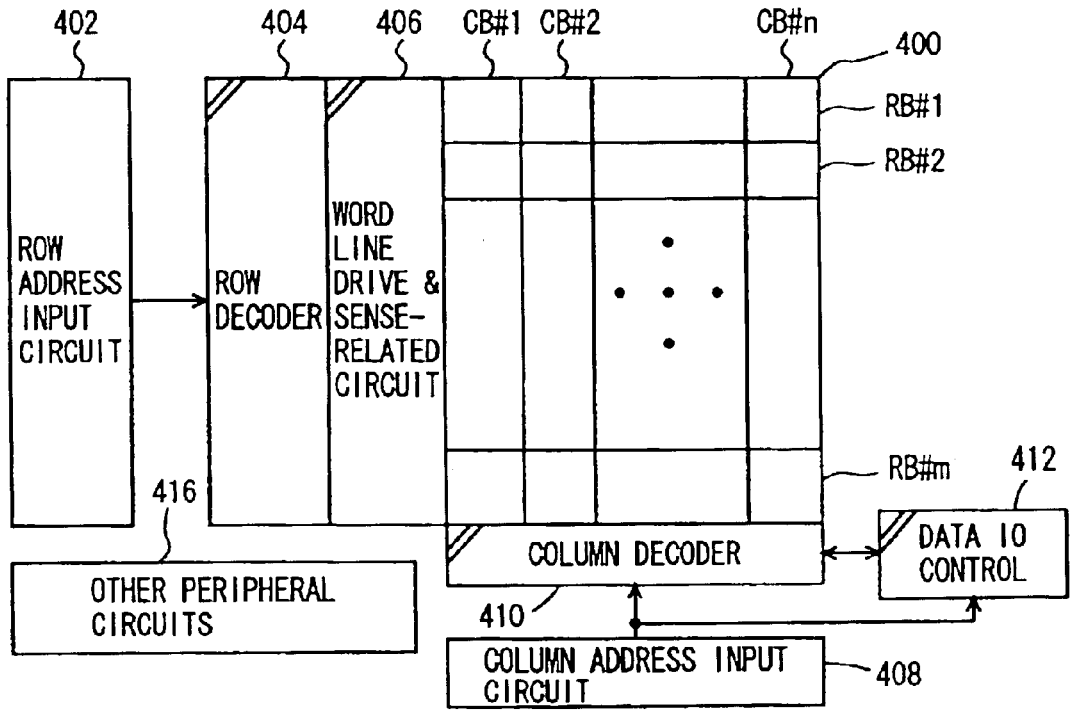
FIG. 93 schematically shows a whole structure of a semiconductor device according to a fifteenth embodiment of the present invention.

FIG. 93 schematically shows a whole structure of a semiconductor device according to a fifteenth embodiment of the present invention. FIG. 93 shows a Dynamic Random Access Memory (DRAM) as an example of the semiconductor device. In FIG. 93, this DRAM includes a memory cell array 400 having memory cells arranged in rows and columns. Memory cell array 400 is divided into a plurality of row blocks RB#1–RB#m and a plurality of column blocks CB#1–CB#n.

The DRAM further includes: a row address input circuit 402 which receives an externally applied row address signal, and produces an internal row address signal; a row decoder 404 which receives and decodes the internal row address signal including a block address signal from row address input circuit 402; a word line drive and sense-related circuit 406 which includes a word line drive circuit for driving a selected row in a selected block to the selected state in accordance with the decode signal received from row decoder 404, and a sense-related control circuit for controlling the sense amplifiers for sensing and amplifying the data of memory cells in the selected row; a column address input circuit 408 which receives an externally applied column address signal, and produces an internal column address signal including a block select signal; a column decoder 410 which performs the decoding in accordance with the internal column address signal received from column address input circuit 408, and produces a column select signal designating a column to be selected; a data IO control circuit 412 which couples the column selected by column decoder 410 through an internal IO line to an internal data line for performing input/output of data in accordance with the block select address received from column address input circuit 408; and other peripheral circuitry 416 including an internal voltage generating circuit and a central control circuit for producing a row-related control signal common to row blocks RB#1–RB#m and a column-related control signal common to column blocks CB#1–CB#n.

Row decoder 404 includes block row decoders provided corresponding to row blocks RB#1–RB#m, respectively, and only a block row decoder provided corresponding to a row block including the selected row operates. The unselected block row decoders maintain the standby state. In column decoder 410, only a block column decoder provided corresponding to the selected column block performs the decoding operation. In data IO control circuit 412, input/output circuit (write driver/preamplifier) provided corresponding to the selected column is activated to couple the internal data line to the internal IO line selected by column decoder 410. Therefore, the block-division operation or a partial activation operation is performed, and row decoder 404, word line drive and sense-related circuit 406, column decoder 410 and data IO control circuit 412 control the gate tunnel currents on a block by block basis.

Figure 94:
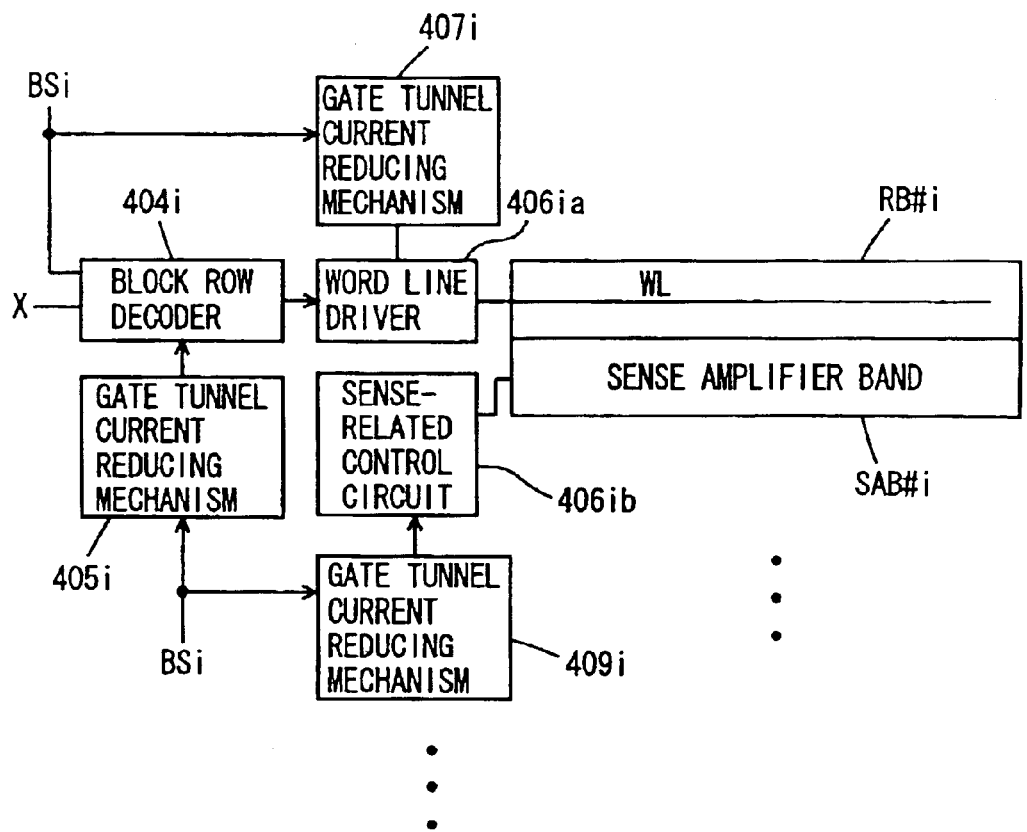
FIG. 94 schematically shows a structure of a portion corresponding to one row block of the semiconductor device shown in FIG. 93.

FIG. 94 schematically shows a structure of a portion corresponding to one row block RB#i (i=1–m) of row decoder 404 and word line drive and sense-related circuit 406 shown in FIG. 93. Referring to FIG. 94, row block RB#i is provided with a block row decoder 404i that is activated to decode an internal row address signal X when block select signal BSi is active, and a word line driver 406i that drives an addressed word line WL in corresponding row block RB#i to the selected state in accordance with the decode signal of block row decoder 404i. A sense amplifier band SAB#i is arranged adjacently to row block RB#i. In sense amplifier band SAB#i, sense amplifier circuits are arranged corresponding to the columns of the row block RB#i. Sense-related control circuit 406ib controls activation/deactivation of sense amplifier band SAB#i.

Gate tunnel current reducing mechanisms 405i, 407i and 409i are provided corresponding block row decoder 404i, word line driver 406*ia* and sense-related control circuit 406*ib*. These gate tunnel current reducing mechanisms 405*i*, 407*i* and 409*i* are activated when block select signal BSi is in the unselected state, and reduce the gate tunnel currents in block row decoder 404*i*, word line driver 406*ia* and sense-related control circuit 406*ib*, respectively when activated. These gate tunnel current reducing mechanisms 405*i*, 407*i* and 409*i* are arranged corresponding to each row block. Only for the selected row block, block decoder 404*i* and word line driver 406*i* are activated, and sense-related control circuit 406*i* is activated. For the unselected row blocks, gate tunnel current reducing mechanisms 405*i*, 407*i* and 409*i* are kept active to reduce the gate tunnel currents in the active cycle (in the same manner as in the standby cycle).

If a sense amplifier band is shared between the adjacent row blocks, gate tunnel current reducing mechanism 409*i* is also supplied with the block select signal for the row blocks sharing sense amplifier band SAB#i. According to the shared sense amplifier structure, in which each sense amplifier band is shared between adjacent row blocks, sense-related control circuit 406*ib* also controls the operations of the bit line isolation gate, the bit line precharge and equalize circuit, and the sense power supply node equalize circuit.

Figure 95:
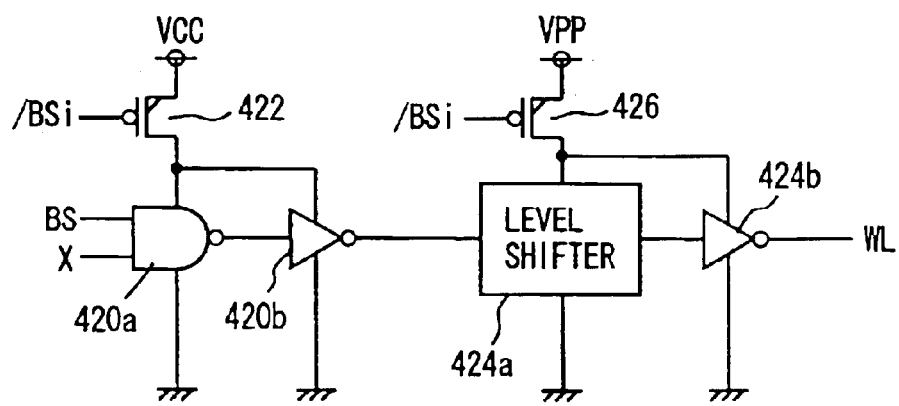
FIG. 95 schematically shows structures of a block row decoder and a word line driver shown in FIG. 94.

FIG. 95 shows, by way of example, structures of gate tunnel current reducing mechanisms 405*i* and 407*i* shown in FIG. 94. In FIG. 95, a unit row decoder included in block row decoder 404*i* includes an NAND decoder circuit 420*a* which is enabled to decode internal row decode signal X when block select signal BS is active, and an inverter 420*b* which inverts the output signal of NAND decode circuit 420*a*. The power supply nodes of NAND decode circuit 420*a* and inverter 420*b* are coupled to the power supply node via a power supply transistor 422. This power supply transistor 422 is preferably formed of an ITR transistor, and receives complementary block select signal /BSi on its gate.

The word line driver includes a level shifter 424*a* which converts the output signal of inverter 420*b* into a signal having an amplitude of the high voltage VPP level, and an inverter circuit 424*b* which drives a corresponding word line WL in accordance with the output signal of level shifter 424*a*. The gate tunnel current reducing mechanism includes a power supply transistor 426, which is formed of an ITR transistor, and is turned on to supply the high voltage VPP to level shifter 424*a* and inverter circuit 424*b* in response to complementary block select signal /BSi.

In the structure shown in FIG. 95, power supply transistor 422 is provided commonly to the unit row decode circuits included in block row decoder 404*i*, and power supply transistor 426 is provided commonly to the word line drive circuits included in word line drivers 406*i*. In the standby state or the unselected state, therefore, power supply transistors 422 and 426 are off so that the power supply voltage is not supplied to the block row decoder and the word line driver.

In the structure shown in FIG. 95, a word line WL may be formed of a hierarchical word line structure including a main word line ZMWL and sub-word lines SWL. In this case, main word line ZMWL is held at high voltage VPP level when unselected. In the case of the hierarchical word line structure, therefore, a structure for interrupting the high voltage is preferably replaced with a structure for deepening a source bias or a well bias, or is preferably replaced with a hierarchical power supply structure.

Figure 96:
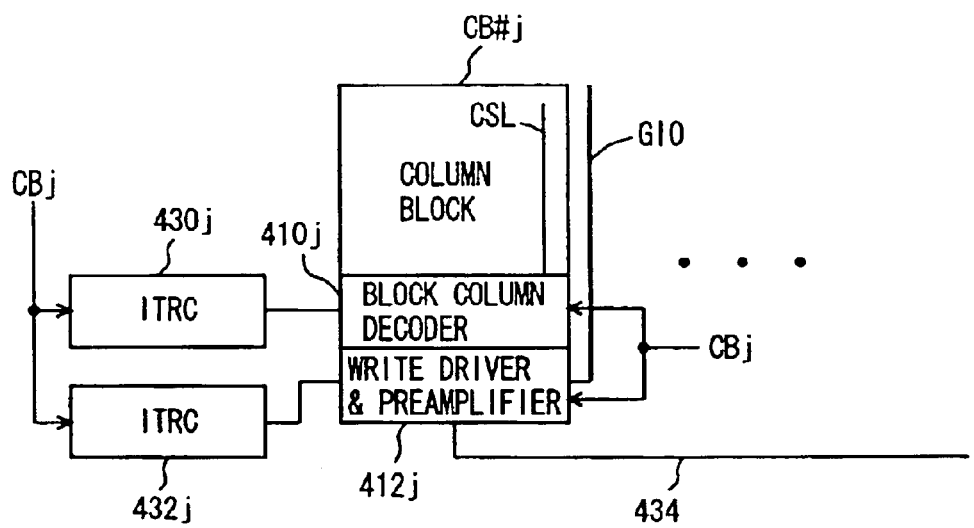
FIG. 96 schematically shows a structure of a portion provided corresponding to one column block of the semiconductor device shown in FIG. 93.

FIG. 96 schematically shows a structure of a portion corresponding to one column block CB#j in column decoder 410 and data IO control circuit 412 shown in FIG. 93. For column block CB#j, there are arranged: a block column decoder 410*j* which decodes the internal column address signal received from column address input circuit 408 shown in FIG. 93 when column block select signal CBj is active, and drives column select signal CSL selecting a corresponding column in column block CB#j to the active state; and a write driver/preamplifier 412*j* which writes and reads data onto and from the selected column in column block CB#j. Write driver and preamplifier 412*j* is activated to perform an amplifying operation when column block select signal CBj is active, too. Write driver and preamplifier 412*j* is coupled to global data bus GIO, which is arranged commonly to the memory blocks of column block CB#j with the memory block being the one arranged in the crossing between a row block and a column block. Write driver and preamplifier 412*j* is coupled to an internal data bus 434. Write driver and preamplifiers 412*j* (j=1–n) which are arranged corresponding to the respectively column blocks CB#1–CB#n are coupled commonly to internal data bus 434.

Gate tunnel current reducing mechanisms (ITRCs) 430*j* and 432*j* are provided for block column decoder 410*j* and write driver/preamplifier 412*j*, respectively. These gate tunnel current reducing mechanism (ITRCs) 430*j* and 432*j* are activated, when column block select signal CBj is unselected, to reduce the gate tunnel currents of block column decoder 410*j* as well as write driver/preamplifier 412.

In the structure shown in FIG. 96, the column selecting operation and write/read of data are performed in the column block designated by column block select signal CBj. In each unselected column block, block column decoder 410 as well as write driver/preamplifier 412 maintain the unselected state (standby state). By arranging gate tunnel current reducing mechanism 430*j* and 432*j* for each column block, the gate tunnel currents are reduced in an unselected column block of the selected memory array, and the operation current during the active period can be reduced.

[First Modification]

Figure 97:
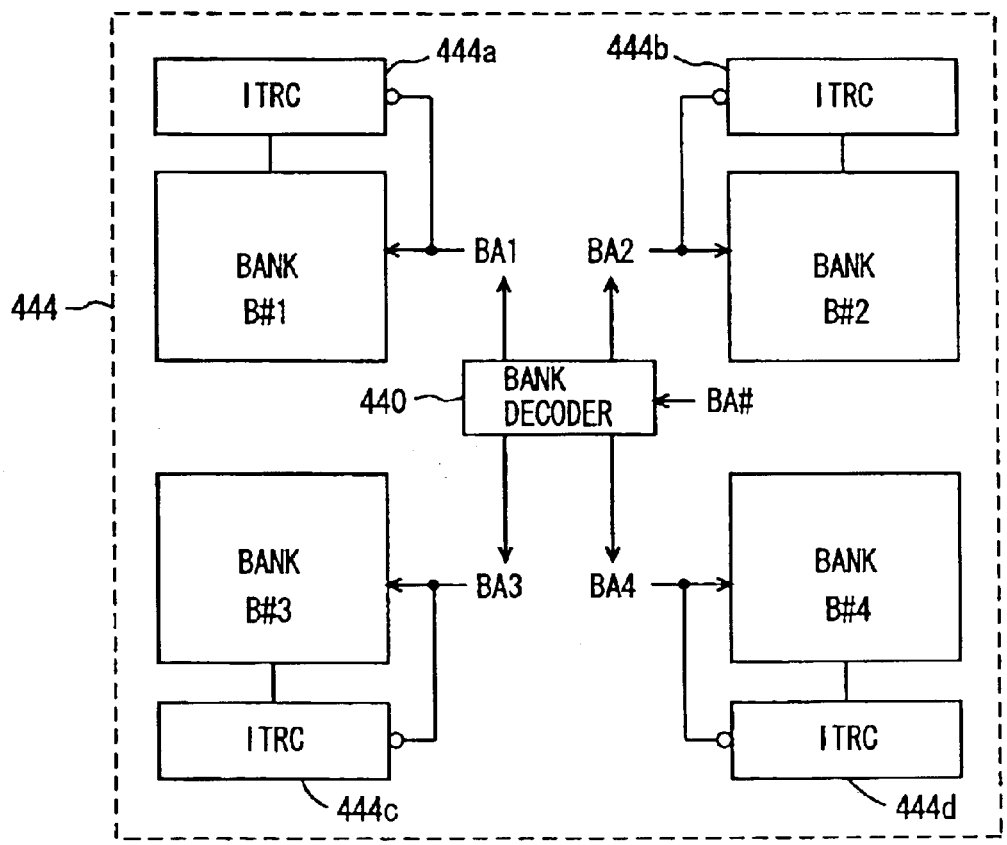
FIG. 97 schematically shows a structure of a first modification of the fifteenth embodiment of the present invention.

FIG. 97 schematically shows a structure of a first modification of the fifteenth embodiment of the present invention. In FIG. 97, a semiconductor device 444 includes a plurality of banks B#1–B#4, gate tunnel current reducing mechanisms (ITRCs) 444*a*–444*d* provided corresponding to respective banks B#1–B#4, and a bank decoder 440 to decode an externally applied bank address signal BA# for producing bank designating signals BA1–BA4. Each of banks B#1–B#4 is activated to perform a memory access (row selection or column selection) when a corresponding one of bank designating signals BA1–BA4 is active. Gate tunnel current reducing mechanisms 444*a*–444*d* are activated to reduce the gate tunnel currents of corresponding banks B#1–B#4 when corresponding bank address signals BA1–BA4 are inactive, respectively. When bank designating signals BA1–BA4 are in the unselected state, corresponding banks B#1–B#4 are kept in the standby state. Therefore, the gate tunnel current reducing mechanism provided for a unselected bank in semiconductor device 440 is activated, whereby the leak current due to the gate tunnel current can be reduced in semiconductor device 444, and therefore the current consumption can be reduced.

As described above, in the fifteenth embodiment of the present invention, the gate tunnel currents in the unselected circuits are adapted to be reduced, and thus the current consumption in the circuit operation or the device active state can be reduced owing to reduction of the gate tunnel currents in the unselected circuit blocks even in the active cycle, because the gate tunnel leak current can be suppressed.

[Sixteenth Embodiment]

Figure 98:
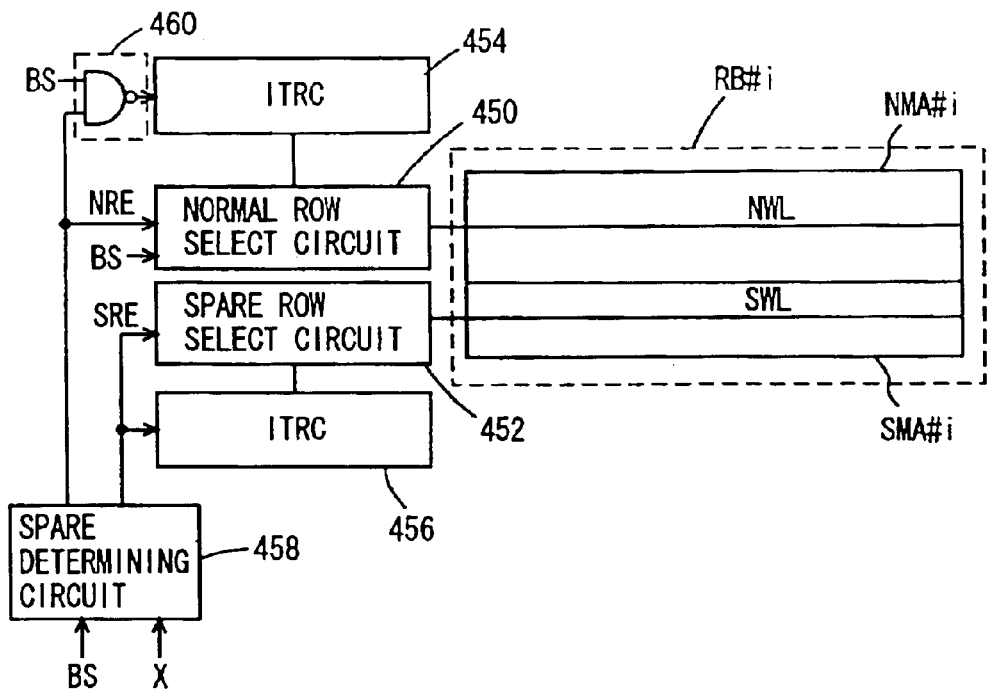
FIG. 98 schematically shows a structure of a main portion of a semiconductor device according to a sixteenth embodiment of the present invention.

FIG. 98 schematically shows a structure of a main portion of a semiconductor memory device according to a sixteenth embodiment of the present invention. In this sixteenth embodiment, a memory array is divided into a plurality of row blocks, similarly to the structure shown in FIG. 93. FIG. 98 shows one row block RB#i as a representative. Row block RB#i includes a normal memory array NMA#i provided with normal word lines NWL, and a spare memory array SMA#i provided with spare word lines SWL.

A normal row select circuit 450 is provided for normal memory array NMA#i, and a spare row select circuit 452 is provided for spare memory array SMA#i. Normal row select circuit 450 includes a normal row decoder and a normal word line drive circuit for driving a selected normal word line NWL in accordance with the output signal of the normal row decoder. Likewise, spare row select circuit 452 includes a spare row decoder and a spare word line drive circuit for driving spare word line SWL to the selected state in accordance with the output signal of spare row decoder.

Gate tunnel current reducing mechanisms (ITRCs) 454 and 456 are provided for normal row select circuit 450 and spare row select circuit 452, respectively. Gate tunnel current reducing mechanisms 454 and 456 in the active state reduce the gate tunnel currents in the corresponding circuits, respectively.

For row block RB#i, there is arranged a spare determining circuit 458 for determining which one of normal word line NWL and spare word line SWL is to be selected. Spare determining circuit 458 stores an address of a defective row in normal memory array NMA#1, and is activated when block select signal BS is activated to designate the row block RB#i. Spare determining circuit 458, when activated, compares address signal X applied thereto with the stored address of the defective memory cell, and activates one of a normal row enable signal NRE and a spare row enable signal SRE in accordance with the result of determination. Normal row enable signal NRE controls activation/deactivation of normal row select circuit 450, and spare row enable signal SRE controls activation/deactivation of spare row select circuit 452.

Normal row enable signal NRE is usually applied to a normal word line drive circuit, and normal row select circuit 450 decodes row address signal X applied thereto when block select signal BS is in the selected state. During the standby state, normal row enable signal NRE is at H-level. Spare row enable signal SRE is at L-level during the standby state, and the spare word line is driven to the selected state when spare row enable signal SRE is active.

Gate tunnel current reducing mechanism (ITRC) 454 provided for normal row select circuit 450 is made inactive when a gate circuit 460 receiving normal row enable signal NRE and block select signal BS generates an output signal at H-level. Gate tunnel current reducing mechanism (ITRC) 454 is activated to reduce the gate tunnel current in normal row select circuit 450 when at least one of block select signal BS and normal row enable signal NRE is inactive or at L-level. In FIG. 98, gate circuit 450 is depicted being formed of an NAND circuit receiving block select signal BS and normal row enable signal NRE. This is because normal row enable signal NRE is set to H-level in the standby state.

Gate tunnel current reducing mechanism (ITRC) 456 provided for spare row select circuit 452 is activated to reduce the gate tunnel current of spare row select circuit 452 when spare row enable signal SRE is inactive. Spare row enable signal SRE is fixed to L-level in the standby state and unselected state (i.e., in access to a normal memory cell).

In the structure shown in FIG. 98, spare determining circuit 458 is provided corresponding to each row block RB#i, and the spare determination is executed on a row block by row block basis. When a spare word line is to be used in the selected row block, the gate tunnel current in normal row select circuit 450 is reduced. When normal word line NWL is to be used (accessed), the gate tunnel current in spare row select circuit 452 is reduced. In the selected row block, therefore, the gate tunnel currents of the unselected circuits can be reduced, and the current consumption during the active period can be reduced. In an unselected row block, gate tunnel current reducing mechanisms 454 and 456 are both activated.

[First Modification]

Figure 99:
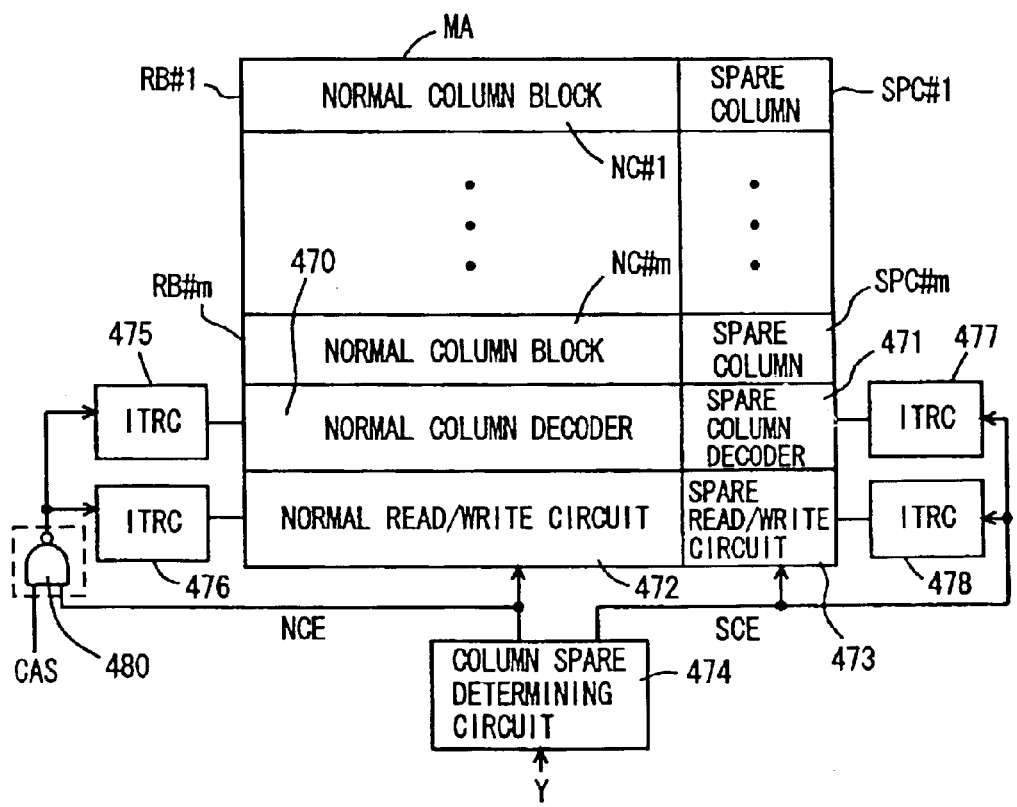
FIG. 99 schematically shows a structure of a first modification of the sixteenth embodiment of the present invention.

FIG. 99 schematically shows a structure of a first modification of the sixteenth embodiment of the present invention. In FIG. 99, a memory array MA is divided into a plurality of row blocks RB#1–RB#m. Memory array MA is also divided into normal column blocks including normal columns, and spare column blocks including spare columns. These normal and spare column blocks are arranged corresponding to each other in the row blocks. Normal column blocks NC#1–NC#m as well as spare column blocks SPC#1–SPC#m are arranged. Row block RB#i includes normal column block NC#i and spare column block SPC#i.

A word line is arranged commonly to normal column block NC#i and spare column block SPC#i. Therefore, when one row block is selected, a row decoder (not shown) selects a row in the normal column block and the spare column block in the selected row block.

A normal column decoder 470 is provided commonly to normal column blocks NC#1–NC#m, and a spare column decoder 471 is provided commonly to spare column blocks SPC#1–SPC#m. A normal read/write circuit 472 is provided for performing data access to a normal column selected by normal column decoder 470. Also, a spare read/write circuit 473 is provided for performing data access to a spare column selected by spare column decoder 471.

For determining which one of the normal column and the spare column is to be accessed, a column spare determining circuit 474 is provided. Column spare determining circuit 474 activates one of normal column enable signal NCE and spare column enable signal SCE in accordance with match/mismatch between an applied column address signal Y and the defective column address. Usually, normal column enable signal NCE is set to H-level during the normal column access and the standby state, similarly to normal row enable signal NRE. Spare column enable signal SCE is set to the active state of H-level only when a spare column is to be accessed.

Gate tunnel current reducing mechanisms (ITRCs) 475 and 476 are provided for normal column decoder 470 and normal read/write circuit 472, respectively. Gate tunnel current reducing mechanisms (ITRCs) 477 and 478 are provided for spare column decoder 471 and spare read/write circuit 473, respectively. These gate tunnel current reducing mechanisms 475 and 476 reduce the gate tunnel currents of normal column decoder 470 and normal read/write circuit 472, respectively, when an output signal of a gate circuit 480 receiving a column access activating signal CAS and normal column enable signal NCE is active or at H-level. Gate circuit 480 is shown being formed of an NAND circuit in FIG. 99, based on the assumption that each of column access activating signal CAS and normal column enable signal NCE is at H-level when activated. Therefore, the output signal of gate circuit 480 is deactivated (L-level) when the column access of column selection and the data access (write/read) start, and a normal column address is designated. Responsively, gate tunnel current reducing mechanisms 475 and 476 are deactivated to stop the gate tunnel current reducing operations for normal column decoder 470 and normal read/write circuit 472, respectively.

Gate tunnel current reducing mechanisms (ITRCs) 477 and 478 provided for spare column decoder 471 and spare read/write circuit 473 are activated to reduce the gate tunnel currents of spare column decoder 471 and spare read write circuit 473 when spare column enable signal SCE is inactive. Spare column enable signal SCE is held inactive (Llevel) during the standby state and the normal column access.

Therefore, the gate tunnel current for inactive circuits is reduced during the column access, and the current consumption during the column access period can be reduced.

[Second Modification]

Figure 100:
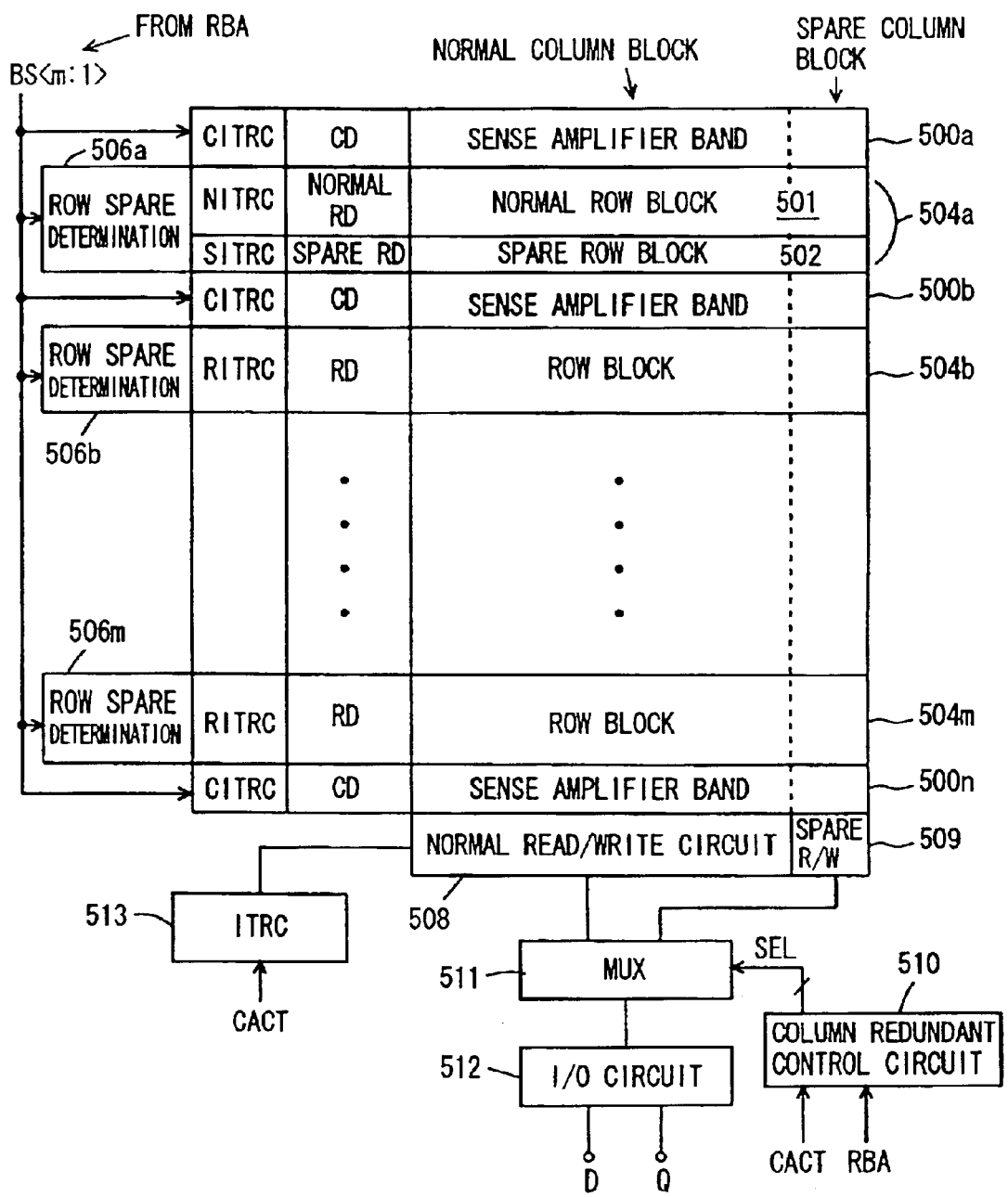
FIG. 100 schematically shows a structure of a second modification of the sixteenth embodiment of the present invention.

FIG. 100 schematically shows a structure of a second modification of the sixteenth embodiment of the present invention. In FIG. 100, a memory array is divided into a plurality of row blocks 504a–504m. Each of row blocks 504a–504m includes a normal row block 501 with normal word lines, and a spare row block 502 with spare word lines. In the structure shown in FIG. 100, a defective row is repaired in units of row blocks. Sense amplifier bands 500a–500n are arranged adjacent in the column direction to row blocks 504a–504m, respectively. Sense amplifier bands 500a–500n shared between adjacent row blocks.

Row decoders RD including word line drive circuits are arranged for respective row blocks 504a–504m. Each row decoder RD includes a normal row decoder (RD) arranged corresponding to normal row block 501 and a spare row decoder (RD) arranged corresponding to spare row block 502.

For sense amplifier bands 500a–500n, column decoders CD are arranged for producing column select signals, respectively. The column select signals produced by column decoders CD are transmitted via column select lines extending in the row direction within corresponding sense amplifier bands 500a–500n. Accordingly, column decoder CD simultaneously performs the column selection in the spare column block and the column selection in the normal column block within a row block. Column decoder CD is not supplied with a result of the column spare determination. When a corresponding block select signal is active in the column access, the column decode operation is executed in accordance with the column access instructing (activating) signal CACT.

A column gate tunnel current reducing mechanism CITRC is arranged corresponding to column decoder CD, and a row gate tunnel current reducing mechanism RITRC is arranged for row decoder RD. Row gate tunnel current reducing mechanism RITRC includes a normal gate tunnel current reducing mechanism NITRC provided for normal row decoder (RD) and a spare row gate tunnel current reducing mechanism SITRC provided for spare row decoder (RD).

For row decoders RD, there are arranged row spare determining circuits 506a–506m, respectively. Each of row spare determining circuit 506a–506m is supplied with a corresponding block select signal in block select signals BS<m:1>. The block select signals BS<m:1> are applied to corresponding column gate tunnel current reducing mechanisms CITRC provided corresponding to column decoders CD.

A normal read/write circuit 508 is provided for the normal column blocks, and a spare read/write (R/W) circuit 509 is provided for a spare column blocks. These normal read/write circuit 508 and spare read/write (R/W) circuit 509 operate in parallel in the column access operation.

In the memory array, a global data bus of multiple bits is coupled in parallel to normal read/write circuit 508, and a defective column is replaced on a global data line basis. For repairing a defective column, there are arranged: a column redundant control circuit 510 which is activated to decode row block address signal RBA and produce data line select signal SEL when column access instructing signal CACT is active; and a multiplexer (MUX) 511 which selectively couples normal read/write circuit 508 and spare read/write circuit 509 to an input/output circuit 512 in accordance with data line select signal SEL applied from column redundant control circuit 510. In column redundant control circuit 510, programming of defective column addresses is individually performed for each row block, and the global data line which is connected to the defective column in the selected row block is replaced with the spare global data line in accordance with row block address signal RBA.

Since normal read/write circuit 508 and spare read/write circuit 509 operate in parallel, gate tunnel current reducing mechanism (ITRC) 513 is provided commonly to these normal read/write circuit 508 and spare read/write (R/W) circuit 509. This gate tunnel current reducing mechanism 513 reduces the gate tunnel currents of normal read/write circuit 508 and spare read/write circuit 509 when column access instructing signal CACT is inactive. When a column access starts, the operation of reducing the gate tunnel currents of normal and spare read/write circuits 508 and 509 stops, and these normal and spare read/write circuits 508 and 509 operate fast.

In the structure shown in FIG. 100, the gate tunnel currents of column decoder CD and row decoder RD are controlled in accordance with block select signals BS<m:1> and the result of determination by a corresponding one of row spare determining circuits 506a–506m. When the normal row block is to be accessed in a selected row block, the corresponding spare gate tunnel current reducing mechanism SITRC is held in substantially the same state as that in the standby state, so that the gate tunnel current of corresponding spare row decoder (RD) is reduced.

When a spare word line is to be accessed in the selected row block, the corresponding normal gate tunnel current reducing mechanism NITRC maintains substantially the same state as that in the standby state, so that the gate tunnel current of the corresponding normal row decoder (RD) is reduced.

In the structure shown in FIG. 100, therefore, control of the gate tunnel current is performed on a row block basis and on a normal/spare block basis, and the gate tunnel current reducing operation is stopped only for the circuit to be operated. Therefore, the current consumption during the active period (period of memory cell selecting operation) is reduced.

Activation and deactivation of column gate tunnel current reducing mechanism CITRC for column decoder CD are controlled in accordance with block select signals BS<m:1> produced from row block address signal RBA. However, column gate tunnel current reducing mechanism CITRC may be configured to receive both block select signals BS<m:1> and column access instructing signal CACT, to stop its gate tunnel current reducing operation only when both the received signals are in the selected state.

[Third Modification]

Figure 101A:
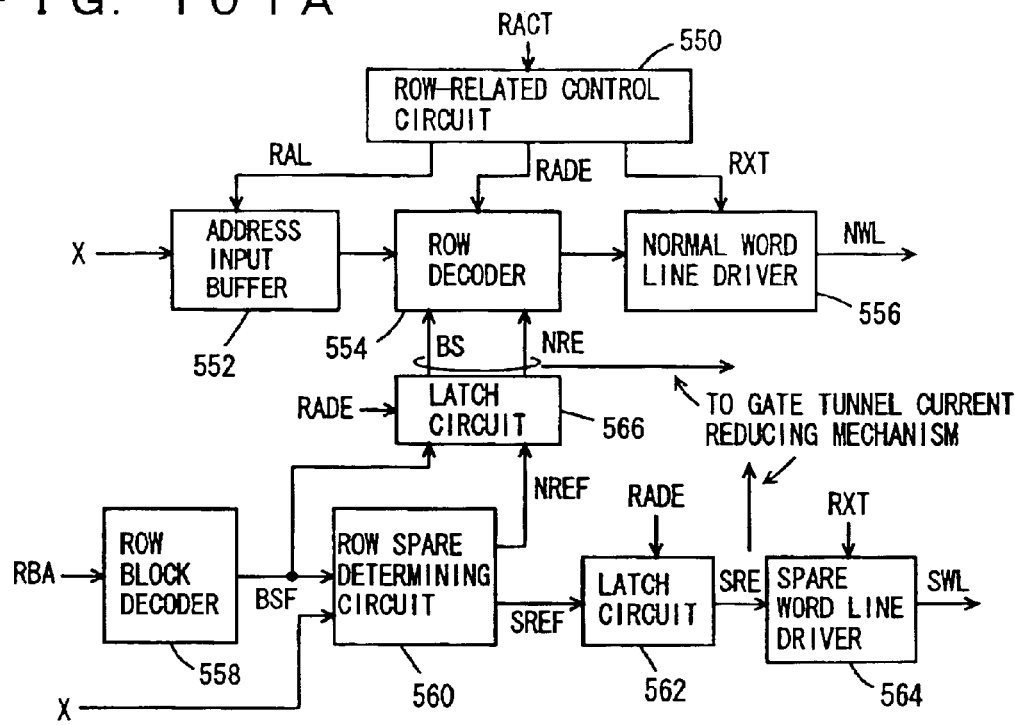
FIG. 101A schematically shows a structure of a third modification of the sixteenth embodiment of the present invention.

FIG. 101A schematically shows a structure of a main portion of a third modification of the sixteenth embodiment of the present invention. FIG. 101A shows a structure of only a row-related circuit for one row block.

In FIG. 101A, the row-related circuit includes: an address input buffer 552 which latches word line address signal X in accordance with a row address latch enable signal RAL; a row decoder 554 which decodes internal word line address signal X applied from address input buffer 552 in accordance with row decoder enable signal RADE; a normal word line driver 556 which drives a normal word line NWL to the selected state in accordance with word line drive timing signal RXT and the output signal of row decoder 554; a row block decoder 558 which decodes row block address signal RBA; a row spare determining circuit 560 which is activated in accordance with block select signal BSF applied from row bock decoder 558, and determines whether word line address signal X designates a defective row or not when activated; a latch circuit 562 which latches spare row enable signal SREF applied from row spare determining circuit 560 in accordance with row decoder enable signal RADE; and a spare word line driver 564 which is activated in accordance with spare row enable signal SRE applied from latch circuit 562, and drives a spare word line SWL to the selected state in response to word line drive timing signal RXT when activated.

Figure 101B:
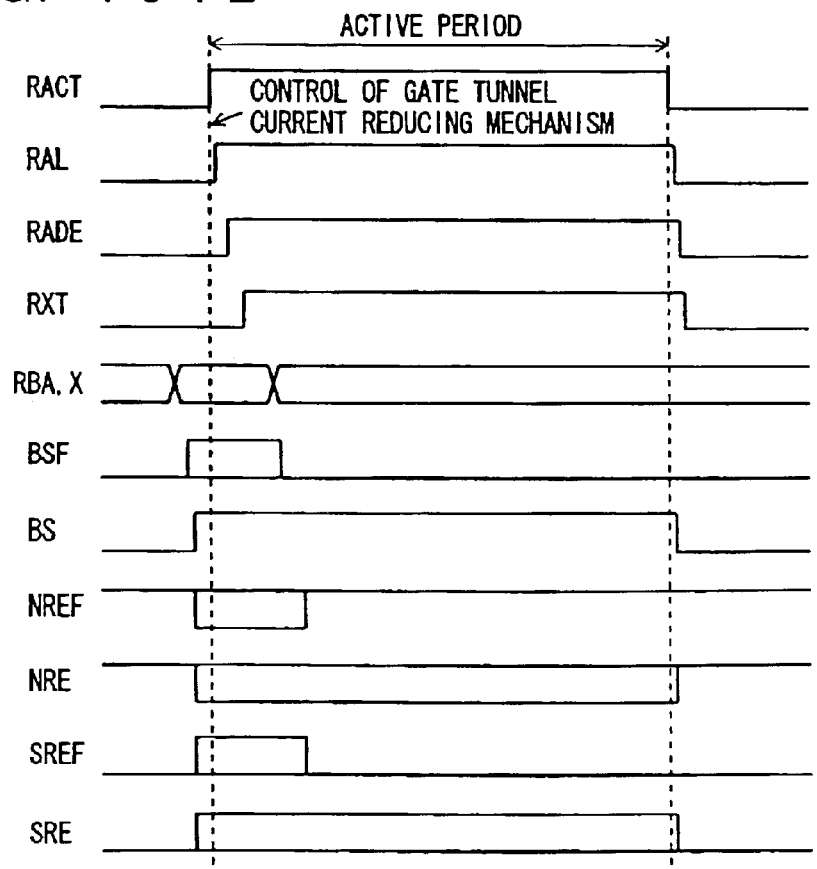
FIG. 101B is a signal waveform diagram representing an operation of the circuit shown in FIG. 101A.

This row-related circuit further includes a latch circuit 566 which is activated in accordance with row decoder enable signal RADE to latch block select signal BSF applied from row block decoder 558 and normal row enable signal NREF applied from row spare determining circuit 560, and generate block select signal BS and normal row enable signal NRE to row decoder 554. Normal row enable signal NRE applied from latch circuit 566 may be applied to normal word line driver 556. Row-related control circuit 550 produces row address latch enable signal RAL, row address decoder enable signal RADE and word line drive timing signal RXT in a predetermined sequence when row access activating signal RACT is active. Row-related control circuit 550 and address input buffer 552 are provided commonly to a plurality of row blocks. An operation of the structure shown in FIG. 101A will now be described with reference to a signal waveform of FIG. 101B.

When row access activating signal RACT is driven to the active state of H-level, row address latch enable signal RAL, row address decoder enable signal RADE and word line drive timing signal RXT are successively activated in a predetermined sequence. Before the activation of row access activating signal RACT, word line address signal X and row block address signal RBA are applied. Row block decoder 558 and row spare determining circuit 560 operate asynchronously to row access activating signal RACT, and perform the decoding operation and the determining operation, respectively. In other words, the row spare determination is performed utilizing the setup periods of address signals X and RBA with respect to row access activating signal RACT.

In accordance with block select signal BSF generated from row block decoder 558, the spare determining operation is performed in the selected row block. In accordance with the spare determination result, normal row enable signal NREF and spare row enable signal SREF are set to the states representing the result of spare determination, respectively. Therefore, normal row enable signal NREF and spare row enable signal SREF generated from row spare determining circuit 560 are made definite before activation of row access activating signal RACT.

Then, latch circuits 566 and 562 take in and latch the applied signals in accordance with activation of row address decode enable signal RADE. Accordingly, row decoder 554 is supplied with block select signal BS and normal enable signal NRE. When a normal word line is designated in the selected row block, row decoder 554 performs the decoding operation, and then normal word line driver 556 drives the normal word line NWL to the selected state.

When a defective word line is addressed in the selected row block, row decoder 554 does not perform the decoding operation, and maintains the standby state. Normal word line driver 556 also maintains the standby state. When the defective word line is addressed, the spare row enable signal SREF from row spare determining circuit 560 becomes active, latch circuit 562 enters the latch state in accordance with row address decoder enable signal RADE, and spare word line driver 564 drives spare word line SWL to the selected state in accordance with word line drive timing signal RXT.

Accordingly, the result of spare determination is in the definite state before activation of row access activating signal RACT or before activation of row address decoder enable signal RADE at the latest, and the period required for the spare determination within the active period can be reduced, and thus, the current consumption of the circuits, which are held inactive in the normal and spare row decoders, can be reduced, because corresponding gate tunnel current reducing mechanisms are driven to the active state.

In the case of a standard DRAM, this row access activating signal RACT is produced in accordance with row address strobe signal /RAS. In the case of a synchronous DRAM operating synchronously with the clock signal, an active command is applied, and the internal active state is maintained until reception of a subsequent precharge command.

In the case of the clock synchronous DRAM, latch circuits 566 and 562 may be configured to transfer corresponding signals in synchronization with cock signal CLK.

Such a structure may be employed that word line address signal X is applied to row spare determining circuit 560 and row decoder 554, and block select signal BSF from row block decoder 558 is transferred in synchronization with the clock signal for activating row decoder 554 and transfer of the output signal of row spare determining circuit 560.

In any of the above structures, the setup period of the address signal is utilized for performing the row spare determination.

In the structure shown in FIG. 101A, row block decoder 558 and row spare determining circuit 560 operate statically. However, row block decoder 558 and row spare determining circuit 560 may be temporarily reset in response to the deactivation of row access activating signal RACT.

In the structure shown in FIG. 101A, one spare word line SWL is provided in the spare row block. In the case where a plurality of spare word lines SWL are provided in each row block, row spare determining circuit 560 is configured to include spare determining circuits corresponding to respective spare sub-word lines, with spare word lines being related to the spare determining circuits in a one-to-one relationship. In this case, normal row enable signal NREF is produced by NOR operation on output signals of the plurality of spare determining circuits.

[Fourth Modification]

Figure 102:
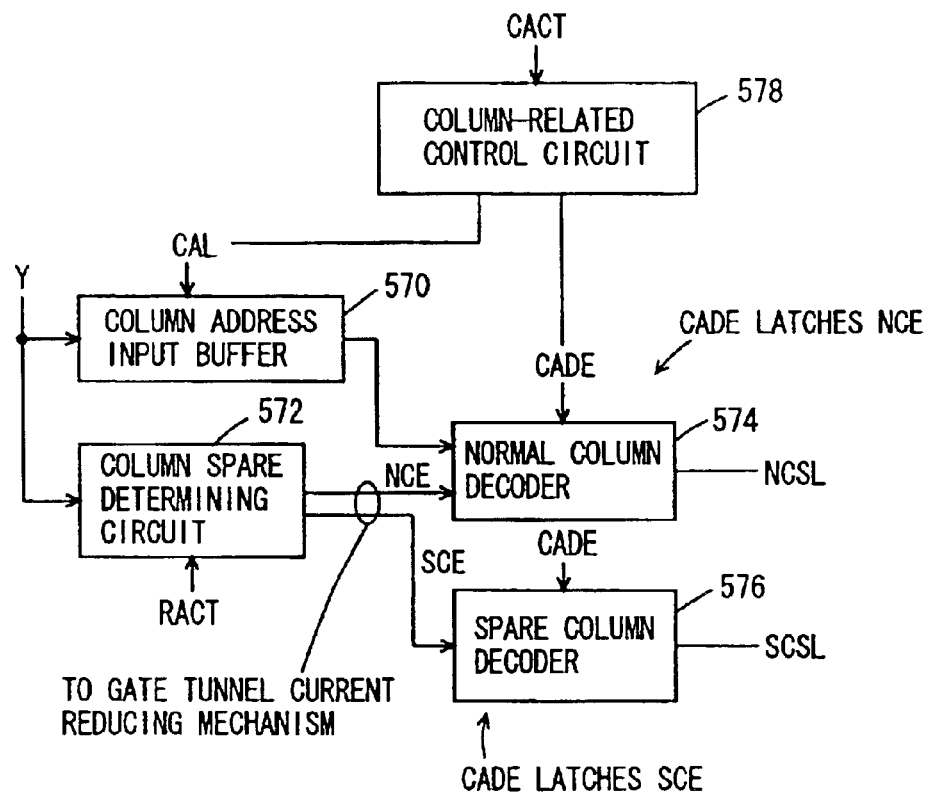
FIG. 102 schematically shows a structure of a fourth embodiment of the sixteenth embodiment of the present invention.

FIG. 102 schematically shows a structure of a fourth modification of the sixteenth embodiment of the present invention. FIG. 102 shows column-related circuitry.

In FIG. 102, the column-related circuit includes: a column-related control circuit 578 which is responsive to activation of column access instructing signal CACT for producing column address latch enable signal CAL and column address decoder enable signal CADE in a predetermined sequence; a column address input buffer 570 which takes in and latches column address signal Y in response to column address latch enable signal CAL; a column spare determining circuit 572 which is activated in response to activation of row access activating signal RACT, to incorporate column address signal Y for performing the column spare determination; a normal column decoder 573 which is responsive to activation of column address decoder enable signal CADE for latching normal column enable signal NCE received from column spare determining circuit 572, and decoding the column address signal received from column address input buffer 570; and a spare column decoder 576 which latches spare column enable signal SCE received from column spare determining circuit 572 in response to activation of column address decoder enable signal CADE, and produces spare column select signal CSL.

Spare column decoder 576 merely drives spare column select line SCSL to the selected state in accordance with spare column enable signal SCE. In the case where a plurality of spare column lines are provided, column spare determining circuit 572 is adapted to include a plurality of program circuits for storing a plurality of address of defective columns, with these column program circuits corresponding to the respective spare column select lines SCSL.

Figure 103:
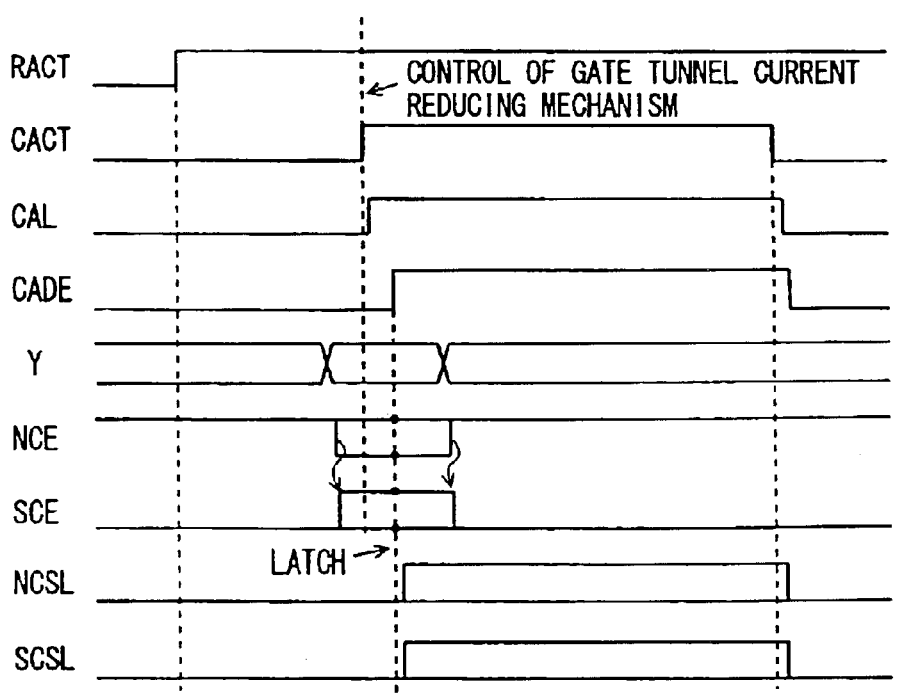
FIG. 103 is a signal waveform diagram representing an operation of the circuit shown in FIG. 102.
Figure 104:
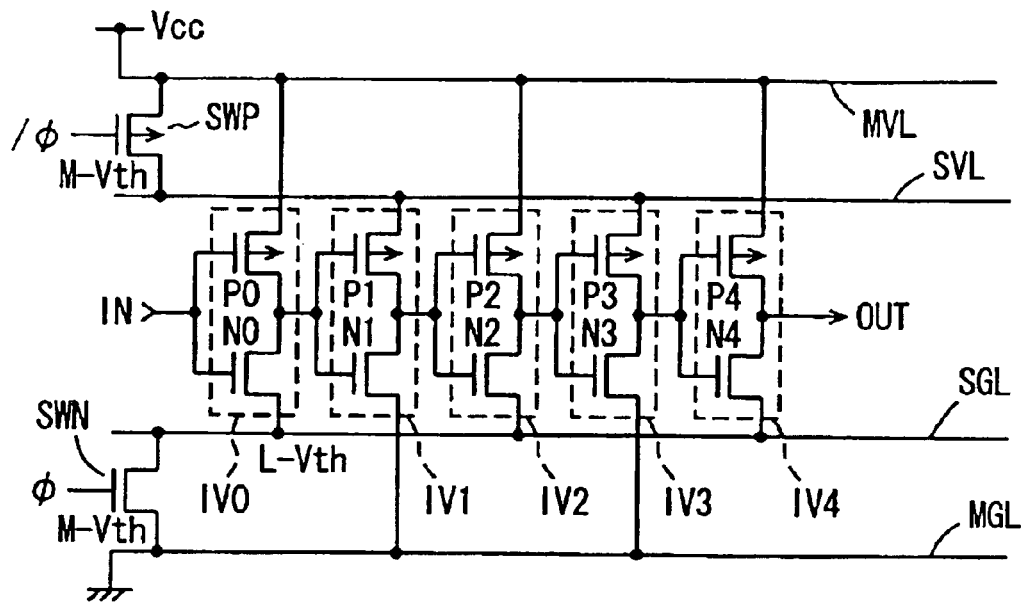
FIG. 104 shows, by way of example, a structure of a semiconductor device in the prior art.
Figure 105:
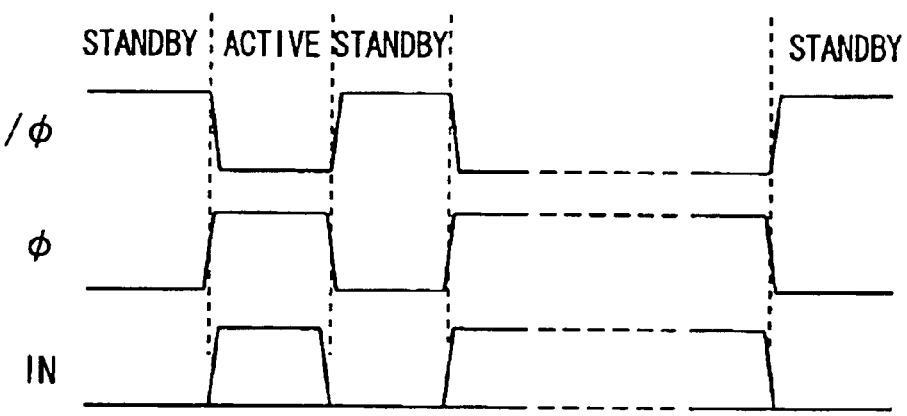
FIG. 105 is a signal waveform diagram representing an operation of the semiconductor device shown in FIG. 104.
Figure 106A:
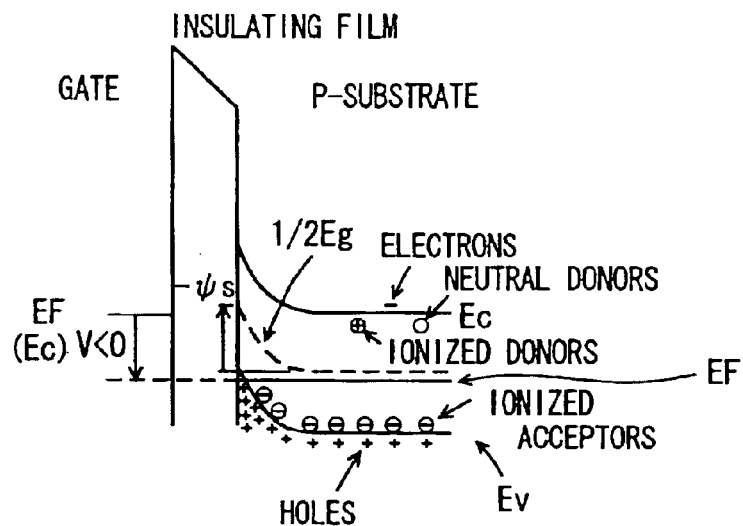
FIGS. 106A–106C schematically show structures of energy bands in an accumulated state, a depleted state and an inverted state of an N-channel MIS transistor, respectively.
Figure 106B:
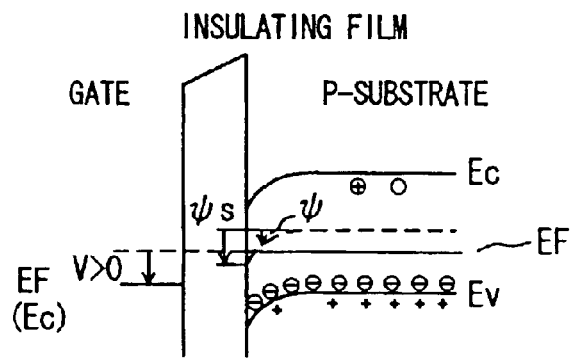
Figure 106C:
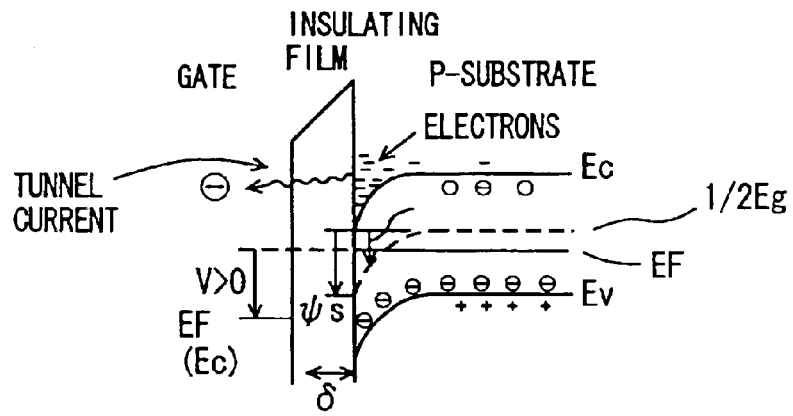
Figure 107:
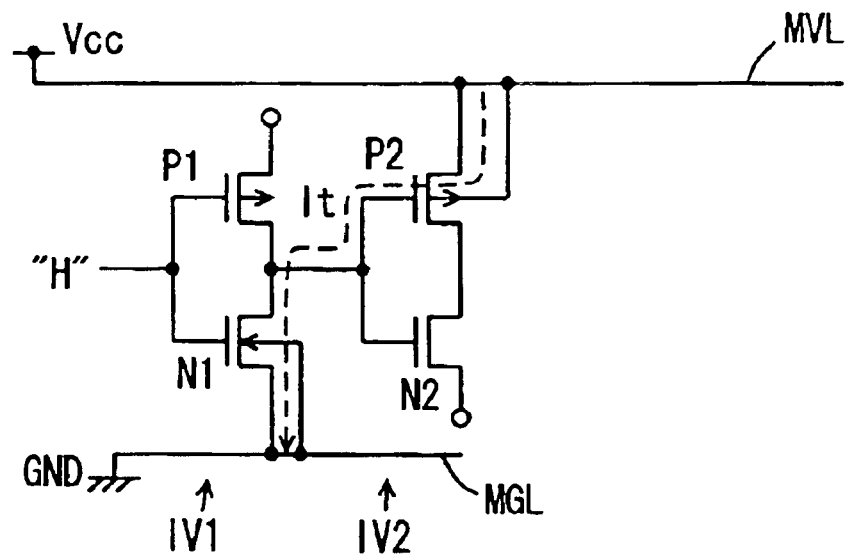
FIG. 107 shows a gate tunnel current path in a conventional semiconductor device.
Figure 108:
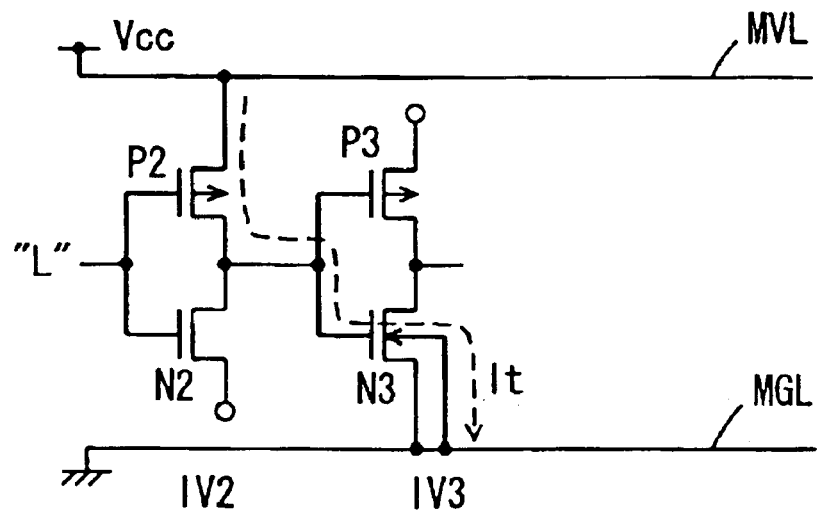
FIG. 108 shows another path for the gate tunnel current in the conventional semiconductor device.

Normal column decoder 574 and spare column decoder 576 drive normal column select line NCSL and spare column select line SCSL to the selected state in accordance with column address decoder enable signal CADE, respectively. Column spare determining circuit 572 performs the spare determining operation asynchronously to column access activating signal CACT, as shown in FIG. 103. Accordingly, at the start of decoding by normal column decoder 574, column spare determining circuit 572 has already completed its determining operation. Therefore, the column selecting operation can be internally started at a faster timing, and the activation/deactivation of the gate tunnel current reducing mechanisms provided for normal and spare column decoders 574 and 576 can be controlled at a faster timing.

Since the time for switching the states of gate tunnel current reducing mechanism is not present within the active period, the current consumption caused by this switching can be eliminated from the active period, and the current consumption in the active period can be reduced.

In the structure shown in FIG. 102, column access instruction (activation) signal CACT may be produced in accordance with column address strobe signal /CAS, or may be produced in accordance with the column access command, as is done in the clock synchronous DRAM. In the case of the clock synchronous DRAM, the determination result of column spare determining circuit 572 may be transferred in synchronization with clock signal CLK.

In the structures shown in FIGS. 101A and 102, internal operations are performed in accordance with access activating signals RACT and CACT, and the gate tunnel current reducing mechanisms are selectively activated. Alternatively, the gate tunnel current reducing mechanisms may be configured to be switched in the state asynchronously to these access activating signals RACT and CACT. More specifically, in FIG. 101A, block select signal BSF generated from row block decoder 558 as well as spare and normal row enable signals SREF and NREF generated from row spare determining circuit 560 may be adapted to be applied to the corresponding gate tunnel current reducing mechanisms.

In the structure shown in FIG. 100, the normal and spare row blocks are arranged within the row block. Alternatively, a single spare row block may be provided commonly to a plurality of normal row blocks. In this case, the activation/deactivation and the gate tunnel current of the normal sense amplifiers are controlled independently of those of the spare sense amplifiers.

According to the sixteenth embodiment of the present invention, as described above, in the normal/spare memory cell redundant structure, the gate tunnel current reducing mechanism for the access path in the unselected state is held active. Thus, the leak current due to the gate tunnel current can be reduced, and thereby the current consumption can be reduced during the active period of this semiconductor memory device.

According to the present invention, as described above, the ITR transistors or the MIS transistors which can have large gate tunnel barriers are used in the portions where gate tunnel current may cause a problem, so that the gate tunnel leak current can be efficiently suppressed, and the current consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a normal array having a plurality of normal memory cells;
   a redundant array having spare memory cells for repairing a defective normal memory cell having a defect in said normal array;
   a normal access circuit for accessing a selected normal memory cell in said normal array, said normal access circuit including, as a component thereof, an insulated gate field effect transistor;
   a spare access circuit for accessing the spare memory cell in said redundant array, said spare access circuit including, as a component thereof, an insulated gate field effect transistor; and
   a power supply control circuit for setting a gate tunnel current of the insulated gate field effect transistor of an inactive circuit out of said spare access circuit and said normal access circuit to be smaller than the gate tunnel current of the transistor in an active circuit out of the spare and normal access circuits.

2. The semiconductor device according to claim 1, wherein
   each of said spare and normal access circuits includes a plurality of sub-access circuits to be activated selectively; and
   said power supply control circuit sets the unselected sub-access circuit in said spare and normal access circuits to the state causing a gate tunnel current smaller than the gate tunnel current of the transistor in the selected sub-access circuit.

3. The semiconductor device according to claim 1, further comprising:
   a determining circuit for determining which is to be activated between the normal and spare access circuits in accordance with an address signal, and activating one of said normal and spare access circuits in accordance with a result of determination, said determining circuit starting the determining operation before activation of an operation mode instructing signal instructing a memory cell selecting operation.

4. The semiconductor device according to claim 1, further comprising:

a determining circuit for determining which is to be activated between the normal and spare access circuits in accordance with an address signal, and activating one of said normal and spare access circuits in accordance with a result of determination, said determining circuit executing the determining operation asynchronously to an operation mode instructing signal instructing a memory cell selecting operation.

* * * * *